US008514636B2

(12) United States Patent
Kamata et al.

(10) Patent No.: US 8,514,636 B2

(45) Date of Patent: Aug. 20, 2013

(54) SEMICONDUCTOR STORAGE DEVICE

(75) Inventors: Yoshihiko Kamata, Yokohama (JP); Fumitaka Taniwaki, Kawasaki (JP); Hirotaka Kariya, Yokohama (JP); Yuki Shimizu, Kawasaki (JP); Shirou Fujita, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 184 days.

(21) Appl. No.: 13/235,391

(22) Filed: Sep. 18, 2011

(65) Prior Publication Data

US 2012/0069683 A1 Mar. 22, 2012

(30) Foreign Application Priority Data

Sep. 21, 2010 (JP) ................................ 2010-211429
Feb. 14, 2011 (JP) ................................ 2011-028639
Feb. 14, 2011 (JP) ................................ 2011-029107

(51) Int. Cl.
*G11C 7/10* (2006.01)

(52) U.S. Cl.
USPC ................................ 365/189.05; 365/230.08

(58) Field of Classification Search
USPC ........................................ 365/189.05, 230.08
See application file for complete search history.

(56) References Cited

U.S. PATENT DOCUMENTS 5,886,938 A * 3/1999 Haukness .................... 365/205

FOREIGN PATENT DOCUMENTS

JP 2004-192789 7/2004

* cited by examiner

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

According to one embodiment, a semiconductor storage device includes a cell array, an even line, an odd line, and sense amplifiers. The cell array includes memory cells holding data. The even line connects to the memory cells. The odd line connects to the memory cells. The memory cells connect to an odd column or the even column. Each the sense amplifiers selectively connect to the odd line or the even line. Each the sense amplifiers includes a latch circuit, a first transistor, a second transistor, and a third transistor. The latch circuit includes a first node and a second node, and holds the data supplied to the first node. The first transistor supplies read data to the latch circuit. The second transistor transfers the data held by the latch circuit to the wiring. The third transistor transfers the data held by the latch circuit to the wiring.

20 Claims, 102 Drawing Sheets

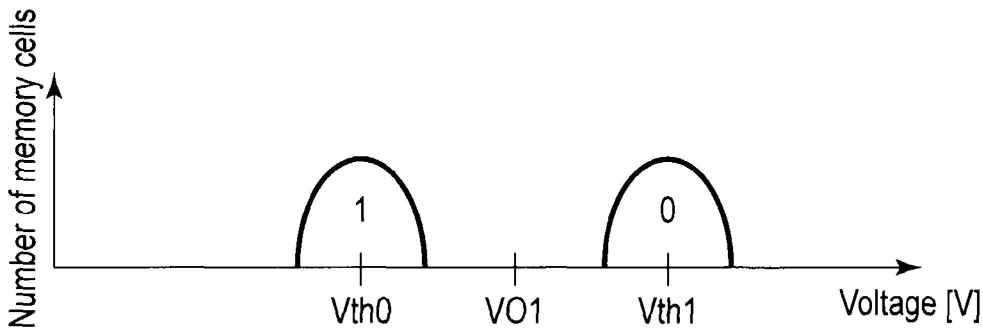
F I G. 2
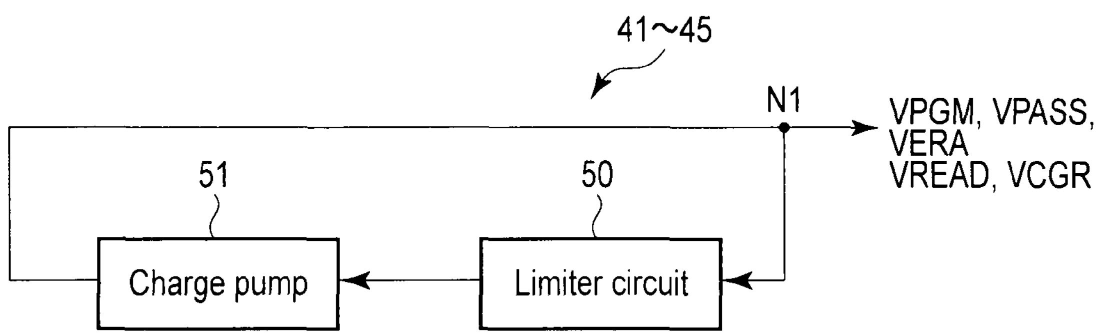
F I G. 3

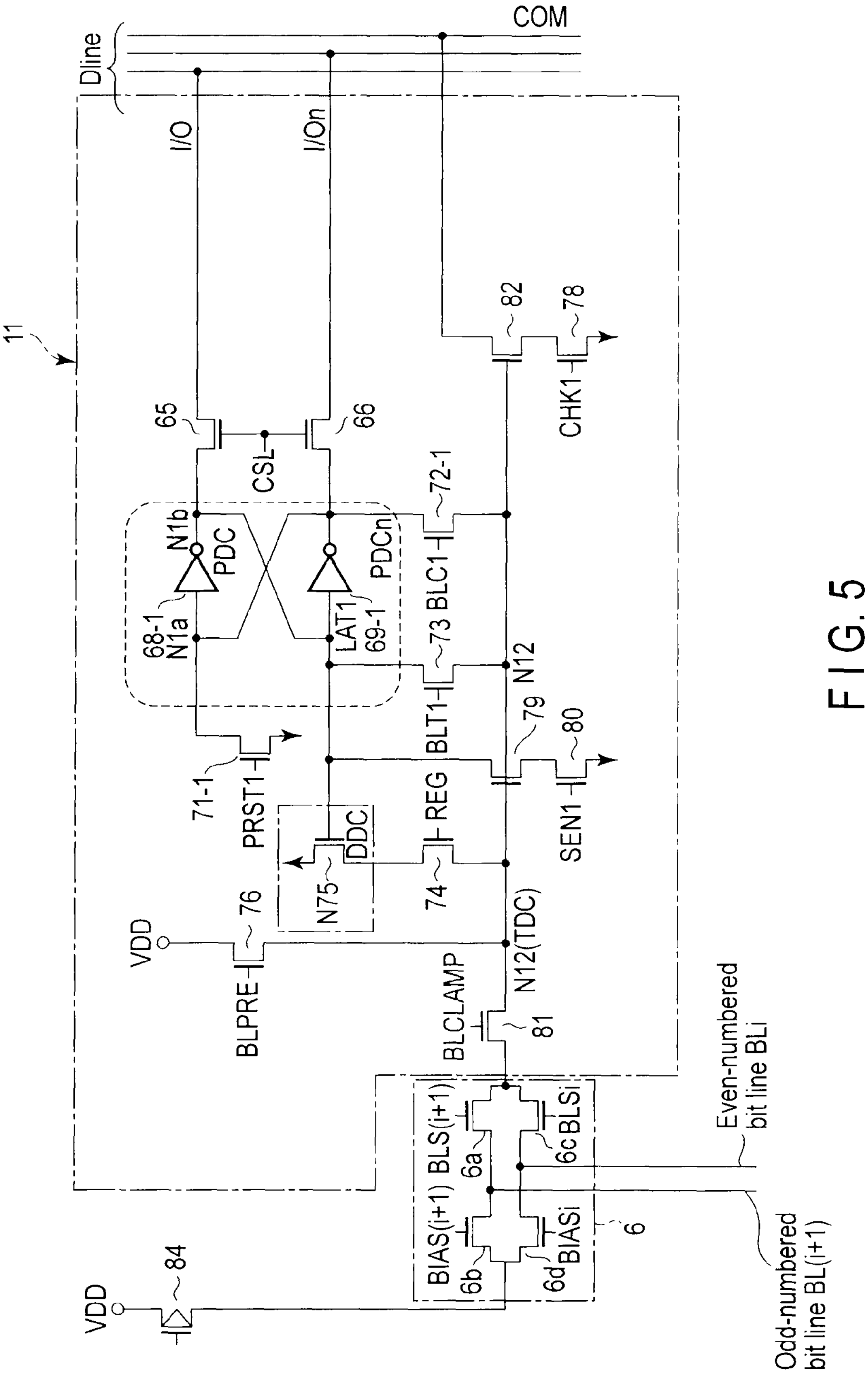
F I G. 5

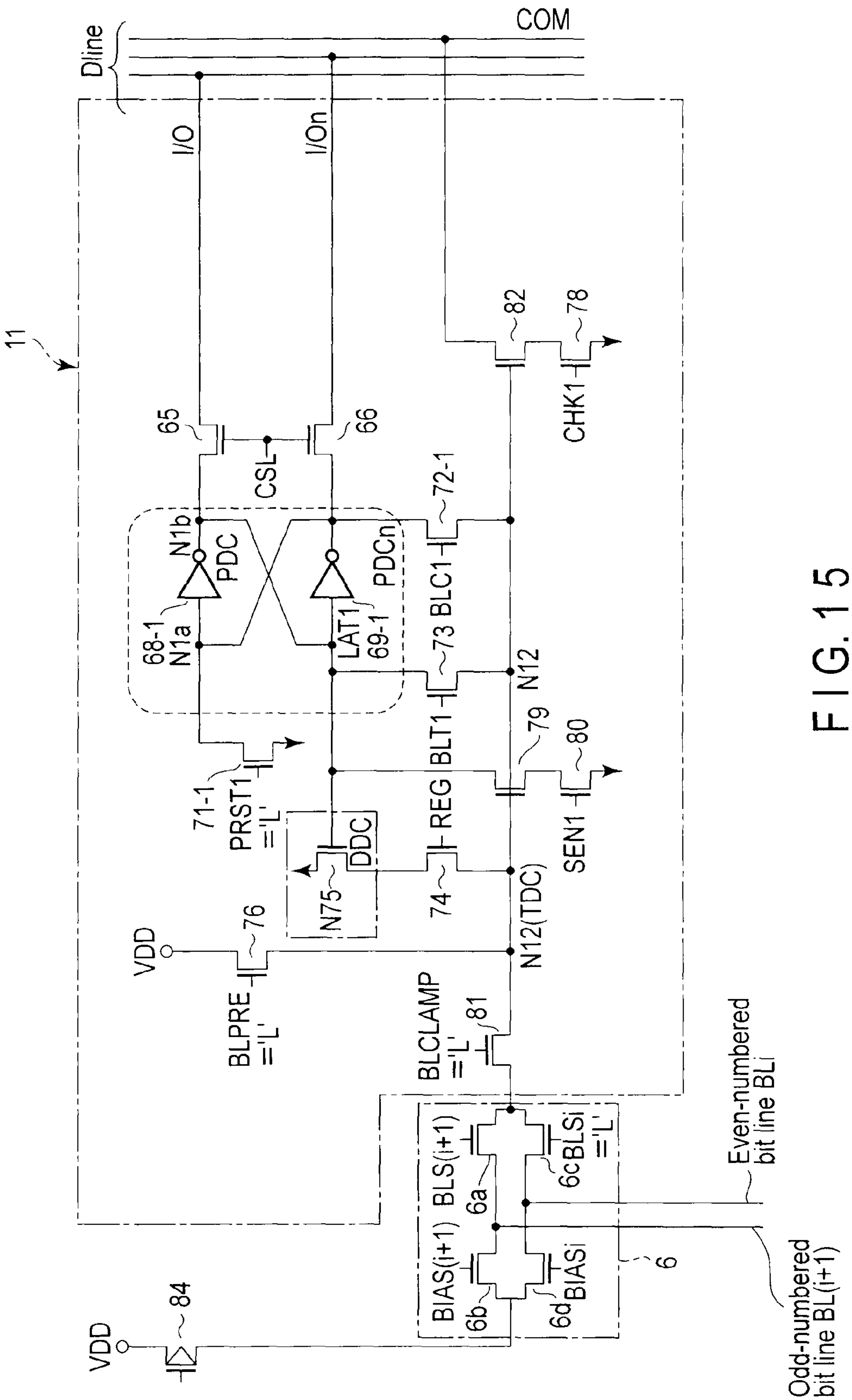
F I G. 1 5

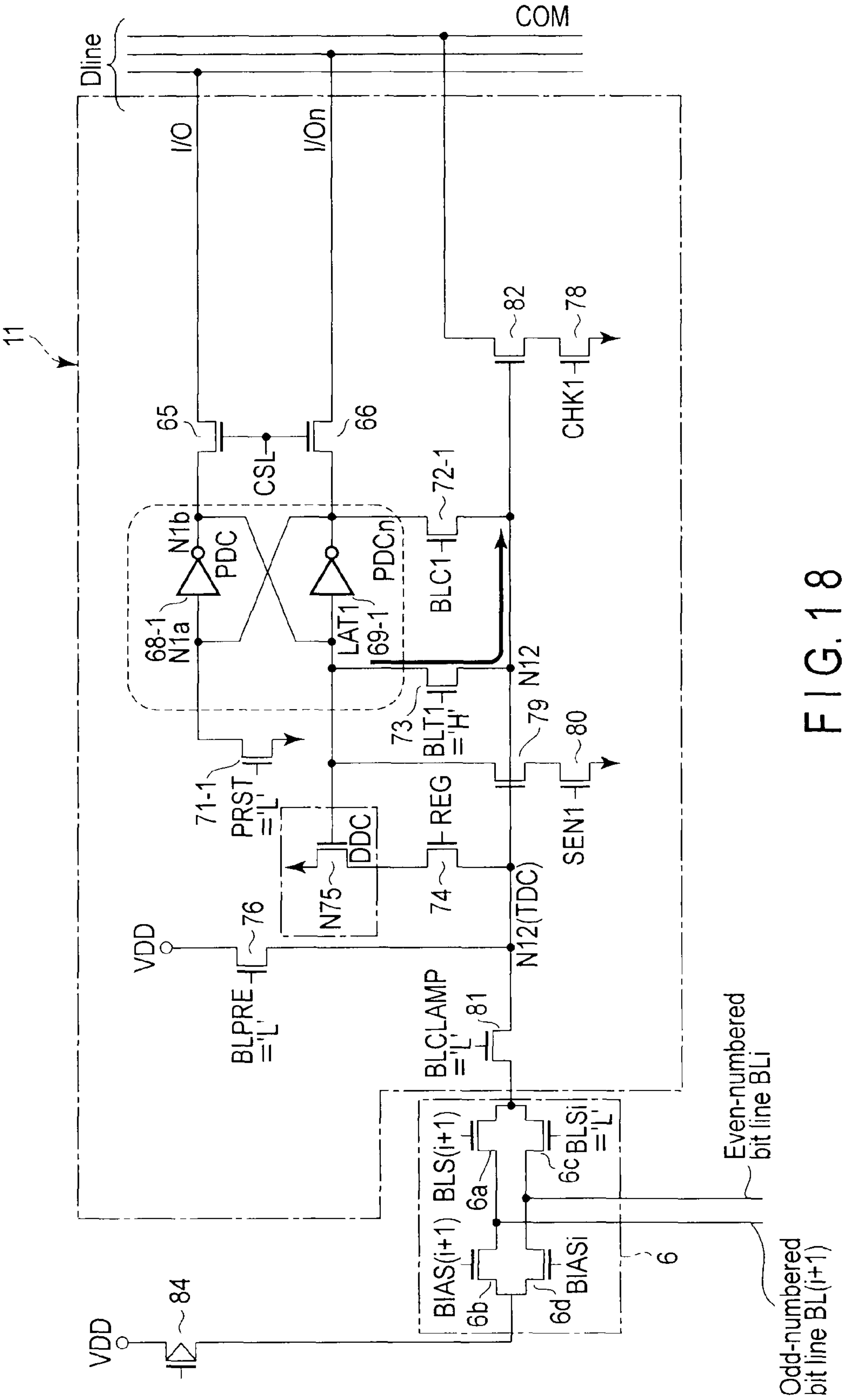
F I G. 1 8

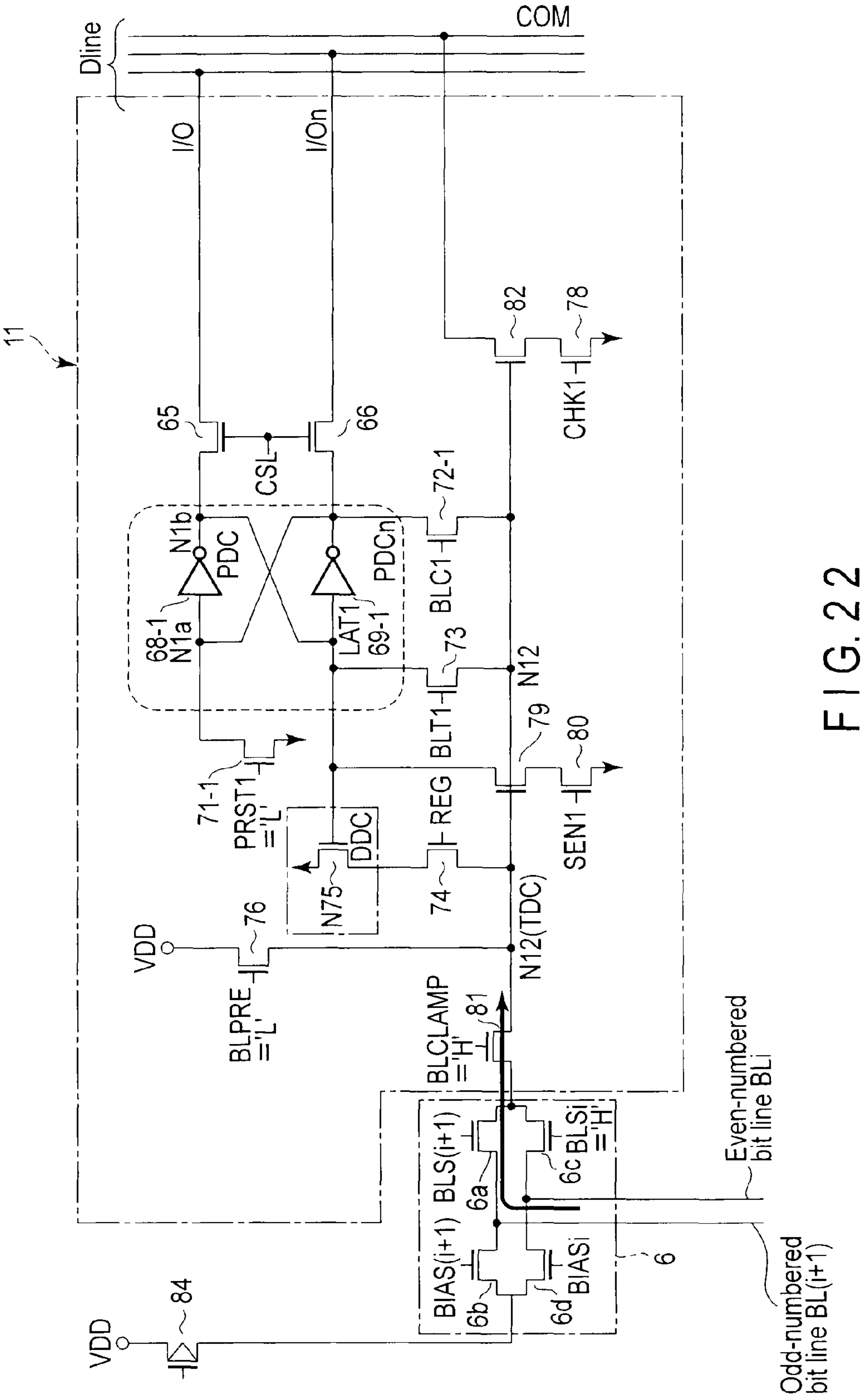
F I G. 2 2

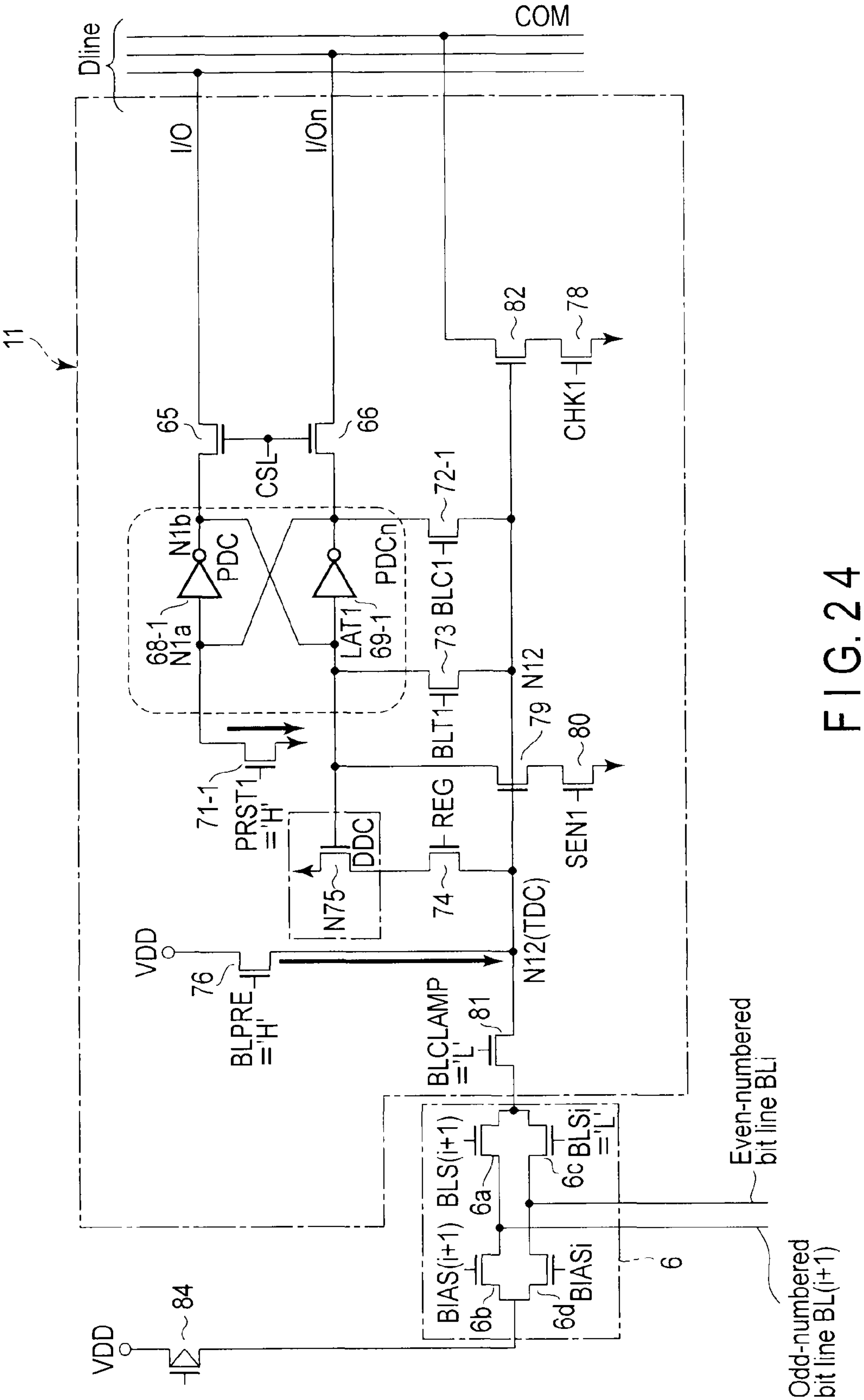
F I G. 2 4

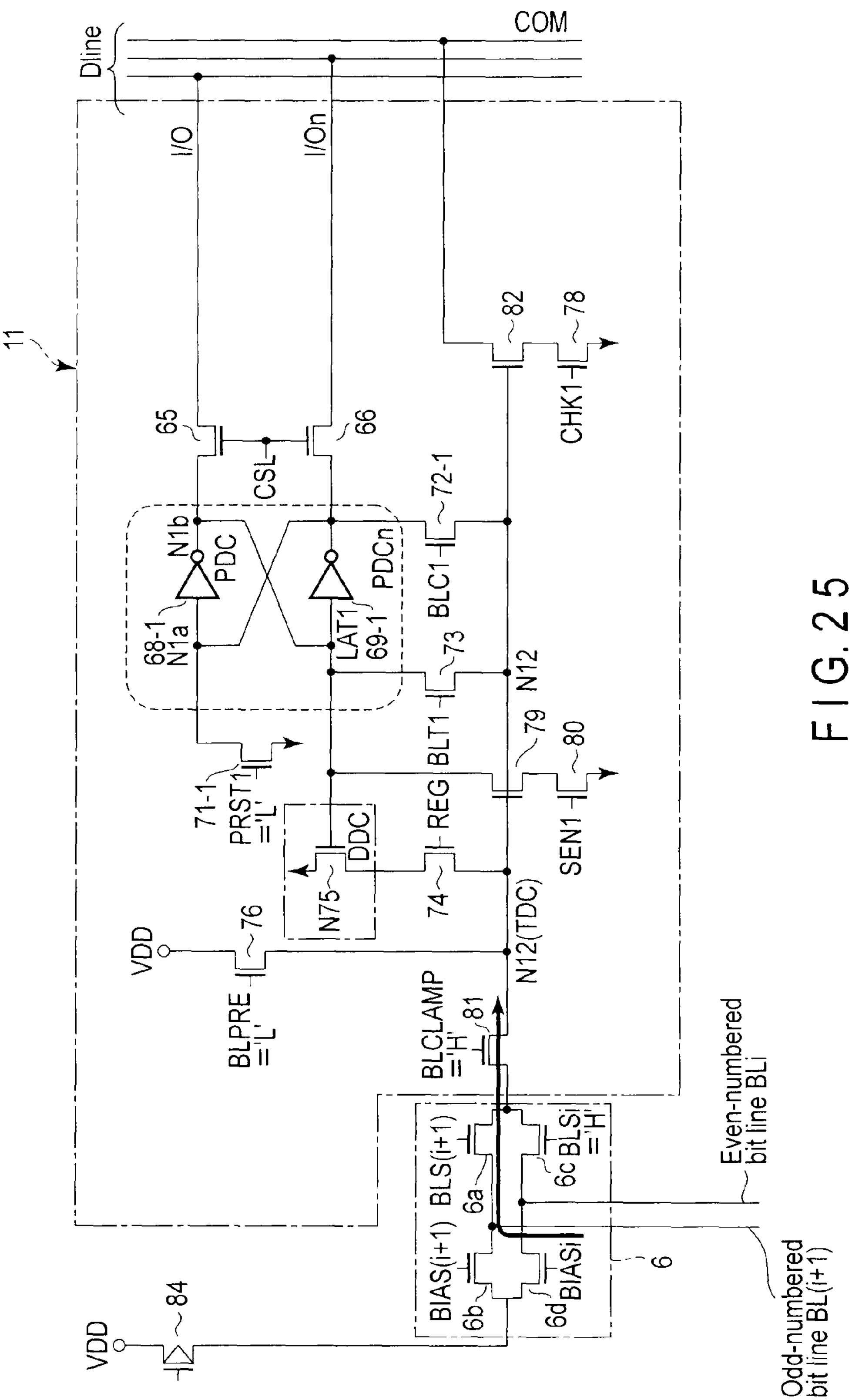
F I G. 2 5

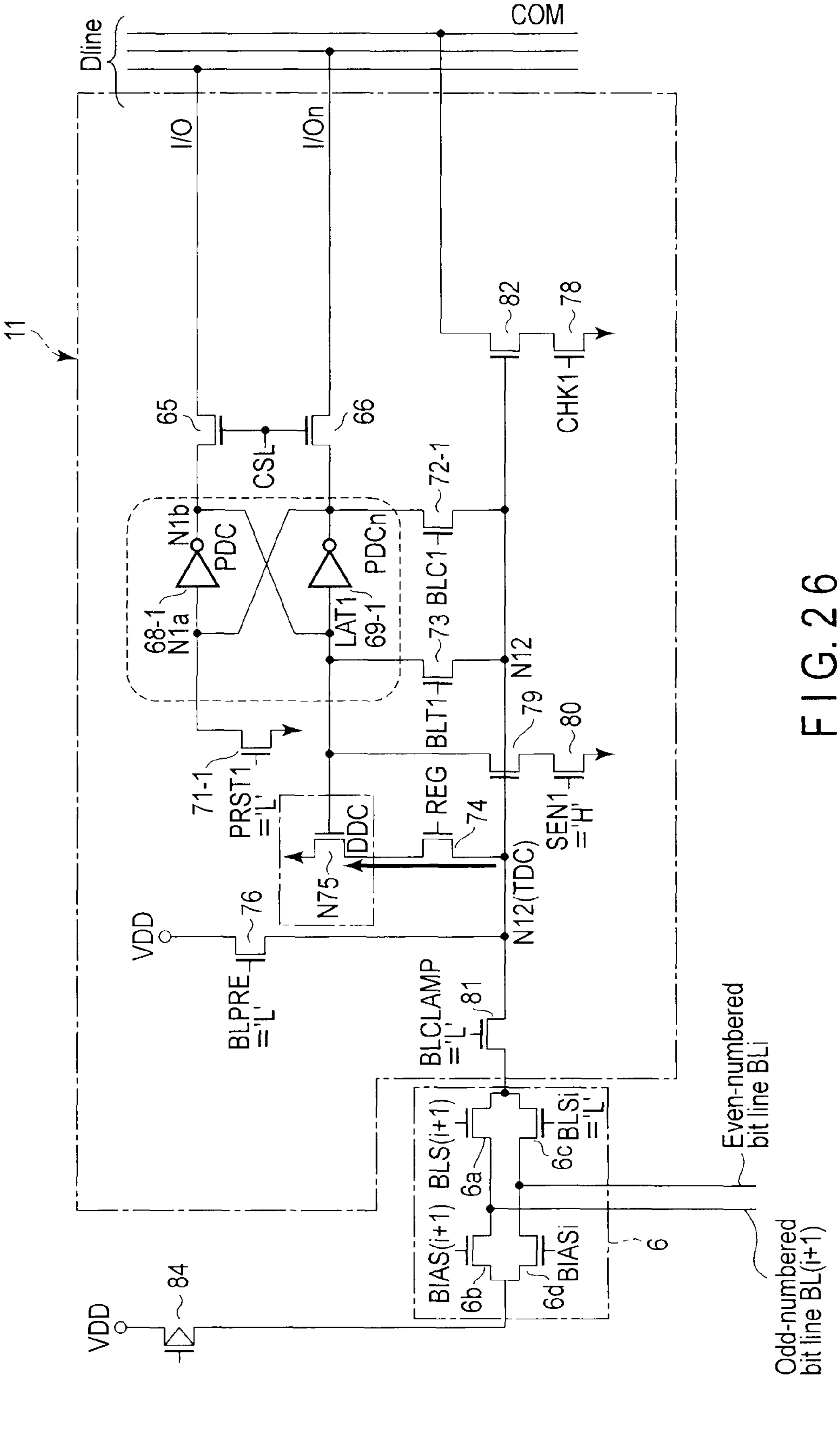
F I G. 2 6

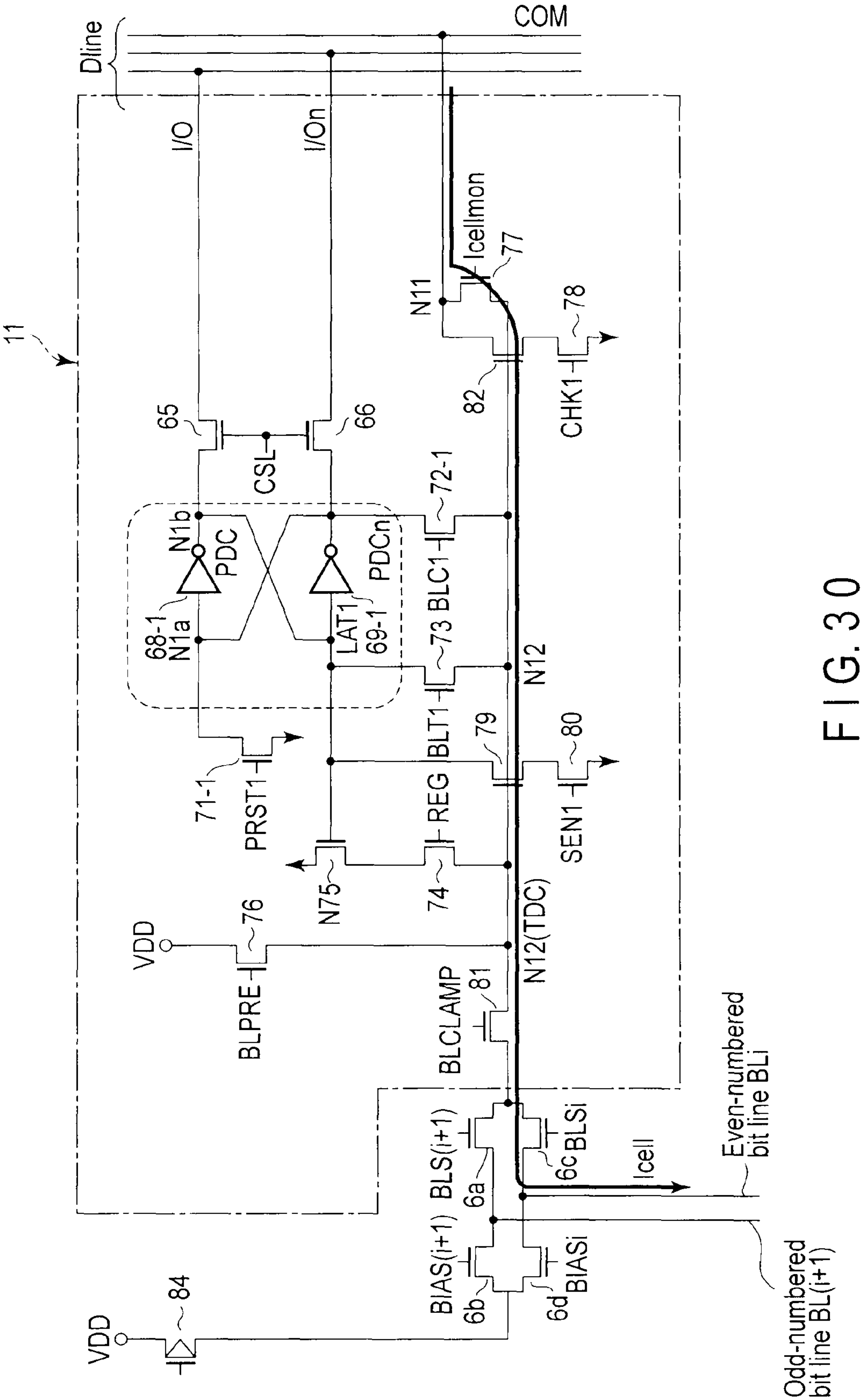
F I G. 3 0

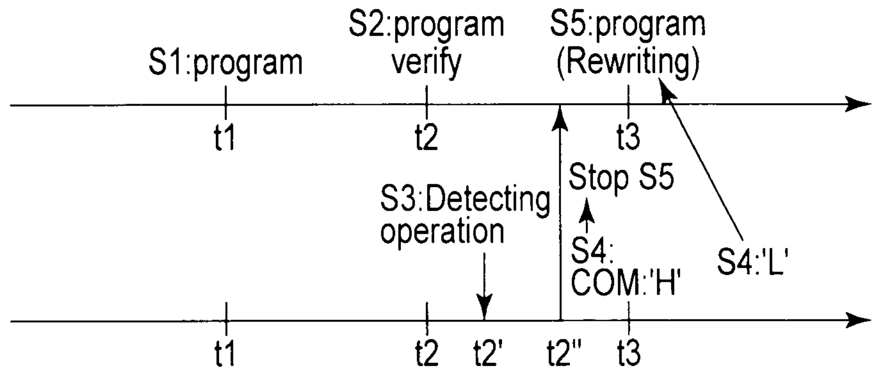
F I G. 3 2
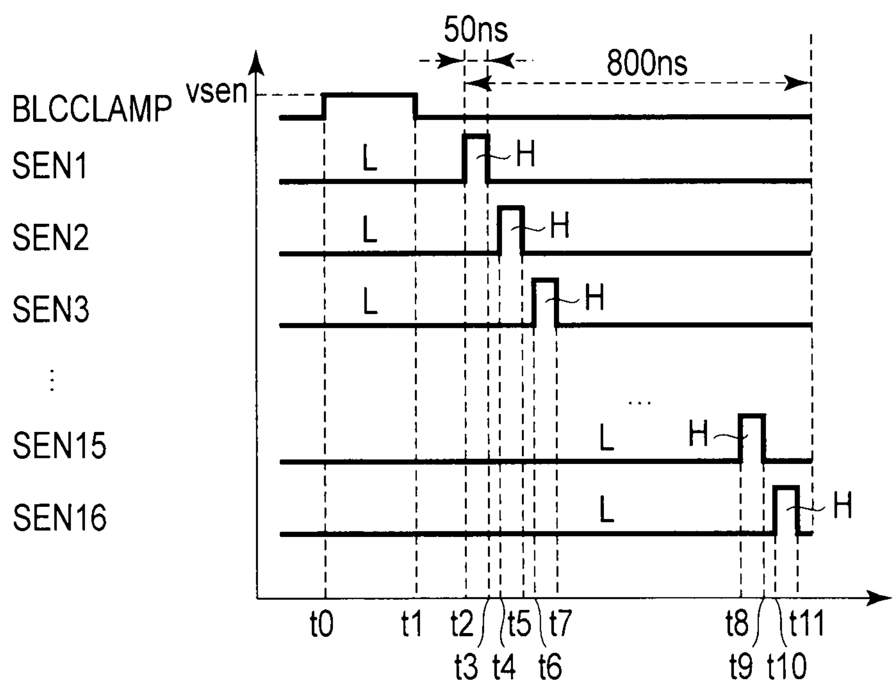
F I G. 3 3

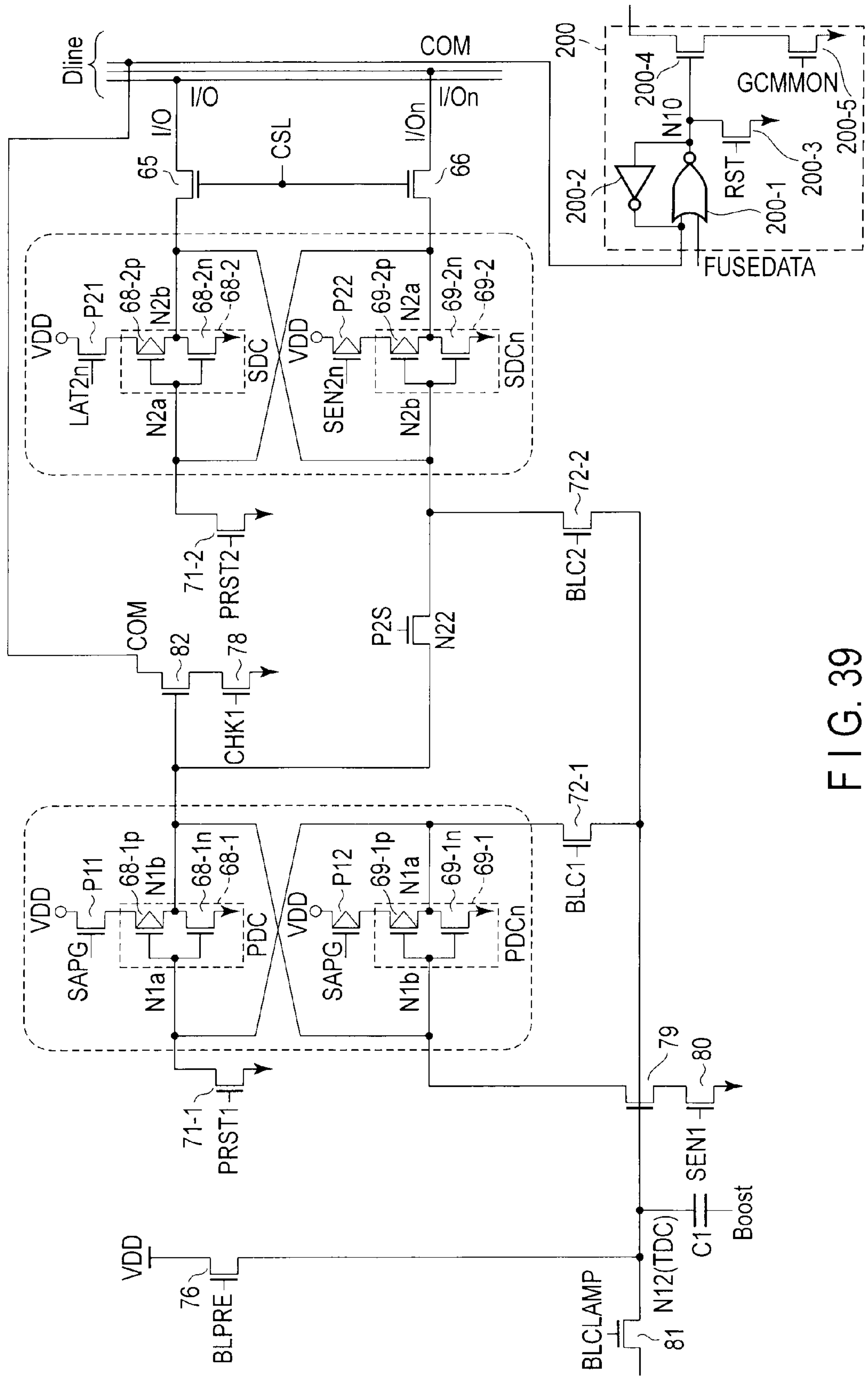
F I G. 39

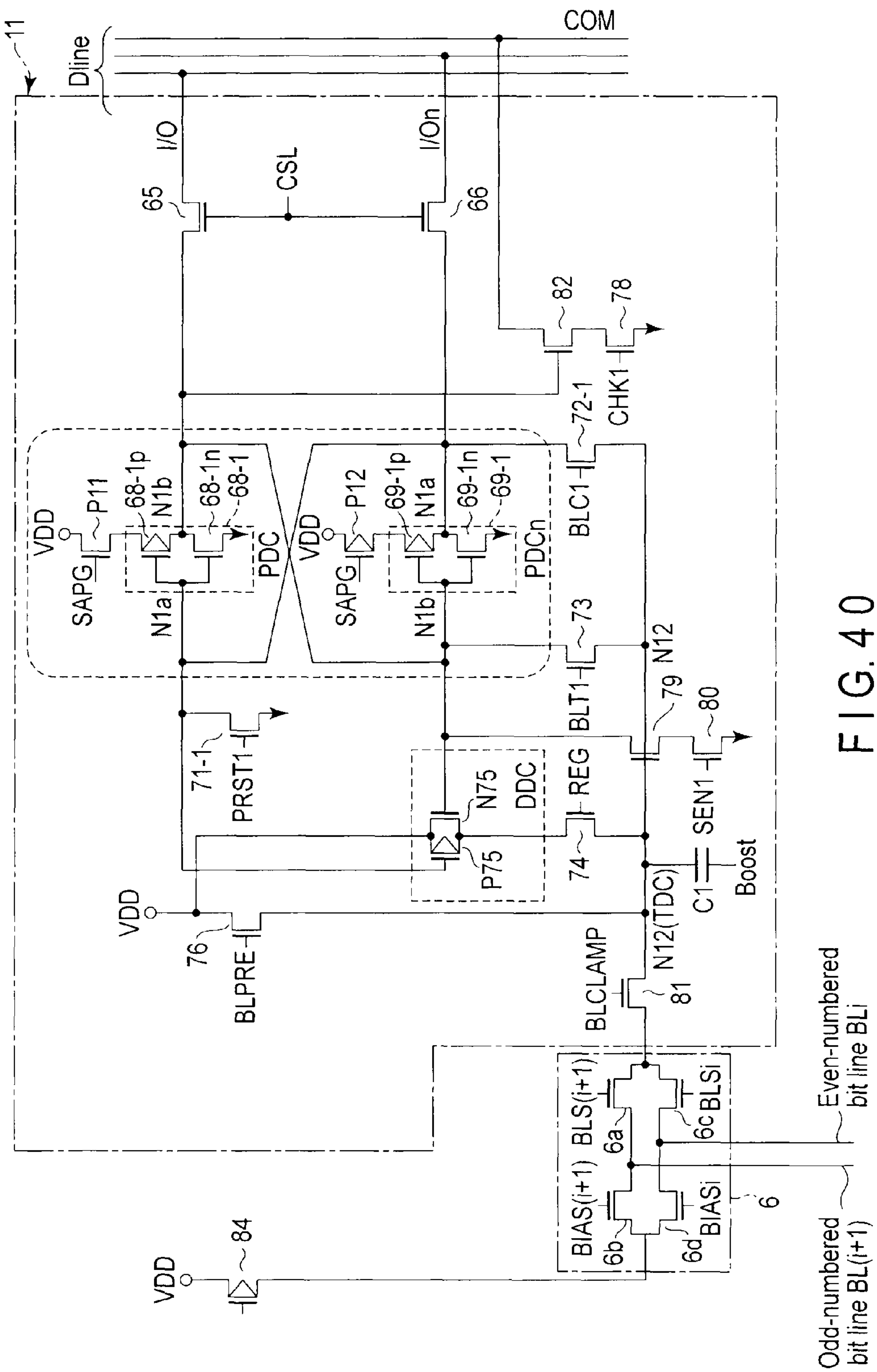
F I G. 4 0

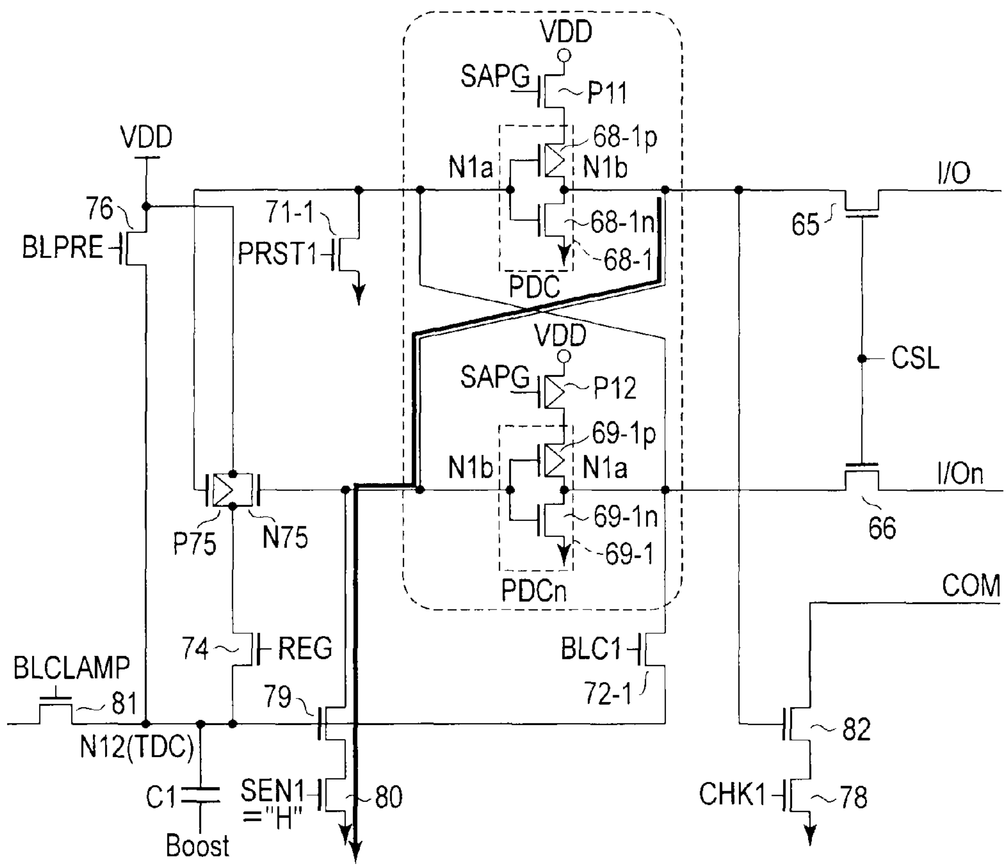
F I G. 4 3

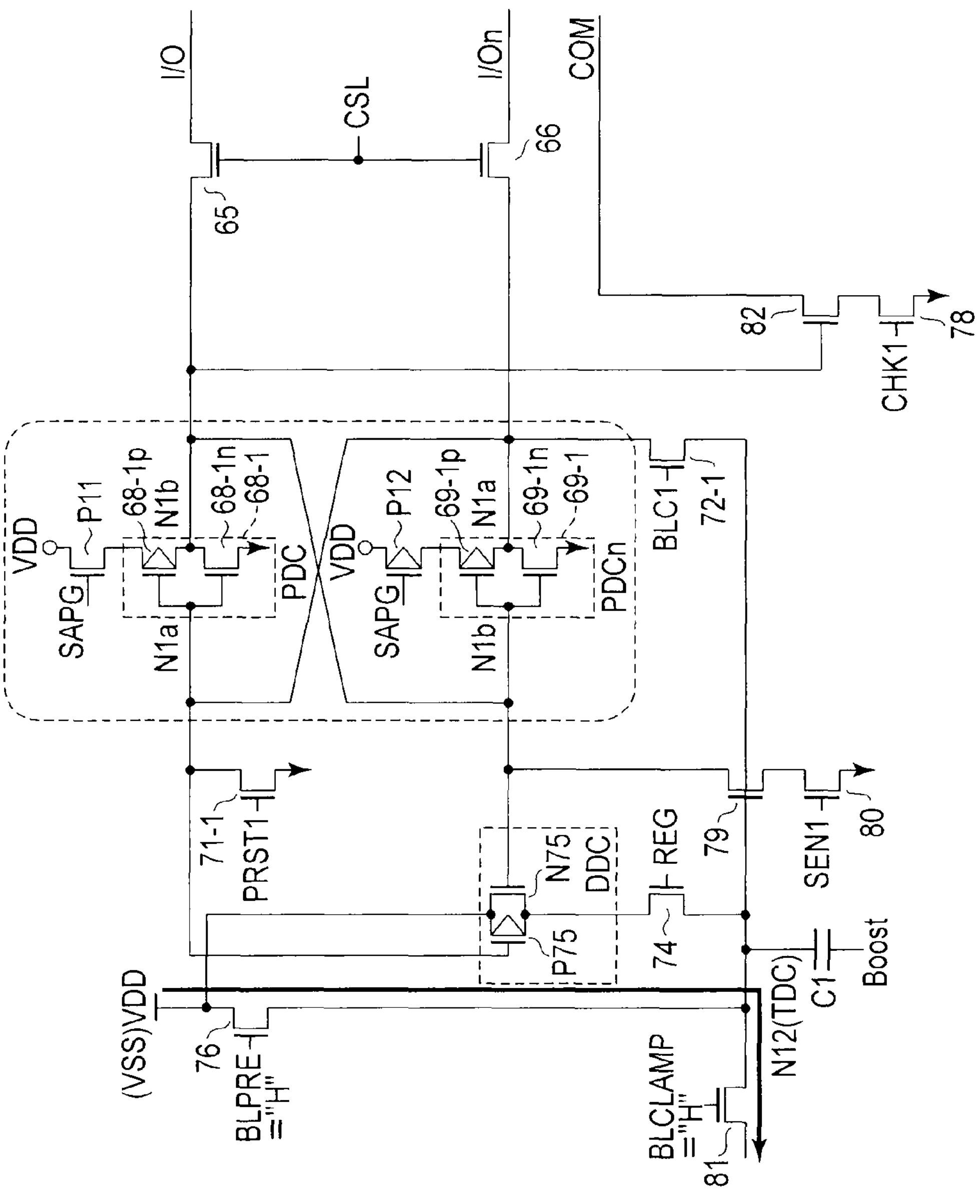
F I G. 4 4

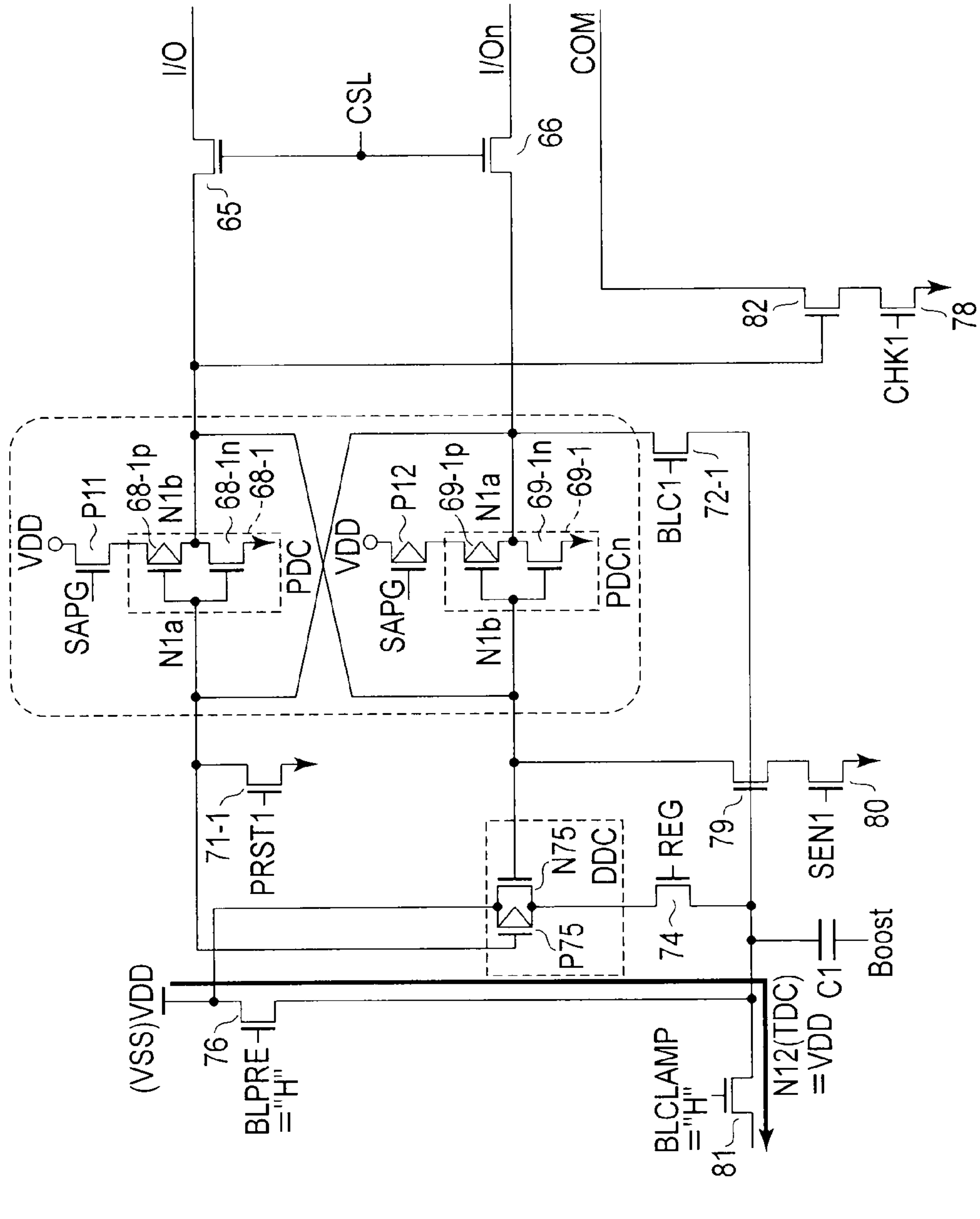
F I G. 4 5

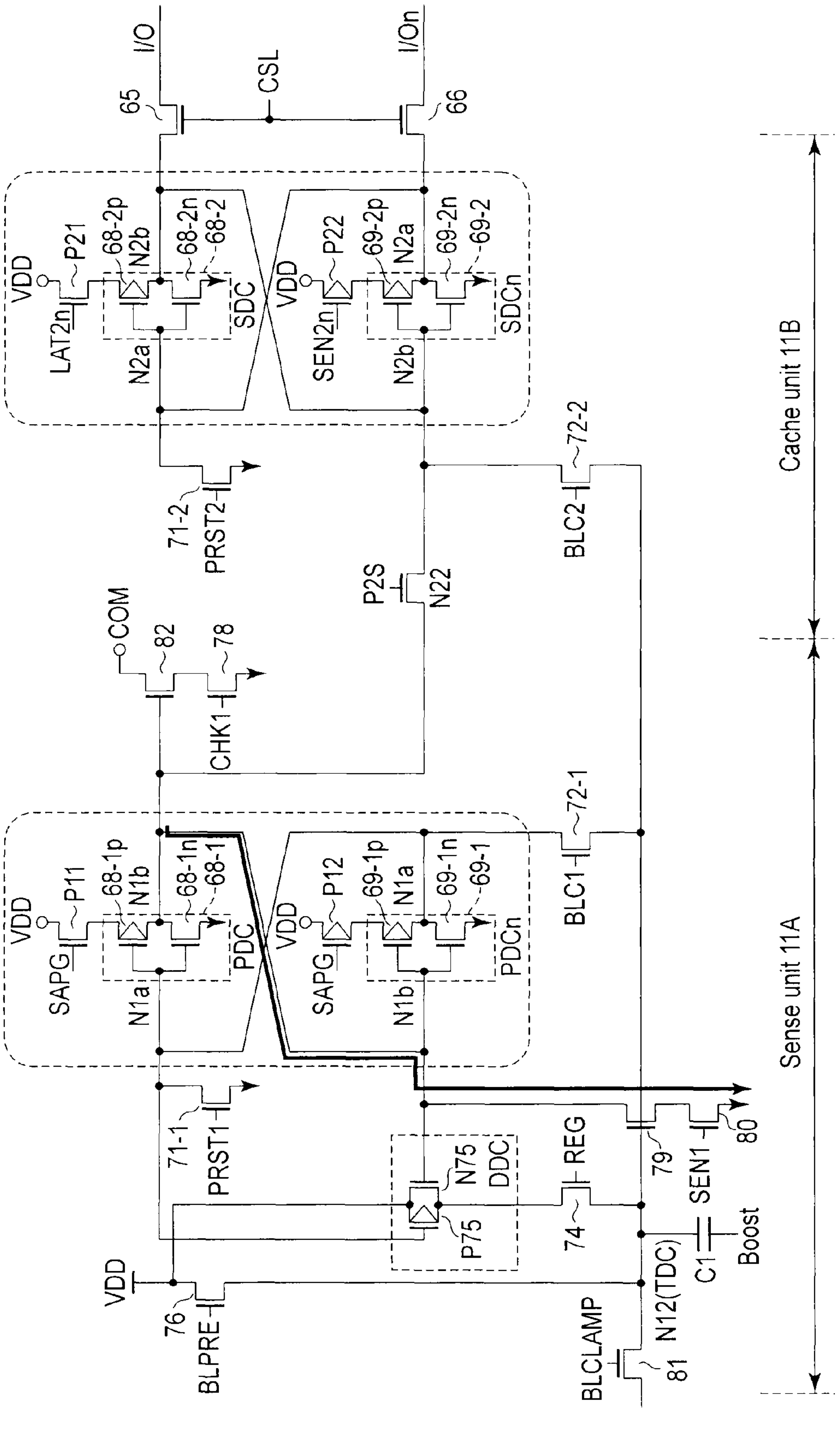
F I G. 6 5

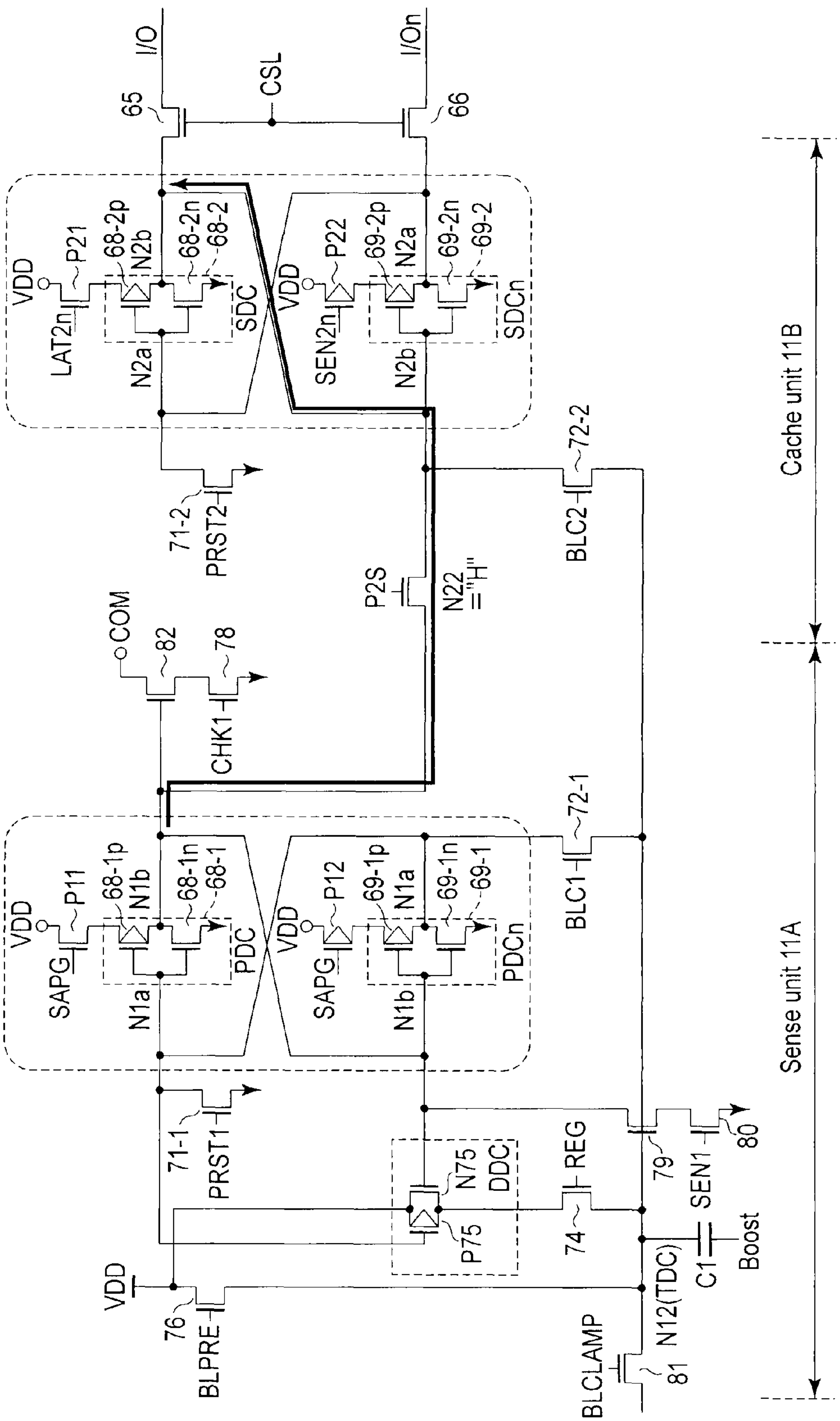
F I G. 66

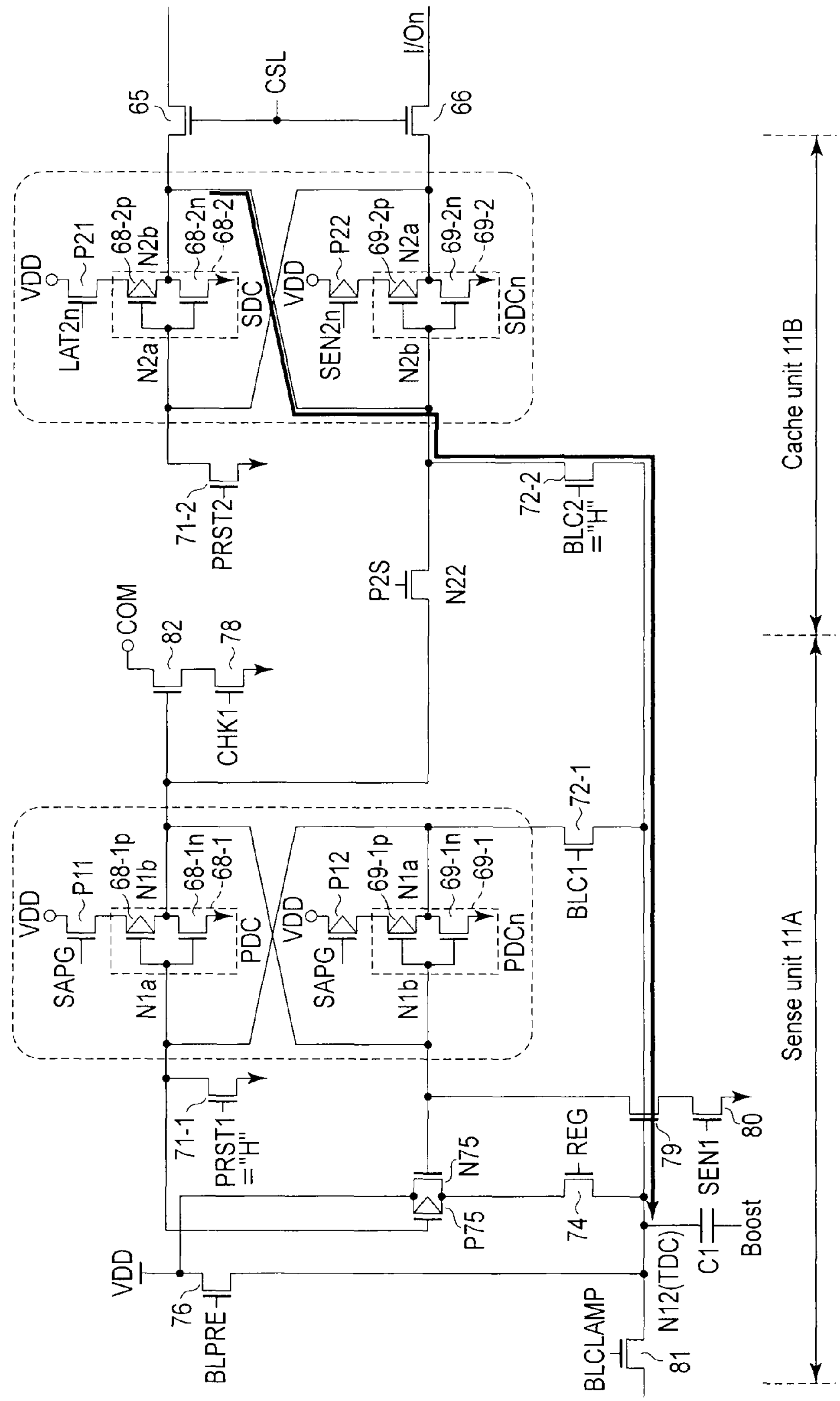
F I G. 7 1

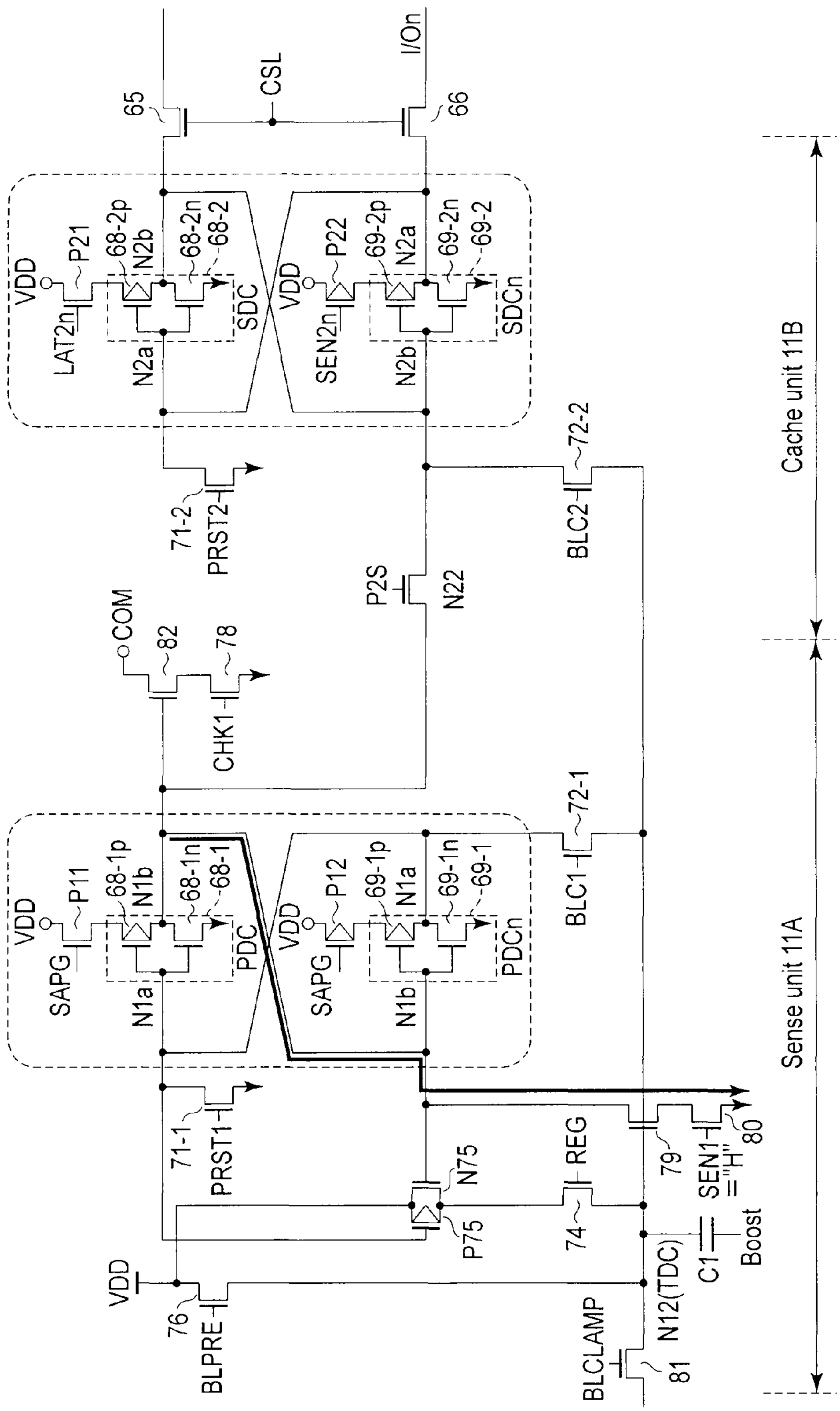
F I G. 7 2

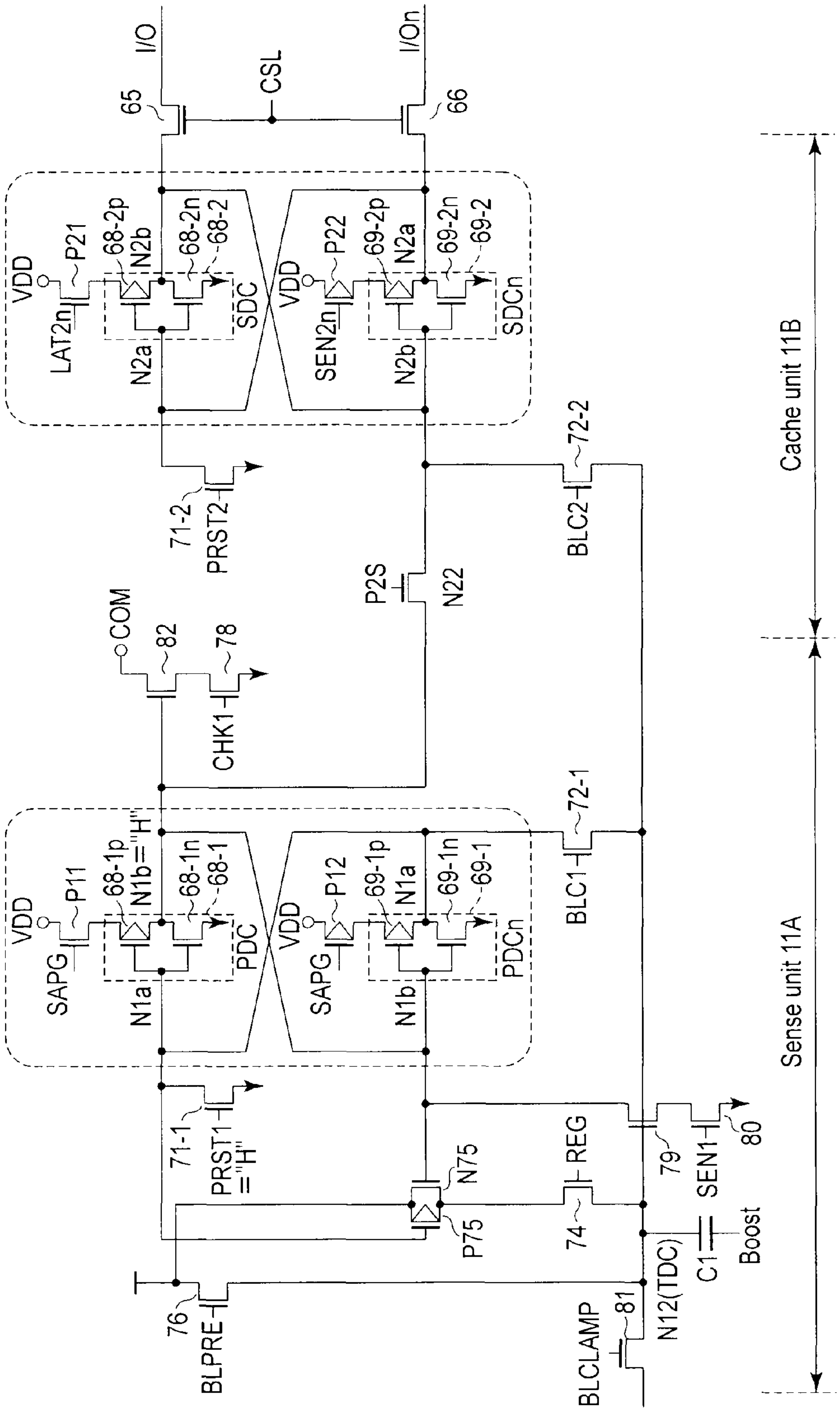
F I G. 7 7

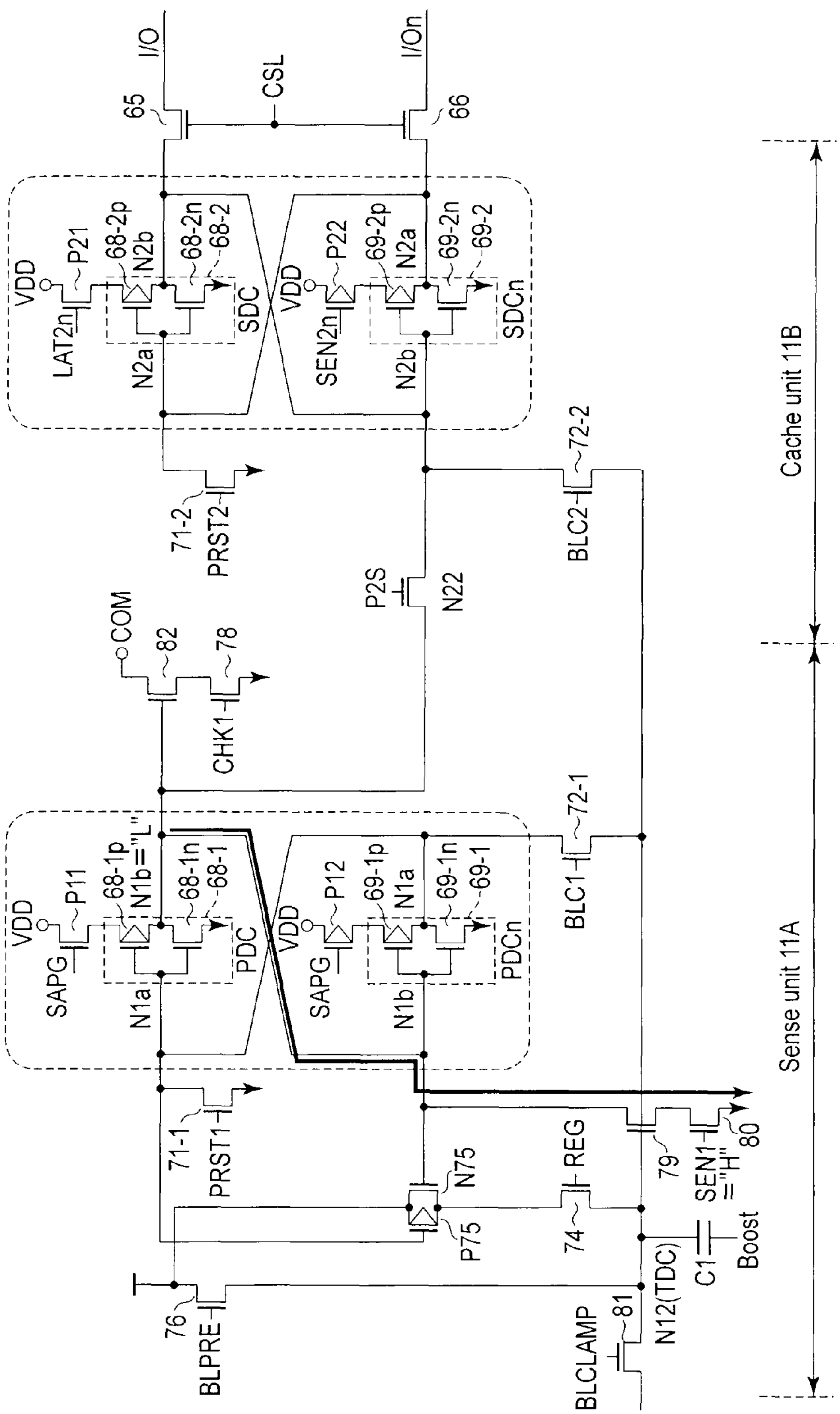
F I G. 7 8

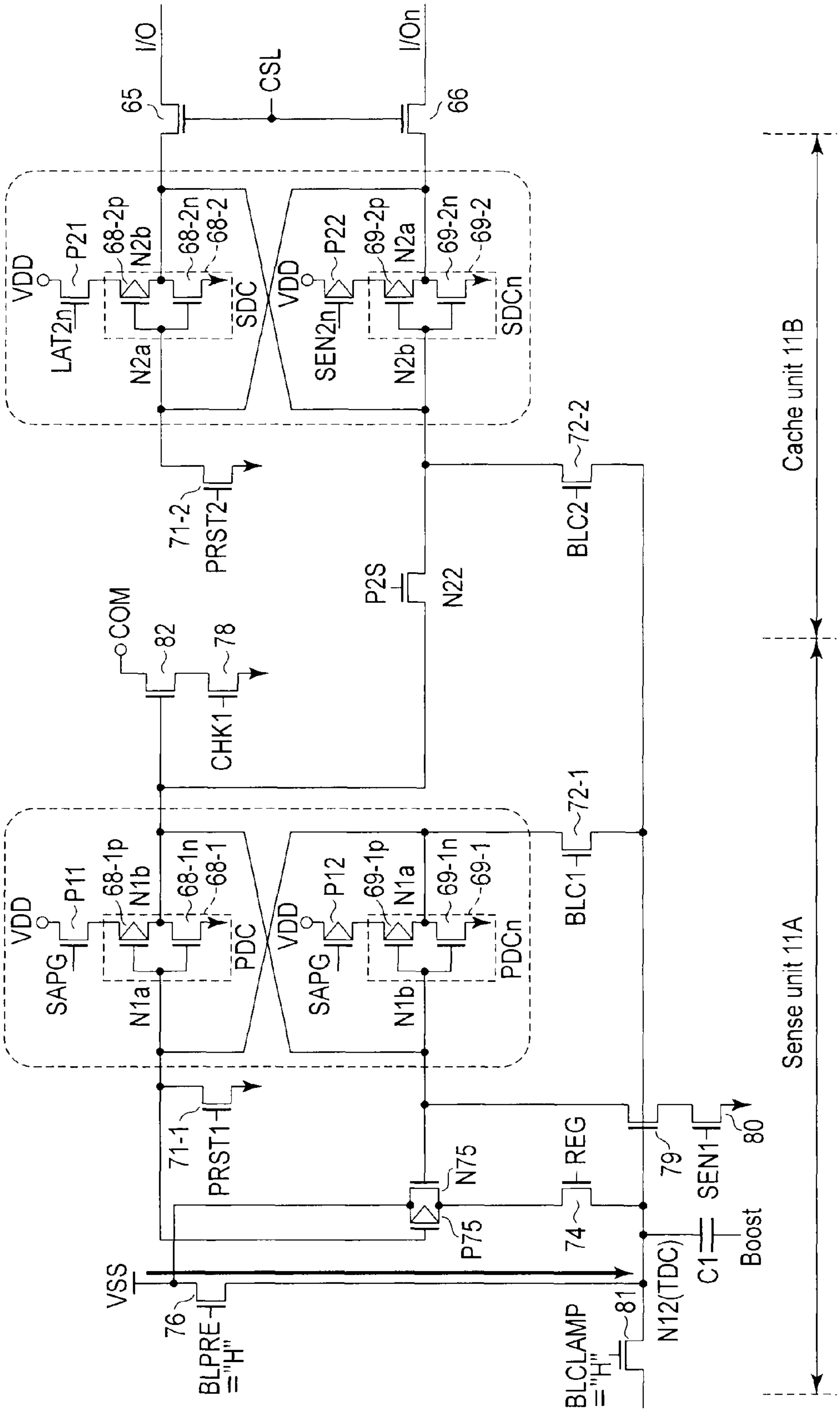
F I G. 8 0

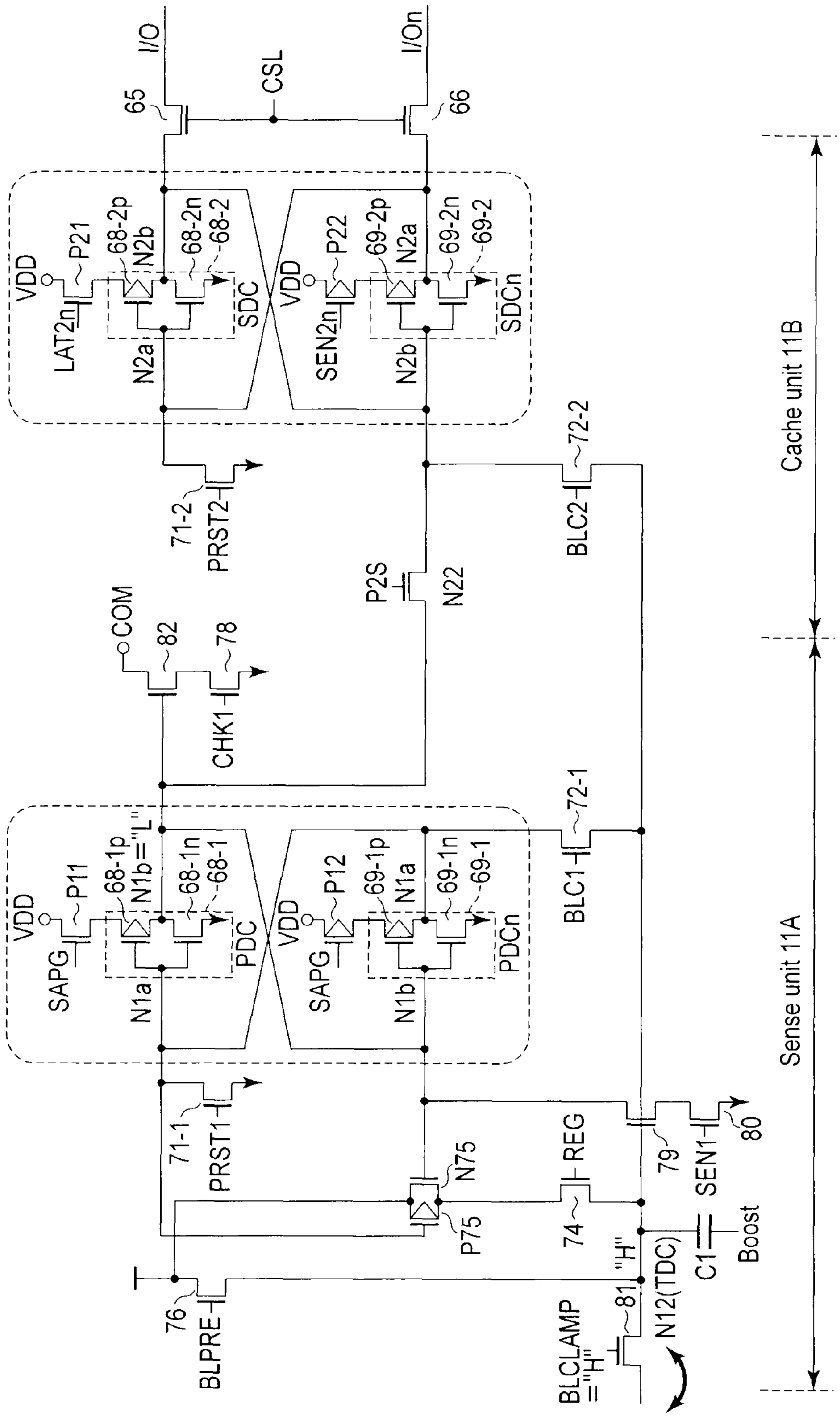
F I G. 8 2

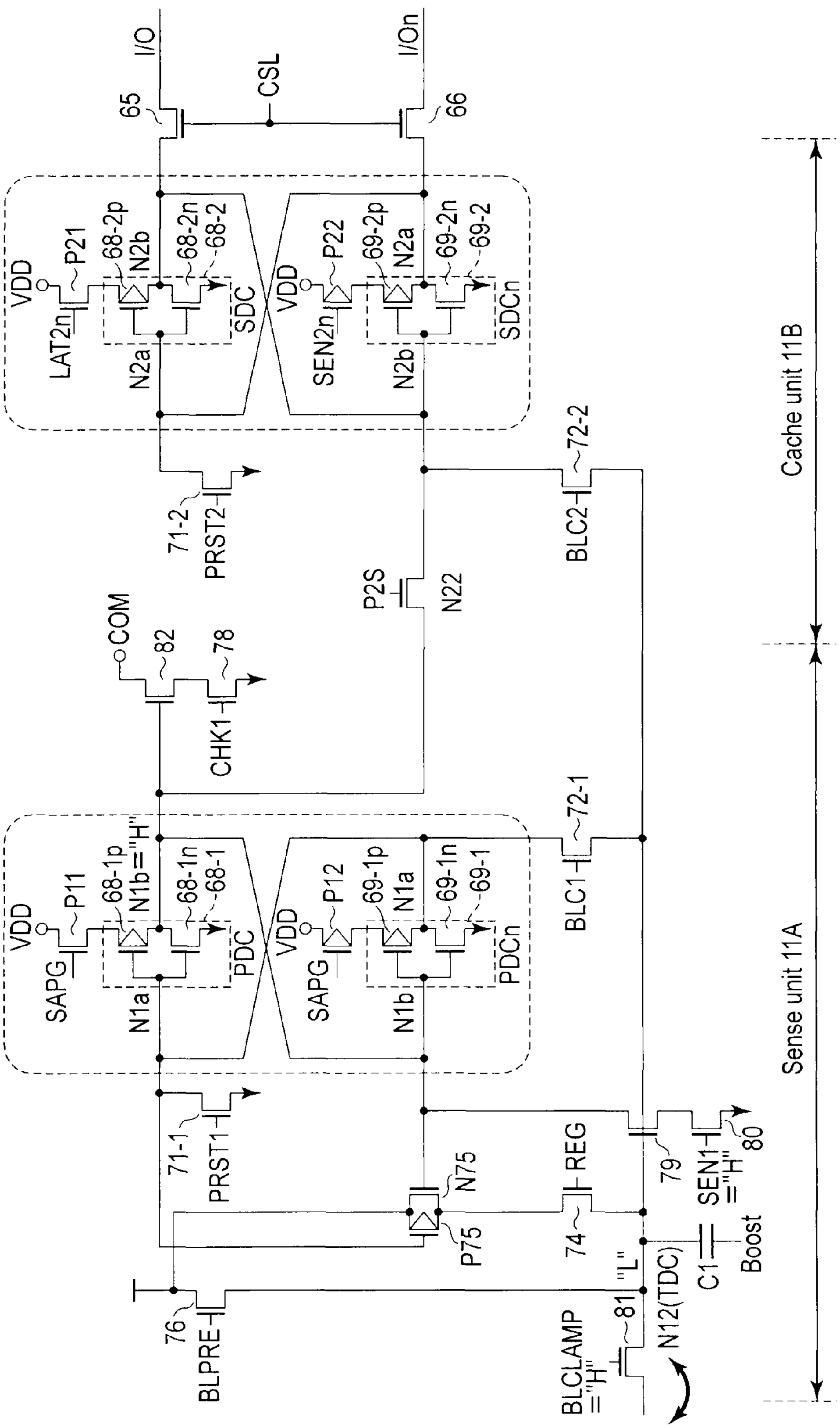
F I G. 8 3

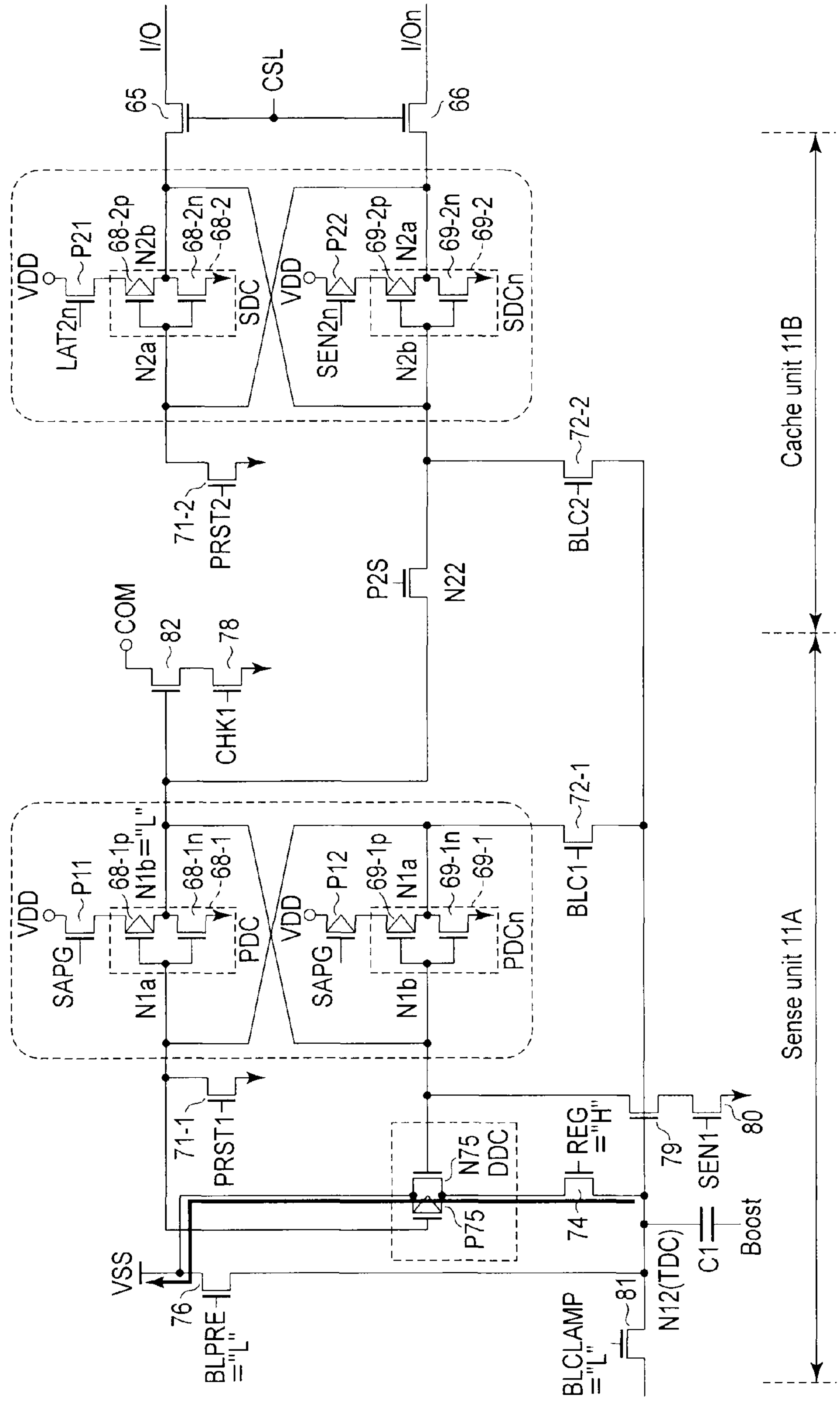
F I G. 8 4

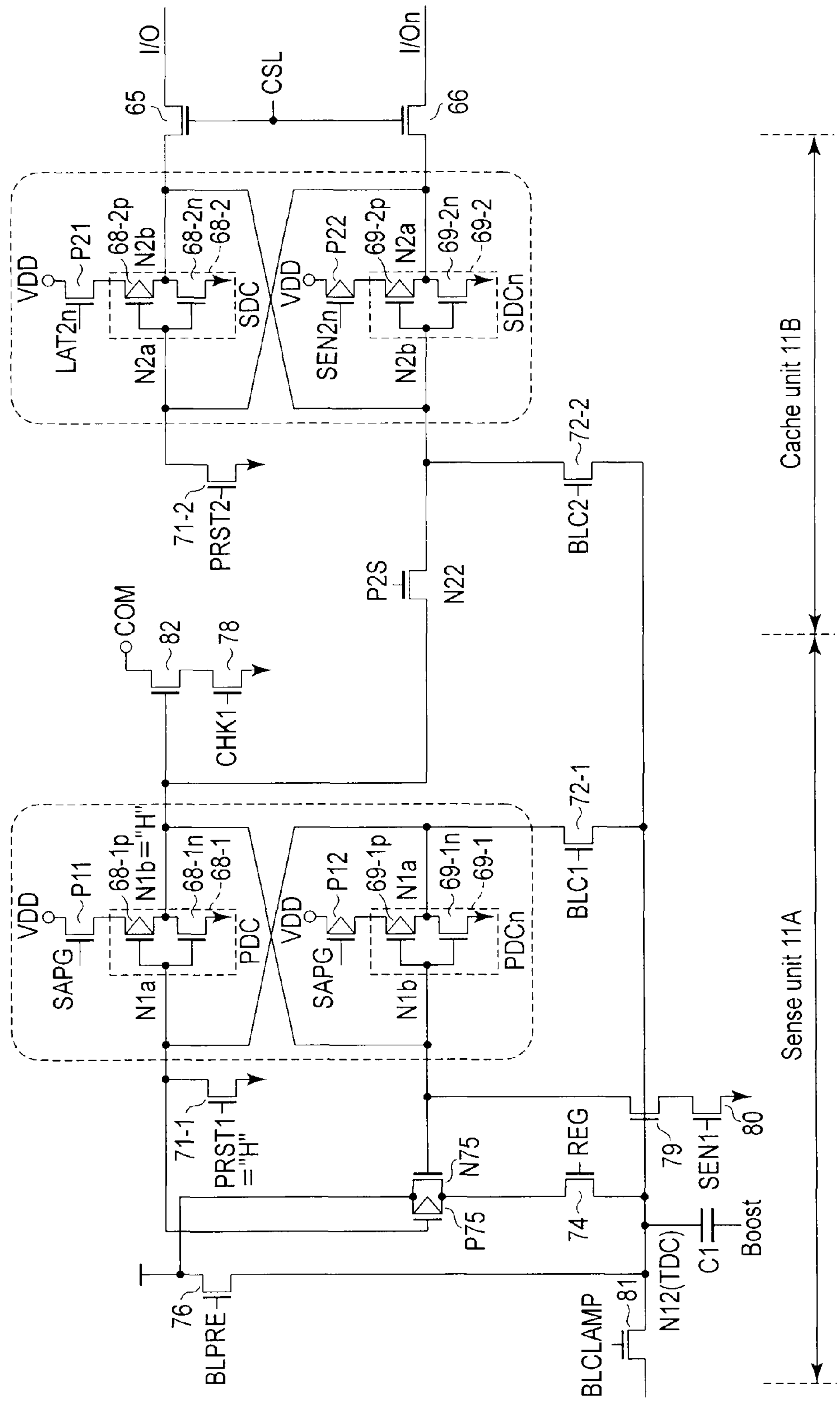
F I G. 8 5

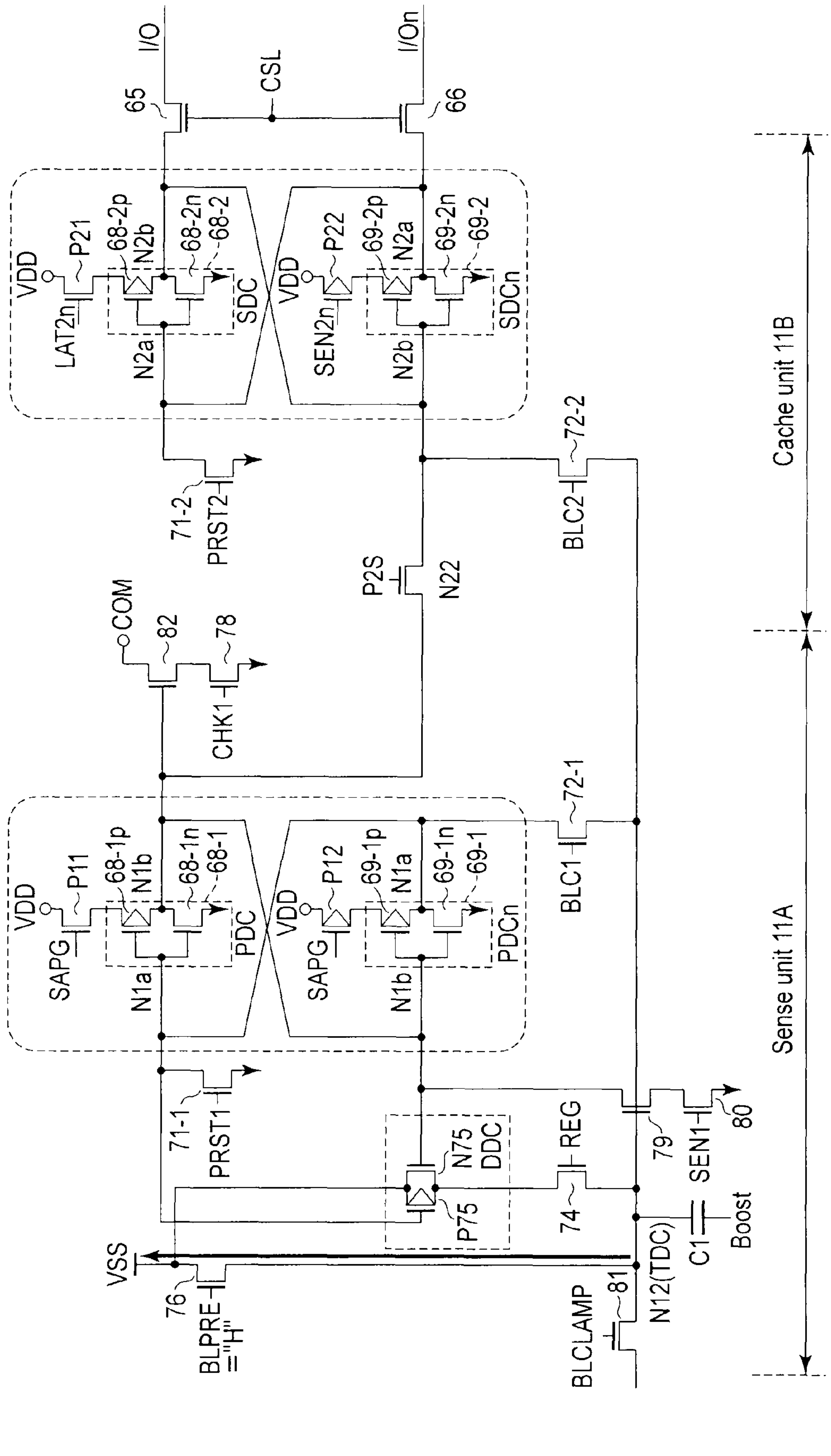
F I G. 8 7

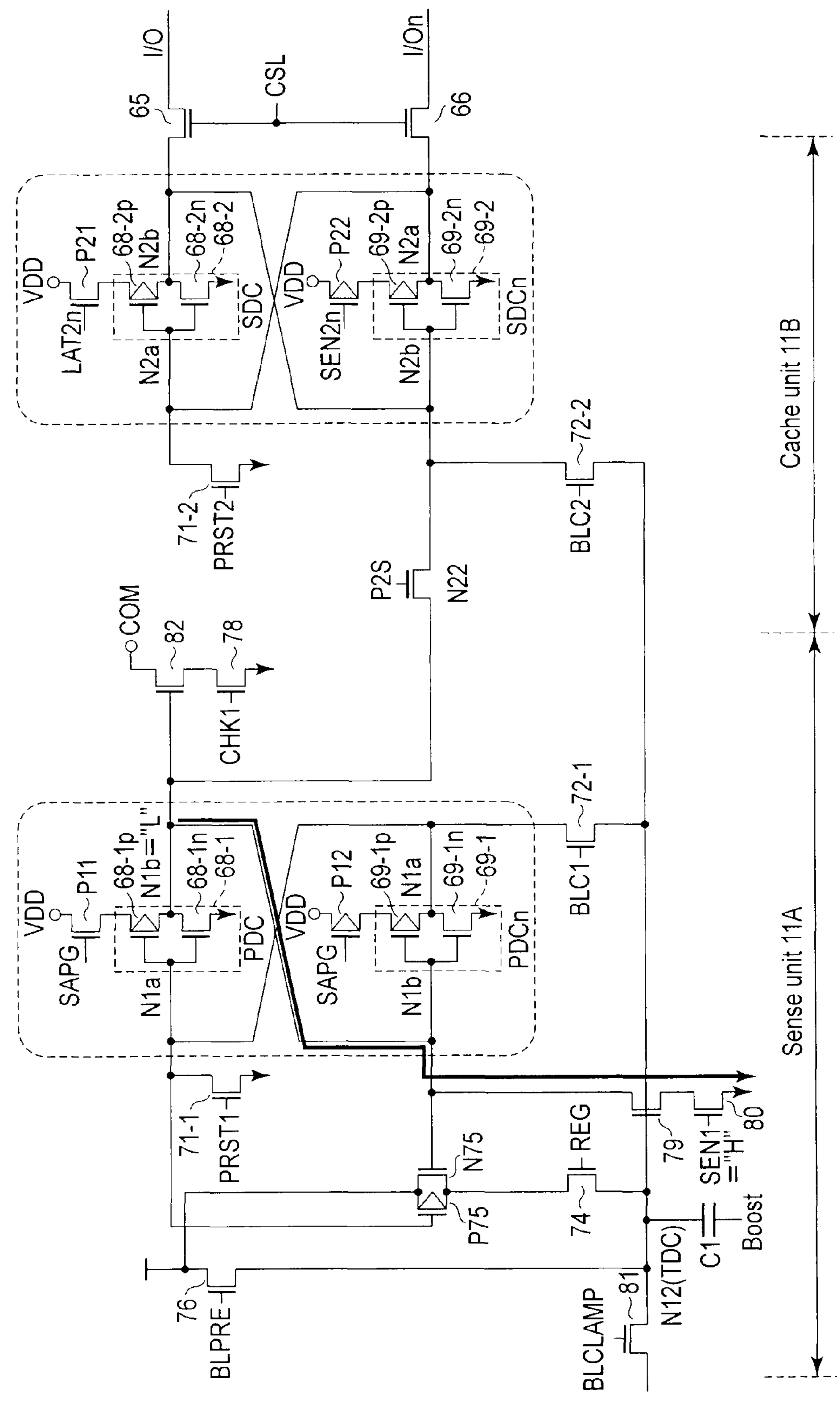
F I G. 9 0

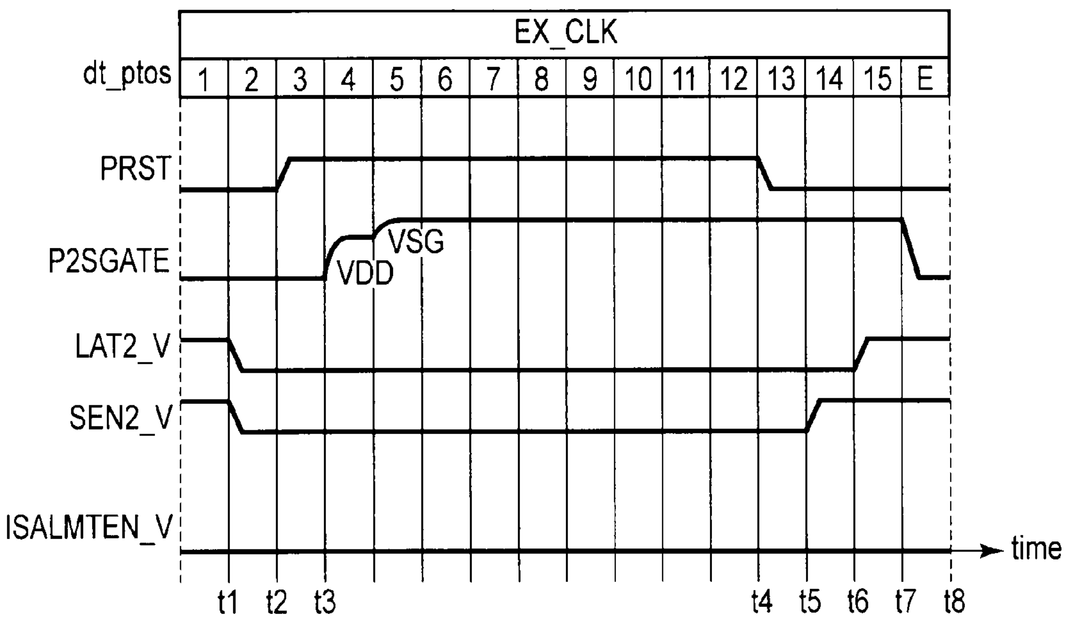
F I G. 9 2

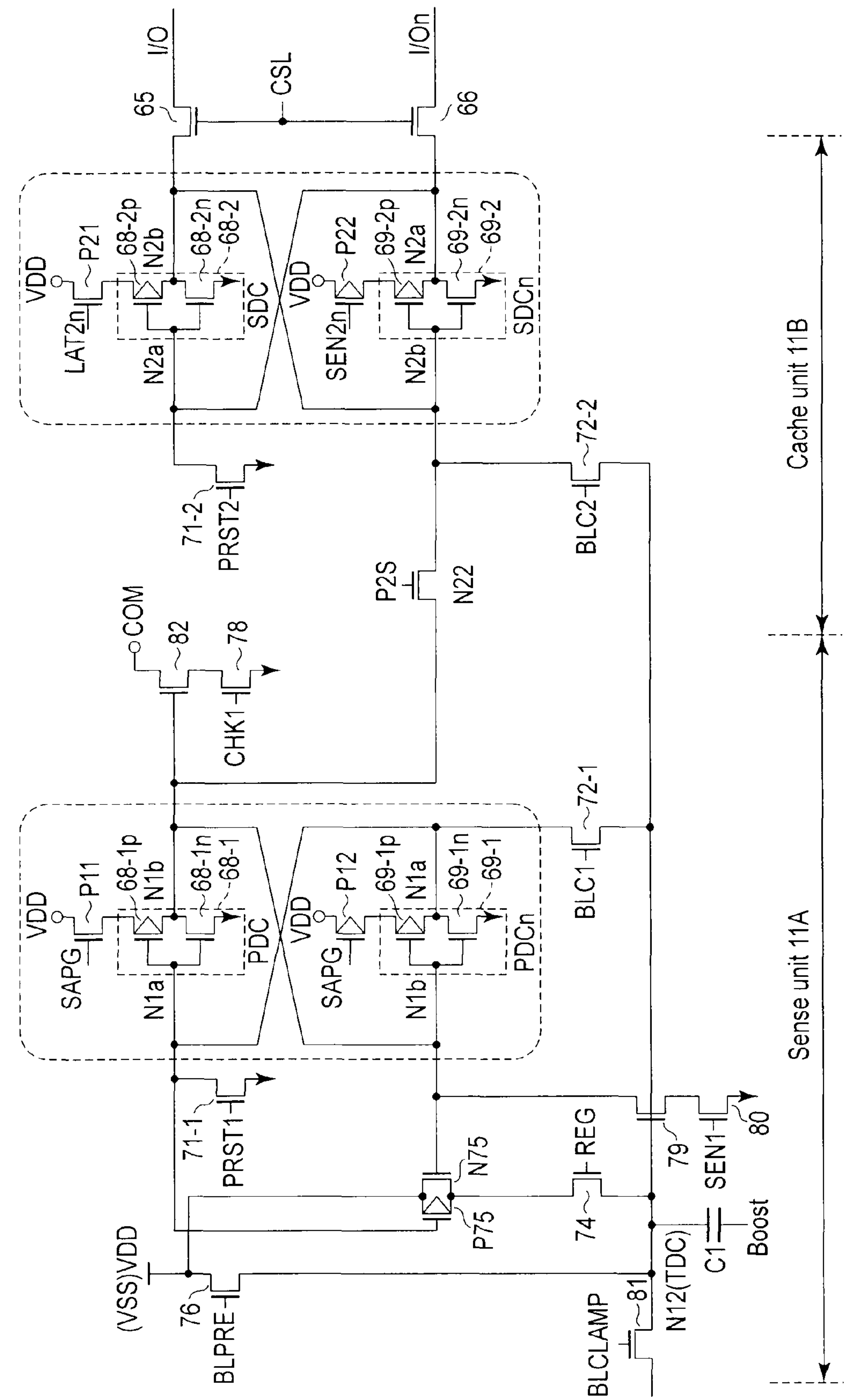
F I G. 9 3

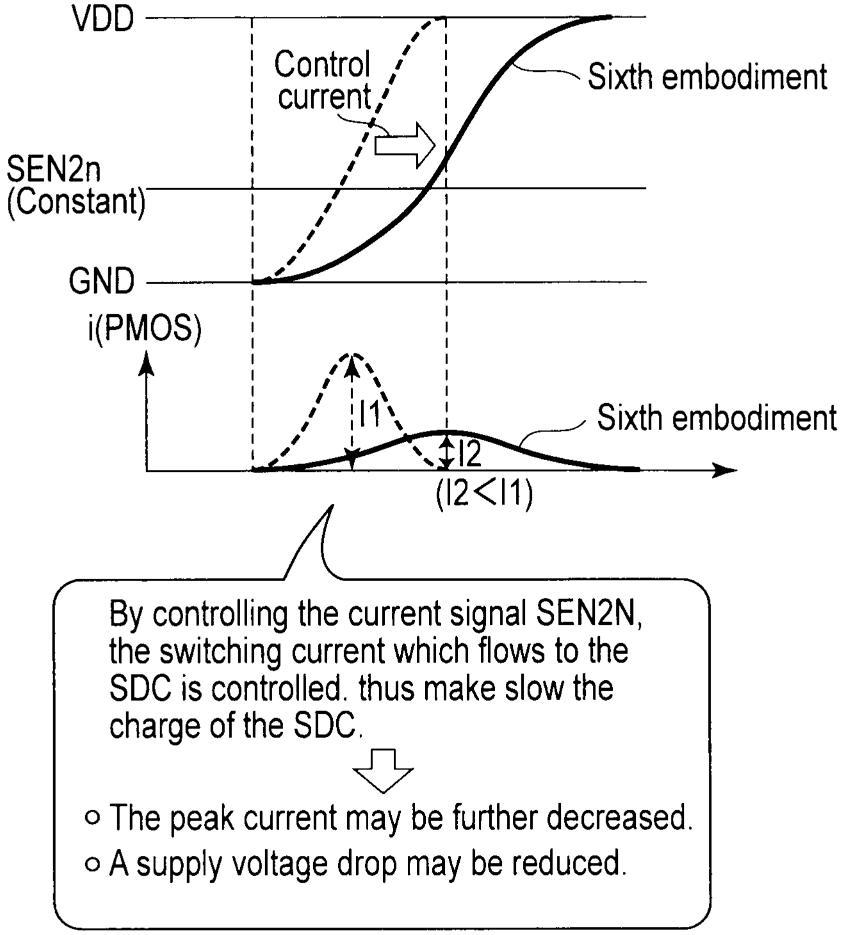
F I G. 9 4

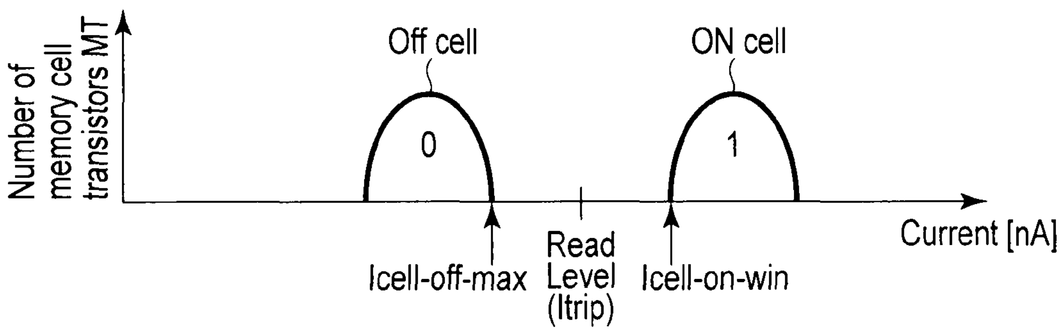
F I G. 9 6

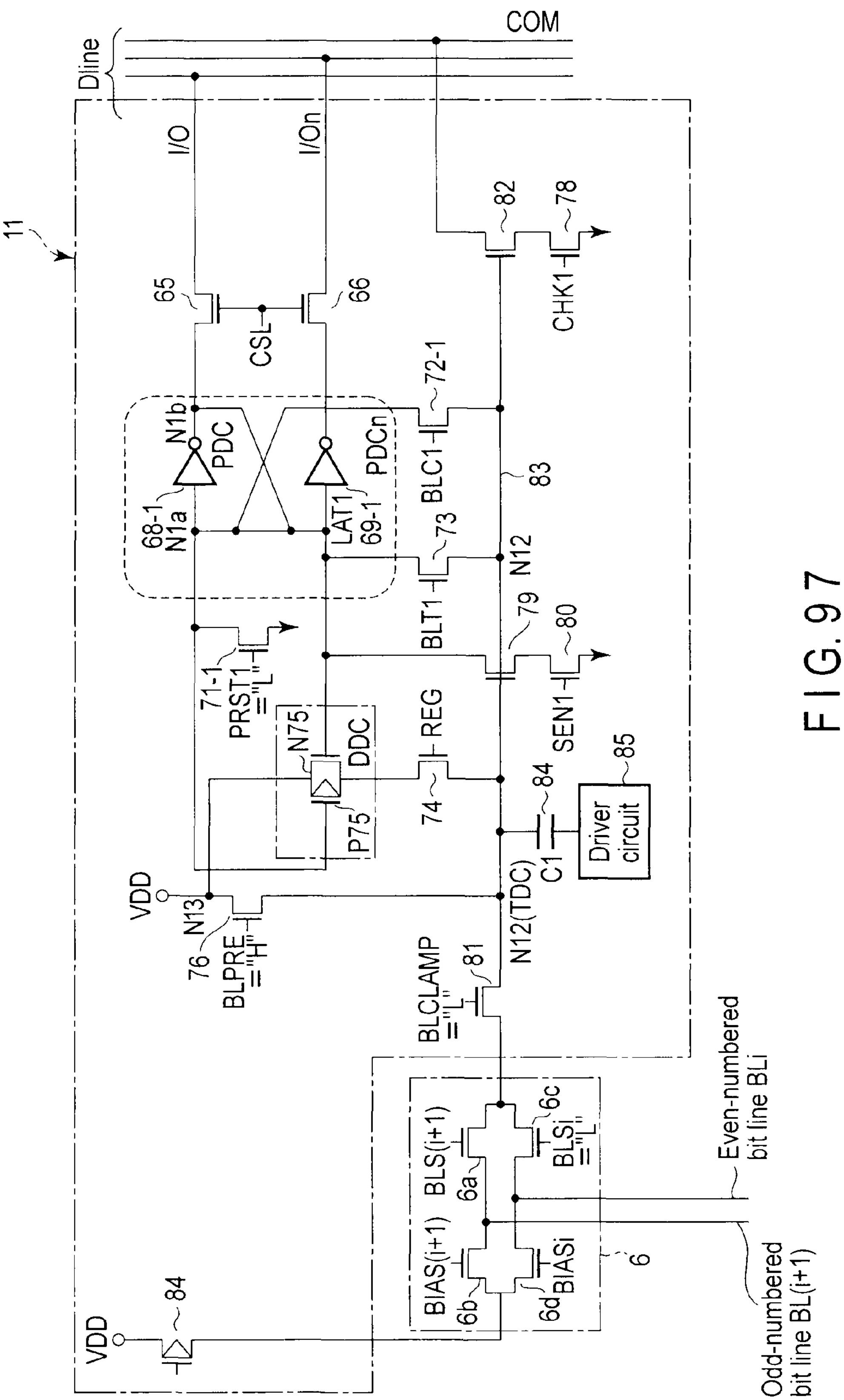
F I G. 9 7

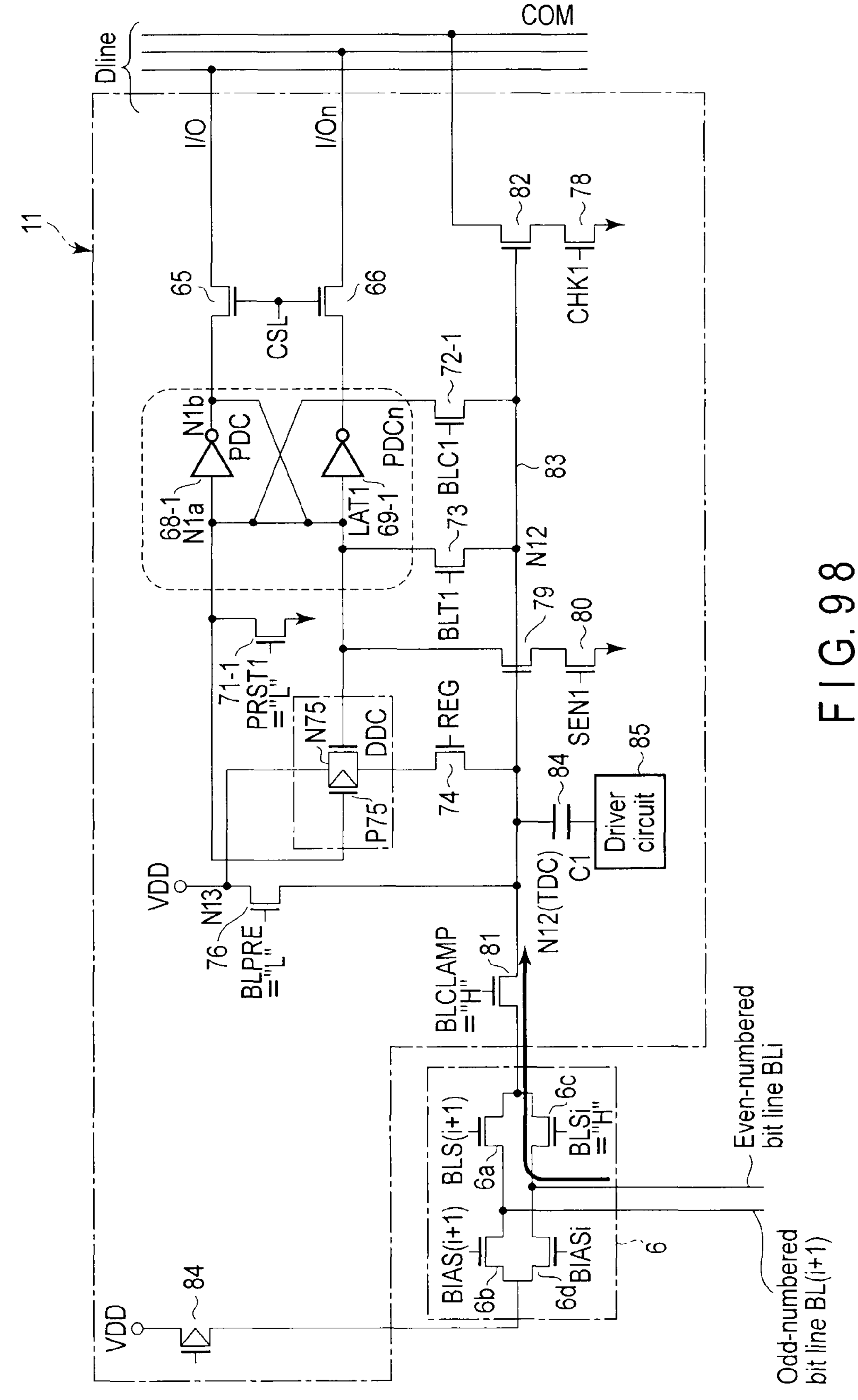
F I G. 9 8

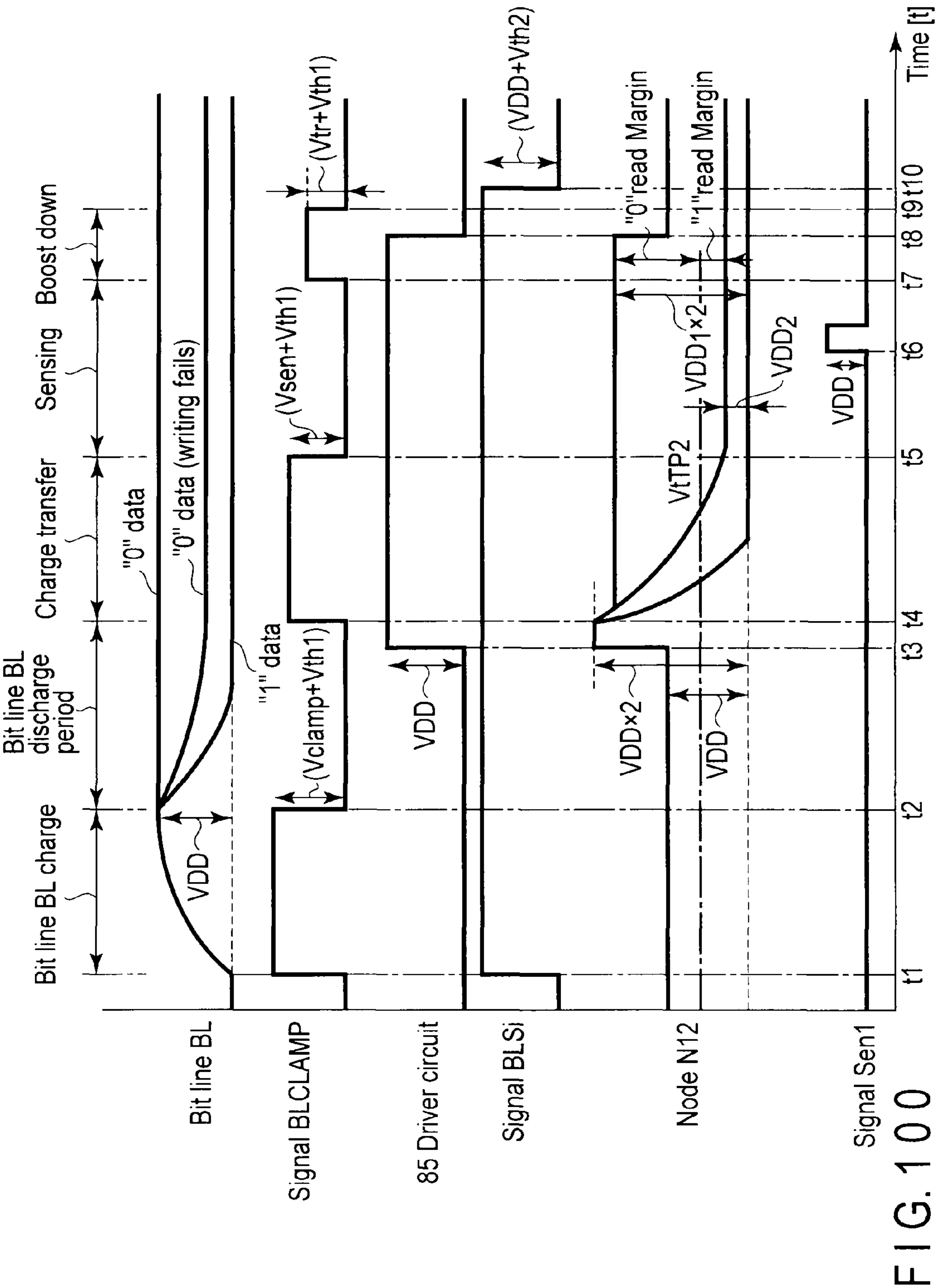
F I G. 1 0 0

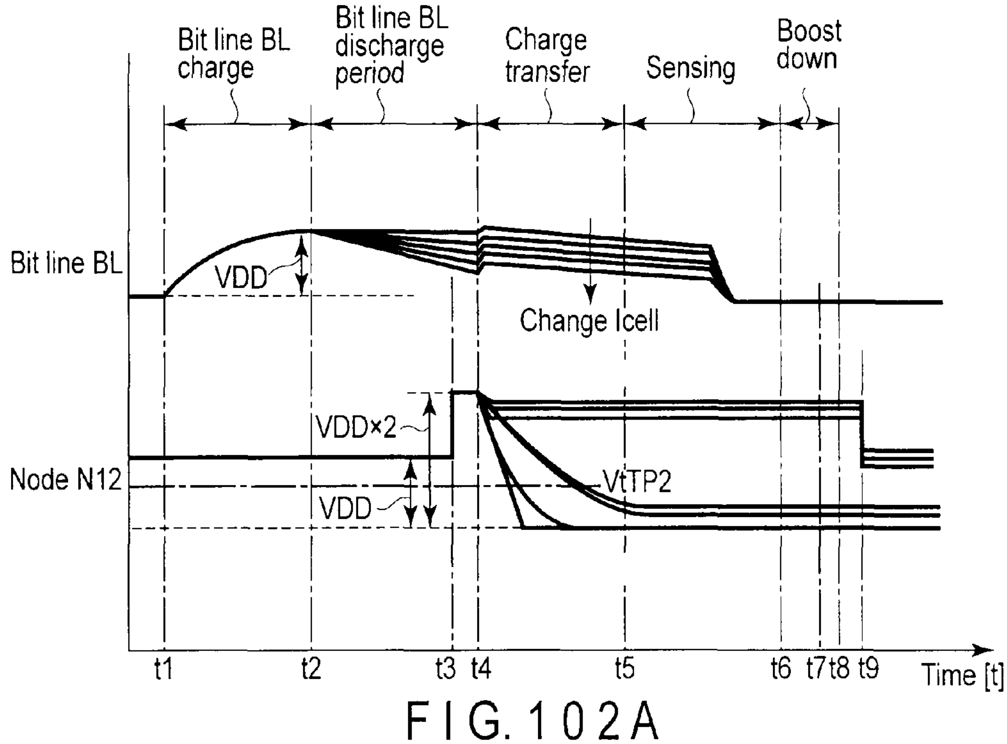
F I G. 1 0 2 A
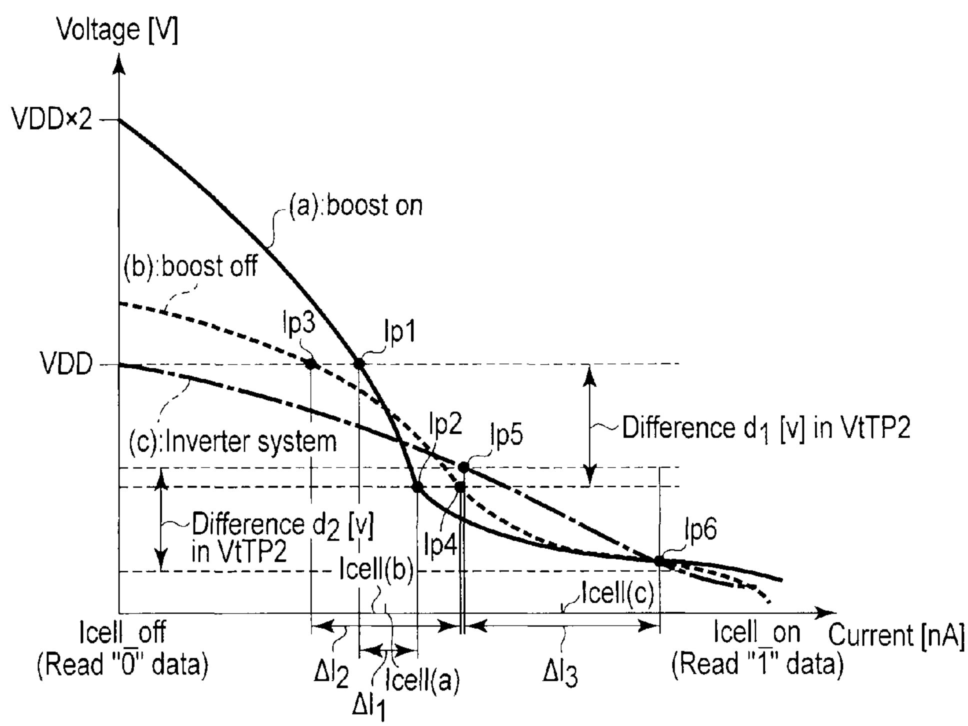
F I G. 1 0 2 B

SEMICONDUCTOR STORAGE DEVICE

CROSS-REFERENCE TO RELATED APPLICATIONS

This application is based upon and claims the benefit of priority from prior Japanese Patent Applications No. 2010-211429, filed Sep. 21, 2010; No. 2011-028639, filed Feb. 14, 2011; and No. 2011-029107, filed Feb. 14, 2011, the entire contents of all of which are incorporated herein by reference.

FIELD

Embodiments described herein relate generally to a semiconductor storage device, which communicates data with a memory cell, which holds the data, while enabling to reduce a peak current and error in data reading.

BACKGROUND

A memory capable of holding multi-level data in the memory cell has been developed. In the memory, a function of a sense amplifier is also required to support multi-level. That is, in the memory, there is a single-level cell (SLC) capable of storing 1-bit data in the memory cell, a multi-level cell (MLC) capable of storing multi-bit data in the memory cell and the like.

BRIEF DESCRIPTION OF THE DRAWINGS

FIG. 2 is a threshold distribution of memory cells according to the first embodiment;

FIG. 3 is a block diagram of a voltage generating circuit according to the first embodiment;

FIG. 5 is a block diagram of a sense unit according to the first embodiment;

FIGS. 14-17 are a schematic diagram illustrating the write-verify operation of the sense unit according to the first embodiment;

FIG. 18 is a schematic diagram illustrating a collective detecting operation of the sense unit according to the first embodiment;

FIGS. 21-23 are a schematic diagram of the sense unit illustrating an erase-verify operation of an even-numbered bit line BL according to the first embodiment;

FIGS. 24-26 are a schematic diagram of the sense unit illustrating the erase-verify operation of an odd-numbered bit line BL according to the first embodiment;

FIG. 30 is a schematic diagram of a sense unit according to a first variation of the first embodiment;

FIG. 32 is a schematic diagram illustrating a detecting operation of the sense unit according to the second variation of the first embodiment;

FIG. 33 is a time chart of a signal SEN according to a second embodiment;

FIG. 39 is a schematic diagram of a sense unit according to a variation of the fourth embodiment;

FIG. 40 is a block diagram illustrating an entire configuration example of a semiconductor storage device according to the fifth embodiment;

FIG. 43 is a view illustrating a write-verify operation of the sense unit according to the first embodiment;

FIGS. 44-46 are a view illustrating a data erase/erase-verify operation of the sense unit according to the fifth embodiment;

FIGS. 63-68 are a view illustrating a data read operation of the sense unit according to the sixth embodiment;

FIGS. 69-72 are a view illustrating a data write operation of the sense unit according to the sixth embodiment;

FIGS. 73-86 are a view illustrating a data erase/erase-verify operation of the sense unit according to the fifth embodiment;

FIGS. 87-91 are a view illustrating a NOT arithmetic operation of the sense unit according to the sixth embodiment;

FIGS. 92, 93 are a view illustrating an operation to transfer data of the sense unit according to the six embodiment;

FIGS. 94, 95 are a schematic diagram illustrating the switching current flows through the sense unit according to the sixth embodiment;

FIG. 96 is a distribution of a cell current, which flows to the memory cell transistor MT according to the seventh embodiment;

FIG. 97 is a circuit example of the sense unit according to the seventh embodiment;

FIGS. 98, 99 are a schematic diagram illustrating the read operation according to the seventh embodiment;

FIG. 100 is a time chart illustrating the read operation according to the seventh embodiment;

FIG. 102A is a time chart illustrating a read operation of the semiconductor storage device according to the seventh embodiment and FIG. 102B is I-V characteristics of the semiconductor storage device according to the seventh embodiment;

DETAILED DESCRIPTION

Figure 1:
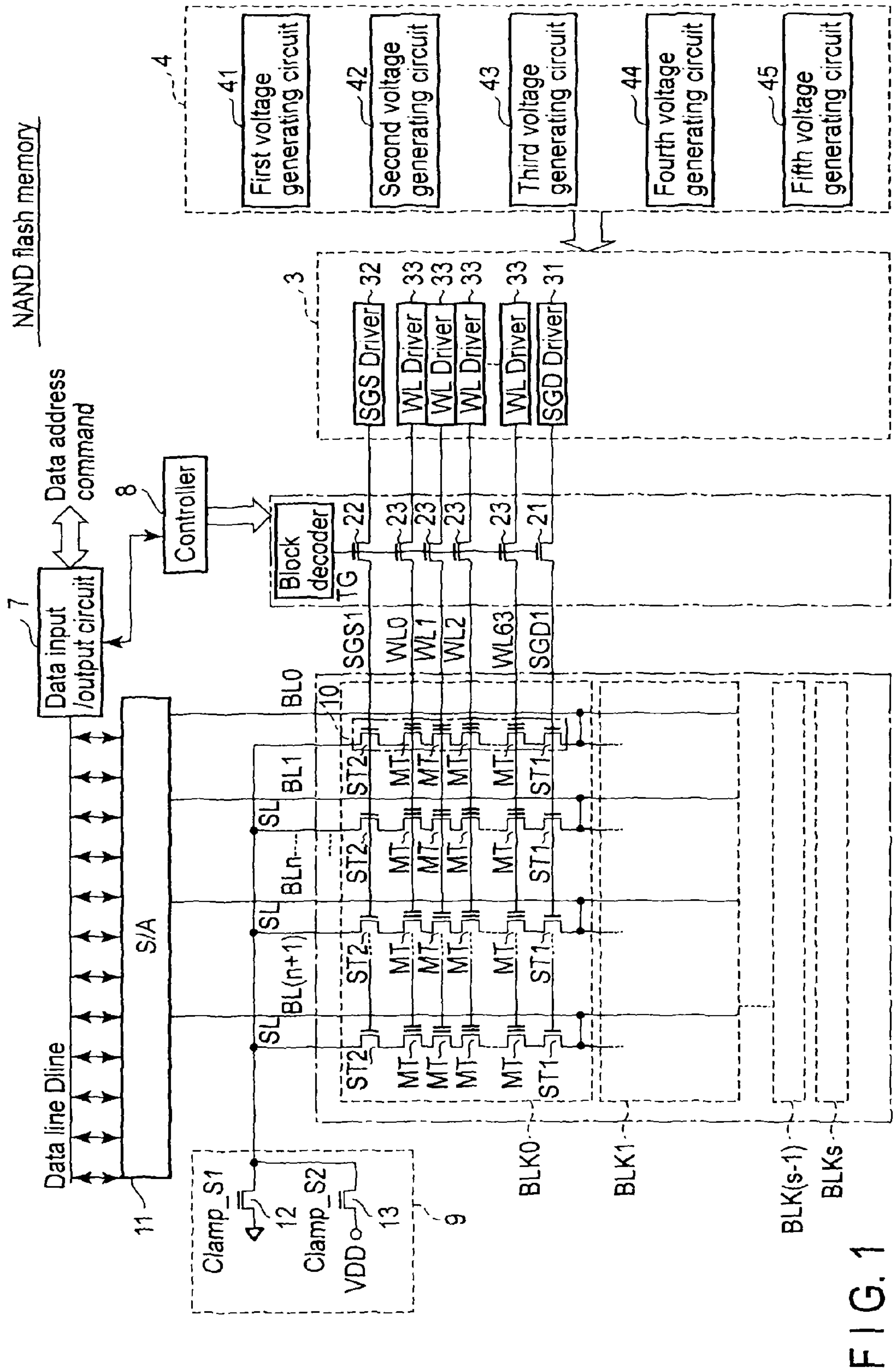
FIG. 1 is a configuration example of a NAND flash memory according to a first embodiment.

An embodiment is hereinafter described with reference to the drawings. In this description, a common reference numeral is assigned to common parts throughout the drawings.

It will be understood that when an element is referred to as being "electrically connected to" or "connected to" another element, it can be not only directly connected but also connected to the other element or intervening elements may be present.

First Embodiment

In general, according to one embodiment, a semiconductor storage device includes a memory cell array, an even-numbered bit line, an odd-numbered bit line, and a plurality of sense amplifiers. The memory cell array includes a plurality of memory cells. The even-numbered bit line connects to the memory cells connected to an even-numbered column. The odd-numbered bit line connects to the memory cells connected to an odd-numbered column adjacent to the even-numbered column. Each of the plurality of sense amplifiers selectively connect to the odd-numbered bit line and the even-numbered bit line. The each of the sense amplifiers includes a latch circuit, a first transistor, a second transistor, and a third transistor. The latch circuit includes a first node and a second node, which holds the data supplied to the first node. A gate of the first transistor connects to wiring selectively connected to the even-numbered bit line or the odd-numbered bit line. One end of a current pathway of the first transistor connects to the first node of the latch circuit. The first transistor supplies read data to the latch circuit on the basis of a potential of the wiring when reading the data. The second transistor is connected between the first node of the latch circuit and the wiring. The second transistor transfers the data held by the latch circuit to the wiring when performing arithmetic of the data. The third transistor is connected between the second node of the latch circuit and the wiring. The third transistor transfers the data held by the latch circuit to the wiring when writing the data.

An area of a semiconductor storage device according to this embodiment is reduced by omitting a transistor, which is not required in operation, of a sense amplifier capable of reading and writing data from and to a memory cell transistor MT, which holds 2-level data.

An entire configuration example of the semiconductor storage device according to this embodiment is described with reference to FIG. 1.

1. Regarding Entire Configuration Example

As illustrated in FIG. 1, the semiconductor storage device according to this embodiment is provided with a memory cell array 1, a row decoder 2, a driver circuit 3, a voltage generating circuit 4, a bit line clamp driver 5 (hereinafter, a BLC driver 5), an re-channel MOS transistor group 6, a data input/output circuit 7, a controller 8, a source line SL driver 9, a well driver 10, and a sense amplifier 11.

1-2. Regarding Configuration Example of Memory Cell Array 1

The memory cell array 1 is provided with blocks BLK0 to BLKs (s is a natural number), each of which includes a plurality of nonvolatile memory cell transistors MT. Each of the blocks BLK0 to BLKs is provided with a plurality of NAND strings 15 obtained by connecting the nonvolatile memory cell transistors MT in series. Each of the NAND strings 15 includes 64 memory cell transistors MT, for example, and selection transistors ST1 and ST2.

The memory cell transistor MT is capable of holding 2-or-higher-level data. A structure of the memory cell transistor MT is a MONOS structure including a charge accumulation layer (for example, an insulating film) formed on a semiconductor substrate with a gate insulating film interposed therebetween, an insulating film (hereinafter, referred to as a block layer) with a dielectric constant higher than that of the charge accumulation layer formed on the charge accumulation layer, and further, a control gate formed on the block layer. The structure of the memory cell transistor MT may also be of an FG type. The FG type structure is one that includes a floating gate (conductive layer) formed on a p-type semiconductor substrate with the gate insulating film interposed therebetween and the control gate formed on the floating gate with an intergate insulating film interposed therebetween.

The control gate of the memory cell transistor MT is electrically connected to a word line, a drain thereof is electrically connected to a bit line, and a source thereof is electrically connected to a source line. Also, the memory cell transistor MT is an re-channel MOS transistor. The number of the memory cell transistors MT is not limited to 64, and may be 128, 256, 512 and the like, and there is no limitation.

Also, adjacent memory cell transistors MT share the source and the drain. The memory cell transistors MT are arranged between the selection transistors ST1 and ST2 such that current pathways thereof are connected in series. A drain region on one end side of the memory cell transistors MT connected in series is connected to a source region of the selection transistor ST1 and a source region on the other end side thereof is connected to a drain region of the selection transistor ST2.

The control gates of the memory cell transistors MT on the same row are connected in common to any of word lines WL0 to WL63 and gate electrodes of the selection transistors ST1 and ST2 of the memory cell transistors MT on the same row are connected in common to select gate lines SGD1 and SGS1, respectively. To simplify the description, hereinafter, when the word lines WL0 to WL63 are not distinguished from one another, they are sometimes simply referred to as word lines WL. Also, in the memory cell array 1, drains of the selection transistors ST1 on the same column are connected in common to any of bit lines BL0 to BLn. Hereinafter, when the bit lines BL0 to BLn are not distinguished from one another, they also are collectively referred to as bit lines BL (n is a natural number). Sources of the selection transistors ST2 are connected in common to a source line SL.

Also, the data is collectively written to a plurality of memory cell transistors MT connected to the same word line WL and this unit is referred to as a page. Further, the data is collectively erased from a plurality of memory cell transistors MT in a block BLK unit.

1-3. Regarding Threshold Distribution of Memory Cell Transistors MT

A threshold distribution of the above-described memory cell transistors MT is described with reference to FIG. 2. FIG. 2 is a graph in which the threshold distribution is represented along an abscissa axis and the number of the memory cell transistors MT is represented along a ordinate axis.

As illustrated, each of the memory cell transistors MT may hold the 2-level data (1-bit data), for example. That is to say, the memory cell transistor MT may hold two types of data, which are '1' and '0' in ascending order of a threshold voltage Vth.

A threshold voltage Vth0 of the data '1' in the memory cell transistor MT satisfies Vth0<V01. A threshold voltage Vth1 of the data '0' satisfies V01<Vth1. In this manner, the memory cell transistor MT may hold the 1-bit data, which are the data '0' or the data '1', according to a threshold. The memory cell transistor MT is set to the data '1' (for example, a negative voltage) in an erased state and is set to a positive threshold voltage by writing the data and injecting charge to the charge accumulation layer.

1-4. Regarding Row Decoder 2

Returning to FIG. 1, the row decoder 2 is described. The row decoder 2 is provided with a block decoder 20 and n-channel MOS transistors 21 to 23. The block decoder 20 decodes a block address given by the controller 8 at the time of a write operation, read operation, and erasing of the data and selects the block BLK based on a result. That is to say, the block decoder 20 selects a control line TG to which the MOS transistors 21 to 23 corresponding to the block BLK including a selected memory cell transistor MT is connected to turn on the MOS transistors 21 to 23. At that time, a block selection signal is output from the block decoder 20. The block selection signal is the signal with which the row decoder 2 selects any of a plurality of memory blocks BLK0 to BLKs when reading, writing, and erasing the data. Also, according to this, the row decoder 2 selects a row direction of the memory cell array 1 corresponding to a selected block BLK. That is to say, based on the selection signal given by the block decoder 20, the row decoder 2 applies a voltage given by the driver circuit 3 to the select gate lines SGD1 and SGS1 and the word lines WL0 to WL63.

1-5. Regarding Driver Circuit 3

The driver circuit 3 is provided with select gate line drivers 31 and 32 provided for the select gate lines SGD1 and SGS1, respectively, and a word line driver 33 provided for each of the word lines WL. In this embodiment, only the word line driver 33 and the select gate line drivers 31 and 32 corresponding to the block BLK0 are illustrated. However, actually, the word line drivers 33 and the select gate line drivers 31 and 32 are connected in common to the 64 word lines WL, for example, and the select gate lines SGD1 and SGS1 provided for each of the blocks BLK0 to BLKs.

The block BLK is selected according to a decode result of a page address given by the controller 8. The word line driver 33 transfers a voltage to the control gate of the memory cell transistor MT provided in a selected block BLK through a selected word line WL. Also, the select gate line driver 31 transfers the required voltage to a gate of the selection transistor ST1 through the select gate line SGD 1 corresponding to the selected block BLK. At that time, the select gate line driver 31 transfers a signal sgd to the gate of the selection transistor ST1. Specifically, the select gate line driver 31 transfers the signal sgd to the gate of the selection transistor ST1, for example, through the select gate line SGD1 when writing, reading, and erasing the data, and further when verifying the data. Meanwhile, the signal sgd is set to 0 [V] when the signal is at an 'L' level and set to a voltage VDD (for example, 1.8 [V]) when this is at an 'H' level.

Also, as the select gate line driver 31, the select gate line driver 32 transfers the required voltage to a gate of the selection transistor ST2 through the select gate line SGS1 corresponding to the selected block BLK when writing and reading the data, and when verifying the data. At that time, the select gate line driver 32 transfers a signal sgs to the gate of the selection transistor ST2. The signal sgs is set to 0 [V] when the signal is at the 'L' level and set to the voltage VDD when this is at the 'H' level.

1-6. Regarding Voltage Generating Circuit 4

The voltage generating circuit 4 is provided with a first voltage generating circuit 41, a second voltage generating circuit 42, a third voltage generating circuit 43, a fourth voltage generating circuit 44, and a fifth voltage generating circuit 45. The first voltage generating circuit 41 to the fifth voltage generating circuit 45 are described with reference to FIG. 3.

As illustrated in FIG. 3, each of the first voltage generating circuit 41 to the fifth voltage generating circuit 45 is provided with a limiter circuit 50 and a charge pump circuit 51. The charge pump circuit 51 generates voltages required for the write operation, the erase operation, and the read operation of the data, for example, according to controlling by the controller 8. Each of the above-described voltages is output from a node N1 and is supplied to the row decoder 2, for example, in a NAND flash memory through the driver circuit 3. The limiter circuit 50 controls the charge pump circuit 51 according to the potential of the node N1 while monitoring the potential of the node N1. That is to say, the limiter circuit 50 stops pumping of the charge pump circuit 51 when the potential of the node N1 is higher than a predetermined value to decrease the potential of the node N1.

On the other hand, when the potential of the node N1 is lower than the predetermined value, the limiter circuit 50 allows the charge pump circuit 51 to pump to increase the potential of the node N1.

Next, the voltages generated by the above-described first voltage generating circuit 41 to fifth voltage generating circuit 45 are described. The first voltage generating circuit 41 generates a voltage VPGM when writing the data and transfers the voltage VPGM to the selected word line WL. The voltage VPGM is the voltage of magnitude such that the charge of a channel formed just below the memory cell transistor MT is injected to the charge accumulation layer and the threshold of the memory cell transistor MT transits to another level.

The second voltage generating circuit 42 generates a voltage VPASS and transfers the voltage VPASS to a non-selected word line WL. The voltage VPASS is the voltage at which the memory cell transistor MT is turned on.

The third voltage generating circuit 43 generates a voltage VERA and transfers the same to the well driver 10. The voltage VERA is set to 20 [V], for example. That is to say, when erasing the data, the voltage of 20 [V], for example, generated by the third voltage generating circuit 43 is applied to a well region in which the memory cell transistor MT is formed.

Also, the fourth voltage generating circuit 44 generates a voltage VCGR and transfers the voltage VCGR to the selected word line WL. The voltage VCGR is the voltage corresponding to the data, which is to be read from the memory cell transistor MT.

Also, the fifth voltage generating circuit 45 generates a voltage VREAD and transfers the voltage VREAD to the non-selected word line WL when reading the data. The voltage VREAD is the voltage to turn on the memory cell transistor MT without depending on the data held by the memory cell transistor MT.

1-7. Regarding Data Input/Output Circuit 7

The data input/output circuit 7 outputs an address and a command supplied from a host through an unillustrated I/O terminal to the controller 8. Also, the data input/output circuit 7 outputs written data to the sense amplifier 11 through a data line $D_{line}$. Also, when outputting the data to the host, the data input/output circuit 7 receives the data amplified by the sense amplifier 11 through the data line $D_{line}$ and thereafter outputs the same to the host through the I/O terminal based on control by the controller 8.

1-8. Regarding Controller 8

The controller 8 controls the entire operation of a NAND flash memory. That is to say, the controller 8 executes an operation sequence of the write operation, the read operation, and the erase operation of the data based on the above-described address and command given by the un-illustrated host through the data input/output circuit 7. The controller 8 generates the block selection signal/column selection signal based on the address and the operation sequence.

The controller 8 outputs the above-described block selection signal to the row decoder 2. Also, the controller 8 outputs the column selection signal to the sense amplifier 11. The column selection signal is the signal to select a column direction of the sense amplifier 11.

Also, a control signal supplied from an unillustrated memory controller is given to the controller 8. The controller 8 distinguishes whether the signal supplied from the host to the data input/output circuit 7 through the unillustrated I/O terminal is the address or the data by the supplied control signal.

1-9. Regarding Source Line SL Driver 9

Next, the source line SL driver 9 is provided with MOS transistors 12 and 13. One end of a current pathway of the MOS transistor 12 is connected to the source line SL, the other end thereof is connected to ground, and a signal Clamp_S1 is applied to a gate thereof. Also, one end of a current pathway of the MOS transistor 13 is connected in common to one end of the current pathway of the MOS transistor 12, the voltage VDD is supplied to the other end thereof, and a signal Clamp_S2 is applied to a gate thereof.

When the MOS transistor 12 is turned on, the potential of the source line SL is set to 0 [V], and when the MOS transistor 13 is turned on, the potential of the source line SL is set to the voltage VDD. Meanwhile, the signals Clamp_S1 and S2 applied to the gates of the MOS transistors 12 and 13, respectively, are controlled by the controller 8. Meanwhile, the MOS transistor 13 is turned on when erase verification is performed. That is to say, by turning on the MOS transistor 13 at the time of the erase verification, the voltage VDD is transferred from a side of the source line SL to the bit line BL.

1-10. Regarding Sense Amplifier 11

A configuration example of the sense amplifier 11 according to this embodiment is described with reference to FIG. 4. As illustrated, the sense amplifier 11 is provided with sense blocks $SB_1$ to $SB_{16}$, for example. The sense blocks $SB_1$ to $SB_{16}$ may hold 2-kbyte data, for example. That is to say, the sense amplifier 11 may exchange (read and write) the 2-kbyte data per page with (from and to) the memory cell array 1 through the bit line BL. Meanwhile, when the sense block $SB_1$ to the sense block $SB_{16}$ are not distinguished from one another, they are simply referred to as sense blocks SB. Meanwhile, the number of divisions of the sense amplifier 11 is not limited to 16 and may be any number.

Each of the sense blocks SB is provided with sense units $SU_{1-1}$ to $SU_{1-M}$, $SU_{2-1}$ to $SU_{2-M}$, . . . , and $SU_{16-1}$ to $SU_{16-M}$. Each of the sense units $SU_{1-1}$ to $SU_{1-M}$, $SU_{2-1}$ to $SU_{2-M}$, . . . , and $SU_{16-1}$ to $SU_{16-M}$ holds the data of the corresponding memory cell transistor MT. Meanwhile, when the sense units $SU_{1-1}$ to $SU_{1-M}$, $SU_{2-1}$ to $SU_{2-M}$, . . . , $SU_{16-1}$ to $SU_{16-M}$ are not distinguished from one another, they are simply referred to as sense units SU.

The sense unit SU has a configuration capable of holding the 1-bit data. Also, two bit lines BL are connected to one sense unit SU. That is to say, the reading and the writing of the data are performed for one of two adjacent bit lines BL, which are an even-numbered bit line BLi and an odd-numbered bit line BL. The configuration is described with reference to an enlarged view of the sense block SB.

As illustrated, in the sense units $SU_{1-1}$ to $SU_{8-1}$, groups of the two adjacent bit lines BL are the group of the bit lines BL1 and BL2, the group of the bit lines BL3 and BL4, the group of the bit lines BL5 and BL6, and so on. That is to say, the reading and the writing are collectively performed for n/2 bit lines BL out of n bit lines BL. Hereinafter, out of one group of the bit lines BL, the bit line BL, which is a target of the reading or the writing, is referred to as a selected bit line BL and the bit line BL, which is not the target, is referred to as a non-selected bit line BL.

The sense unit SU senses to amplify the data read from the memory cell transistor MT to the bit line BL when reading the data. More specifically, the sense unit SU precharges the bit line BL with the voltage VDD and senses the voltage (or a current) of the bit line BL.

Also, the sense units $SU_{1-1}$ to $SU_{8-1}$ are connected to a common signal line COM. The data held by the sense units $SU_{1-1}$ to $SU_{8-1}$ is detected by a fail bit detecting circuit 11-1. Thereafter, a result of detection by the fail bit detecting circuit 11-1 is transferred to the controller 8.

1-10-1. Regarding Configuration Example of Sense Unit SU

A configuration example of the sense unit SU is described with reference to FIG. 5. The sense unit SU according to this embodiment is the sense unit SU specialized for the 2-level data.

As illustrated, the sense unit SU includes a primary data cache (PDC), a dynamic data cache (DDC), a temporary data cache (TDC), and the MOS transistor group 6.

One end of a current pathway of a column selection MOS transistor 65 is connected to a node N1*b* and the other end thereof is connected to an input/output data line $D_{line}$ (signal line I/O). A signal at the 'L' or 'H' level is input/output from/to the input/output data line $D_{line}$ to/from the PDC through the MOS transistor 65.

Also, one end of a current pathway of a column selection transistor 66 is connected to a node N1*a* and the other end thereof is connected to the input/output data line $D_{line}$ (signal line I/On). The signal at the 'L' or 'H' level is input/output from/to the input/output data line $D_{line}$ to/from the PDC through the MOS transistor 66. Meanwhile, symmetrical signals are input/output to/from the signal line I/O and the signal line I/On.

A column selection signal CSL is supplied to gates of the MOS transistors 65 and 66. That is to say, the MOS transistors 65 and 66 are turned on by the signal CSL, and according to this, the data is input/output from/to the data input/output circuits 7 to/from the sense unit SU through the input/output data line $D_{line}$.

The PDC, which holds input data when writing, holds read data when reading, and temporarily holds the data when verifying, is used to operate internal data when storing the 2-level data ('0' or '1'), for example, of the memory cell transistor MT. The PDC is provided with a latch circuit LAT1. The latch circuit LAT1 is obtained by combining inverter 68-1 and 69-1. Also, the inverter circuits 68-1 and 69-1 are formed of the n-channel MOS transistor and a p-channel MOS transistor (A detail configuration of the LAT1 may be illustrated in Fifth embodiment).

An output terminal of the inverter 68-1 is connected to an input terminal of the inverter 69-1 at the node N1*b* and an output terminal of the inverter 69-1 is connected to an input terminal of the inverter 68-1 at the node N1*a*.

The node N1*a* may be connected to the ground through a MOS transistor 71-1 and a signal PRST1 is supplied to a gate of the MOS transistor 71-1.

Also, one end of a current pathway of a MOS transistor 72-1 is connected to the node N1*a*, the other end thereof is connected to a node N12, and a signal BLC1 is supplied to a gate thereof. Also, one end of a current pathway of a MOS transistor 73 is connected to the node N12, the other end thereof is connected to the node N1*b* of the PDC, and a signal BLT1 is supplied to a gate thereof. The node N12 is connected to wiring 83 (TDC) in the sense unit SU. The wiring 83 holds the data of the bit line BL when reading and verifying the data.

Further, the node N1*b* is connected to one end of a current pathway of a MOS transistor 79 and the node N12 is connected to a gate thereof. One end of a current pathway of a MOS transistor 80 is connected to the other end of the current pathway of the MOS transistor 79, the other end thereof may be connected to the ground, and a signal SEN1 is supplied to a gate thereof. The MOS transistor 80 is turned on according to a value of the signal SEN1, then MOS transistor 79 is turned on or off according to the magnitude of the voltage transferred from the BL line to the wiring, and according to this, a value of the node N1*b* changes. This is referred to as a forced inverting method.

Next, the DDC is described. The DDC is used at the time of the erase verification. The DDC is provided with an n-channel MOS transistor N75. One end of a current pathway of the MOS transistor N75 may be connected to the ground and a gate thereof is connected to the node N1*b*. The node N1*b* is connected to the gate of the MOS transistor N75. That is to say, one end of each of the current pathways of the MOS transistors 79 and 73 is connected to the gate of the MOS transistor 75-1. Meanwhile, one end of a current pathway of the MOS transistor 75 is connected in common to the other end of the current pathway of the MOS transistor 76, One end of a current pathway of a MOS transistor 75 is connected to the other end of the current pathway of the MOS transistor N75 and the other end thereof is connected to the node N12. Also, a signal REG is supplied to a gate of the MOS transistor 74.

Further, one end of a current pathway of a MOS transistor 82 is connected to the input/output data line $D_{line}$ (signal line COM), the other end of the current pathway is connected to one end of a current pathway of a MOS transistor 78, and a gate thereof is connected to the node N12. Also, the other end of the current pathway of the MOS transistor 78 may be connected to the ground and a signal CHK1 is supplied to a gate thereof.

As described above, the signal line COM is connected in common to the sense blocks $SB_1$ to $SB_8$, for example, in the column direction. Similarly, another signal line COM is connected in common to the sense blocks $SB_9$ to $SB_{16}$.

The signal indicating whether write verification, the erase verification and the like are completed in the sense unit SU is output to the signal line COM. That is to say, the signal at the 'L' or 'H' level is output to the signal line COM depending on whether the MOS transistor 82 is turned on according to the voltage transferred to the wiring 83 in a state in which the MOS transistor 78 is turned on.

One end of a current pathway of a MOS transistor 76 is connected to the node N12, the voltage VDD is supplied to the other end thereof, and a signal BLPRE is supplied to a gate thereof. Further, one end of a current pathway of a MOS transistor 81 is connected to the wiring 83 (TDC). A signal BLCCLAMP is supplied to a gate of the MOS transistor 81 and the other end of the current pathway is connected to one end of a current pathway of the MOS transistor group 6. For example, when reading and writing the data, and at the time of the write verification of the data, the voltage VDD is supplied to the bit line BL through the MOS transistor 76, the node N12, the MOS transistor 81, and the MOS transistor group 6.

Next, the MOS transistor group 6 is described. The MOS transistor group 6 serves as a bit line selection circuit, which allows the node N12 to be connected to any of the odd-numbered and even-numbered bit lines BL. The MOS transistor group 6 is provided with MOS transistors 6*a* to 6*d*.

One end of a current pathway of the MOS transistor 6*a* is connected to the other end of the MOS transistor 81, the other end of the current pathway is connected to one end of a current pathway of the MOS transistor 6*b* and a bit line BL(i+1) in common, and a signal BLS(i+1) is applied to a gate thereof.

The other end of the current pathway of the MOS transistor 6*b* is connected to one end of a current pathway of a p-channel MOS transistor 84 (which serves as a non-selection circuit), one end of the current pathway of the MOS transistor 6*b* is connected to the other end of the current pathway of the MOS transistor 6*a* and the bit line BL(i+1), and a signal BIAS(i+1) is applied to a gate thereof.

Also, one end of a current pathway of the MOS transistor 6*c* is connected to the other end of the current pathway of the MOS transistor 81, the other end of the current pathway is connected to one end of a current pathway of the MOS transistor 84 and the bit line BLi, and a signal BLSi is applied to a gate thereof.

A signal BIASi is applied to a gate of the MOS transistor 6*d*, the other end of the current pathway thereof is connected to one end of the MOS transistor 84, and one end of the current pathway is connected to the other end of the current pathway of the MOS transistor 6*b* and the bit line BLi.

The MOS transistors 6*b* and 6*d* are complementarily turned on with the MOS transistors 6*a* and 6*c*, respectively, according to the signal BIAS(i+1) and the signal BIASi to supply the voltage VDD to the non-selected bit line BL. Meanwhile, hereinafter, the even-numbered bit line BL is referred to as an even-numbered bit line BLi (i is an even-number and i=0, 2, 4, . . . , n), and the odd-numbered bit line BL is referred to as an odd-numbered bit line BL(i+1).

From the above, when the MOS transistors 6*b* and 6*c* and the MOS transistor 84 are turned on, the sense unit SU is electrically connected to the even-numbered bit line BLi (selected bit line BL) and the odd-numbered bit line BL(i+1) is made the non-selected bit line BL.

On the other hand, when the MOS transistors 6*a* and 6*d* and the MOS transistor 84 are turned on, the sense unit SU is connected to the odd-numbered bit line BL(i+1) (selected bit line BL) and the even-numbered bit line BLi is made the non-selected bit line BL. At that time, the potential of the even-numbered or odd-numbered bit line BL, which is made the non-selected bit line BL, is fixed at the voltage VDD, for example. That is to say, the MOS transistor 84 serves as the non-selection circuit to charge the bit line BL to a non-selected potential.

Meanwhile, when a voltage (VDD+Vth) corresponding to the 'H' level is supplied to the gates of the MOS transistors 6*a* to 6*d* as the signal BLSi, the signal BLS(i+1), the signal BIASi, and the signal BIAS(i+1), the MOS transistors 6*a* to 6*d* are turned on. Herein, the voltage Vth is the threshold voltage of the MOS transistors 6*a* to 6*d*.

On the other hand, when the voltage corresponding to the 'L' level, for example, zero potential is transferred to the gates of the MOS transistors 6*a* to 6*d* as the signal BLSi, the signal BLS(i+1), the signal BIASi, and the signal BIAS(i+1), the MOS transistors 6*a* to 6*d* are turned off.

2. Operation of Sense Unit SU 2-1. <Read Operation>

Next, the read operation of the data in the above-described configuration is described with reference to FIGS. 6 to 9. Meanwhile, as a precharge operation performed for the odd-numbered bit line BL(i+1) and the even-numbered bit line BLi is the same, only a case in which the even-numbered bit line BLi is made the selected bit line BL is herein described. That is to say, the odd-numbered bit line BL(i+1) is charged up to a non-selected voltage (voltage VDD) in the read operation to be described hereinafter.

<Precharge and PDC Reset>

Figure 6:
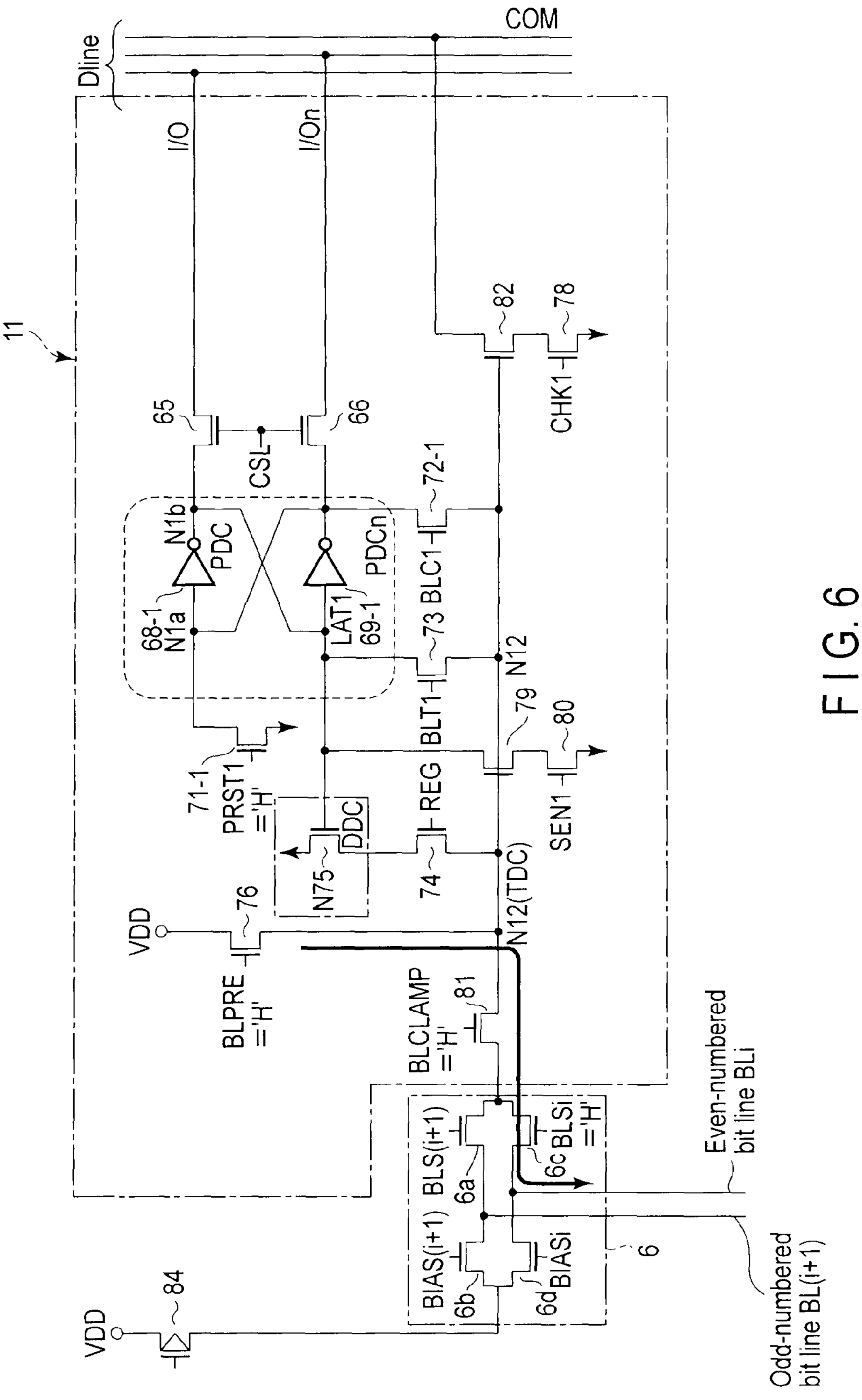
FIGS. 6-9 are a schematic diagram illustrating a read operation of the sense unit according to the first embodiment.

As illustrated in FIG. 6, the signal BLPRE, the signal BLCCLAMP, and the signal BLSi are set to the 'H' level to turn on the MOS transistors 76, 81, and 6*c*, respectively. According to this, the voltage VDD is supplied to the even-numbered bit line BLi through the MOS transistors 76, 81, and 6*c*.

Also, the data held by the PDC is reset once. That is to say, the signal PRST1 is set to the 'H' level to turn on the MOS transistor 71-1. According to this, the node N1*a* is set to the 'L' level (zero potential). Therefore, the PDC holds the 'H' level (potential level of the node N1*b*).

<Discharge>

Figure 7:
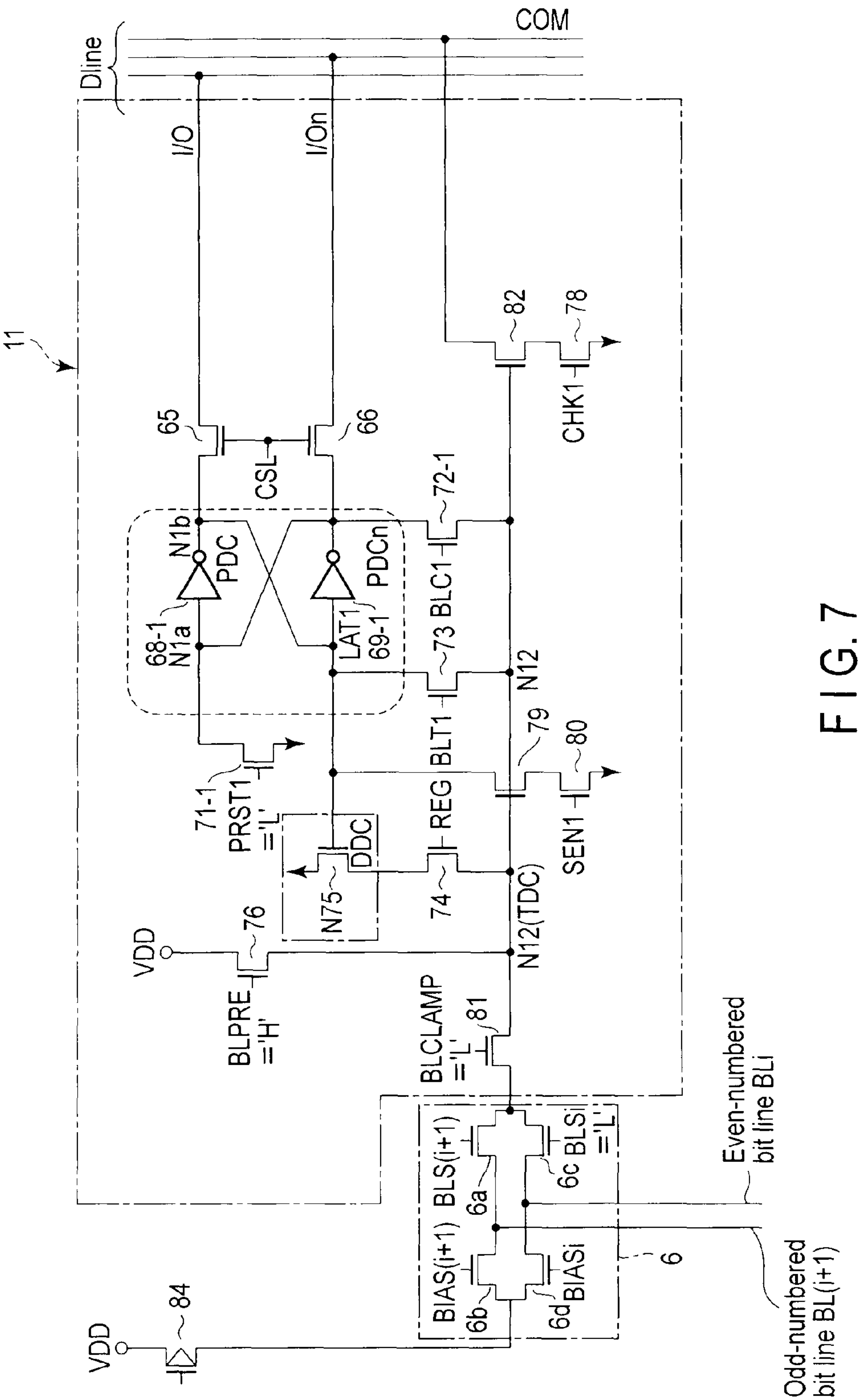

Next, the signal BLCCLAMP and the signal BLSi are set to the 'L' level as illustrated in FIG. 7. According to this, the precharge to the even-numbered bit line BLi is stopped. Herein, the voltage VCGR as a read level is supplied from the fourth voltage generating circuit 44 to the selected word line WL, and the voltage VREAD is supplied from the fifth voltage generating circuit 45 to the non-selected word line WL. When the threshold voltage of the memory cell transistor MT connected to the selected word line WL is lower than the voltage VCGR (in a non-writing state), the memory cell transistor MT is turned on. Since the non-selected memory cell transistor MT is turned on by the voltage VREAD, all the memory cell transistors MT of the NAND string 15 are turned on. According to this, the potential (charge) of the bit line BL is discharged to the source line SL.

On the other hand, when the threshold voltage of the selected memory cell transistor MT is higher than the voltage VCGR (in a writing state), the memory cell transistor MT is turned off. Therefore, the potential (charge) of the bit line BL is held to be maintained at the voltage VDD.

Meanwhile, at that time, since the signal BLPRE is at the 'H' level, the potential of the node N12 is maintained at the voltage VDD.

<Charge Transfer>

Figure 8:
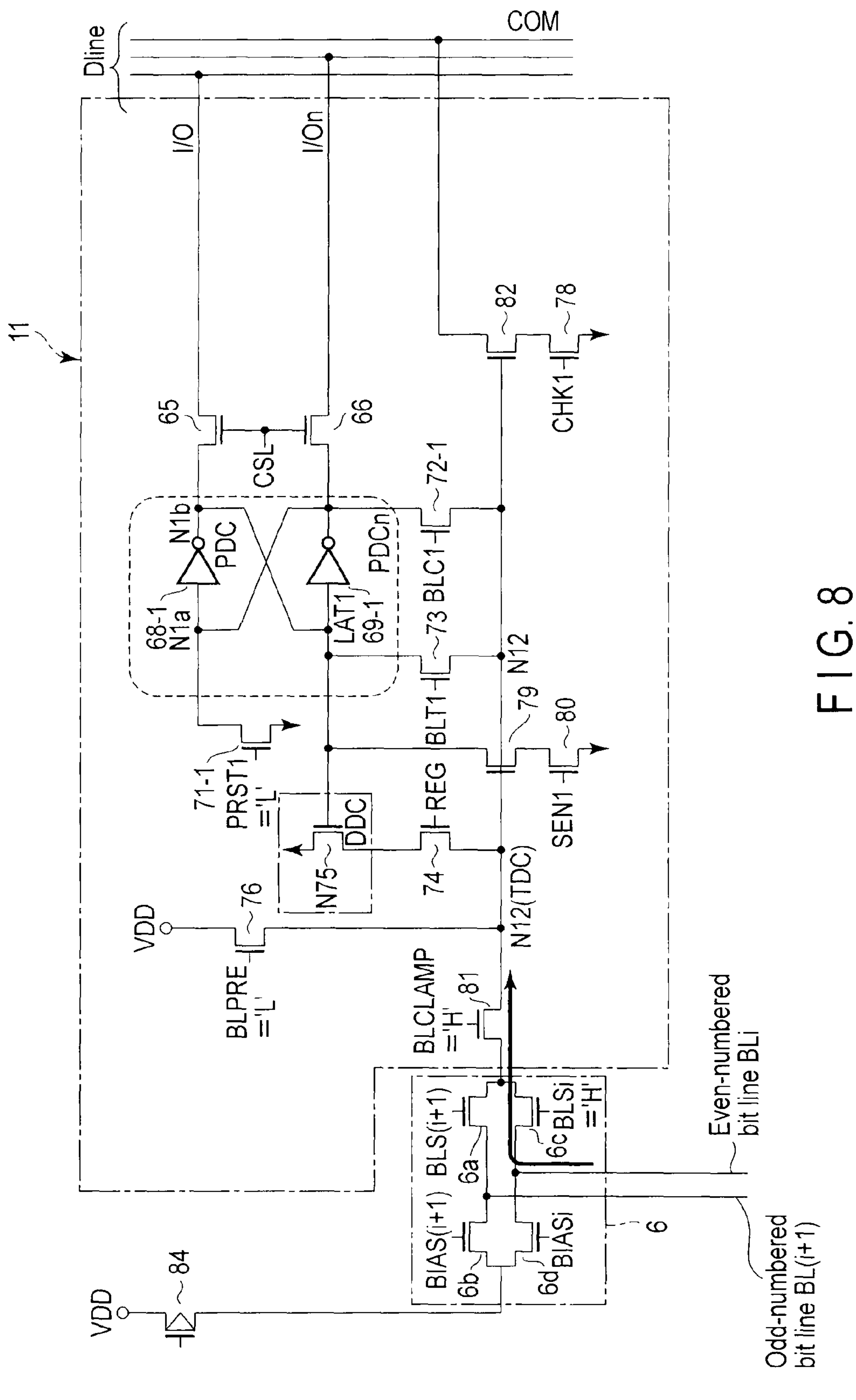

As illustrated in FIG. 8, the signal BLCCLAMP and the signal BLSi are set to the 'H' level to electrically connect the even-numbered bit line BLi to the node N12. According to this, charge transfer occurs. That is to say, when the NAND string 15 is in a conducting state, the charge of the even-numbered bit line BLi is discharged toward the source line SL. As a result, the node N12 transits from the voltage VDD to the zero potential, for example. That is to say, the charge of the node N12 moves to the even-numbered bit line BLi. This is because a capacity of the even-numbered bit line BLi is larger than a wiring capacity of the node N12.

On the other hand, when the NAND string 15 is in a non-conducting state, the potential of the even-numbered bit line BLi is maintained at the voltage VDD, so that the charge transfer does not occur. That is to say, the potential of the node N12 is maintained at the voltage VDD.

<Sensing>

Figure 9:
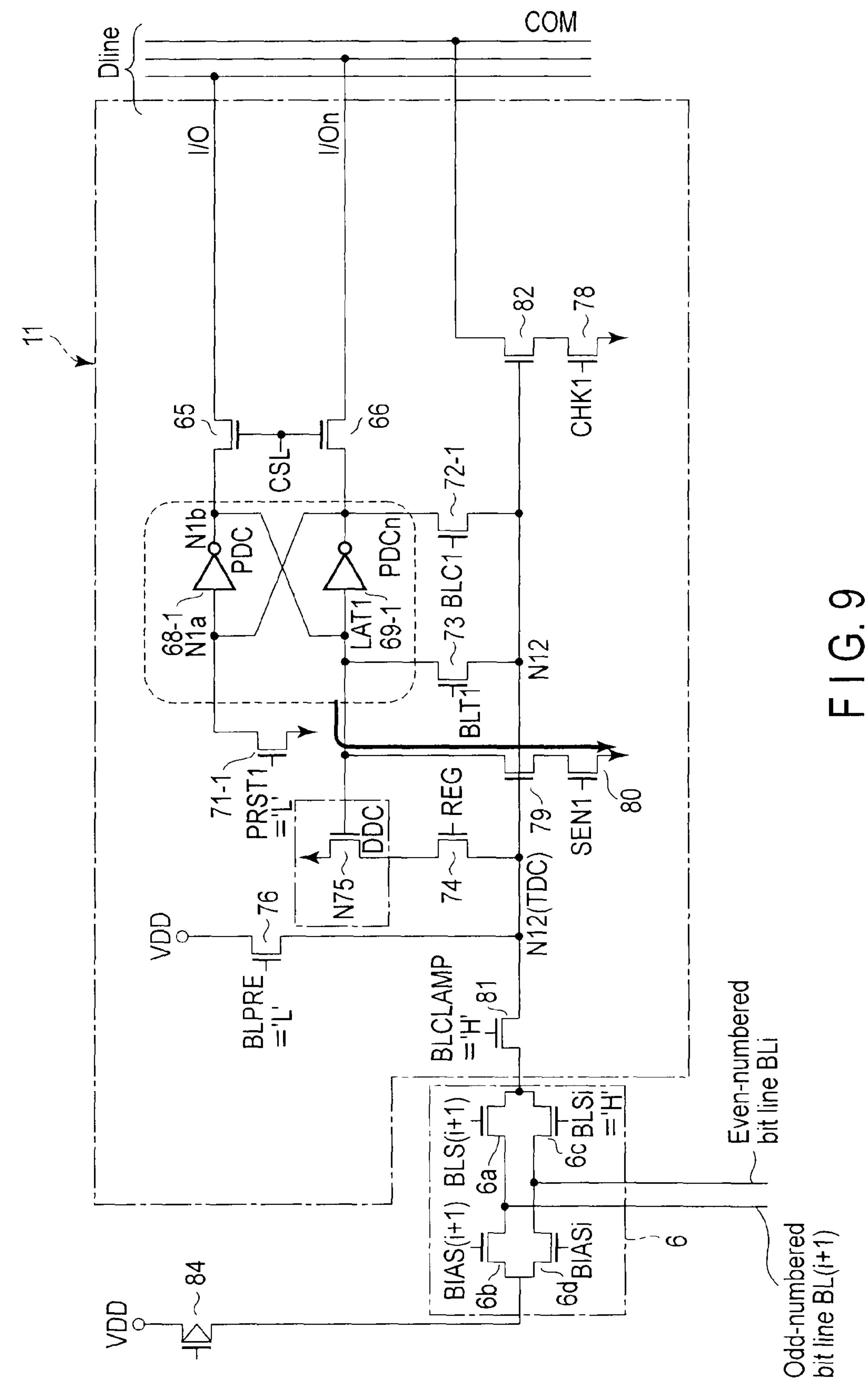

Sensing is described with reference to FIG. 9. A sense operation is the operation to set the signal SEN1 to the 'H' level to import the potential of the bit line BL (wiring 83) into the PDC. As a result of conduction of the NAND string 15, when the potential of the node N12 transits to the zero potential, for example, the MOS transistor 79 is turned off. Therefore, even when the signal SEN1 is set to the 'H' level and the MOS transistor 80 is turned on, the node N1*b* of the PDC (hereinafter, represented as PDC (node N1*b*)) holds the 'H' level.

On the other hand, when the NAND string 15 is put into the non-conducting state and the potential of the node N12 is maintained at the voltage VDD, the MOS transistor 79 is turned on. In this state, the signal SEN1 is set to the 'H' level to turn on the MOS transistor 80. Then, the current, which flows to the MOS transistor 80, and the current, which flows to the transistor (PMOS), which forms the PDC, conflict with each other, and as a result, the node N1*b* is set to a ground potential (for example, 'L' level=zero potential) (indicated by an arrow in FIG. 9). Therefore, the PDC (node N1*b*) holds the 'L' level.

In this manner, the PDC holds the data of any of the 'L' level and the 'H' level according to the potential of the even-numbered bit line BLi. Thereafter, when the signal CSL is set to the 'H' level, the held data of the PDC is output to the signal lines I/O and I/On through the MOS transistors 65 and 66, respectively.

2-2. <Write Operation>

Next, the write operation of the data in the above-described configuration is described with reference to FIGS. 10 to 13. Meanwhile, since the data write operation to the odd-numbered bit line BL (i+1) and the even-numbered bit line BLi is the same, only a case of the even-numbered bit line BLi is herein described. Meanwhile, the odd-numbered bit line BL (i+1) is made the non-selected bit line BL. Therefore, the odd-numbered bit line BL (i+1) is charged up to the non-selected voltage (voltage VDD) through the MOS transistors 84 and 6*b*.

<Data Import>

Figure 10:
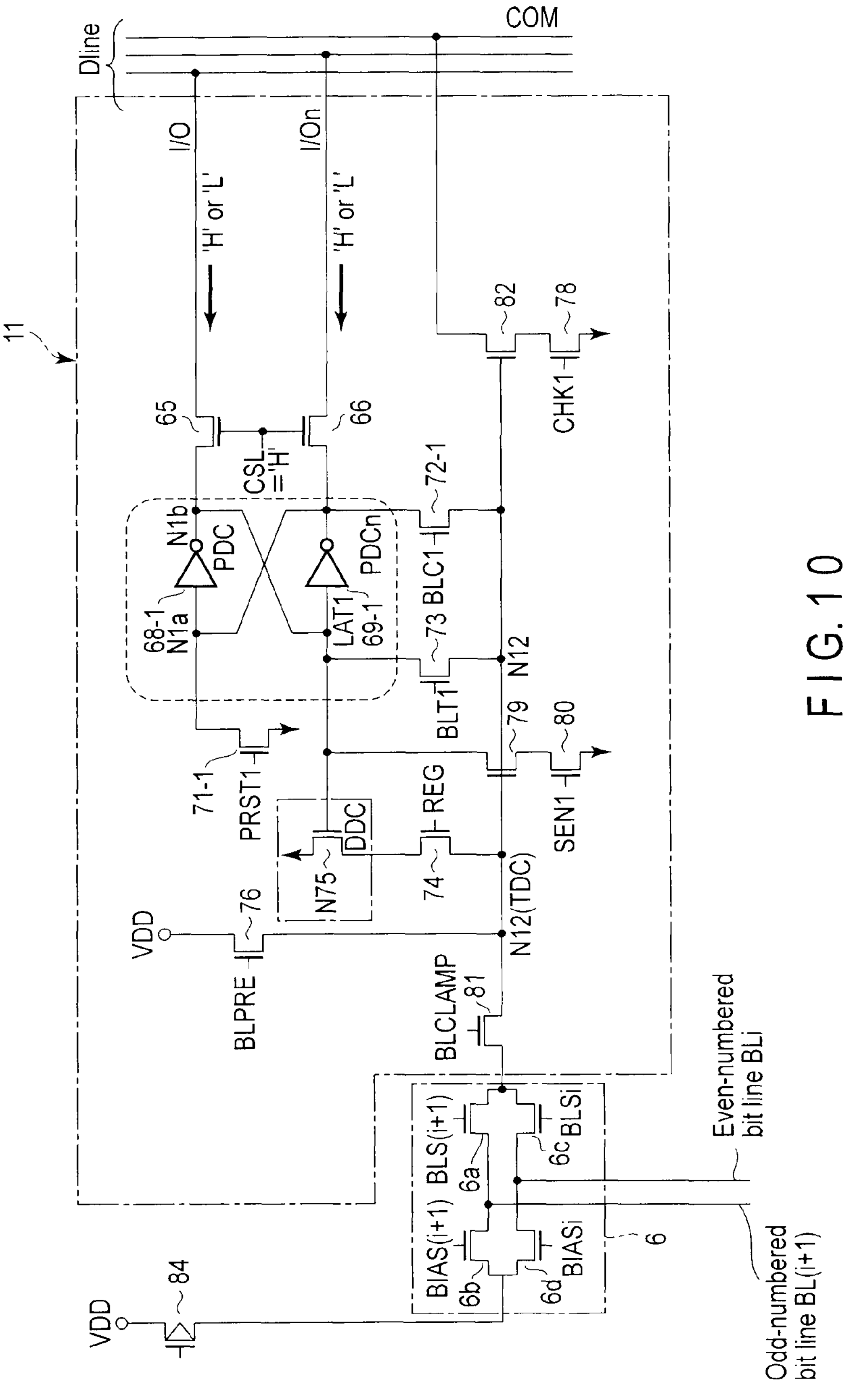
FIGS. 10-13 are a schematic diagram illustrating a write operation of the sense unit according to the first embodiment.
Figure 11:
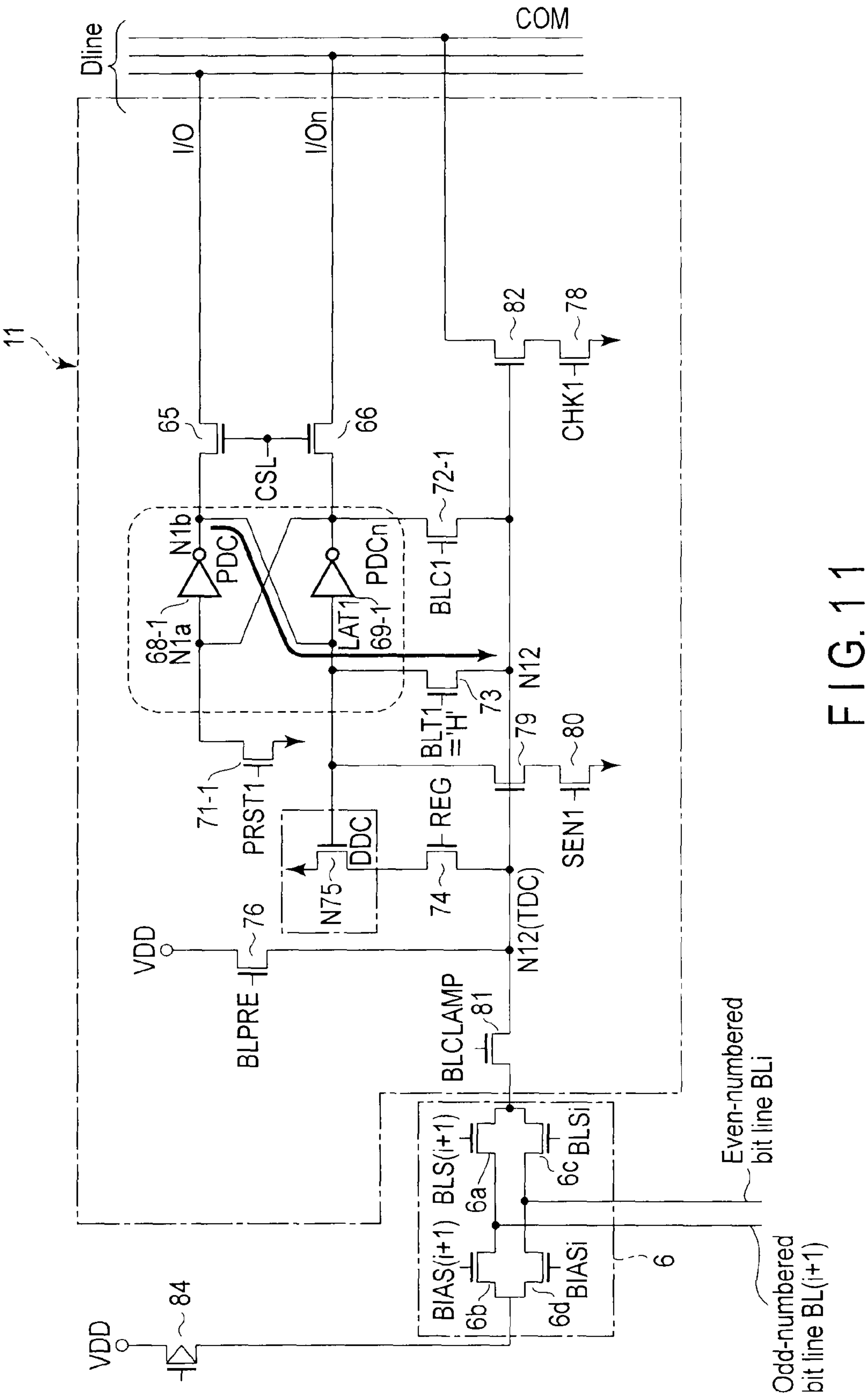
Figure 12:
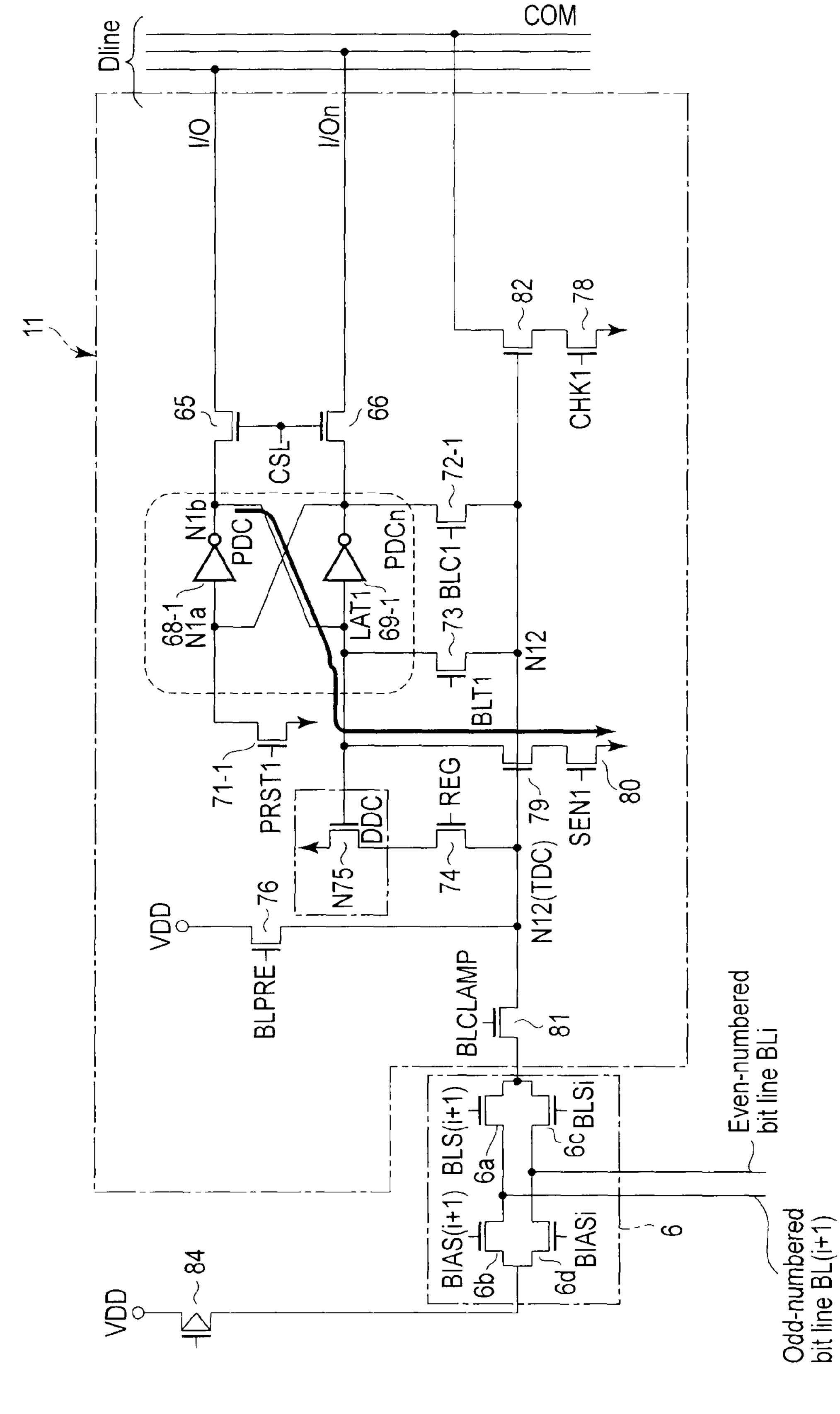

Import of the data is described with reference to FIG. 10. As illustrated in FIG. 10, when a command (CMD85h) is output from the host to the controller 8, the written data (signal at the 'H' level or the 'L' level) transferred from the signal lines I/O and I/On is stored in the PDC through the MOS transistors 65 and 66.

2-3. <NOT Arithmetic>

Next, the held data (node N1*b*) of the PDC is inverted. That is to say, NOT arithmetic is performed for the data of the PDC. The NOT arithmetic is described with reference to FIGS. 11 and 12.

First, the signal BLT1 is set to the 'H' level to turn on the MOS transistor 73. According to this, the data of the 'H' or 'L' level stored in the PDC is transferred to the wiring 83 as indicated by an arrow in FIG. 11. Thereafter, the signal BLT1 is set to the 'L' level to turn off the MOS transistor 73.

Next, a PDC reset operation is performed. That is to say, the signal PRST1 is set to the 'H' level to turn on the MOS transistor 71-1. According to this, the node N1*a* is set to the ground potential, that is to say, the 'L' level.

Also, the MOS transistor 79 is turned on or off according to the data transferred to the node N12. That is to say, when the node N12 is at the 'H' level, the MOS transistor 79 is turned on. Then, when the signal SEN1 is set to the 'H' level to turn on the MOS transistor 80, the potential of the node N1*b* transits from the 'H' level to the 'L' level (refer to an arrow in FIG. 12).

On the other hand, when the signal transferred from the node N1*b* to the node N12 is at the 'L' level, the MOS transistor 79 is in an off state, so that the PDC maintains the 'H' level after the PDC reset.

2-4. <Data Writing>

Figure 13:
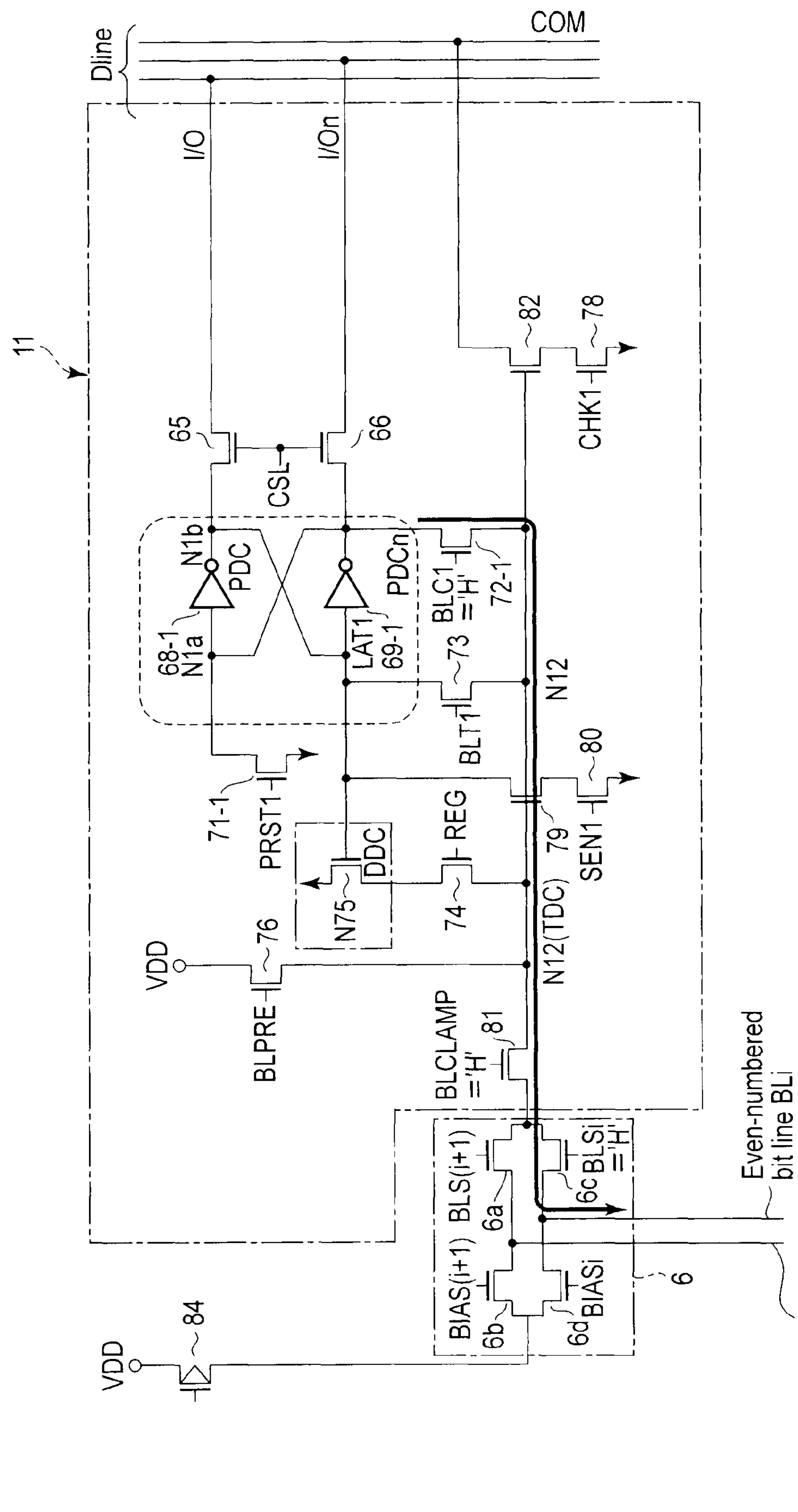

The writing of inverted data stored in the PDC as a result of the above-described NOT arithmetic is described with reference to FIG. 13.

When writing the data to the memory cell transistor MT, the signal BLC1 is set to the 'H' level to turn on the MOS transistor 72-1. Further, the signal BLCCLAMP and the signal BLSi are set to the 'H' level to turn on the MOS transistor 81 and the MOS transistor 6*c*. According to this, the data held by the PDC is transferred to the even-numbered bit line BLi.

That is to say, when the node N1*a* of a PDCn (hereinafter, represented as PDC (node N1*a*)) holds the data at the 'L' level, the even-numbered bit line BLi is set to the 'L' level, that is to say, the zero potential.

On the other hand, when the PDC (node N1*a*) holds the data at the 'H' level, the even-numbered bit line BLi is set to the 'H' level, that is to say, the voltage VDD. That is to say, the potential of the even-numbered bit line BLi is set to the non-selected potential.

Thereafter, the voltage VPGM is transferred to the selected word line WL and the voltage VPASS is supplied to the non-selected word line WL. As a result, when the bit line BL is at the 'L' level, the '0' data is written to the memory cell transistor MT, which is the writing target. Also, when the bit line BL is at the 'H' level, even when the voltage VPGM is transferred to the selected word line WL, a potential difference generated between the control gate of the memory cell transistor, which is the writing target, and the channel is smaller than that when writing the '0' data, so that variation in threshold such that the level transits does not occur. As a result, the memory cell transistor MT maintains the erased state ('1' data).

2-5. <Write Verify Operation>

Next, a write verify operation in the above-described configuration is described with reference to FIGS. 14 to 19. The write verify operation is the operation similar to the above-described read operation, and a verify voltage is used in place of the read voltage VCGR. The verify voltage is the voltage slightly higher than the voltage VCGR. Specifically described, the verify voltage corresponds to the potential on a low-potential side in the distribution of the threshold to hold the '0' data (refer to FIG. 2).

In the write verify operation, it is judged whether the writing is completed according to the held data of the PDC. Specifically, when the held data of the PDC is at the 'L' level, it is judged that the above-described writing is completed, and when this is at the 'H' level, the above-described write operation and write verify operation of the data are repeated until it is judged that the write operation of the data is completed.

Meanwhile, since the verify operation performed for the odd-numbered bit line BL (i+1) and the even-numbered bit line BLi is the same, attention is herein only focused on the even-numbered bit line BLi. Also, when the even-numbered bit line BLi is made the selected bit line BL, the odd-numbered bit line BL (i+1) is made the non-selected bit line BL.

That is to say, the MOS transistors 6*a* and 6*d* are turned off and the MOS transistors 76, 81, 84, 6*b*, and 6*c* are turned on. Therefore, the potential of the even-numbered bit line BLi is set to the voltage VDD and the potential of the odd-numbered bit line BL (i+1) is set to the non-selected potential.

Figure 14:
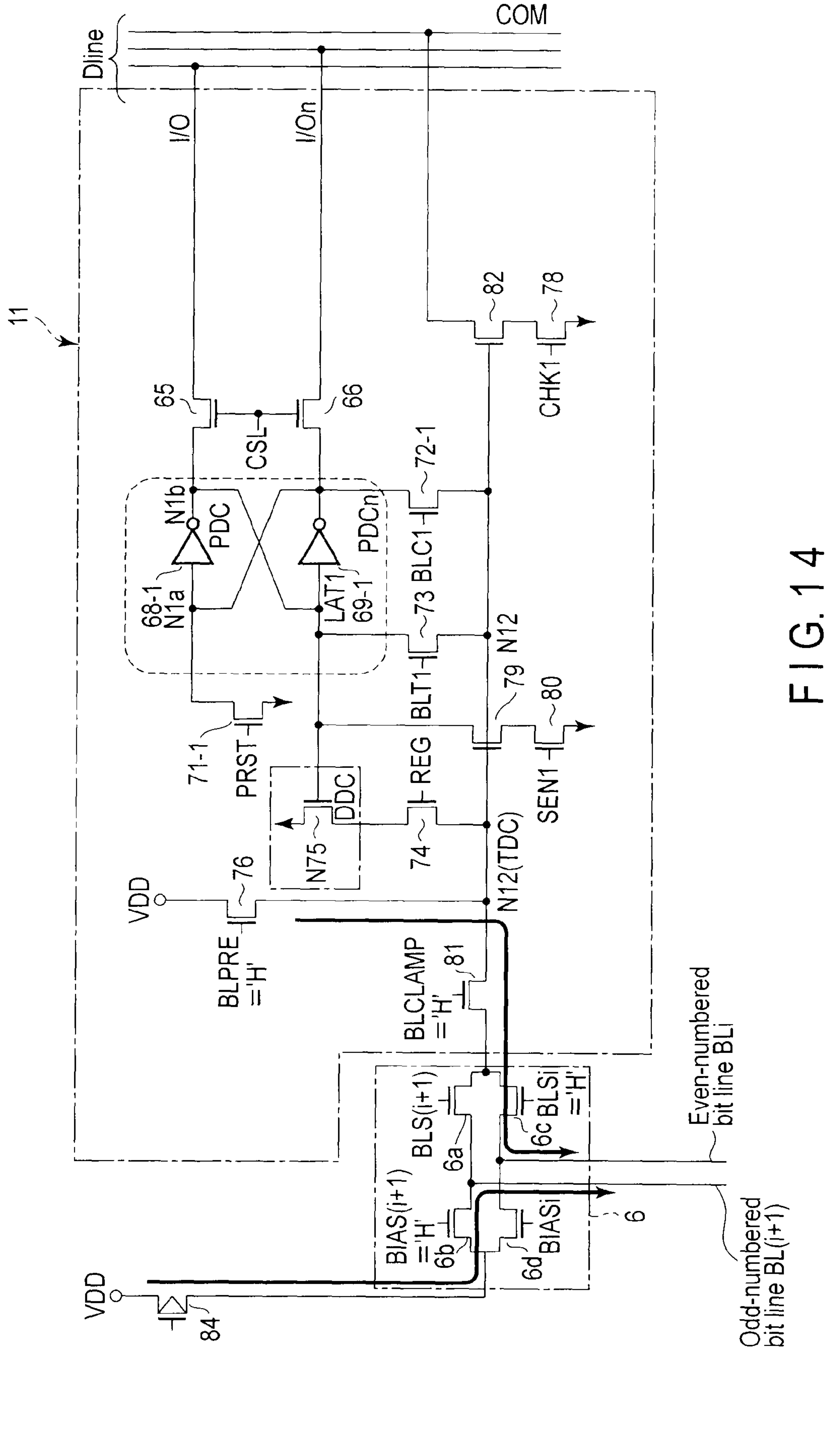
Figure 16:
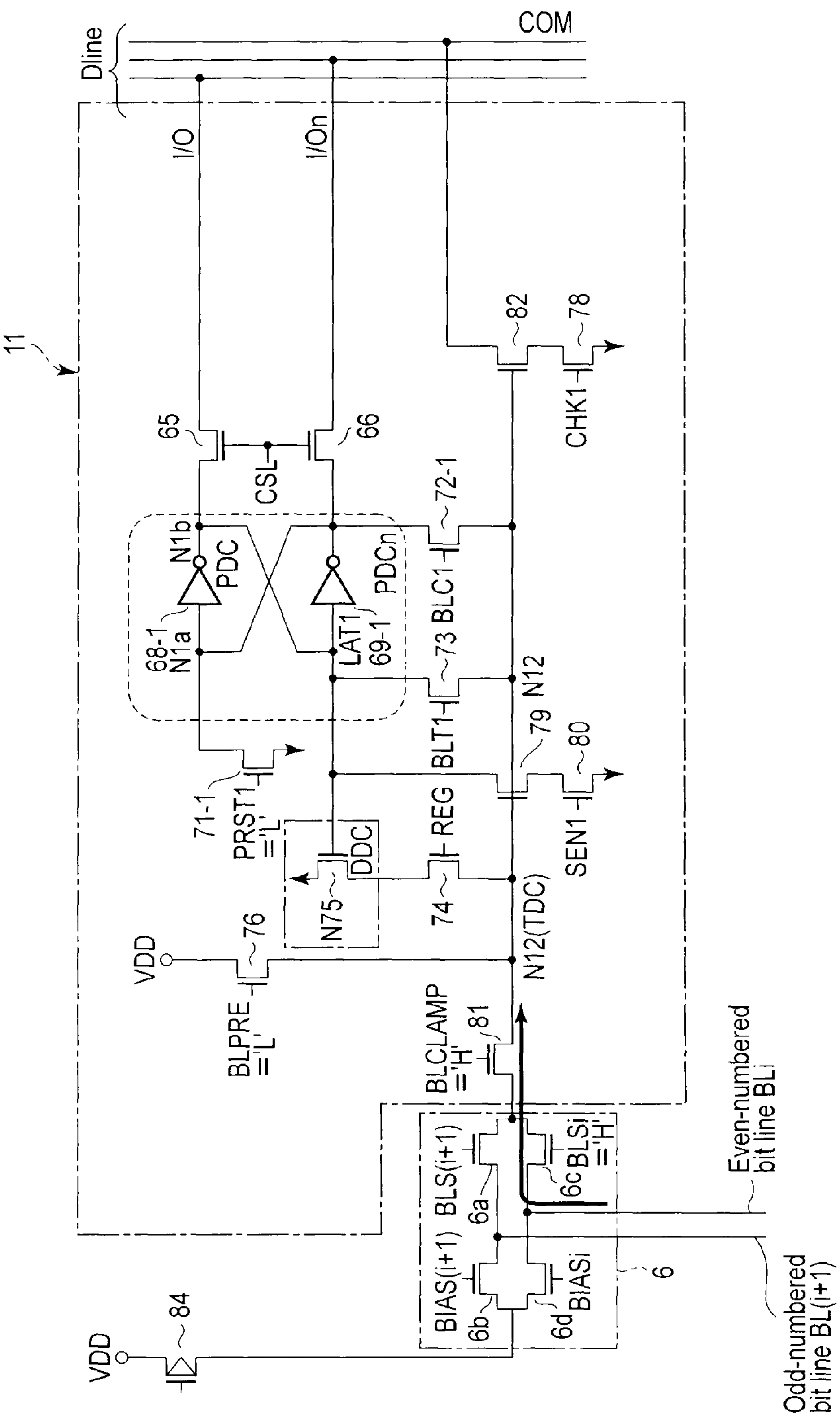
Figure 17:
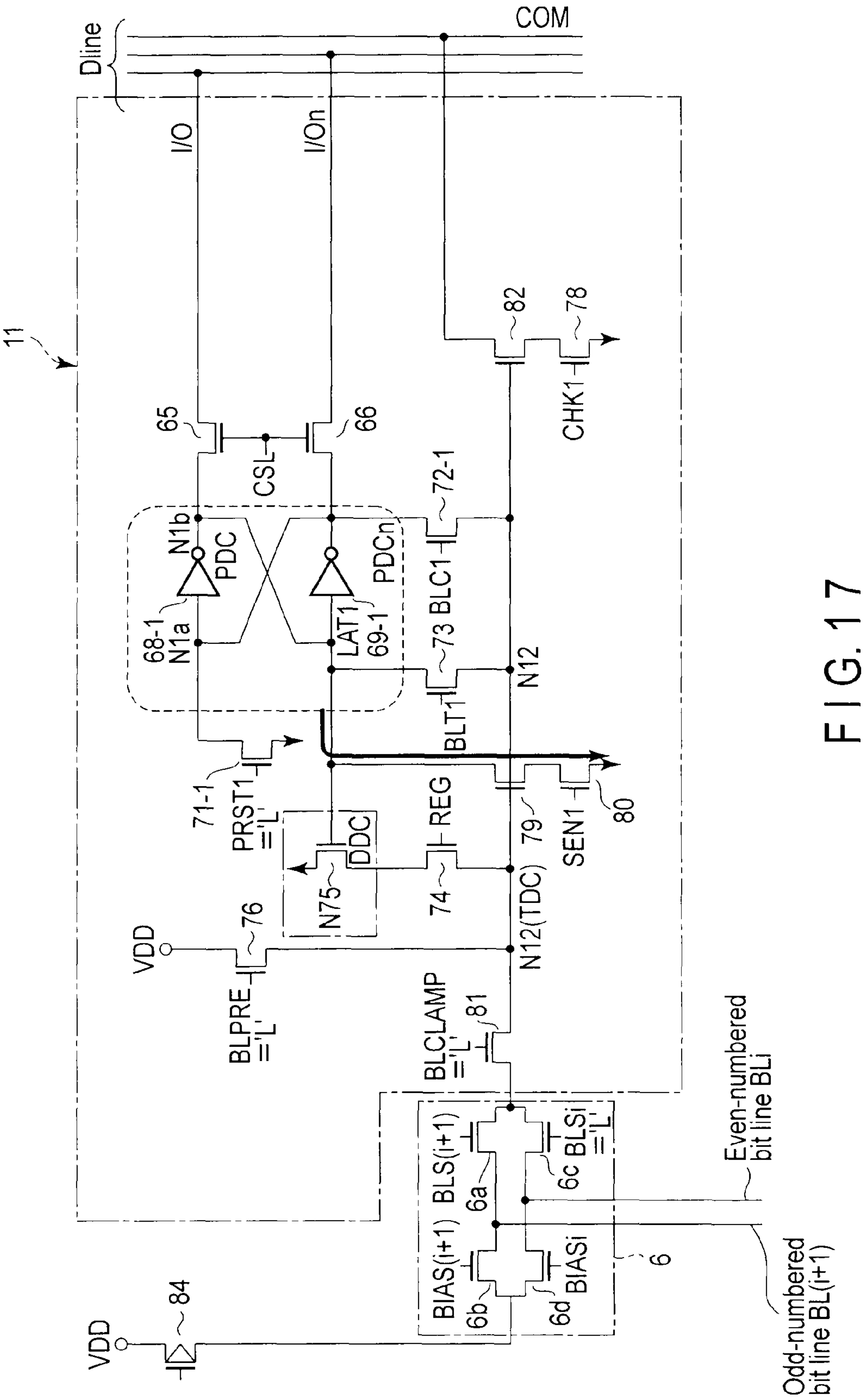

First, as illustrated in FIGS. 14 to 16, the precharge, the discharge, and the sensing are performed as in the above-described read operation. As a result of the sensing, the held data of the PDC changes according to the potential of the wiring 83 (node N12). Hereinafter, it is separately described according to the data held by the PDC ('L' or 'H' level) as a result of the sensing.

<Case of L Level (Writing is Completed)>

As a result of the sensing, there are the following two cases in which the PDC (node N1*b*) holds the 'L' level.

The first case is one in which the data held by the PDC (node N1*b*), that is to say, the written data to the memory cell transistor MT is '1' (erased state), that is to say, this holds the 'L' level, and when the PDC (node N1*b*) holds the 'L' level also after the sensing, that is to say, a case of non writing.

The second case is one in which the data held by the PDC (node N1*b*), that is to say, the written data to the memory cell transistor MT is '0', that is to say, this holds the 'H' level, and when the PDC (node N1*b*) holds the 'L' level after the sensing, that is to say, a case in which the writing is completed.

First, a first case in which the data held by the PDC (node N1*b*), that is to say, the written data to the memory cell transistor MT is '1' (erased state), that is to say, this holds the 'L' level is described. In this case, since the writing is not performed for the memory cell transistor MT, the bit line BL is set to the ground potential by the write verification. Therefore, as a result of the sense operation in the write verification, the potential of the node N12 is set to the 'L' level to turn off the MOS transistor 79. Therefore, the PDC (node N1*b*) is in a state of holding the 'L' level.

That is to say, in a case in which the threshold of the memory cell transistor MT is in the erased state ('1' data is held) by the above-described write operation, when the verify voltage is transferred to the memory cell transistor MT, this is turned on and the NAND string 15 is put into the conducting state. According to this, the even-numbered bit line BLi is set to the 'L' level.

Next, the case in which the PDC (node N1*b*) holds '0', that is to say, the 'H' level as the written data to the memory cell transistor MT is described. By the above-described write operation, in a case in which the threshold distribution of the memory cell transistor MT increases (refer to FIG. 2) and the '0' data is held, when the verify voltage (FIG. 2, voltage V01) is transferred to the memory cell transistor MT, the memory cell transistor MT is turned off and the NAND string 15 is put into the non-conducting state. That is to say, as a result of the sense operation in the write verification, the potential of the node N12 is set to the 'H' level to turn on the MOS transistor 79. Herein, the MOS transistor 80 is turned on, and according to this, the held data of the PDC (node N1*b*) transits from the 'H' level to the 'L' level (refer to FIG. 17).

<Case of H Level (Rewriting)>

In contrast to the above-described data writing completion, a case in which the writing is not completed, that is to say, a case in which rewriting is performed is described. There is a following case as a case in which the PDC holds the 'H' level as a result of the sensing in the write verify operation.

In a case in which the PDC (node N1*b*) holds the 'H' level, that is to say, in a case in which the written data to the memory cell transistor MT is '0' and the writing is not completed, when the verify voltage is transferred to the memory cell transistor MT, this is turned on and the NAND string 15 is put into the conducting state. According to this, the even-numbered bit line BLi is set to the 'L' level.

As a result of the sense operation in the write verification, when the potential of the node N12 is at the 'L' level, the MOS transistor 79 is turned off. According to this, the PDC (node N1*b*) holds the 'H' level. This is because the PDC is once reset as described above. Therefore, the written data is held.

2-6. <Collective Detecting Operation>

Collective detection is described with reference to FIG. 18. After the above-described sensing, the sense unit SU performs a collective detecting operation. Specifically, the signal BLT1 is set to the 'H' level to turn on the MOS transistor 73. That is to say, the held data of the PDC (voltage value of the node N1*b*) is transferred to the gate of the MOS transistor 82 through the MOS transistor 73 and the wiring 83.

Herein, the signal CHK1 is set to the 'H' level to turn on the MOS transistor 78. That is to say, when the writing of the '0' data is not completed and the held data of the PDC is at the 'H' level, the MOS transistor 82 is turned on and the signal line COM is set to the ground potential. That is to say, the 'L' level is transferred to the controller 8 through the signal line COM.

On the other hand, when the writing of the data is completed and when the held data of the PDC is at the 'L' level, the MOS transistor 82 is turned off and the signal line COM is not set to the ground potential. That is to say, a value, which is not the ground potential, for example, the voltage at the 'H' level is transferred to the controller 8. A value of any of the 'L' level and the 'H' level is transferred to the signal line COM.

2-7. <Rewrite Operation>

Next, a rewrite operation is described with reference to FIG. 19. The rewrite operation is executed only in a case in which the potential of the signal line COM is set to the 'L' level and it is judged that the writing is not completed in the above-described collective detecting operation.

Also, as described above, since the signal line COM is connected in common to a plurality of sense units SU, if there is any sense unit SU in which the writing of the data is not completed, the following rewrite operation is performed. That is to say, the rewrite operation is executed until the writing of the data is completed in all the sense units SU.

Figure 19:
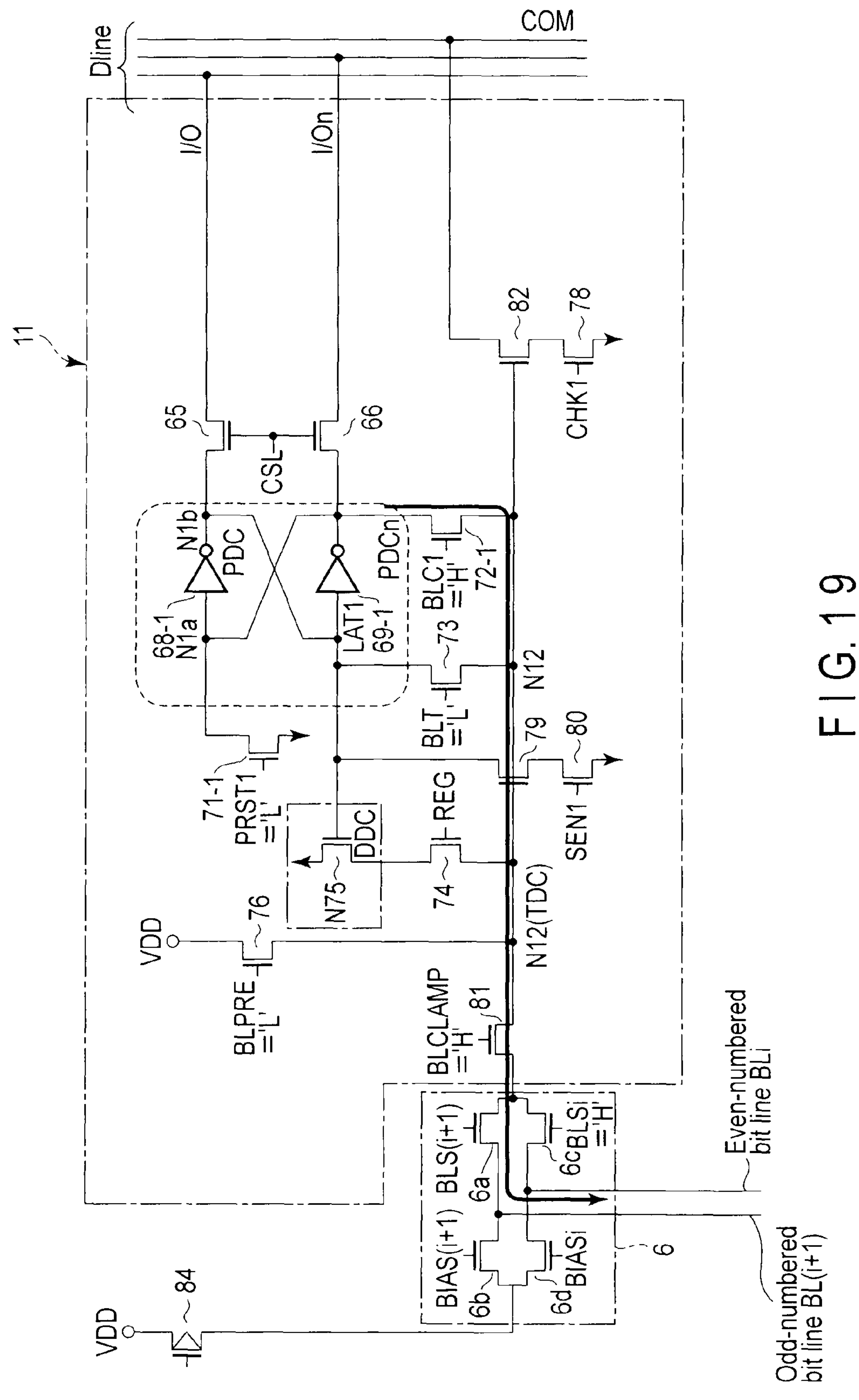
FIG. 19 is a schematic diagram illustrating a rewrite operation of the sense unit according to the first embodiment.

As illustrated in FIG. 19, the signal BLC1 is set to the 'H' level to turn on the MOS transistor 72. According to this, the held data of the PDC (node N1*b*) is transferred to the even-numbered bit line BLi through the wiring 83, the MOS transistor 81, and the MOS transistor 6*c*, and the write operation of the '0' data is executed again.

2-8. <Erase Operation>

Figure 20:
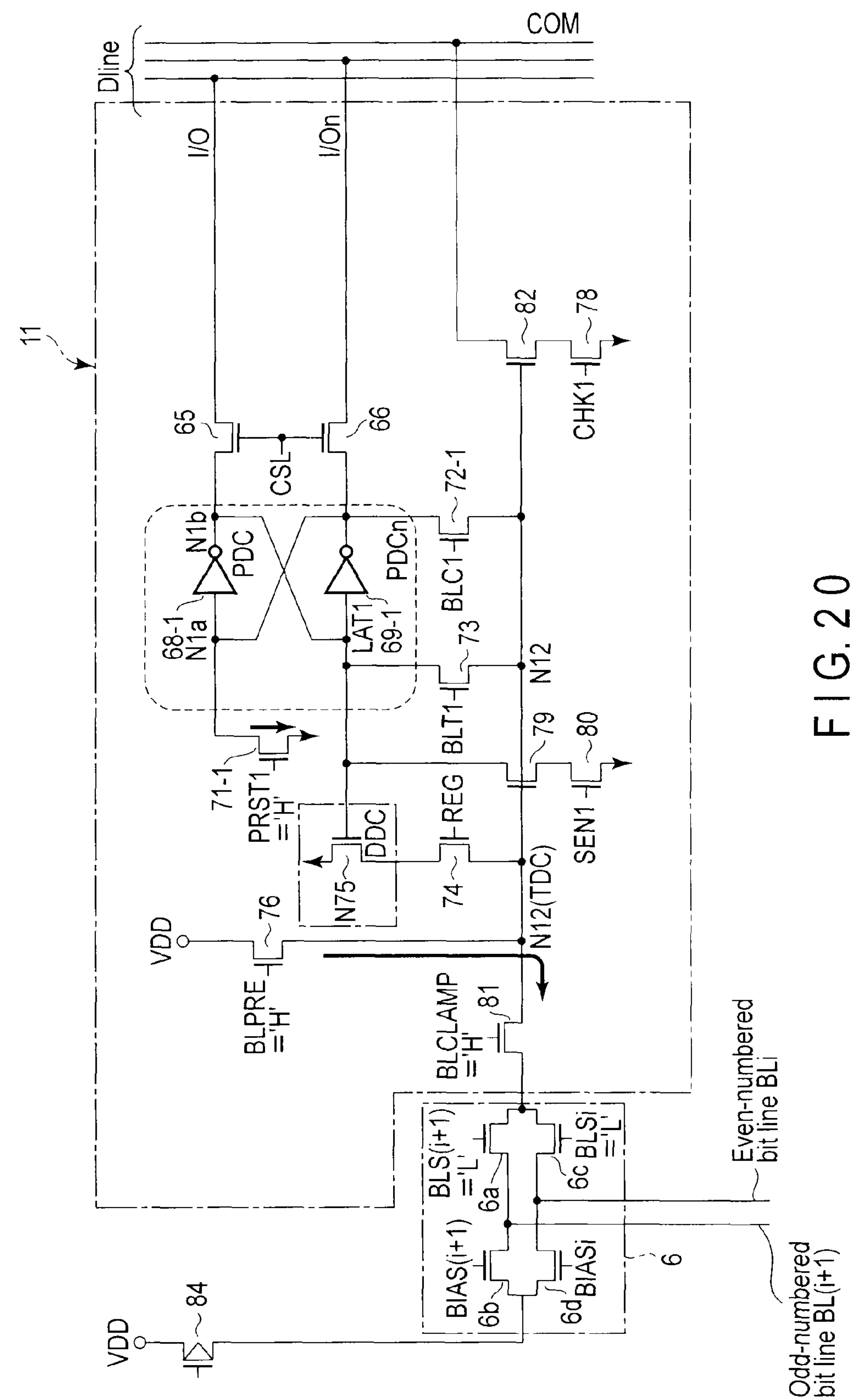
FIG. 20 is a schematic diagram illustrating an erase operation according to the first embodiment.

Next, the erase operation in the above-described configuration is described with reference to FIG. 20.

The erasing of the data is performed in a block unit as described above. Specifically, 0 V is transferred to the word line WL and a positive voltage of 20 V is applied to an activated region (well region) in which the memory cell transistor MT is formed. According to this, the charge in the charge accumulation layer is extracted to the well region. At that time, the high voltage of 20 V applied to the well region is transferred to the bit line BL through an impurity diffusion layer of the memory cell transistor MT and a contact plug CP electrically connected to the same.

Cutoff characteristics of the MOS transistors 6*a* and 6*c* are improved such that the high voltage of 20 V is not transferred into the sense unit SU. This state is illustrated in FIG. 20. The signal BLPRE and the signal BLCCLAMP are set to the 'H' level to turn on the MOS transistors 76 and 81, and the potential on a source terminal of the MOS transistor 81 is set to the voltage VDD. Herein, when the potential of the signal BLSi and the signal BLS (i+1)<voltage VDD is satisfied, the cutoff characteristics of the MOS transistors 6*a* and 6*c* are improved.

Further, the reset operation of the PDC is performed. That is to say, the node N1*b* is set to the 'H' level and the PDCn is set to the 'L' level. Meanwhile, the reset of the PDC is described in the above-described read operation, so that this is not herein described.

2-9. <Erase Verify Operation>

Next, an erase verify operation in the above-described configuration is described with reference to FIGS. 21 to 29. Meanwhile, the erase verify operation is alternately performed for the even-numbered bit line BLi and the odd-numbered bit line BL(i+1), and the erase verify operation is completed when it is confirmed that the written data of the memory cell transistor MT is erased for both of the even-numbered bit line BLi and the odd-numbered bit line BL(i+1). Specifically, in a case in which the held data of the PDC is at the 'L' level after the erase verification, the controller 8 judges that the erase verification is completed based on information from the fail bit detecting circuit 11-1.

The erase verify operation of the even-numbered bit line BLi is described with reference to FIGS. 21 to 23. Also, the erase verify operation of the odd-numbered bit line BL(i+1) is described with reference to FIGS. 24 to 26. Further, an arithmetic operation of the data is described for the even-numbered bit line BLi and the odd-numbered bit line BL (i+1) with reference to FIGS. 27 to 28 and the collective detection using the signal line COM is described with reference to FIG. 29.

<Regarding Even-Numbered Bit Line BLi>

Figure 21:
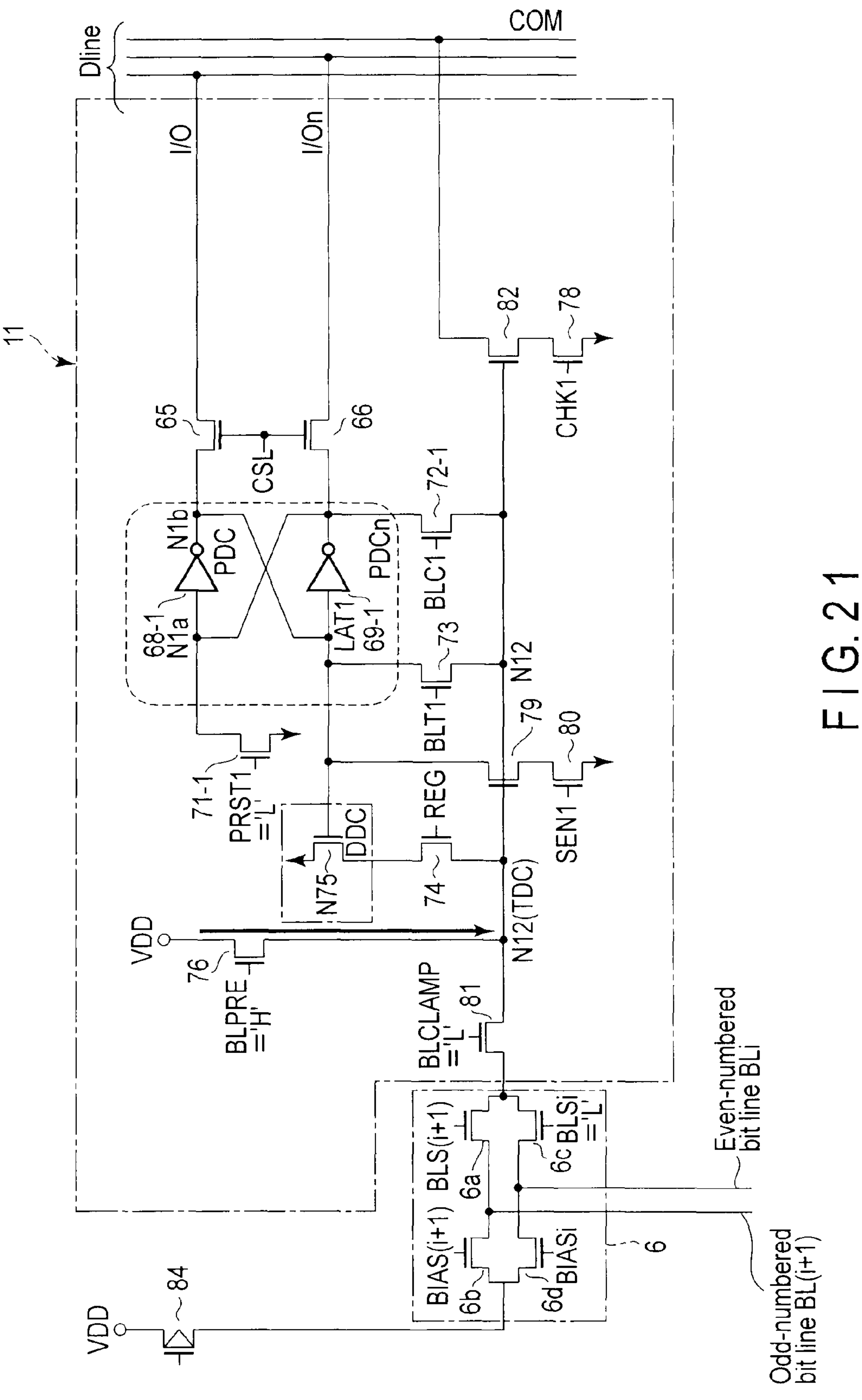

As illustrated in FIG. 21, first, the signal BLPRE is set to the 'H' level to turn on the MOS transistor 76, thereby setting the potential of the wiring 83 (node N12) to the voltage VDD ('H').

Next, the signal Clamp_S2 is set to the 'H' level to turn on the MOS transistor 13 in the source line SL driver. That is to say, the even-numbered bit line BLi is charged to the voltage VDD through the MOS transistor 13. If the threshold voltage of all the memory cell transistors MT is in the erased state, all the memory cell transistors MT are turned on when the voltage VCGR is transferred to all the word lines WL and the potential of the bit line BL is set to the 'H' level (for example, the voltage VDD).

On the other hand, when there is any memory cell transistor MT of which threshold voltage is not in the erased state, even when the voltage VCGR is transferred to the memory cell transistor MT, the memory cell transistor of which threshold voltage is not in the erased state is turned off and the potential of the bit line BL is set to the 'L' level (for example, the zero potential) on a drain side of the memory cell transistor MT.

Next, a state in which the potential of the bit line BL is transferred to the node N12 is described with reference to FIG. 22. As illustrated in FIG. 22, the signal BLSi and the signal BLCCLAMP are set to the 'H' level to electrically connect the even-numbered bit line BLi to the node N12. If all the memory cell transistors MT connected to the even-numbered bit line BLi are in the erased state, the potential of the even-numbered bit line BLi is set to the voltage VDD corresponding to the 'H' level even after charge share.

Figure 23:
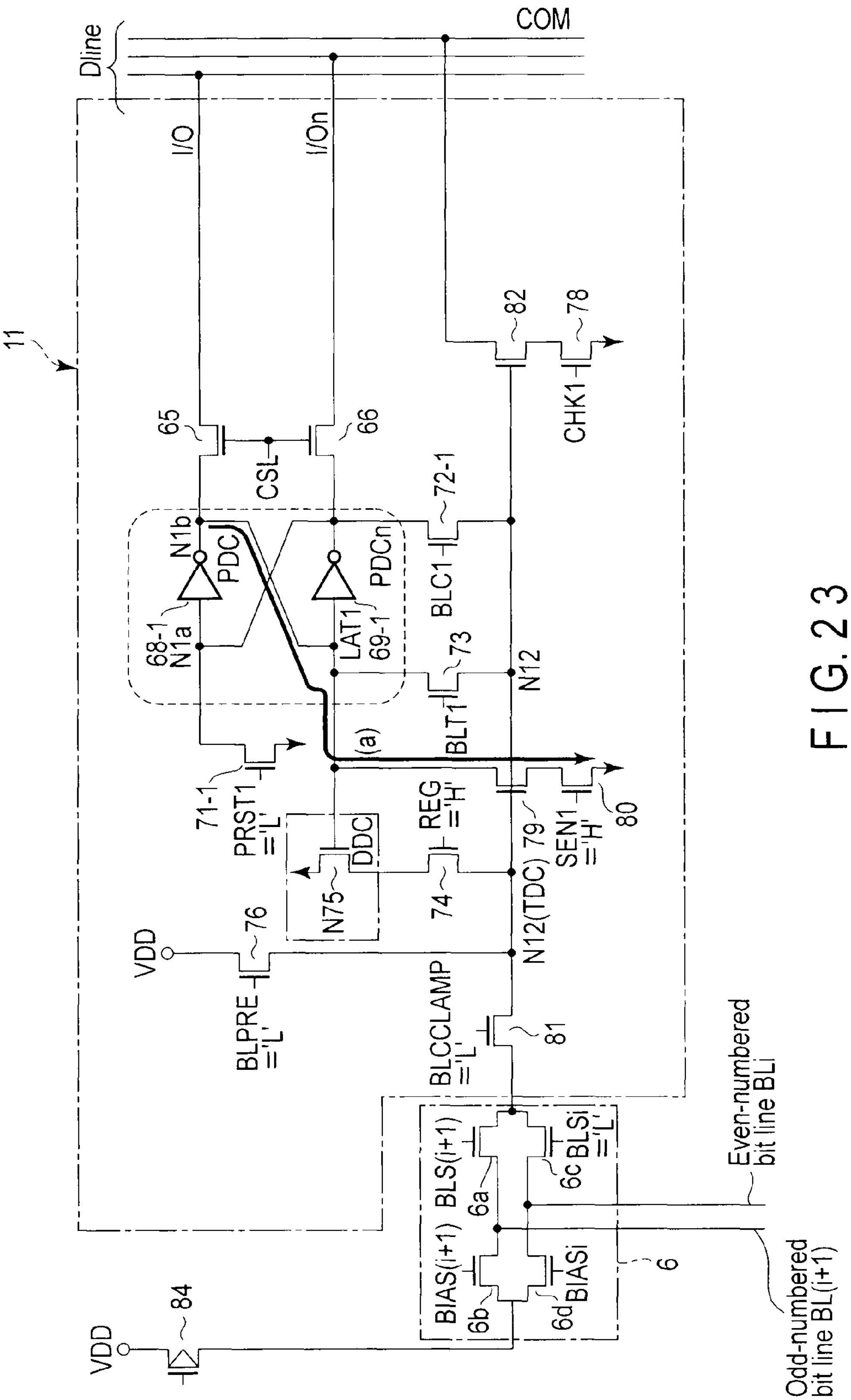

Then, as illustrated in FIG. 23, the MOS transistor 79 is turned on, and by setting the signal SEN1 to the 'H' level, the node N1*b* is set to the ground potential (indicated by an arrow in FIG. 23). That is to say, the held data of the PDC transits from the 'H' level to the 'L' level.

On the other hand, when there is any memory cell transistor MT of which threshold is not in the erased state, the potential of the bit line BL is set to the zero potential corresponding to the 'L' level. Therefore, the potential of the node N12 is set to the 'L' level after the charge share and the MOS transistor 79 is turned off. Therefore, even when the signal SEN1 is set to the 'H' level, the node N1*b* maintains the 'H' level. That is to say, the held data of the PDC is maintained at the 'H' level.

<Regarding Odd-Numbered Bit Line BL(i+1)>

As illustrated in FIG. 24, the signal BLPRE is set to the 'H' level to turn on the MOS transistor 76, and the potential of the node N12 is set to the voltage VDD.

Next, as illustrated in FIG. 25, the MOS transistor 6*a* is turned on to electrically connect the node N12 to the odd-numbered bit line BL(i+1). If all the memory cell transistors MT connected to the odd-numbered bit line BL(i+1) are in the erased state, the potential of the odd-numbered bit line BL(i+1) is set to the voltage VDD corresponding to the 'H' level. Then, the potential of the node N12 is set to the 'H' level even after the charge share.

On the other hand, when there is any memory cell transistor MT of which threshold is not in the erased state, the potential of the bit line BL is set to the zero potential corresponding to the 'L' level. Then, the potential of the node N12 transits to the 'L' level after the charge share.

At that time, the PDC (node N1*b*) holds the data of the even-numbered bit line BLi. Herein, as illustrated in FIG. 26, the signal REG is set to the 'H' level. When the data of the PDC (node N1*b*) is at the 'H' level, that is to say, when the erasing is not completed in the even-numbered bit line BLi, the MOS transistor N75 is turned on. Therefore, the node N12 is set to the ground potential, that is to say, the 'L' level regardless of the value of the odd-numbered bit line BL(i+1).

On the other hand, when the data of the PDC (node N1*b*) is at the 'L' level, that is to say, when the erasing is completed in the even-numbered bit line BLi, the MOS transistor N75 is turned off. Therefore, the value of the odd-numbered bit line BL(i+1) is held by the node N12.

Figure 27:
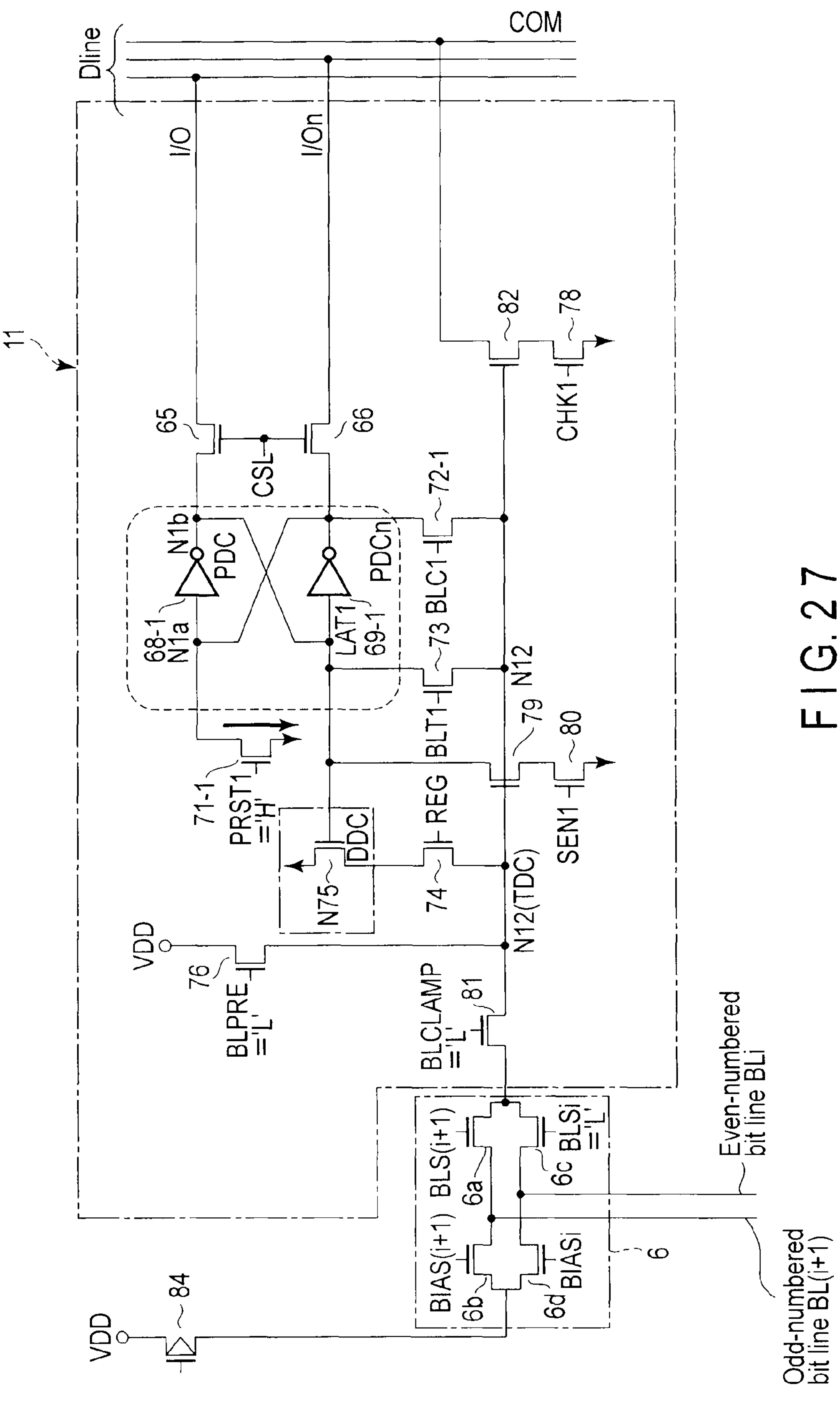
FIGS. 27-29 are a schematic diagram illustrating an arithmetic operation of the sense unit according to the first embodiment.

Next, the PDC is reset as illustrated in FIG. 27. According to this, the PDC (node N1*b*) maintains the 'H' level.

Figure 28:
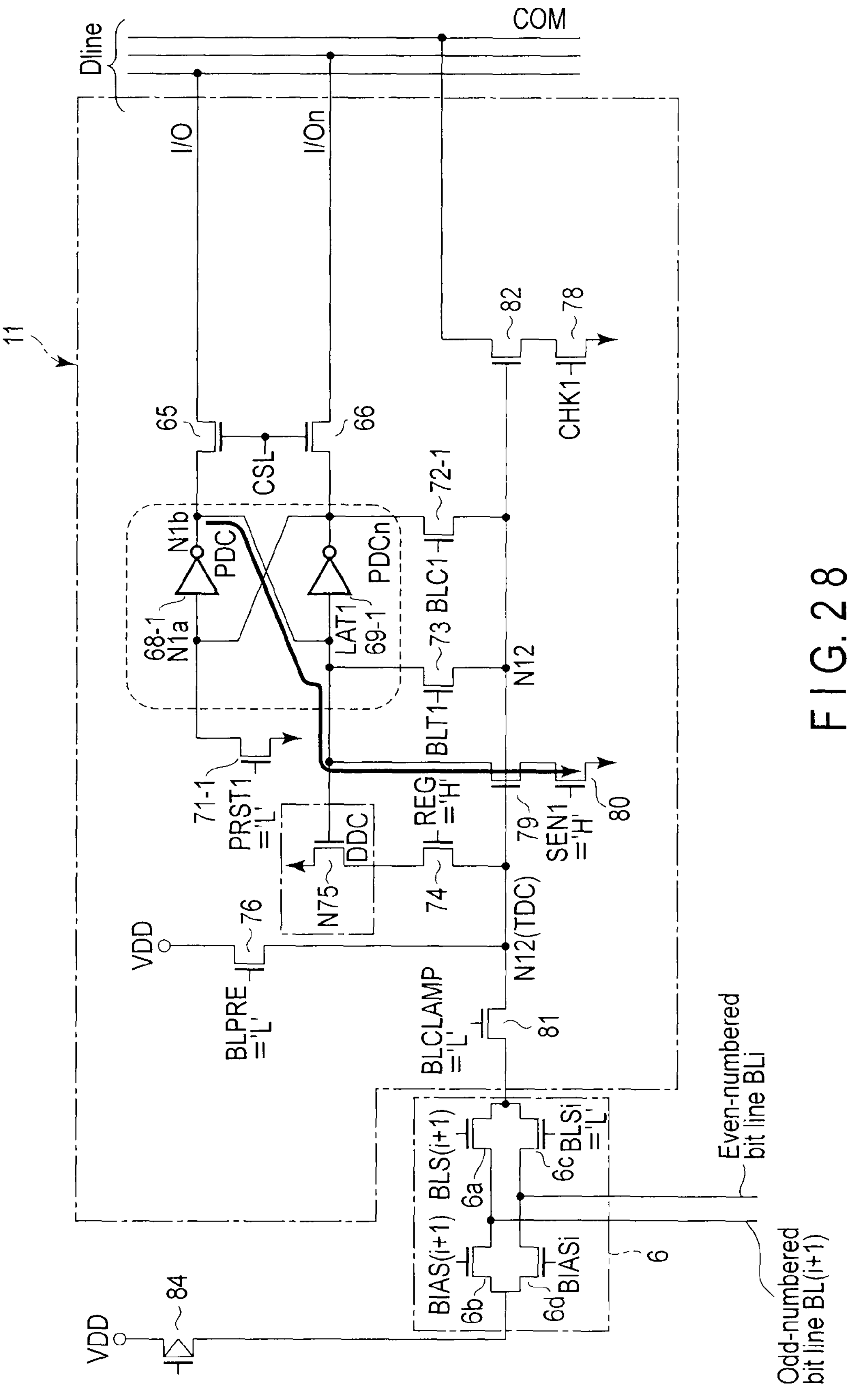

Next, as illustrated in FIG. 28, the sensing is performed for the odd-numbered bit line BL(i+1). That is to say, the potential of the node N12 is transferred to the PDC. Herein, when the potential of the node N12 is at the 'H' level, the MOS transistor 79 is turned on, and next, by setting the signal SEN1 to the 'H' level, the node N1*b* is set to the ground potential (indicated by an arrow in FIG. 28). That is to say, the held data of the PDC is set to the 'L' level. As a result, it is judged that the memory cell transistor MT is in the erased state for both of the even-numbered bit line BLi and the odd-numbered bit line BL(i+1).

On the other hand, when the potential of the node N12 is at the 'L' level, the MOS transistor 79 is turned off and the PDC holds the 'H' level. That is to say, it is judged that there is a memory cell transistor MT which is not in the erased state in any of the odd-numbered and the even-numbered bit line BLi and thus it is judged that the erase verification is not completed.

2-10. <Collective Detection (Serial Mode)>

Figure 29:
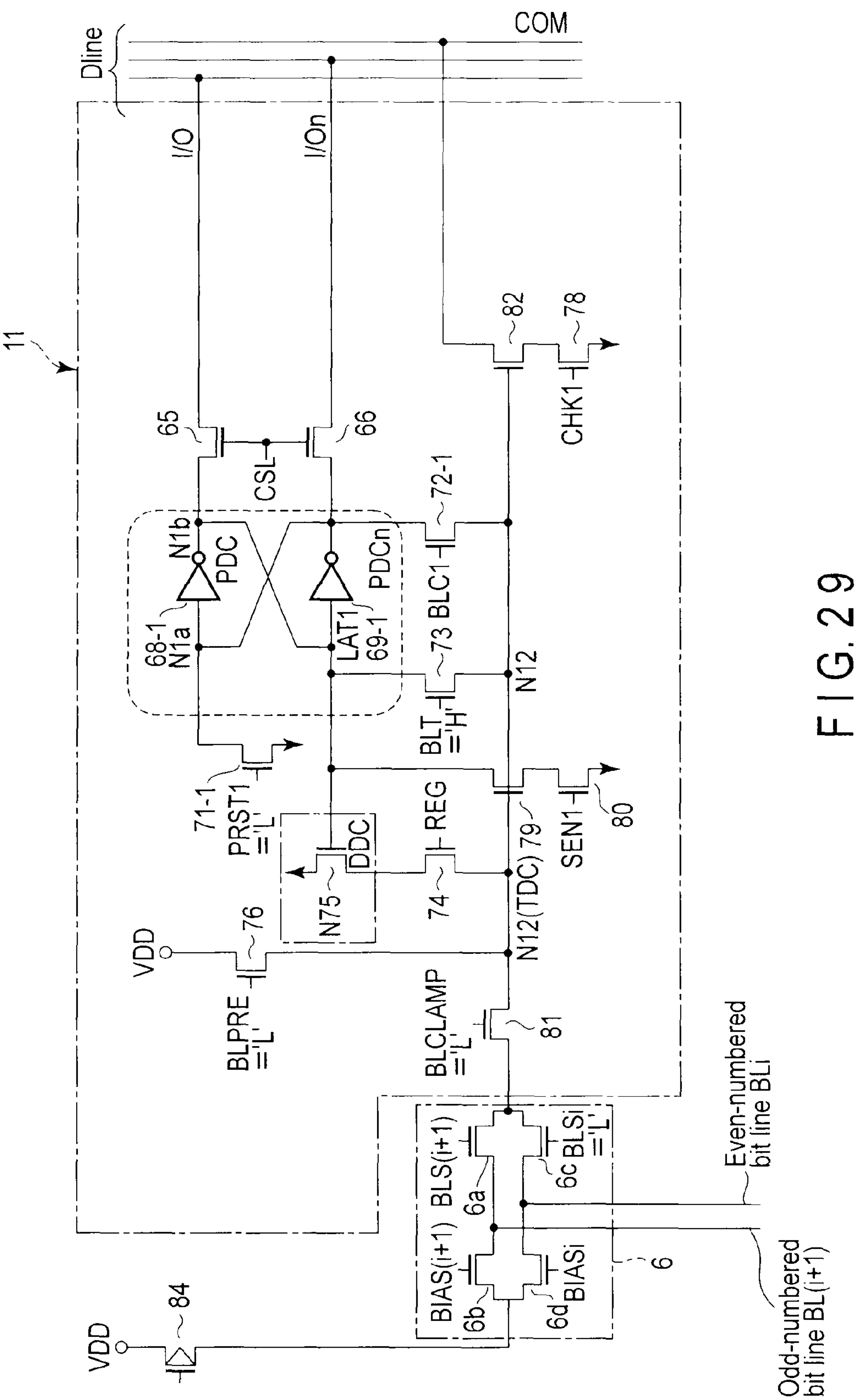

The detecting operation to perform the above-described judgment is described with reference to FIG. 29. FIG. 29 is a view illustrating the collective detecting operation to judge whether the memory cell transistors MT connected to the even-numbered bit line BLi and the odd-numbered bit line BL(i+1) are in the erased state. As illustrated, by setting the signal BLT1 to the 'H' level to turn on the MOS transistor 73, the data of the PDC (node N1*b*) is transferred to the gate of the MOS transistor 82.

When the PDC (node N1*b*) holds the 'H' level, which indicates that the memory cell transistor MT is not in the erased state, the MOS transistor 82 is turned on, and by setting the signal CHK1 to the 'H' level, that is to say, by turning on the MOS transistor 78, the signal line COM is set to the ground potential and the controller 8 judges that the erase verification is not completed.

On the other hand, when the PDC (node N1*b*) holds the 'L' level, the MOS transistor 82 is not turned on, the signal line COM is not set to the ground potential, and the controller 8 judges that the erase verification is completed.

Effect According to First Embodiment (1)

According to the semiconductor storage device according to this embodiment, a small-sized circuit of the sense amplifier 11 may be realized. Specifically described, the sense amplifier 11 of this embodiment is the sense amplifier corresponding to the memory cell transistor MT, which holds the 2-level data. Therefore, a dedicated data cache for latching input/output data required in a multi-level memory cell transistor MT such as 4-level is not required, and the PDC holds the data at the time of an internal data operation such as latch and the NOT arithmetic of the input/output data. Therefore, the number of data caches may be reduced and the small-sized circuit may be realized.

Also, the sense unit SU according to this embodiment has a configuration in which a part of members, which form the dynamic data cache (DDC), is omitted. Also, since the sense unit SU is the one specialized for the 2-value data, a secondary data cache (SDC) is also omitted.

Further, in the sense unit SU according to this embodiment, the MOS transistor, which electrically connects the current pathway between the gate of the MOS transistor N75 and the node N1*b*, is omitted. Therefore, the DDC is formed only of the MOS transistor N75.

Also, the sense unit SU forcedly inverts the held data of the PDC (node N1*b*) based on the potential of the wiring 83. That is to say, a forced inverting type is adopted. That is to say, a capacitor device provided on the sense amplifier, which adopts an inverter system, is omitted. The sense amplifier, which adopts the inverter system, has a configuration in which the capacitor device, one end of an electrode of which is connected to the node N12, is adopted. The held data of the PDC (node N1*b*) is set according to an amount of the charge accumulated by the capacitor.

On the other hand, in this embodiment, in addition to the wiring capacity, the MOS transistor 82 the gate of which is connected to the wiring is provided and the conventional capacitor device is replaced with a gate capacity of the MOS transistor 82.

Therefore, by omitting the capacitor device from the sense amplifier 11 while ensuring a function of the sense amplifier 11, reduction of the area of the sense amplifier 11 may be realized.

Further, in the semiconductor storage device according to this embodiment, there is the sense amplifier 11, which adopts the forced inverting method, so that time may be shortened according to the precharge and the like, for example.

That is to say, in the conventional inverter system, the capacitor device is connected to the node N12 and it is judged whether the data held by the memory cell transistor MT is '0' or '1' according to the voltage value of the capacitor device at the time of the charge transfer. That is to say, it requires time to charge the capacitor device with the voltage, and further it requires time for the charge transfer, so that a processing speed is delayed.

On the other hand, since the sense amplifier 11 according to this embodiment adopts the forced inverting method, this is the system in which the MOS transistor 79, which is turned on or off by the voltage of the wiring, is provided and the value of the node N1*b* is forcedly inverted by the MOS transistor 79. That is to say, since the time to charge the capacitor device and the like is not required, the processing speed may be improved.

<First Variation>

Next, a semiconductor storage device according to a variation of the first embodiment is described. The semiconductor storage device according to a first variation of this embodiment is further provided with a configuration capable of measuring a cell current I, which flows to a memory cell transistor MT, in the configuration of the above-described first embodiment.

1. Configuration 1-1. <Regarding Configuration Example of Sense Unit SU>

<Regarding Configuration Example of Sense Unit SU>

Only a configuration different from that of the above-described first embodiment is described with reference to FIG. 30. As illustrated in FIG. 30, a sense unit SU according to the variation has the configuration further provided with a MOS transistor P75.

One end of a current pathway of the MOS transistor P75 is connected to an input/output data line $D_{line}$ (signal line COM) at a node N11, the other end of the current pathway is connected to a node N12, and a signal Icellmon is supplied to a gate thereof.

One end of a current pathway of a MOS transistor 82 is connected in common to one end of the current pathway of the MOS transistor P75 and a gate thereof is connected to the node N12. By providing the MOS transistor P75 and connecting a drain terminal thereof to the signal line COM, the cell current I, which flows to a channel of the memory cell transistor MT being a measuring target, may be measured. That is to say, an external device (measuring device) measures the cell current I, which flows to the memory cell transistor MT, using the signal line COM.

2. Operation 2-1. <Method of Measuring Cell Current>

Next, a method of measuring the cell current I in the above-described configuration is described. First, a column direction and a row direction of the memory cell transistor MT, which is the measuring target, are selected. That is to say, when selecting the column direction, a column address CA at the 'H' level is supplied to a gate of a MOS transistor (not illustrated) provided between the sense unit SU and the input/output data line $D_{line}$ (signal line COM).

Next, when selecting the row direction, a voltage VCGR is transferred to the memory cell transistor MT corresponding to a selected word line WL provided in a selected block BLK0 and a voltage VREAD is transferred to a non-selected word line WL, for example. According to this, the memory cell transistor MT, which is the measuring target, may be selected.

Next, an operation of the sense unit SU is described. The signal Icellmon is set to the 'H' level to turn on the MOS transistor P75. According to this, the input/output data line $D_{line}$ (signal line COM) is electrically connected to wiring 83 through the MOS transistor P75. Therefore, as illustrated in FIG. 30, it becomes possible to apply a current Icell from the signal line COM to a bit line BL. A value of the current differs depending on characteristics of the memory cell transistor MT.

Herein, a threshold distribution of the memory cell transistor MT is in an erased state and the current, which flows to the channel of the memory cell transistor MT being turned on as a result of transfer of the voltage VCGR, is made a cell current $I_{ON}$.

On the other hand, the threshold distribution of the memory cell transistor MT is in a state of holding '0' data and the current, which flows to the channel of the memory cell transistor MT being turned off as a result of transfer of the voltage VCGR, is made a cell current $I_{OFF}$.

As described above, each of the memory cell transistors MT has its own cell characteristics, so that values of the above-described cell currents $I_{ON}$ and $I_{OFF}$ differ depending on each memory cell transistor MT. Herein, $I_{ON}/I_{OFF}$ is defined as an on/off ratio of the memory cell transistor MT.

The smaller the value of the current $I_{OFF}$ and the larger the value of the current $I_{ON}$, the larger the value of the on/off ratio. That is to say, it is found that the cell characteristics of the memory cell transistor MT are excellent.

On the other hand, the larger the value of the current $I_{OFF}$, and the smaller the value of the current $I_{ON}$, the smaller the value of the on/off ratio as compared to the above-described case. That is to say, it is found that the cell characteristics of the memory cell transistor MT are not excellent. In this manner, the cell current I, which flows to the channel of each memory cell transistor MT, may be measured, and the characteristics of the memory cell transistor MT may be examined by the on/off ratio.

<Second Variation>

Next, a second variation of the above-described first embodiment is described. A semiconductor storage device according to the second variation is configured to perform a detecting operation described in the first embodiment while performing any of a read operation, write operation, write verify operation, erase operation, and erase verify operation, for example. That is to say, the above-described detecting operation and the write operation, for example, are performed at the same time at a certain time t.

1. Configuration 1-1. <Regarding Configuration Example of Sense Unit SU>

A configuration example of a sense unit SU according to the second variation is described with reference to FIG. 31. Herein, only a configuration different from that of the sense unit SU according to the above-described first embodiment is described.

Figure 31:
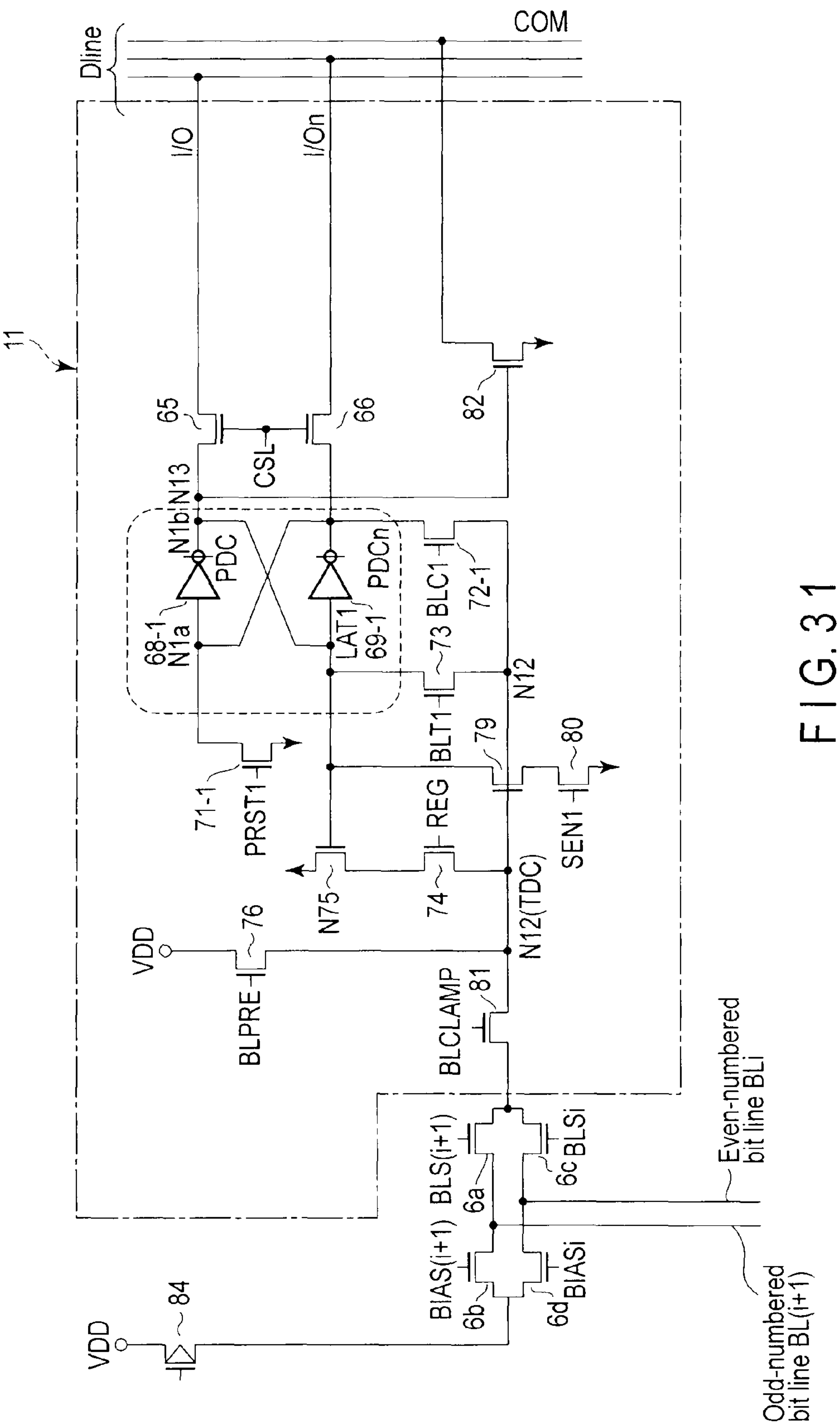
FIG. 31 is a schematic diagram of a sense unit according to a second variation of the first embodiment.

As illustrated in FIG. 31, a MOS transistor 78 is removed and further, a node N1*b* is connected in place of wiring 83 connected to a gate of a MOS transistor 82.

2. Operation 2-1. <Regarding Detecting Operation>

Next, an operation of the sense unit SU according to the second variation is described with reference to FIG. 32. Herein, a case of executing the detecting operation while performing the write operation is described as an example.

As illustrated in FIG. 32, the write operation is performed at a step S1 (time t1). Since the write operation is described in the above-described first embodiment, description of the operation is herein omitted.

Next, the write verify operation is performed at a step S2 (t2) in order to check whether data is written to a memory cell transistor MT at the step S1.

Thereafter, the sense unit SU prepares for a rewrite operation to be performed at a time t3 without waiting for a result of the detecting operation. A time at which rewriting is actually performed is set to t3 and this is made a step S5.

In the second variation, the detecting operation is executed between the above-described step S2 (time t2) and step S5 (time t3).

As illustrated in FIG. 32, the detecting operation at a step S3 is executed after the write verification at the above-described step S2. When a value of a PDC (node N1*b*) is at an 'L' level, the MOS transistor 82 is turned off, and as a result, an input/output data line $D_{line}$ (signal COM) is set to an 'H' level. Therefore, as a result of the detecting operation from a fail bit detecting circuit 11-1, a controller 8 judges that the writing is completed, and the controller 8 stops the rewrite operation at the above-described step S5 at a step S4 (time t2").

As illustrated in FIG. 32, a case in which the value of the PDC (node N1*b*) is at the 'H' level after the verify operation at the above-described step S2 is supposed. In this case, the MOS transistor 82 is turned on. That is to say, the input/output data line $D_{line}$ (signal line COM) is set to the 'L' level. As a result, the controller 8 judges that the writing is not completed and the rewrite operation at the step S5 is executed at the time t3.

In this manner, in contrast to a case in which preparation for the rewrite operation is made according to the result of the detecting operation by preparing for the rewrite operation regardless of the result of the detecting operation and by operating whether to stop the rewrite operation or to continue the rewrite operation depending on the result of the detecting operation as in the second variation, a reduction in time may be realized.

Meanwhile, although the write operation is described as an example, the above-described operation may be applied also to the erase operation.

Second Embodiment

Next, a semiconductor storage device according to a second embodiment is described. The semiconductor storage device according to this embodiment is configured to disperse a current, which flows through sense blocks $SB_1$ to $SB_{16}$ at the time of charge transfer. Specifically, a timing to set a signal SEN to 'H' is divided for each of the sense blocks $SB_1$ to $SB_{16}$ to disperse a timing of the current, which flows to MOS transistors 79 and 80 at the time of the charge transfer. Meanwhile, since a configuration is identical to that of the above-described first embodiment, the description thereof is omitted.

1. Operation 1-1. <Regarding Switching Operation>

Figure 4:
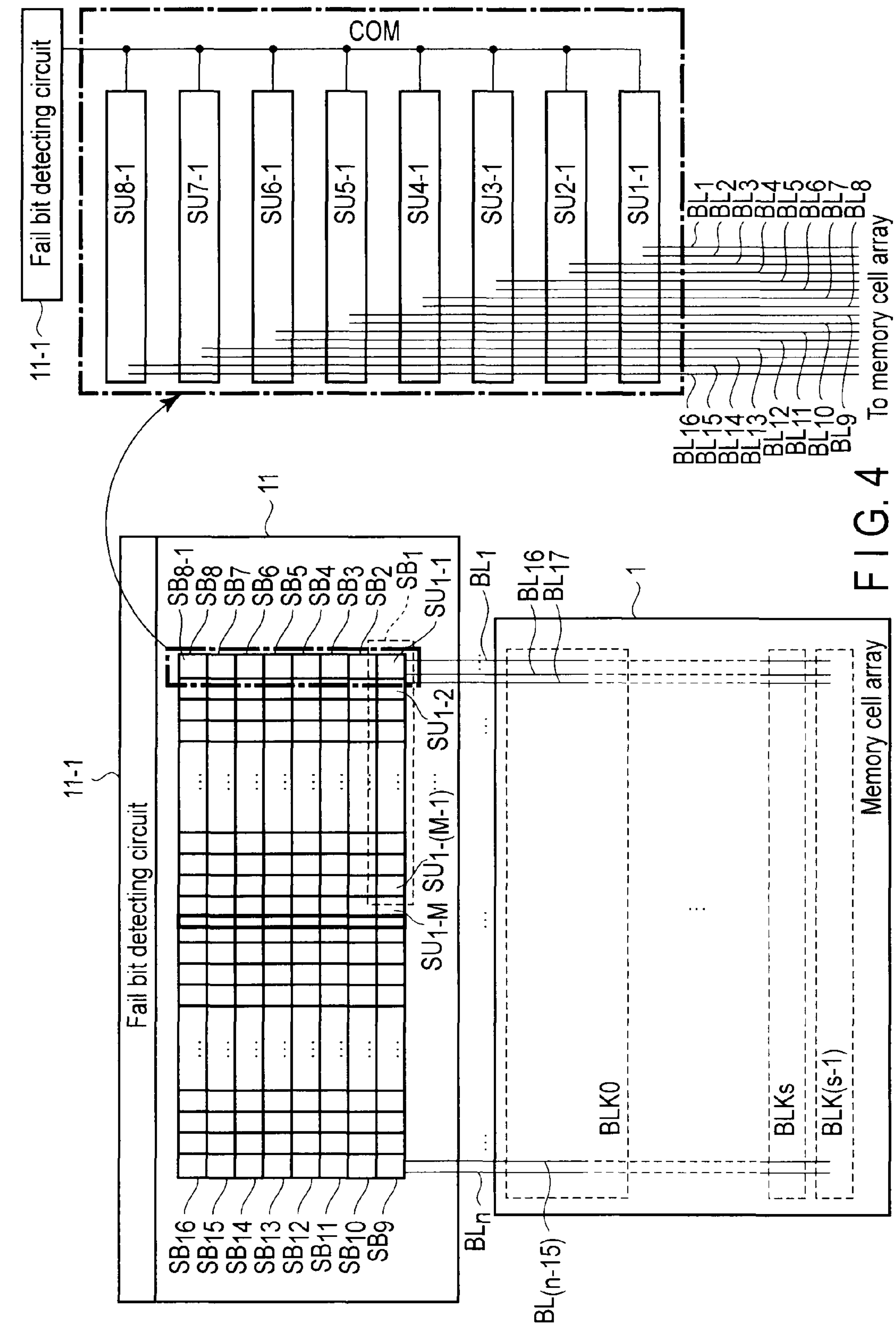
FIG. 4 is a configuration example of a sense amplifier according to the first embodiment.

A timing chart of the signal SEN to be supplied to a sense amplifier 11 illustrated in FIG. 4 is described with reference to FIG. 33. In this embodiment, the signals SEN of different timings are supplied to the sense blocks $SB_1$ to $SB_{16}$. Herein, the signals SEN to be supplied to the sense blocks $SB_1$ to $SB_{16}$ are set to signal $SEN_1$ to signal $SEN_{16}$. That is to say, the signal $SEN_1$ is simultaneously supplied to gates of the MOS transistors 80 of sense units $SU_{1-1}$ to $SU_{1-M}$. Also, the signal $SEN_2$ is simultaneously supplied to the gates of the MOS transistors 80 of sense units $SU_{2-1}$ to $SU_{2-M}$. Hereinafter, similarly, the signal $SEN_{16}$ is simultaneously supplied to the gates of the MOS transistors 80 of sense units $SU_{16-1}$ to $SU_{16-M}$. Time is represented along an abscissa axis, and the signals $SEN_1$ to $SEN_{16}$ and a signal BLCCLAMP are represented along a longitudinal axis.

As illustrated in FIG. 33, first, the signal BLCCLAMP at an 'H' level (voltage VSEN) is supplied to MOS transistors 81 provided on the sense blocks $SB_1$ to $SB_{16}$ at a time t0. According to this, a bit line BL and the sense unit SU corresponding to the same are electrically connected to each other. That is to say, potential of the bit line BL is transferred to wiring 83. Meanwhile, as described above, when a selected bit line is an even-numbered bit line BLi, MOS transistors 6*c* and 6*b* are turned on, and on the other hand, when a selected bit line BL is an odd-numbered bit line BL(i+1), MOS transistors 6*a* and 6*d* are turned on. Thereafter, at a time t1, the signal BLCCLAMP is set to an 'L' level to turn off the MOS transistor, that is to say, the bit line BL and the wiring 83 are electrically separated.

Next, at a time t2, the signal $SEN_1$ is set to an 'H' level. As a result, a PDC (node N1*b*) is connected to the ground. That is to say, suppose that the potential of the wiring 83 is at the 'H' level. Also, a case in which the PDC (node N1*b*) holds data at the 'H' level is supposed.

In this case, since both of the MOS transistors 79 and 80 are turned on, the PDC (node N1*b*) is connected to the ground, and a current flows out from a p-channel MOS transistor, which forms the PDC, to a source terminal of the MOS transistor 80 through the MOS transistor 79. This is referred to as a switching current. Thereafter, the signal $SEN_1$ is set to the 'L' level at a time t3. A time period from the time t2 to the time t3 is set to 50 ns. Hereinafter, intervals from a time t4 to a time t5, from a time t6 to a time t7, from a time t8 to a time t9, and from a time t10 to a time t11 are also set to 50 ns.

Next, at the time t4, the signal $SEN_2$ is set to the 'H' level and the above-described operation is also performed for the sense block SB2, and according to this, the switching current flows. Hereinafter, this is similar through the sense block $SB_{16}$, so that the description is omitted.

In this manner, the sense amplifier 11 capable of holding 2-kbyte data is divided into 16, for example, and generated signals $SEN_1$ to $SEN_{16}$ as many as the number of divisions are supplied to the MOS transistor 80 with a timing illustrated in FIG. 33.

Meanwhile, although the timing to supply the signal SEN at the 'H' level is herein described, this is similar for a signal PRST1. That is to say, for the signal PRST1 also, it is possible to disperse the current, which flows from the PDC, by shifting the timing of signals PRST$\mathbf{1}_1$ to PRST$\mathbf{1}_{16}$ generated for each of the sense blocks SB. A specific timing is obtained by replacing the signals $SEN_1$ to $SEN_{16}$ in FIG. 33 with the signals PRST$\mathbf{1}_1$ to PRST$\mathbf{1}_{16}$.

Effect According to Second Embodiment (2)

The semiconductor storage device according to this embodiment may improve a processing speed in addition to an effect (1) obtained by the above-described first embodiment. For comparison with a conventional example, an inverter system is described as an example.

In the inverter system, the sense unit SU is provided with a large-capacity capacitor as a TDC. The capacitor is provided for performing charge share. However, since the capacitor has a large capacity, it requires time for movement of the potential (charge) of the bit line BL and the charge of the capacitor. That is to say, the MOS transistor 81 should be in the on state until the movement of the charge is finished. Also, when the charge of the TDC is transferred to the PDC, since the capacitor has a large capacity, the time in which the current flows from the PDC to the TDC becomes longer. Also, since the current simultaneously flows from the PDC to the TDC in all the sense units SU provided in the sense amplifier 11, a large internal current flows.

On the other hand, as a forced inverting type is adopted in this embodiment, the capacitor is not used as the above-described TDC as illustrated also in FIG. 5.

That is to say, in a forced inverting type sense amplifier 11, the bit line BL performs the charge share with the wiring 83, so that the time in which the MOS transistor 81 is turned on may be shorter than that in the above-described inverter system. This is because the movement of the charge may be small since a wiring capacity of the wiring 83 is smaller than that of the capacitor.

Also, since the capacity of the wiring 83 is small, a time in which the current flows from the PDC to the wiring 83 becomes shorter than that of the inverter system. That is to say, although a timing to supply the signal SEN to the sense block SB is divided in this embodiment, a time required from the time t2 to the time t11 may be made shorter than the time to apply the current from the PDC to the TDC in the inverter system.

From the above, the processing speed may be improved.

Third Embodiment

Figure 34:
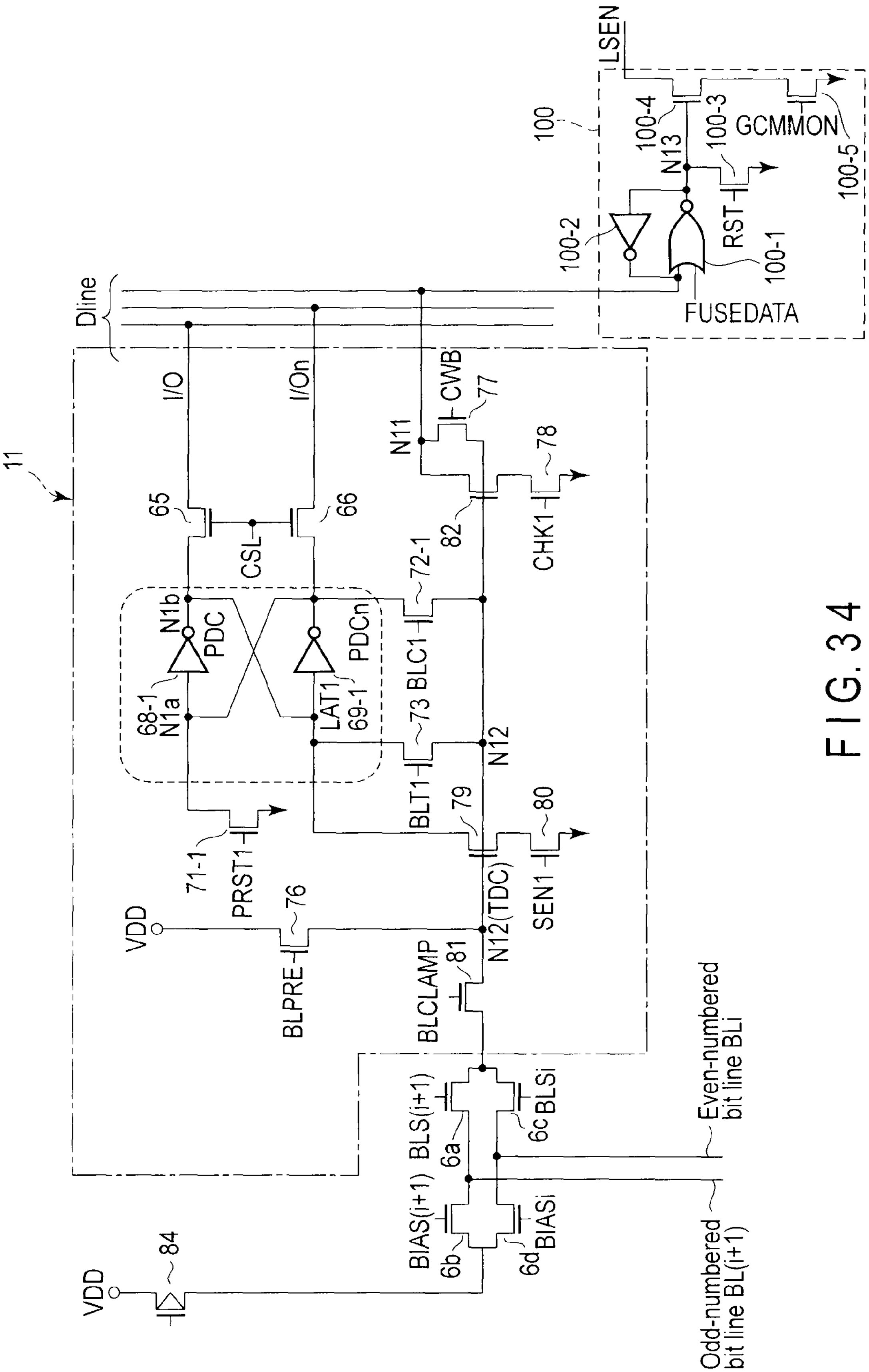
FIG. 34 is a schematic diagram of a sense unit according to a third embodiment.

Next, a semiconductor storage device according to a third embodiment is described with reference to FIG. 34. In the semiconductor storage device according to this embodiment, a configuration for performing NOT arithmetic in a sense unit SU in the above-described first embodiment is connected in common to a plurality of sense units SU in a column direction. Specifically, a configuration is such that a DDC and a MOS transistor 74 are removed and a common circuit is provided on a signal line COM connected in common to a plurality of sense units SU in the column direction.

1. Configuration 1-1. <Regarding Configuration Example of Sense Unit SU>

A configuration of the sense unit SU according to this embodiment is described with reference to FIG. 34. A common circuit 100 is provided with a logic circuit 100-1, an inverter 100-2, and n-channel MOS transistors 100-3, 100-4, and 100-5. The logic circuit 100-1 is a NOR circuit, for example. A value of a node N11 and a signal FUSEDATA are input to the NOR circuit 100-1. That is to say, when any of the signals is at an 'H' level, the NOR circuit 100-1 outputs a signal at an 'L' level to a node N13.

An input terminal of the inverter 100-2 is connected to the node N13 and an output terminal thereof is connected to one end (node N11) of a current pathway of a MOS transistor P75. The inverter 100-2 inverts a potential of the node N13 and transfers the inverted data to the node N11.

One end of a current pathway of the MOS transistor 100-3 is connected to the node N13, the other end thereof is connected to the ground, and a signal RST is supplied to a gate thereof.

A gate of the MOS transistor 100-4 is connected to the node N13 and one end of a current pathway thereof is connected to a data line $D_{line}$ (signal line COM).

One end of a current pathway of the MOS transistor 100-5 is connected to the other end of the current pathway of the above-described MOS transistor 100-4, the other end thereof is connected to the ground, and a signal GCOMMON is supplied to a gate thereof.

Meanwhile, the signal FUSEDATA is the signal indicating whether a block BLK on which attention is focused is a bad block BLK including a defect. When the block BLK is the bad block BLK, the signal FUSEDATA is set to the 'H' level. That is to say, when the signal FUSEDATA is at the 'H' level, the inverter 100-2 outputs the 'H' level to the wiring 83 through the MOS transistor P75. That is to say, the bit line BL is always at the 'H' level (non-selected potential).

The above-described common circuit 100 has a configuration which may be applied when performing an erase verify operation in the above-described first embodiment. The above-described common circuit 100 inverts the potential of the wiring 83 to which an odd-numbered bit line and an even-numbered bit line BLi transfer in each of the sense units SU. It is judged that erase verification is completed only when the potential of the odd-numbered bit line BL(i+1) and that of the even-numbered bit line BLi are set to the 'H' level by the erase verify operation and then held data of the PDC is set to the 'H' level after the inverting operation of the above-described common circuit 100. Hereinafter, a specific operation of the common circuit 100 is described.

2. Operation 2-1. <Regarding Operation of Common Circuit 100>

A NOT operation of the common circuit 100 is described with reference to FIGS. 35 to 37. Meanwhile, since the erase verification performed for the even-numbered bit line BLi and the odd-numbered bit line BL(i+1) is the same, only that for the even-numbered bit line BLi is herein described. Also, it is supposed that the operation in FIG. 21 or FIG. 24 is performed in advance and the potential of a node N12 is set to the 'H' level.

Figure 35:
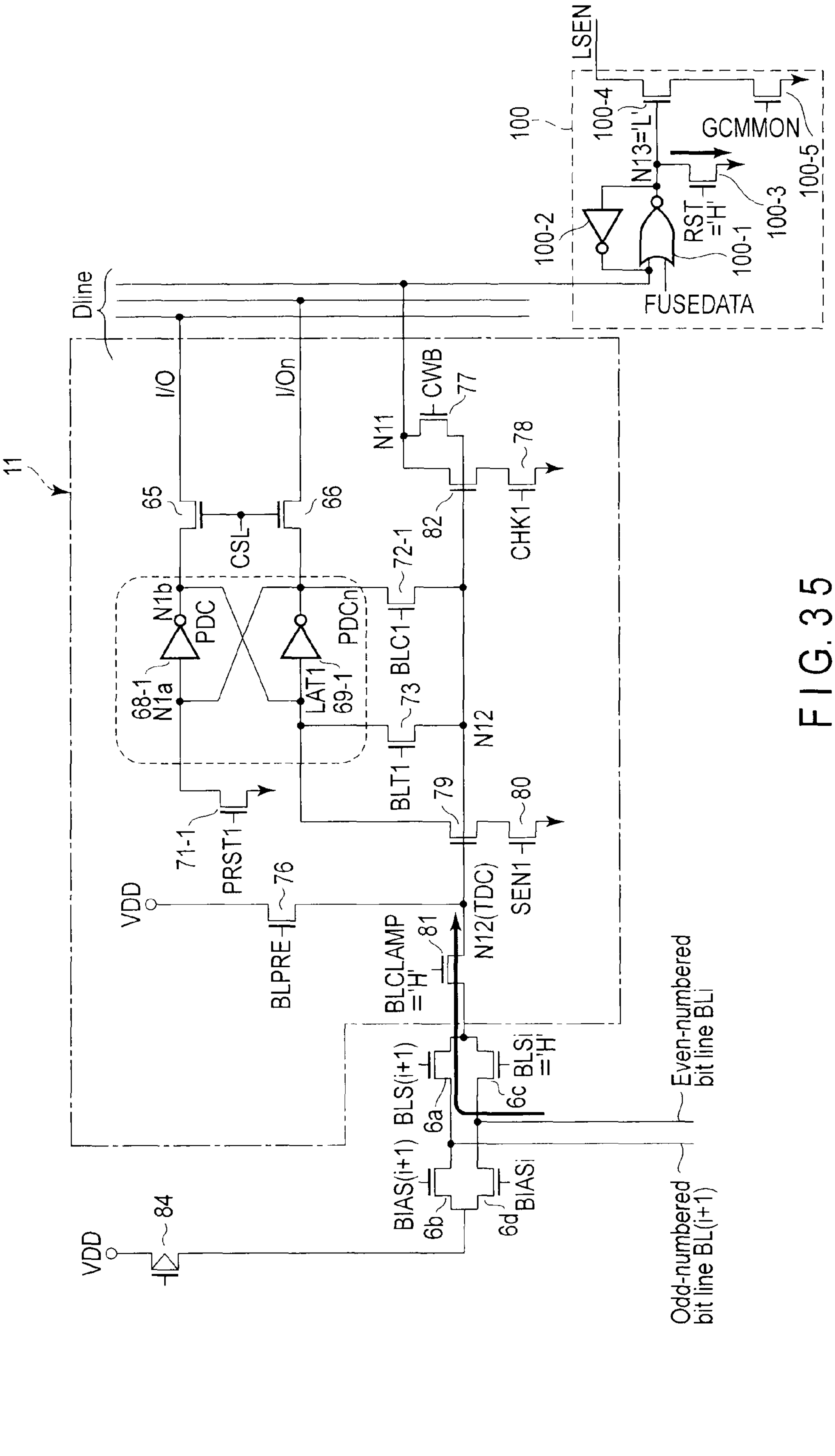
FIGS. 35-37 are a schematic diagram illustrating an erase-verify operation of the sense unit according to the third embodiment.

As illustrated in FIG. 35, by turning on a MOS transistor 6*c* and a MOS transistor 81, the even-numbered bit line BLi is electrically connected to the node N12. As described above, after the charge share, the potential of the node N12 is maintained at the 'H' level when the erase verification in the even-numbered bit line BLi is completed and transits to the 'L' level when this is not completed. Meanwhile, the PDC is herein reset. That is to say, a signal PRST1 is set to the 'H' level and the PDC (node N1*b*) is set to the 'H' level.

Next, the node N13 is reset to the 'L' level in the common circuit 100. That is to say, by turning on the MOS transistor 100-3, the node N13 is set to the ground potential.

Figure 36:
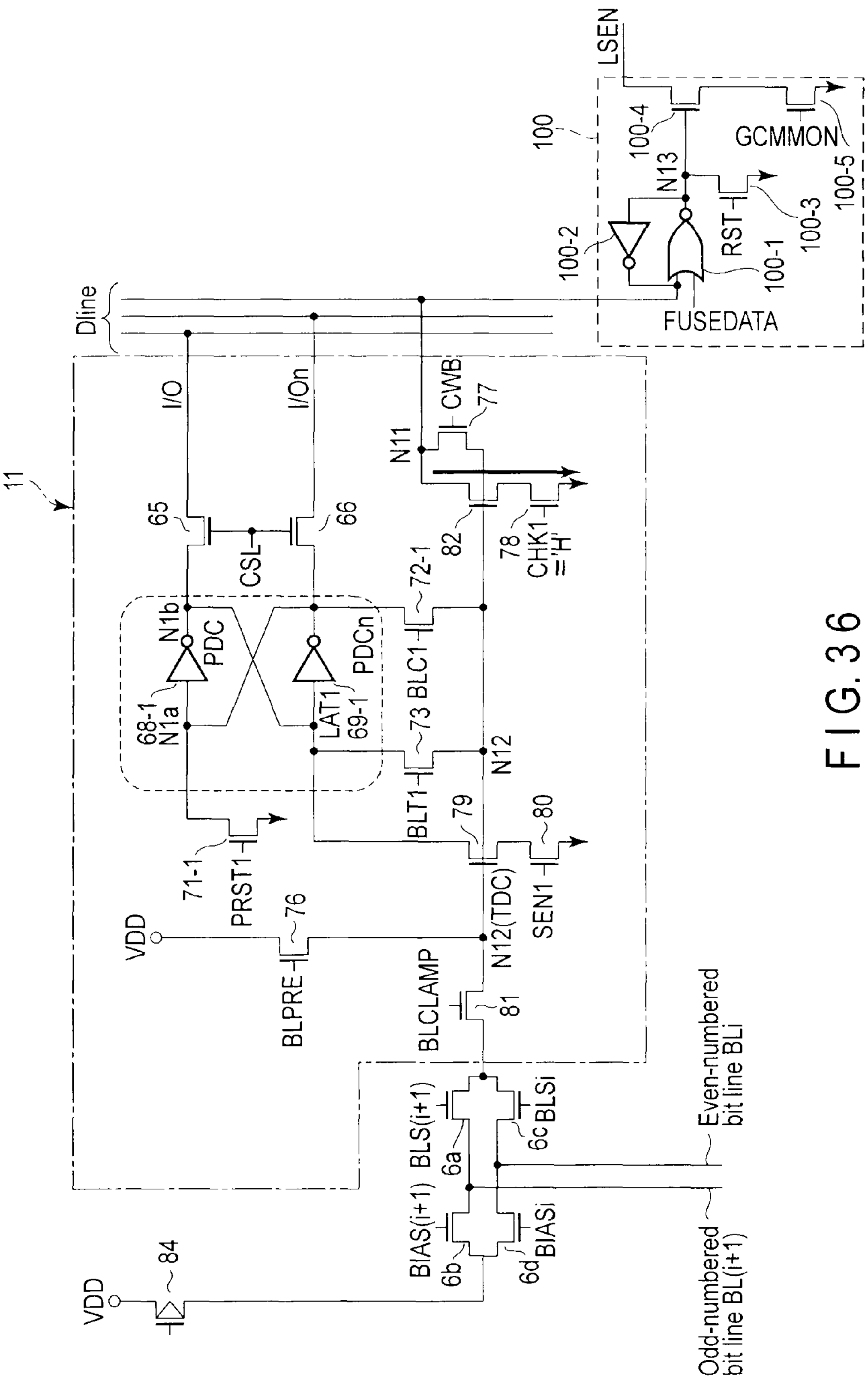
Figure 37:
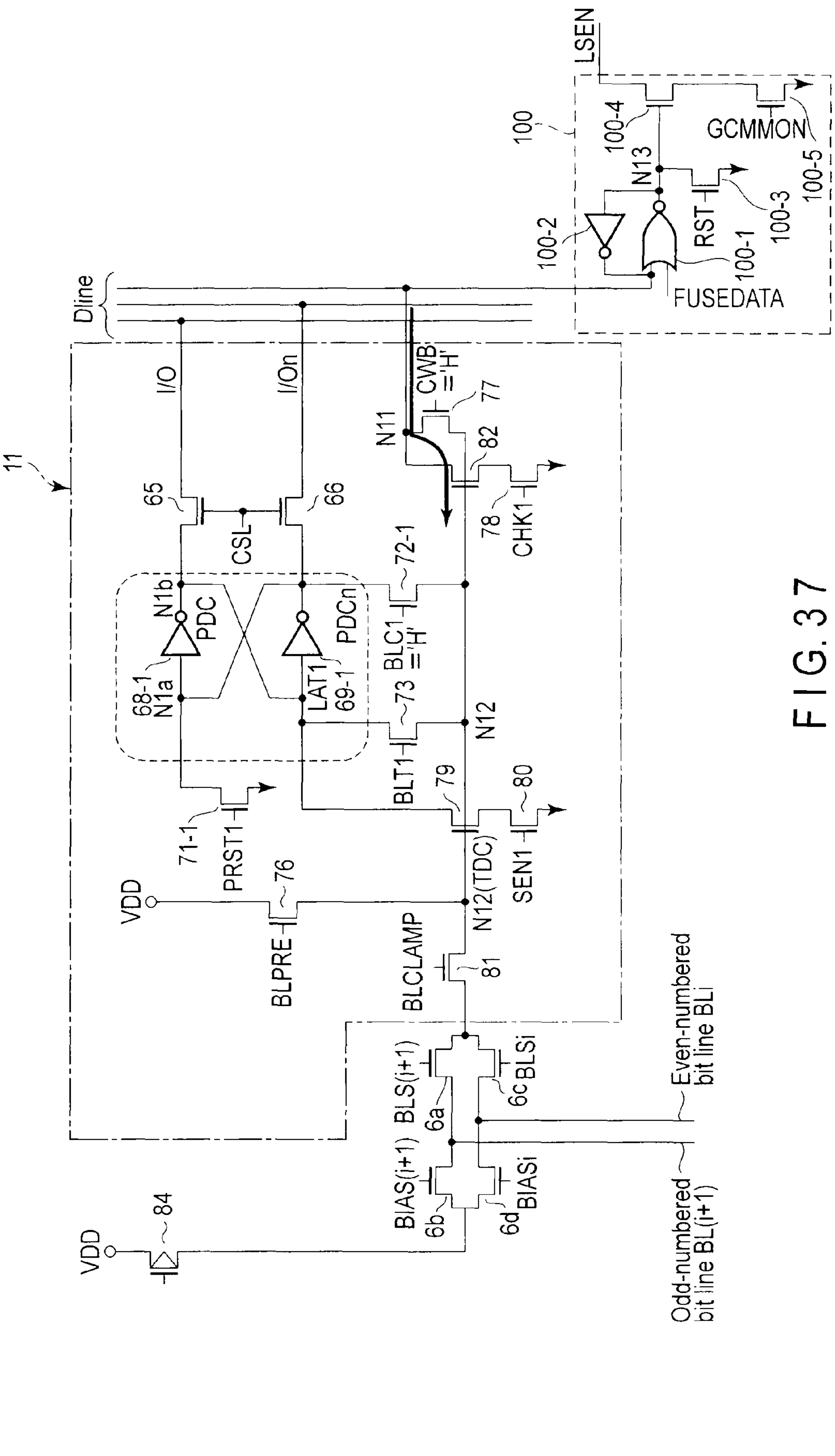

Next, a signal CHK1 is set to the 'H' level as illustrated in FIG. 36. As a result of the erase verification, if the potential of the node N12 is at the 'H' level, a MOS transistor 82 is turned on and the node N11 is set to the ground potential (indicated by an arrow in FIG. 36). That is to say, the node N11 is set to the 'L' level. The NOR circuit 100-1 performs arithmetic of a value of the 'L' level and the signal FUSEDATA. Herein, suppose that the block BLK on which attention is focused is not the bad block BLK. Then, since the signal FUSEDATA is at the 'L' level, the NOR circuit 100-1 outputs the 'H' level to the node N13.

On the other hand, as a result of the erase verification, when the potential of the node N12 is at the 'L' level, the NOR circuit 100-1 outputs the 'L' level to the node N13.

Next, a state in which arithmetic data is transferred from the common circuit 100 to the node N12 is described with reference to FIG. 37. When the potential of the node N11 is at the 'L' level, the inverter 100-2 outputs the 'L' level obtained by inverting the 'H' level output from the NOR circuit 100-1 to the node N11. Next, the MOS transistor P75 is turned on. According to this, the wiring (node N12) transits from the 'H' level to the 'L' level.

On the other hand, when the potential of the node N11 is at the 'H' level, the inverter 100-2 inverts the 'L' level of the node N13 to output the 'H' level to the node N11. Next, the MOS transistor P75 is turned on. According to this, the wiring (node N12) transits from the 'L' level to the 'H' level.

In this manner, when the potential of the node N12 is at the 'H' level after the charge share, the node N12 is inverted to the 'L' level by the common circuit 100. According to this, the PDC (node N1*b*) maintains the potential after reset, that is to say, the 'H' level.

On the other hand, when the potential of the node N12 is at the 'L' level after the charge share, the node N12 is inverted to the 'H' level by the common circuit 100. According to this, by turning on the MOS transistor 80, the PDC (node N1*b*) is set to the potential after the reset, that is to say, from the 'H' level to the ground potential.

The above-described operation is performed also for the odd-numbered bit line BL(i+1), and as a result, when the held data of the PDC (node N1*b*) is at the 'H' level, it is judged that the erase verification is completed, and when the data is at the 'L' level, it is judged that the erase verification is not completed. The operation to detect the same is described.

2-2. <Regarding Collective Detecting Operation>

As described above, when the erase verification is completed for both of the even-numbered bit line BLi and the odd-numbered bit line BL(i+1), the PDC (node N1*b*) of each sense unit SU holds the 'H' level. The data of the PDC (node N1*b*) is transferred to the wiring 83 by turning on the MOS transistor 72. When the erase verification is completed, the wiring 83 is set to the 'L' level. Therefore, the MOS transistor 82 is turned off and the potential of the node N11 is set to the 'H' level. Therefore, the NOR circuit 100-1 outputs the 'L' level to the node N13. According to this, the MOS transistor 100-4 is turned off. Therefore, even when the signal GCOMMON is set to the 'H' level, LSEN is not set to the ground potential and maintains the 'H' level. A controller 8, which receives this information from a fail bit detecting circuit 11-1, judges that the erase verification is completed.

On the other hand, when the erase verify operation is not completed, the PDC (node N1*b*) of the sense unit SU holds the 'L' level. In this case, the NOR circuit 100-1 outputs the 'H' level to the node N13. According to this, the MOS transistor 100-4 is turned on and the signal GCOMMON is set to the 'H' level, and according to this, the LSEN is set to the ground potential. In this case, the controller 8 judges that the erase verification is completed and executes an erase operation again.

Effect According to Third Embodiment (3)

The semiconductor storage device of this embodiment may realize a reduction of an area of the sense unit SU in addition to the above-described effect (1) of the first embodiment.

In the sense unit SU according to this embodiment, the DDC of the first embodiment is removed and the common circuit 100 connected in common to a plurality of sense units SU is provided. Therefore, the larger the number of the sense units SU provided in a NAND flash memory, the greater the effect of the reduction of the area by providing the common circuit 100.

Fourth Embodiment

Next, a semiconductor storage device according to a fourth embodiment is described. The semiconductor storage device according to this embodiment is provided with a configuration in which a 2-level sense amplifier 11 in the above-described first to third embodiments supports multi-level. That is to say, a secondary data cache (hereinafter, SDC) is provided in addition to a PDC.

1. Configuration 1-1. <Configuration Example of Sense Unit SU>

Figure 38:
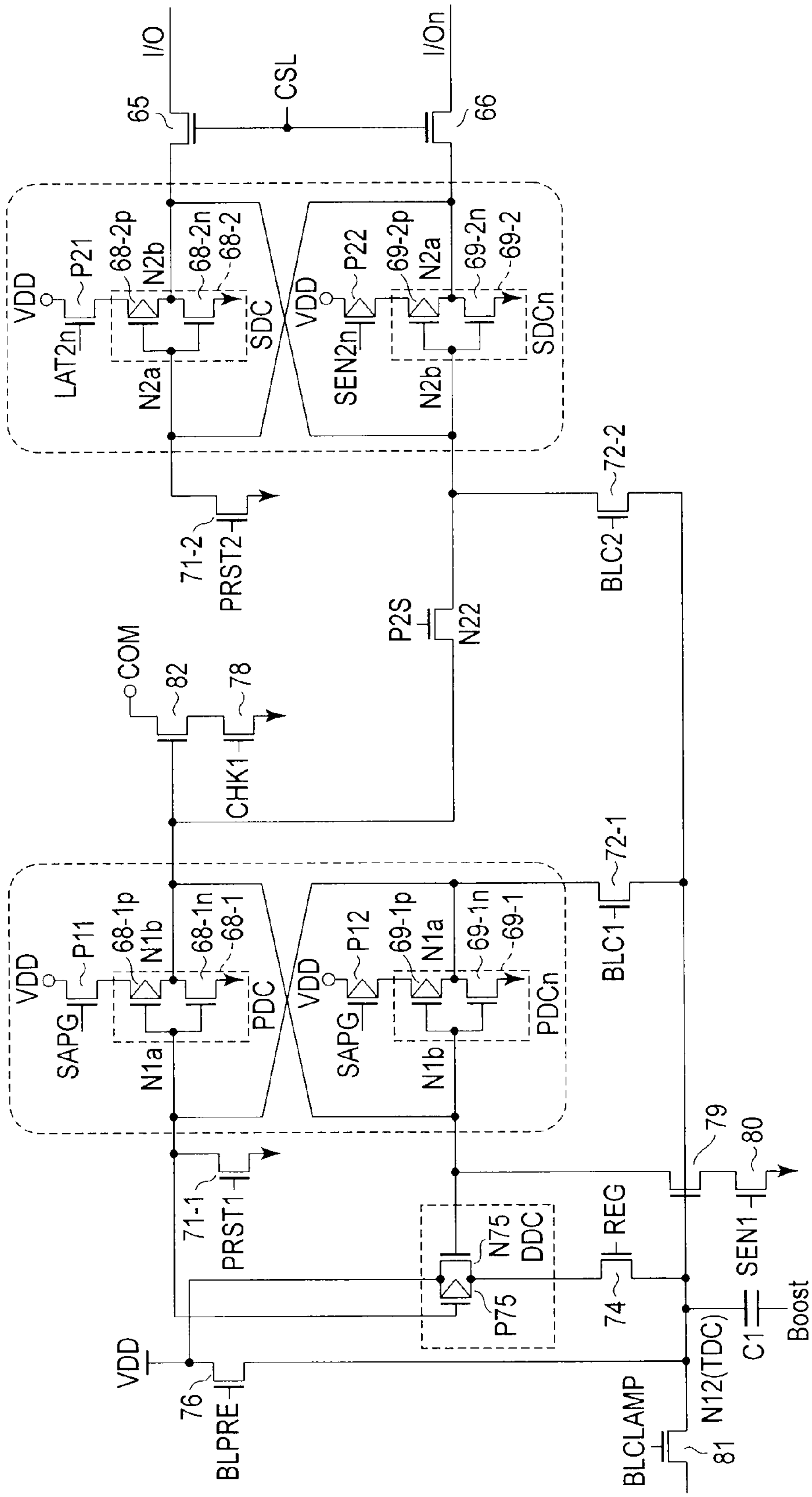
FIG. 38 is a schematic diagram of a sense unit according to a fourth embodiment.

A configuration of a sense unit SU according to this embodiment is illustrated in FIG. 38. Meanwhile, the configuration identical to that of the sense unit SU in the above-described first to third embodiments is not described. As illustrated in FIG. 38, one end of a current pathway of a column selection MOS transistor 65 is connected to a node N2*b* and the other end thereof is connected to an input/output data line $D_{line}$ (signal line I/O).

Also, one end of a current pathway of a column selection transistor 66 is connected to a node N2*a* and the other end thereof is connected to the input/output data line $D_{line}$ (signal line I/On). A signal at an 'L' level or an 'H' level is input/output from/to the input/output data line $D_{line}$ to/from the SDC and the PDC through the MOS transistors 65 and 66. Meanwhile, symmetrical signals are input/output to/from the signal lines I/O and I/On.

A column selection signal CSL is supplied to gates of the MOS transistors 65 and 66. That is to say, the MOS transistors 65 and 66 are turned on by the signal CSL, and according to this, the data is input/output from/to the data input/output circuit 8 to/from the sense unit SU through the input/output data line $D_{line}$.

The SDC holds input data when writing, holds read data when reading, and temporarily holds the data when verifying and is used to operate internal data when storing a higher-bit, for example, of multi-level data ('00', '10', '01', and '11', for example) of the memory cell transistor MT. At that time, the PDC is used for operating the internal data when storing a lower-bit, for example, of the multi-level data.

The SDC is provided with a latch circuit LAT2. The latch circuit LAT2 is formed of a combination of inverter 68-2 and 69-2. Also, the inverter 68-2 and 69-2 are formed of an n-channel MOS transistor and a p-channel MOS transistor.

An output terminal of the inverter 68-2 is connected to an input terminal of the inverter 69-2 at the node N2*b*, and an output terminal of the inverter 69-2 is connected to an input terminal of the inverter 68-2 at the node N2*a*.

One end of a current pathway of a MOS transistor 71-2 is connected to the node N2*a*, the other end thereof may be connected to the ground, and a signal PRST1 is supplied to a gate thereof.

Also, one end of a current pathway of a MOS transistor 72-2 is connected to the node N2*b*, the other end thereof is connected to a node N12 (wiring 83), and a signal BLC2 is supplied to a gate thereof. That is to say, the lower-bit held by the SDC once is transferred from the node N2*b* to the PDC through the MOS transistor 72-2 and the wiring 83.

One end of a current pathway of a MOS transistor N22 is connected to the node N2*b*, one other end of a current pathway of a MOS transistor N22 is connected to the node N1*b*.

Further the DDC is provided with a MOS transistor P75 in addition to a MOS transistor N75. In this embodiment, the DDC is provided with a function to temporarily hold the data of the PDC.

In the above-described configuration, the SDC performs reading, writing, write verification and the like of the data for the higher-bit, for example. The operation is similar to that of the above-described PDC, so that the description thereof is omitted.

Effect According to this Embodiment (4)

The semiconductor storage device according to this embodiment may also obtain an effect (1)-(3) similar to that of the above-described first to third embodiments. That is to say, a forced inverting type is adopted also in the sense amplifier 11 in this embodiment. Therefore, by omitting a capacitor device provided in an inverter system, reduction of an area of the sense amplifier 11 may be realized.

Further, a time for charge share of charge between a bit line BL and the node N12 may be reduced, for example. That is to say, since a time to charge the capacitor device and the like is not required, a processing speed may be improved.

<Third Variation>

Next, a semiconductor storage device according to a variation of the above-described fourth embodiment is described. In this variation, a configuration for performing NOT arithmetic in a sense unit SU illustrated in FIG. 38 is connected in common to a plurality of sense units SU in a column direction. Specifically, a configuration is such that a DDC is removed and a common circuit is provided on a signal line COM connected in common to a plurality of sense units SU in the column direction.

1. Configuration 1-1. <Configuration Example of Sense Unit SU>

A configuration example of the sense unit SU according to the variation is described with reference to FIG. 39. Meanwhile, the configuration identical to that in FIG. 38 is not described. As illustrated, the sense unit SU according to the variation has the configuration in which the DDC and a MOS transistor 74 are removed and a common circuit 200 is provided on the signal line COM connected in common to a plurality of sense units SU in the column direction. The common circuit 200 has a configuration in which a logic circuit 100-1, an inverter 100-2, and MOS transistors 100-3, 100-4, and 100-5 are replaced with a logic circuit 200-1, an inverter 200-2, and MOS transistors 200-3, 200-4, and 200-5, respectively.

Further, one end of a current pathway of a MOS transistor 150 is connected to a node N12, the other end thereof is connected to a node N11, and a signal CWB is supplied to a gate thereof.

<Effect According to Third Variation (5)>

The semiconductor storage device according to the variation may also obtain an effect (4) similar to that of the above-described third embodiment. That is to say, reduction of an area of the sense unit SU may be realized. In the sense unit SU according to the variation, the DDC of the fourth embodiment is removed and a common circuit 200 connected in common to a plurality of sense units SU is provided. Therefore, the larger the number of the sense units SU provided in a NAND flash memory, the greater the effect of the reduction of the area by providing the common circuit 200.

Meanwhile, the sense unit SU, which supports multi-level data, is also capable of measuring a cell current I, which flows to a channel of a memory cell transistor MT. In this case, a MOS transistor, one end of a current pathway of which is connected to a gate of a MOS transistor 134 and the other end of which may be connected to an input/output data line $D_{line}$ (signal line COM), may be provided. That is to say, a MOS transistor 150 may be provided as illustrated in FIG. 39. At that time, a signal Icellmon is supplied to a gate of the MOS transistor. Meanwhile, a method of measuring a cell current I is described above, so that the description thereof is omitted.

Fifth Embodiment

Next, a semiconductor storage device according to a fifth embodiment is described. The semiconductor storage device according to fifth embodiment has a configuration to inhibit a value of a current, which flows through a PDC, for example, at the time of sense operation. When the current, which flows through the PDC, is large at the time of the sense operation, the value of the current from a supply voltage, which will charge the PDC, also becomes large. As a result, a peak current, which passes from the PDC to a MOS transistor 80, increases and the supply voltage, which supplies power to a peripheral circuit including a sense unit SU, decreases.

In order to solve this, there is a method of increasing a gate width (W) of a switching transistor (NMOS) and increasing a gate length (L) of a transistor (PMOS), which forms a latch node, in order to prevent the peak current from increasing, to make the operation more stable. However, a circuit area might increase.

Therefore, this embodiment has a configuration in which a peak of a penetration current, which flows through the PDC and an SDC is inhibited in the sense unit SU as described above. It is hereinafter specifically described. Meanwhile, description of the configuration identical to that of the above-described first to third embodiments is omitted.

1. Configuration 1-1. <Sense Unit SU>

Hereinafter, a configuration of the sense unit SU according to this embodiment is described with reference to FIG. 40. The sense unit SU according to this embodiment is further provided with MOS transistors P11 and P12 in the PDC. Meanwhile, in this embodiment, in order to clarify a connecting relationship between the PDC and the MOS transistors P11 and P12, inverters 68-1 and 69-1 are represented using MOS transistors.

As illustrated in FIG. 40, the inverter 68-1 is provided with a p-channel MOS transistor 68-1*p* and an n-channel MOS transistor 68-1*n*. As illustrated, one end of a current pathway of the MOS transistor 68-1*p* is connected to one end of a current pathway of the MOS transistor 68-1*n* at a node N1*b* and a gate thereof is connected to a node N1*a*. The other end of the current pathway of the MOS transistor 68-1*n* is connected to the ground and a gate thereof is connected to the node N1*a*. The other end of the current pathway of the MOS transistor 68-1*p*, which forms the inverter 68-1, is connected to one end (drain side) of a current pathway of the MOS transistor P11. Also, an internal supply voltage VDD is supplied to the other end (source side) of the current pathway of the MOS transistor P11 and a current potential signal SAPG is applied to a gate thereof.

The inverter 69-1 is provided with a p-channel MOS transistor 69-1*p* and an n-channel MOS transistor 69-1*n*. As illustrated, one end of a current pathway of the MOS transistor 69-1*p* is connected to one end of a current pathway of the MOS transistor 69-1*n* at the node N1*a* and a gate thereof is connected to the node N1*b*. The other end of the current pathway of the MOS transistor 69-1*n* is connected to the ground and a gate thereof is connected to the node N1*b*. The other end of the current pathway of the MOS transistor 69-1*p*, which forms the inverter 69-1, is connected to one end (drain side) of a current pathway of the MOS transistor P12. Also, the internal supply voltage VDD is supplied to the other end (source side) of the current pathway of the MOS transistor P12 and the current potential signal SAPG is applied to a gate thereof.

The current potential signal SAPG is a gate potential signal generated by current copying means for inhibiting Ids of the MOS transistor P11 to Ido_P11/*n* (one n-th) when a saturation current of the MOS transistor P11 (drain=VDD, gate=VSS, and source=VSS) is set to Ido_P11. For example, in this embodiment, Ido_P11 is approximately several tens of μA. The peak current may be inhibited to approximately one-fifth by the current potential signal SAPG. It will be described in detail later.

Also, a DDC is provided with a p-channel MOS transistor in addition to an MOS transistor N75 in the first embodiment. Hereinafter, the p-channel MOS transistor is referred to as a MOS transistor 75*p*. One end of a current pathway of the MOS transistor 75*n* is connected to one end of a current pathway of a MOS transistor 76. Also, one end of a current pathway of the MOS transistor P75 is connected in common to one end of the current pathway of the MOS transistor N75. That is to say, one end of the current pathway of the MOS transistor P75 is also connected to one end of the current pathway of the MOS transistor 76. Further, the other end of the current pathway of the MOS transistor P75 is connected in common to the other end of the current pathway of the MOS transistor N75 and a gate thereof is connected to the node N1*a*. That is to say, when held data of the PDC (node N1*a*) is at an 'L' level, the voltage VDD is supplied to the DDC.

<2. Operation of Sense Unit SU>

2-1. <Data Read Operation>

Figure 41:
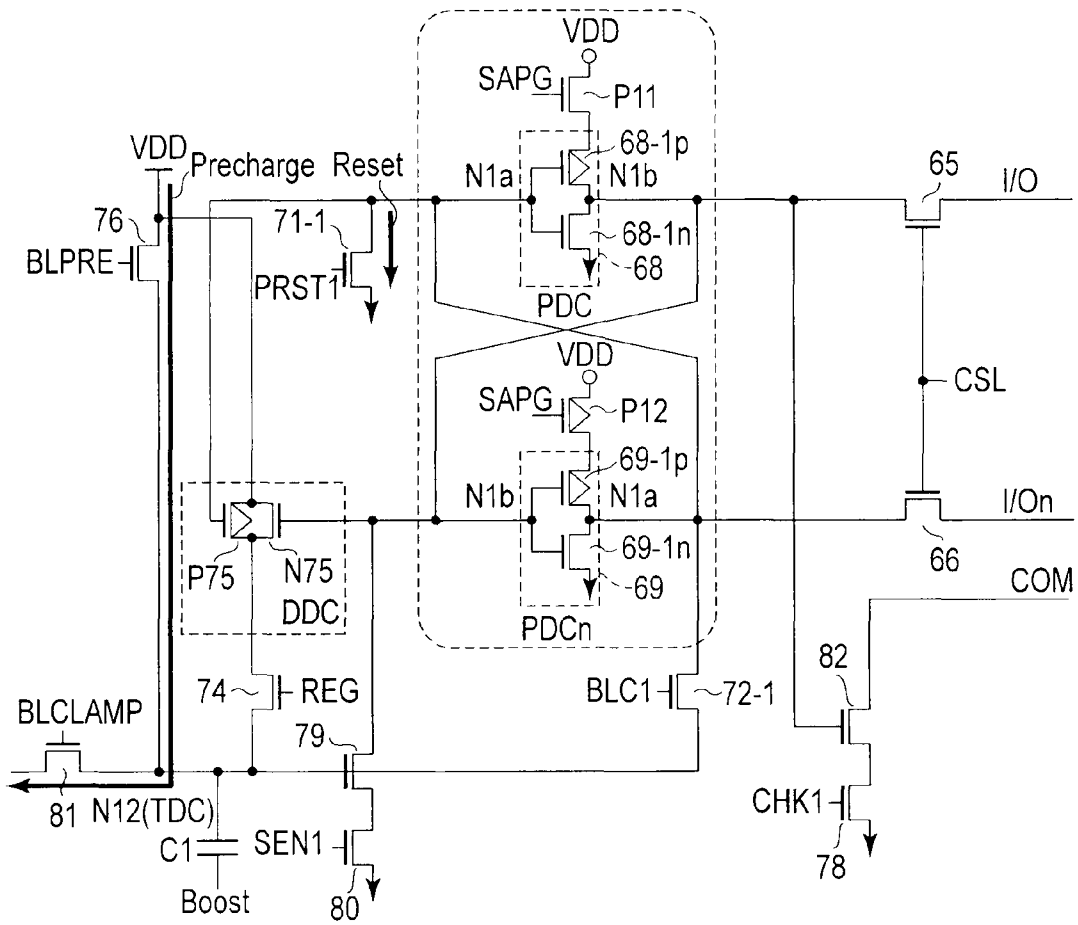
FIGS. 41 and 42 are a view illustrating a data read operation of the sense unit according to the first embodiment.

Next, a data read operation of the sense unit SU according to the first embodiment is described with reference to FIG. 41. Herein, a case in which an even-numbered bit line BLi is made a selected bit line BL is described as an example. Meanwhile, at that time, a voltage of an odd-numbered bit line BL(i+1) is charged up to a non-selected voltage (voltage VDD) at the time of the read operation. Meanwhile, description of the operation similar to that of the above-described first embodiment is omitted. That is to say, description of "precharge and reset", "discharge", and "charge transfer" described in the first embodiment is omitted in this embodiment.

<DDC Charge>

Subsequent to the precharge and reset, a signal PRST at an 'H' level is applied to a gate of a MOS transistor 71-1 to turn on the MOS transistor 71-1. According to this, the node N1*a* is connected to the ground, and node N1*a* is set to the 'L' level. Then, the node N1*b* is set to the 'H' level. Therefore, the MOS transistors N75 and P75 are turned on and the dynamic data cache (DDC) is charged. Meanwhile, at that time, when the supply voltage VDD is high, the PMOS transistor P75 in the dynamic data cache (DDC) is not necessary.

<Sense Operation>

Figure 42:
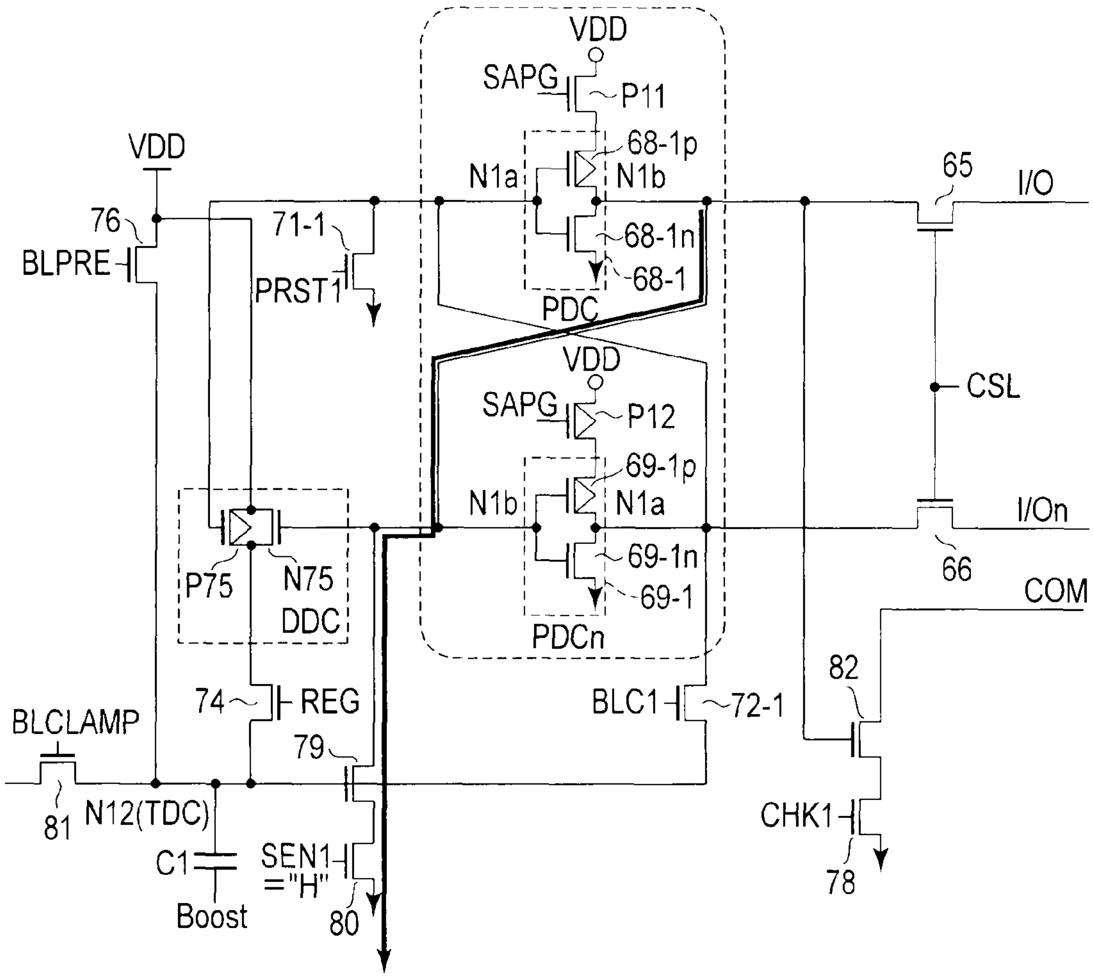

Subsequently, the sense operation is described with reference to FIG. 42. The sense operation is the operation to import a potential of the bit line BL (TDC) into the primary data cache PDC by setting a gate signal SEN1 of the MOS transistor 80 to the 'H' level as in the above-described first embodiment.

That is to say, as a result of conduction of a NAND string 15, when the potential of a node N12 (TDC) transits to zero potential, for example, the MOS transistor 79 is turned off, and the PDC (node N1*b*) holds the 'H' level even when the signal SEN1 is set to the 'H' level.

On the other hand, when the NAND string 15 is put into a non-conducting state and the potential of the node N12 (TDC) is maintained at the voltage VDD, the MOS transistor 79 is turned on. In this state, when the signal SEN1 is set to the 'H' level and the MOS transistor 80 is turned on, the node N1*b* is connected to the ground (for example, 'L' level=zero potential). That is to say, a switching current flows through the PDC and the node N1*b* of the PDC is inverted from the 'H' level to the 'L' level. In this manner, the PDC imports data at the 'L' or 'H' level according to the potential of the even-numbered bit line BLi to latch. The current potential signal SAPG ('$H_1$' level (for example, VDD/3) to narrow the gates of the MOS transistors P11 and P12 is applied when latching the data. Specifically, the current potential signal SAPG at the '$H_1$' level is applied to the MOS transistors P11 and P12 when setting the signal SEN1 to the 'H' level, that is to say, when turning on the MOS transistor 80. That is to say, the sense operation is performed in a state in which a current driving force of the MOS transistor P11 is inhibited. Herein, an amount of the current, which flows to the node N1*b*, depends on the current driving force of the MOS transistor P11.

Meanwhile, a timing to apply the current potential signal SAPG at the '$H_1$' level to the MOS transistors P11 and P12 may depend on the data imported by the PDC and the timing does not necessarily depend thereon. That is to say, the current potential signal SAPG is set to the '$H_1$' level only when the node N1*b* is connected to the ground and the current potential signal SAPG may be maintained at the 'L' level when this is not connected to the ground.

After the above-described read operation, a signal CSL is set to the 'H' level and read data is externally transferred. Specifically, the held data of the PDC is transferred to signal lines I/O and I/On through transistors 65 and 66, which are turned on.

2-2. <Data Write Operation>

Since a data write operation of the sense unit SU according to this embodiment is identical to write operation in the above-described first embodiment, description thereof is omitted.

2-3. <Write Verify Operation>

Next, a write verify operation of the sense unit SU according to this embodiment is described with reference to FIG. 43. Meanwhile, description of the operation identical to that of the above-described first embodiment is omitted. That is to say, the description of the "precharge", the "discharge", and the "charge transfer" is omitted. And a case in which the even-numbered bit line BLi is made the selected bit line BL is described as an example as in the above-described case.

<Sensing>

The sense operation is performed after the "precharge", the "discharge", and the "charge transfer" described in the first embodiment. That is to say, in this embodiment, the sense operation to set the gate signal SEN1 of the transistor 80 to the 'H' level to import the potential of the bit line BL (TDC) into the primary data cache PDC is performed while inhibiting the current driving force of the MOS transistors P11 and P12.

As described above, the data charged to the node N12 (TDC) by the "charge transfer" has a following relationship.

When the 'L' level is charged to the node N12 (TDC) when performing the write verification of '1' data, the transistor 79 is not put into a conducting state and the data is not imported into the PDC even when the signal SEN1 is set to the 'H' level. Therefore, the data latched into the node N1*b* is not inverted.

When the 'L' level is charged to the node N12 (TDC) when performing the write verification of '0' data, the transistor 79 is not put into the conducting state and the data is not imported into the PDC even when the signal SEN1 is set to the 'H' level. Therefore, the data latched into the node N1*b* is not inverted to be maintained at the 'H' level, so that writing of the '0' data is judged to fail.

When performing the write verification of the '0' data, when the 'H' level is charged to the node N12 (TDC), the MOS transistor 79 is turned on. Therefore, when the signal SEN1 at the 'H' level is applied to a gate of the transistor 80, the current flows through a pathway from the node N1*b* through the MOS transistor 79 to the MOS transistor 80. As a result, the data at the 'L' level of the node N12 (TDC) is imported into the PDC. That is to say, the data latched into the node N1*b* is inverted from the 'H' level to the 'L' level and the writing of the '0' data is judged to pass.

As the sense operation, the current potential signal SAPG applied to the MOS transistors P11 and P12 is set to the '$H_1$' level when the above-described signal SEN1 is set to the 'H' level. That is to say, the sense operation is performed in a state in which the current driving force of the MOS transistors P11 and P12 is inhibited. Also, the amount of the current, which flows to the node N1*b*, depends on the current driving force of the MOS transistor P11, as described above.

2-4. <Rewriting>

Subsequently, when the above-described writing is judged to fail, rewriting of the data is performed. Herein, since a rewrite operation of the data is identical to that of the above-described first embodiment, description thereof is omitted.

2-5. <Data Erase/Erase Verify Operation>

First, a data erase operation of the sense unit SU according to the first embodiment is described with reference to FIGS. 44 to 46. Meanwhile, description of the operation identical to that of the above-described fifth embodiment is omitted.

<Data Erasing>

As illustrated in FIG. 44, as in the above-described first embodiment, a gate signal BLPRE and a signal BLCCLAMP of the transistor 76 and a transistor 81, respectively, are set to the 'H' level also in this embodiment. According to this, the current is applied to the MOS transistors 76 and 81 and the potential of a drain terminal of the MOS transistor 81 is set to the voltage VDD.

Further, by setting such that the potential of a signal BLSi and a signal BLS(i+1)<voltage VDD, cut off characteristics of the MOS transistors 6*a* and 6*c* are improved. That is to say, as described above, when applying 20 V, for example, to a well region and applying 0 V to a gate electrode to draw charge, that is to say, at the time of the erase operation, the cut off characteristics of MOS transistors 6*a* and 6*c* are improved such that a high voltage is not transferred to a sense amplifier 11 through a contact plug and the bit line BL.

As illustrated in FIG. 45, the signal BLCCLAMP and the signal BLPRE are continuously set to the 'H' level. That is to say, the MOS transistors 76 and 81 are turned on and the potential of the node N12 (TDC) is set to the voltage VDD.

Figure 46:
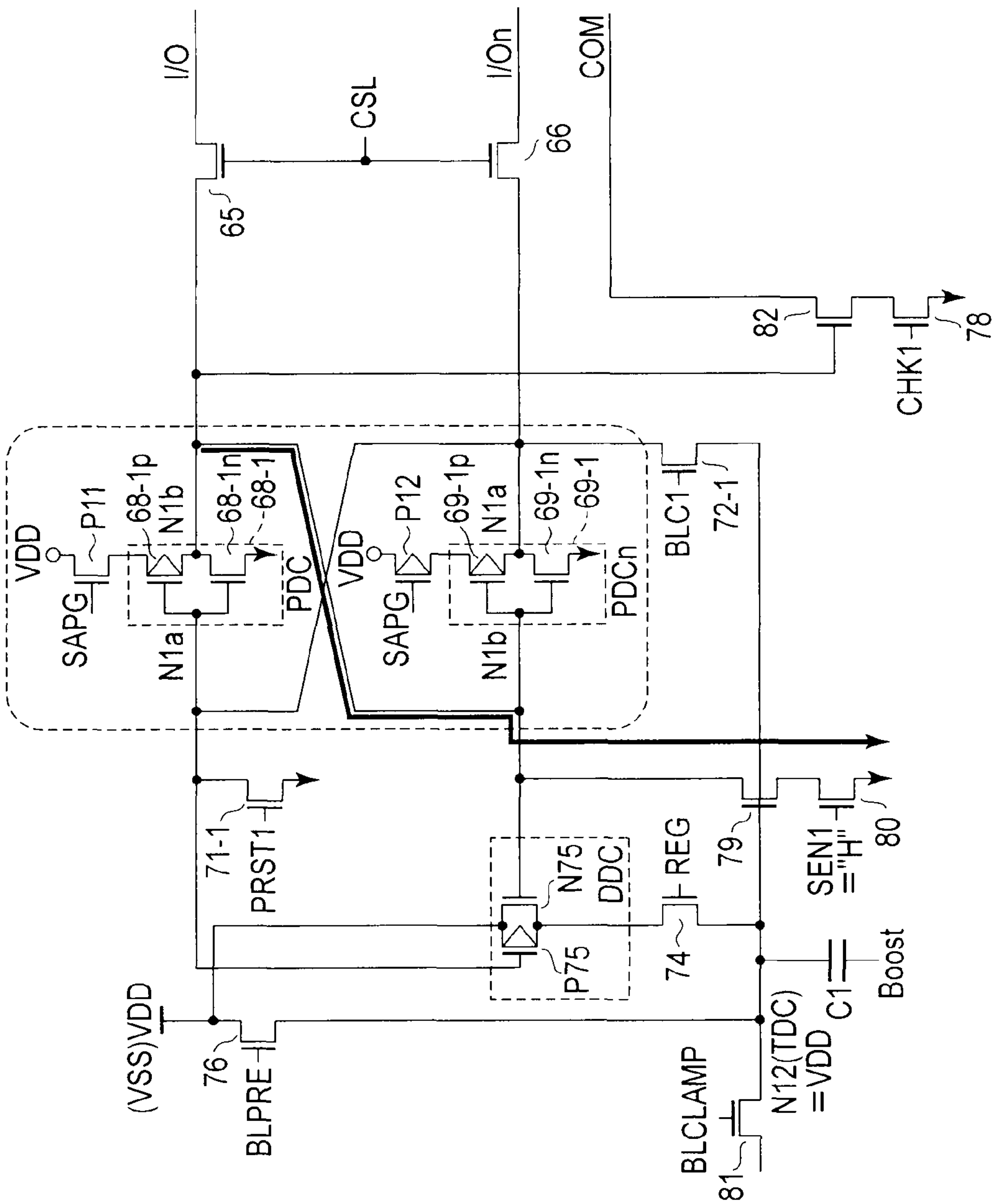

Next, as illustrated in FIG. 46, the potential of the node N12 (TDC) is imported into the PDC. That is to say, by setting the signal SEN1 to the 'H' level, the data at the 'L' level is latched into the PDC (node N1*b*).

<Erase Verification>

Next, an erase verify operation in the above-described configuration is described with reference to FIGS. 47 to 50. Although the voltage VDD is transferred from a source line driver to the sense unit SU in the above-described first embodiment, the bit line BL is charged by a precharge pathway in the sense unit SU in an erased state in this embodiment. An operation other than this is identical to that of the above-described first embodiment. That is to say, the erase verify operation is alternately performed for the even-numbered bit line BLi and the odd-numbered bit line BL(i+1) and the erase verify operation is completed when it is confirmed that written data of a memory cell transistor MT is erased for both of the even-numbered bit line BLi and the odd-numbered bit line BL(i+1). Specifically, when the held data of the PDC is at the 'L' level after the erase verification, a controller 8 judges that the erase verification is completed based on information from a fail bit detecting circuit 11-1. Although the erase verify operation of the even-numbered bit line BLi is also described, description of the identical operation is omitted.

<Regarding Even-Numbered Bit Line BLi>

<Precharge>

Figure 47:
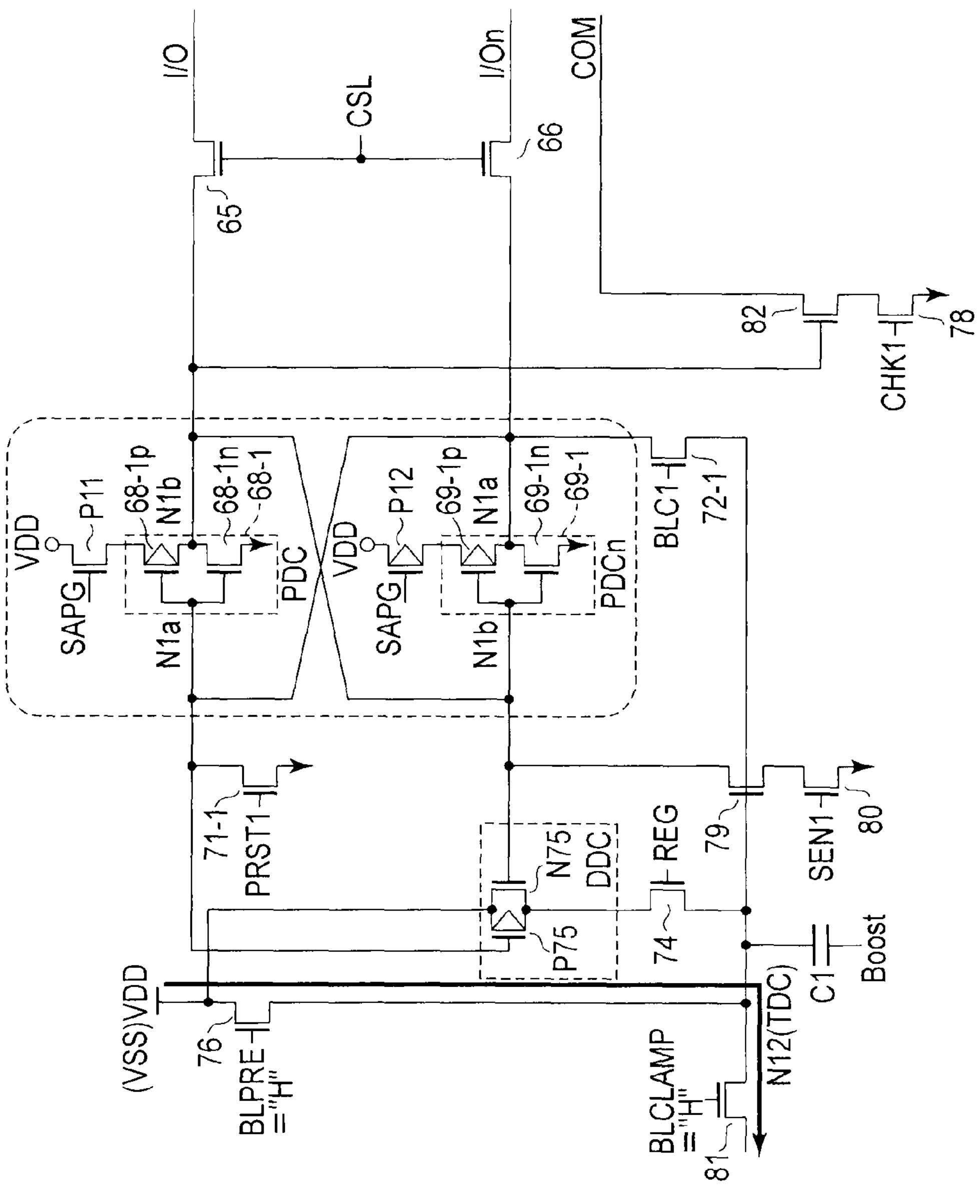
FIGS. 47-52 are a view illustrating a data erase/erase-verify operation of the sense unit according to the fifth embodiment.

As illustrated in FIG. 47, the signal BLCCLAMP and the signal BLPRE are set to the 'H' level to turn on the MOS transistors 76 and 81, respectively. According to this, the bit line BL is precharged through the MOS transistors 76 and 81.

<Discharge and TDC Charge>

Figure 48:
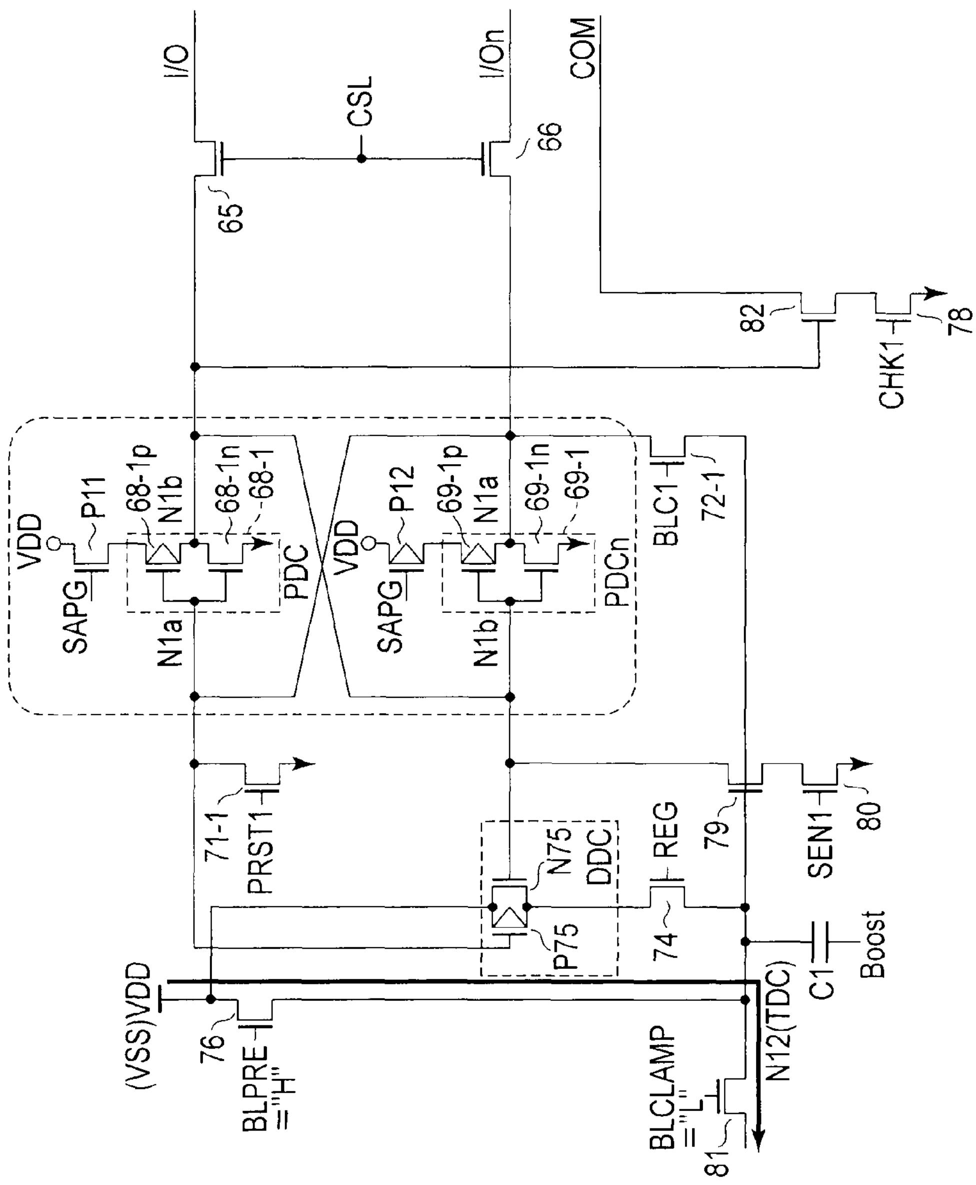

Next, as illustrated in FIG. 48, the signal BLCCLAMP is set to the 'L' level to turn off the MOS transistor 81. Next, a voltage VCGR is transferred to all word lines WL and transition of the potential of the bit line BL is waited for. Also, the signal BLPRE at the 'H' level is applied to the MOS transistor 76 and the node N12 (TDC) is charged up to the voltage VDD.

<Charge Transfer>

Figure 49:
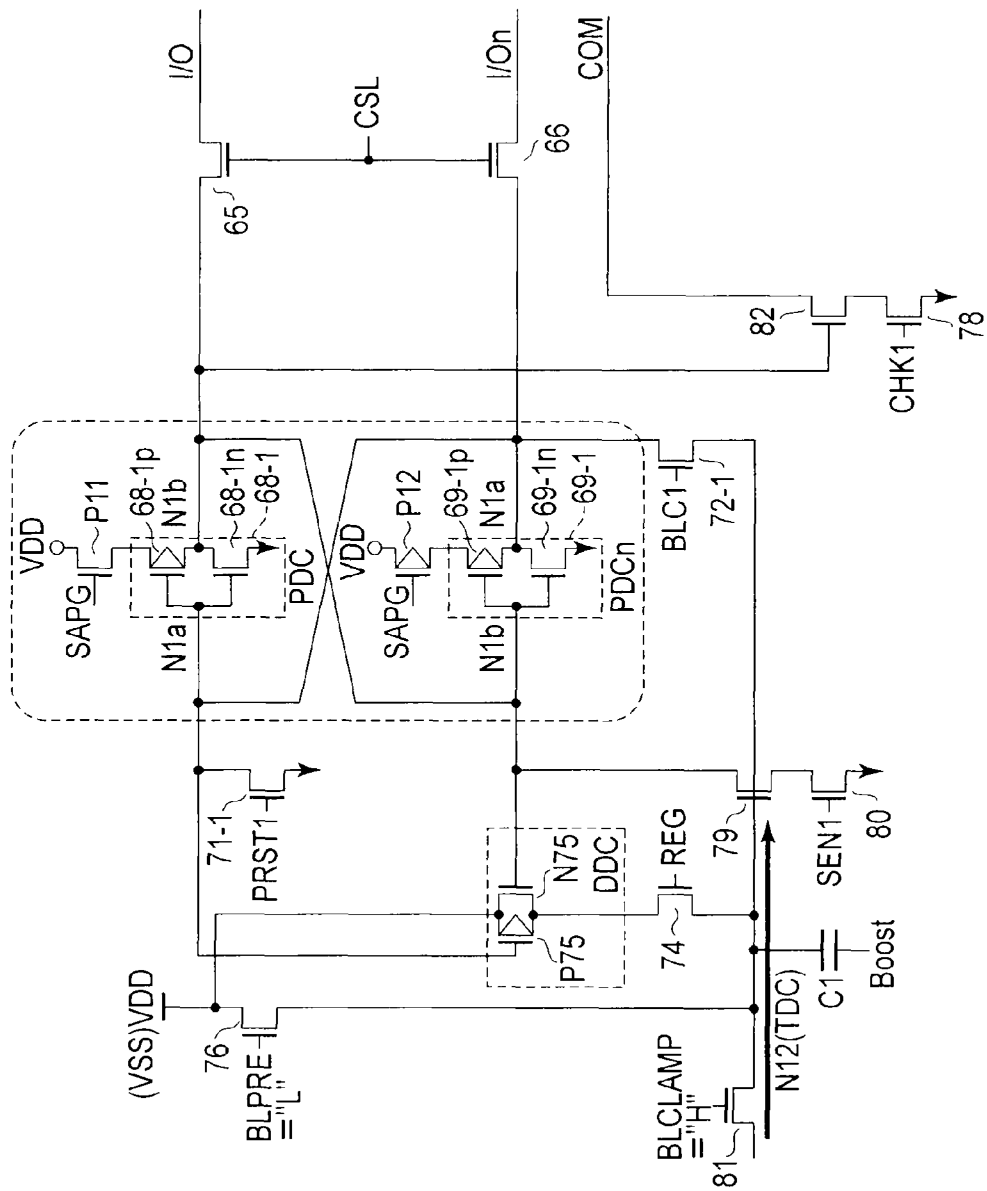

Next, as illustrated in FIG. 49, the potential of the bit line BL is transferred to the node N12 (TDC) while setting the signal BLPRE to the 'L' level to turn off the transistor 76. That is to say, the signal BLCCLAMP is set to the 'H' level to electrically connect the even-numbered bit line BLi to the node N12 (TDC). If all the memory cell transistors MT connected to the even-numbered bit line BLi are in the erased state, the potential of the even-numbered bit line BLi is set to the 'H' level even after charge share (erase verification passes).

On the other hand, if there is any memory cell transistor MT, which is not in the erased state, the potential of the even-numbered bit line BLi is set to the 'L' level (precharge voltage) even after the charge share (erase verification fails).

<Held Data of DDC='L' Level>

Figure 50:
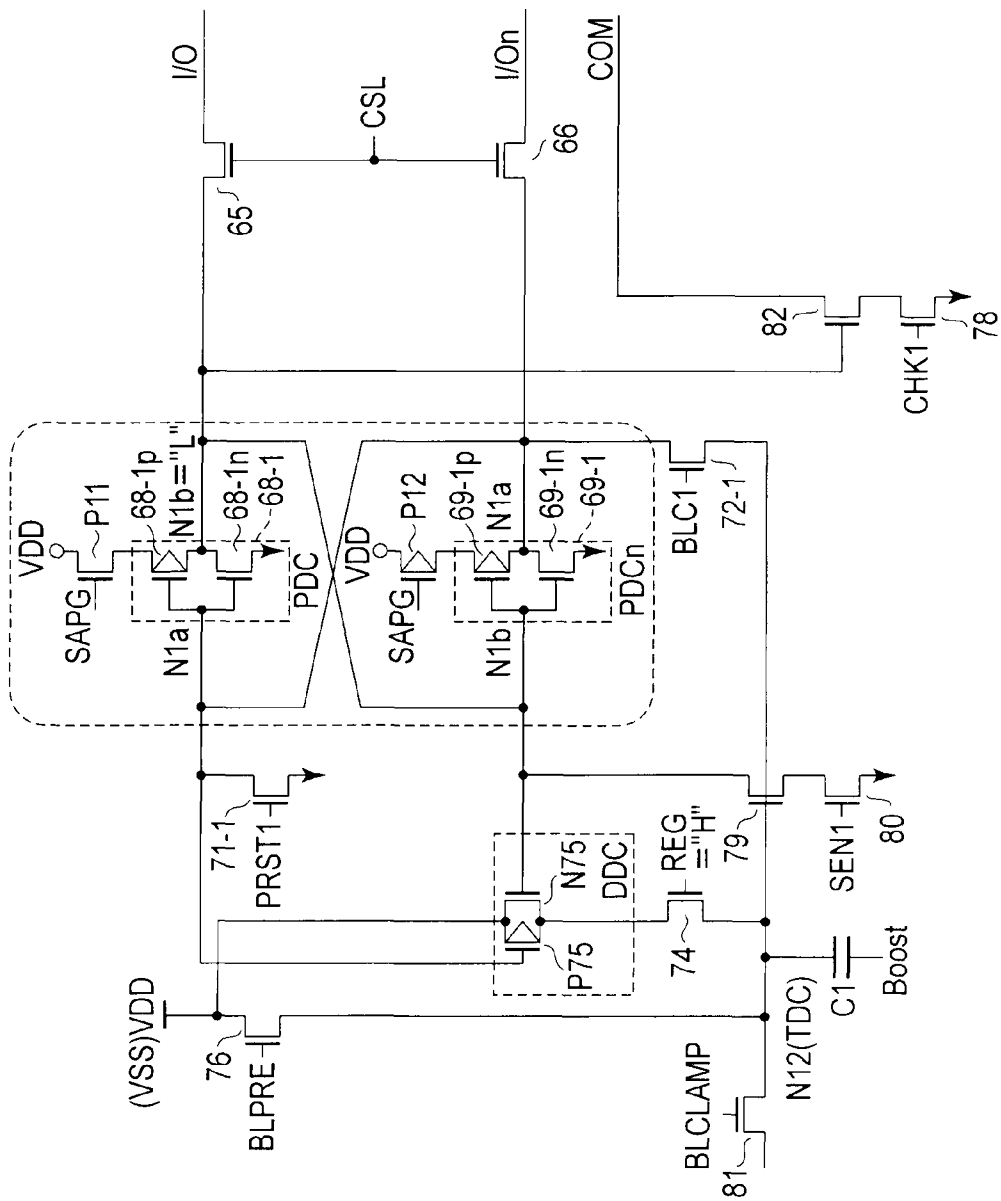

Thereafter, as illustrated in FIG. 50, a signal REG is set to the 'H' level to turn on the MOS transistor 74. Also, the node N1*b* and the node N1*a* of the PDC are at the 'L' level and at the 'H' level, respectively, so that the DDC are turned off (both of the MOS transistors N75 and P75 are turned off).

<RESET>

Figure 51:
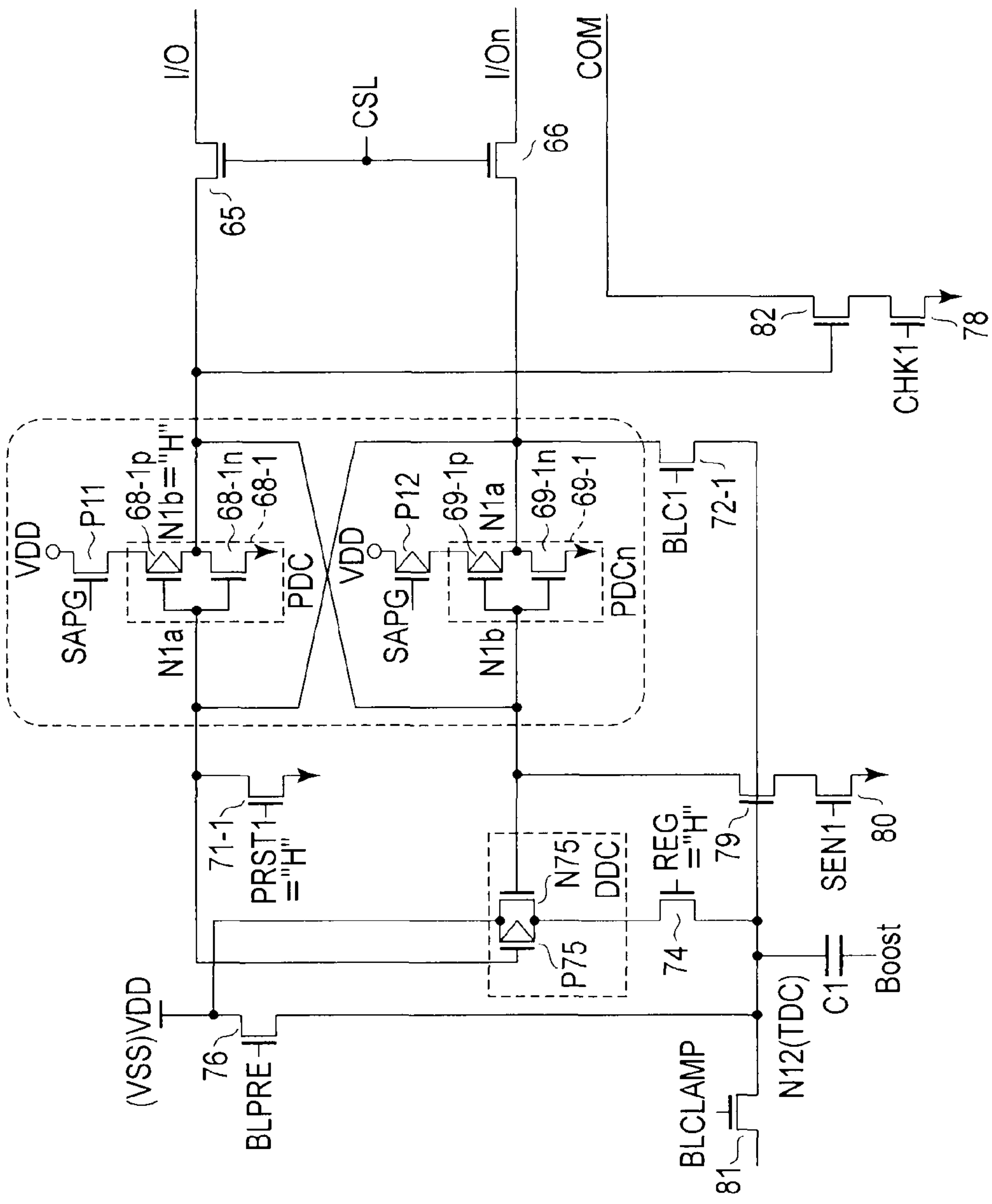

Further, a reset operation of the PDC is performed as illustrated in FIG. 51. That is to say, the signal PRST1 is set to the 'H' level to turn on the MOS transistor 71-1, thereby connecting the node N1*a* to the ground. According to this, the node N1*b* is set to the 'H' level, the node N1*a* is set to the 'L' level, and the data latched into the PDC is inverted.

<Sensing>

Figure 52:
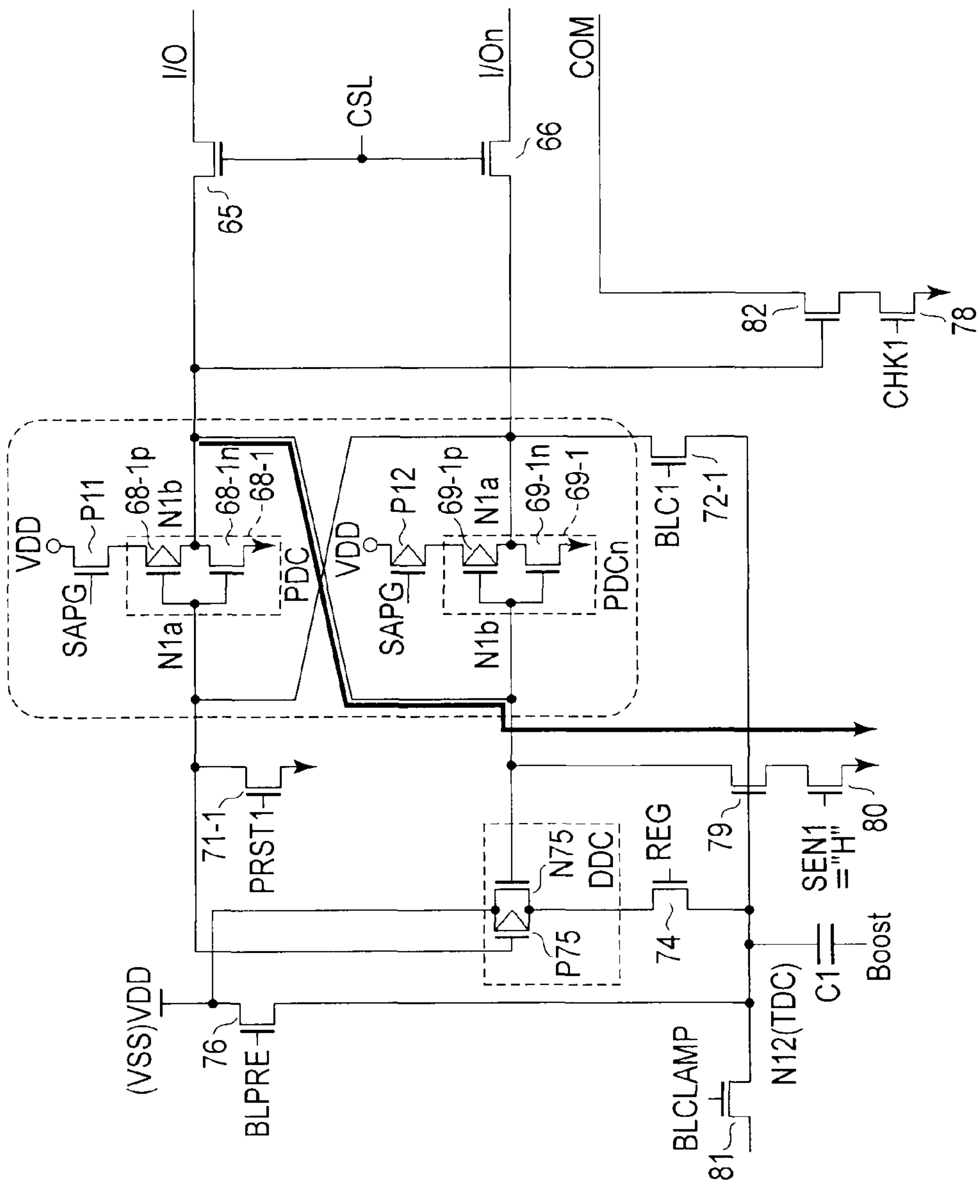

Thereafter, as illustrated in FIG. 52, the sense operation to import the potential of the node N12 (TDC) into the PDC is performed. At that time, when the node N12 (TDC) is at the 'H' level, that is to say, when the erase verification passes, the MOS transistor 79 is turned on. Therefore, when the signal SEN1 is set to the 'H' level, the held data of the PDC transits from the 'H' level to the 'L' level.

On the other hand, when the node N12 (TDC) is at the 'L' level, that is to say, when the erase verification fails, the MOS transistor 79 is turned off. Therefore, even when the signal SEN1 is set to the 'H' level, the held data of the PDC is held at the 'H' level.

In the sense operation in the erase verify operation also, the current potential signal SAPG applied to the MOS transistors P11 and P12 are set to the '$H_1$' level when the above-described signal SEN1 is set to the 'H' level. That is to say, the sense operation is performed in a state in which the current driving force of the MOS transistors P11 and P12 is inhibited. Also, the amount of the current, which flows to the node N1*b*, depends on the current driving force of the MOS transistor P11 as described above. Meanwhile, since the erase verify operation of the odd-numbered bit line BLi is possible as in the above case, detailed description thereof is omitted.

Continuously, erase verify arithmetic and collective detection (serial mode) as described above are performed. In this embodiment also, the erase verify arithmetic and the collective detection are identical to those of the above-described first embodiment, the description thereof is omitted.

2-6. <NOT Arithmetic>

Figure 53:
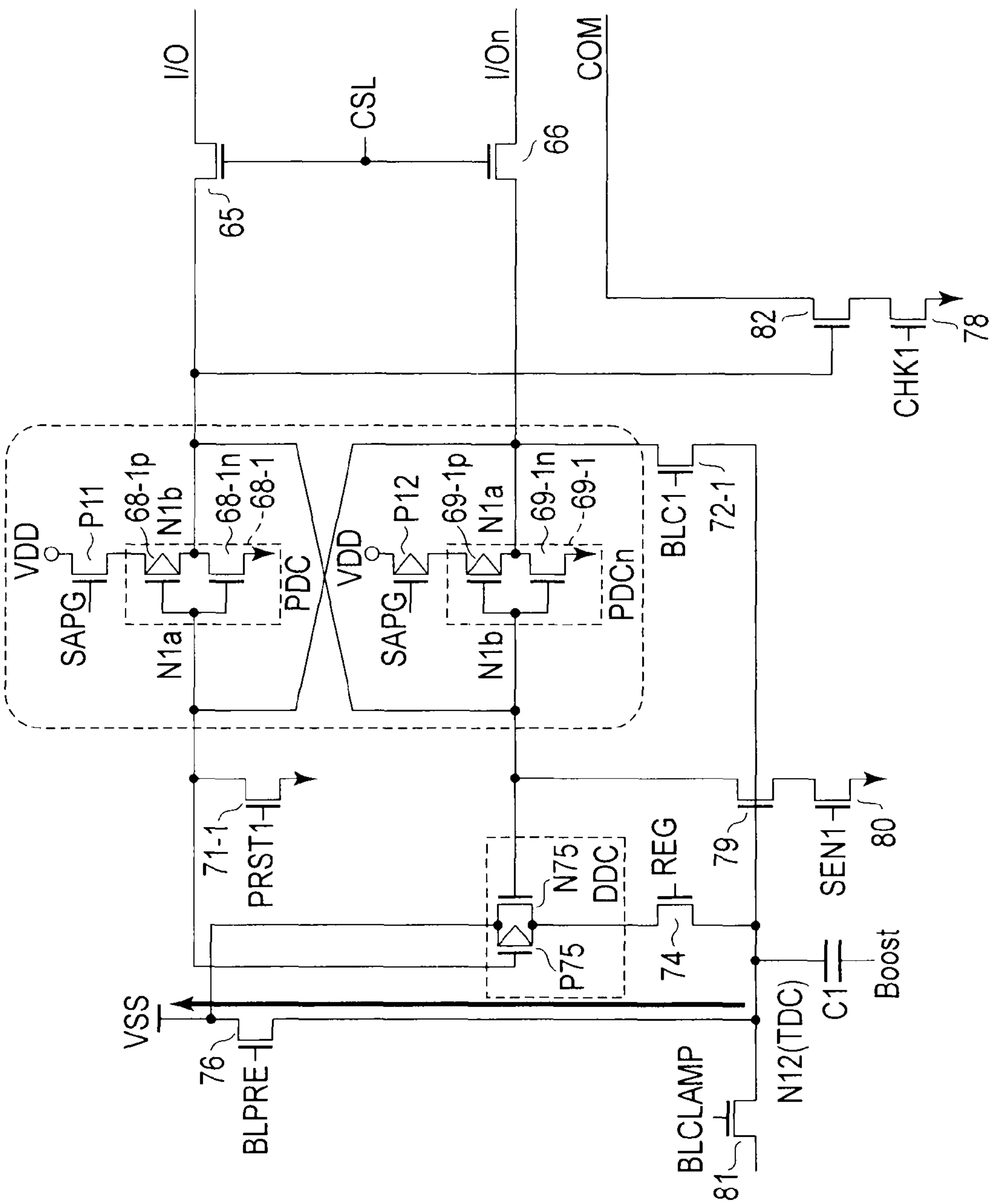
FIG. 53 is a view illustrating a NOT arithmetic operation of the sense unit according to the fifth embodiment.
Figure 54:
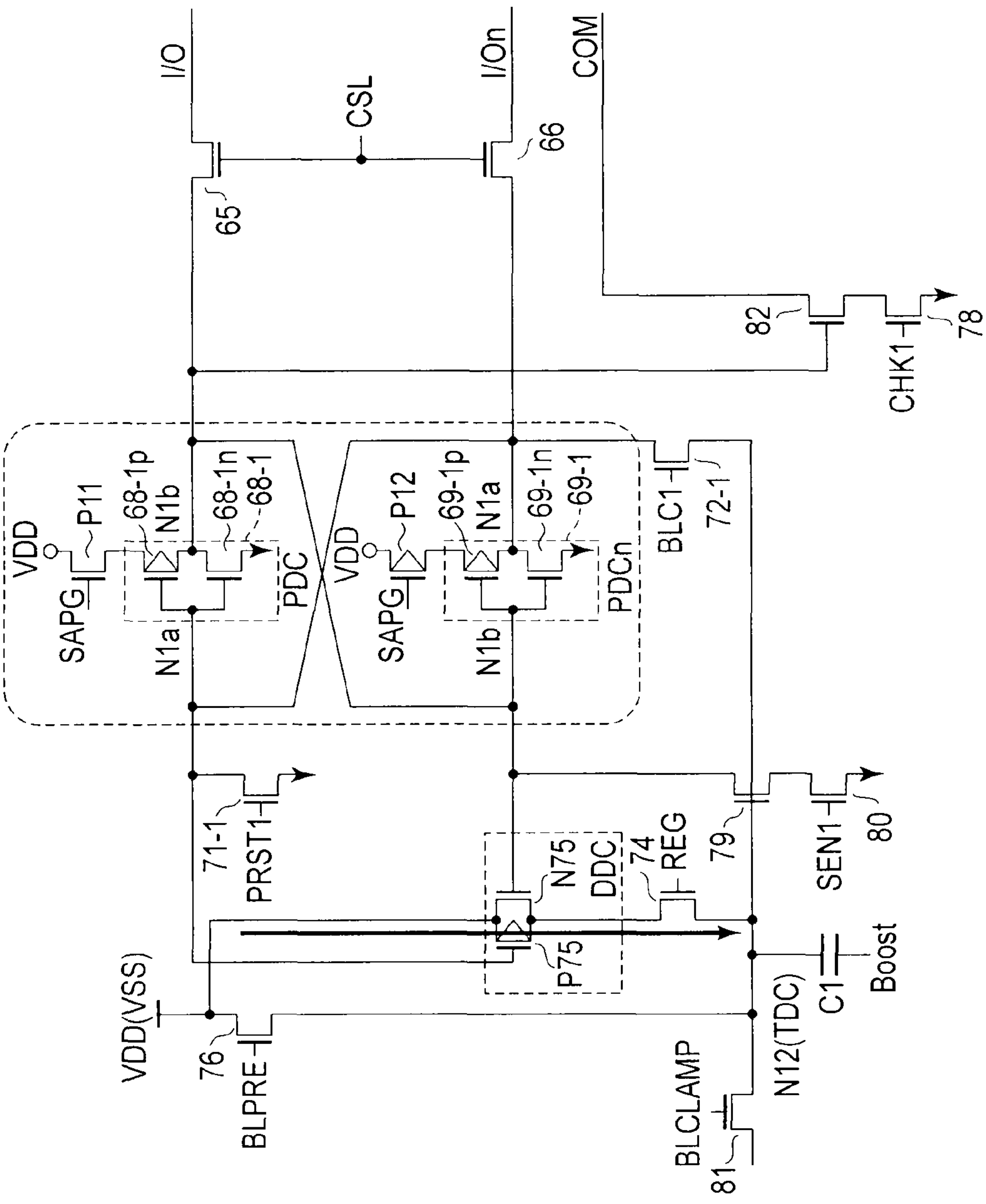
FIGS. 54-56 are a view illustrating a data erase/erase-verify operation of the sense unit according to the fifth embodiment.

Next, a NOT arithmetic operation of the sense unit SU according to the fourth embodiment is described with reference to FIGS. 53 to 55. As described above, the NOT arithmetic operation is performed by inversion of the held data of the PDC (node N1*b*).

<TDC='L'>

A voltage supplied to one end of the MOS transistor 76 is set to the voltage VSS. As illustrated in FIG. 53, the signal BLPRE is set to the 'H' level to turn on the MOS transistor 76. Then, the potential of the node N12 (TDC) is set to the ground potential ('L' level).

<Data Transfer (PDC to TDC)>

Subsequently, the voltage supplied to one end of the MOS transistor 76 is set to the voltage VDD. Next, the signal REG is set to the 'H' level to turn on the MOS transistor 74 as illustrated in FIG. 54. According to this, the data, which is '0' or '1', stored in the PDC is transferred to the node N12 (TDC). That is to say, when the held data of the PDC (node N1*b*) is at the 'H' level, the DDC is turned on and the potential of the node N12 is set to the 'H' level. On the other hand, when the held data of the PDC (node N1*b*) is at the 'L' level, the DDC is turned off and the potential of the node N12 is held at the 'L' level.

<RESET>

Figure 55:
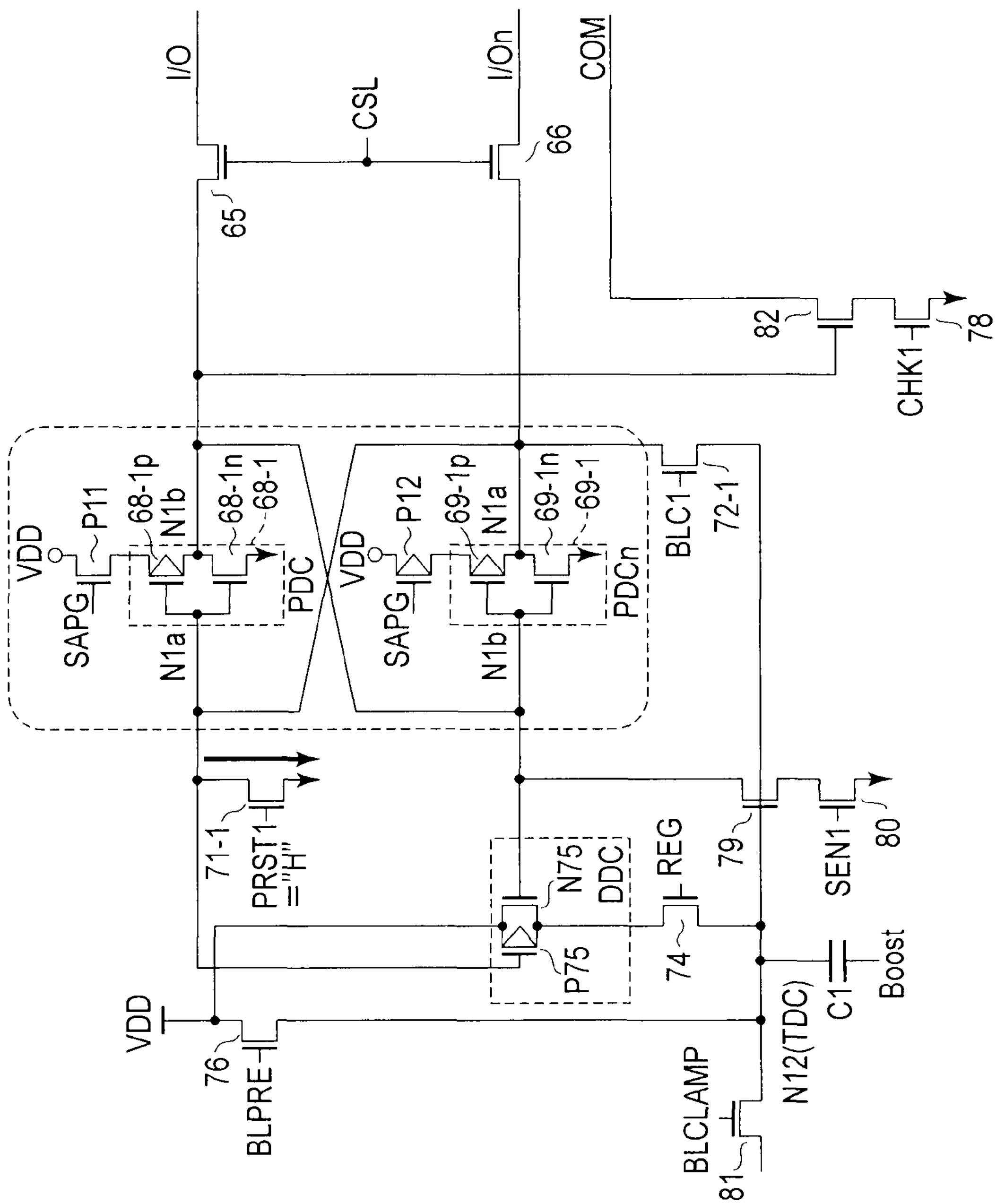

Subsequently, the PDC reset operation is performed as illustrated in FIG. 55. That is to say, the signal PRST1 is set to the 'H' level to turn on the MOS transistor 71-1. That is to say, the node N1*a* of the PDC is set to the ground potential (node N1*b*='H' level).

<Sensing>

Figure 56:
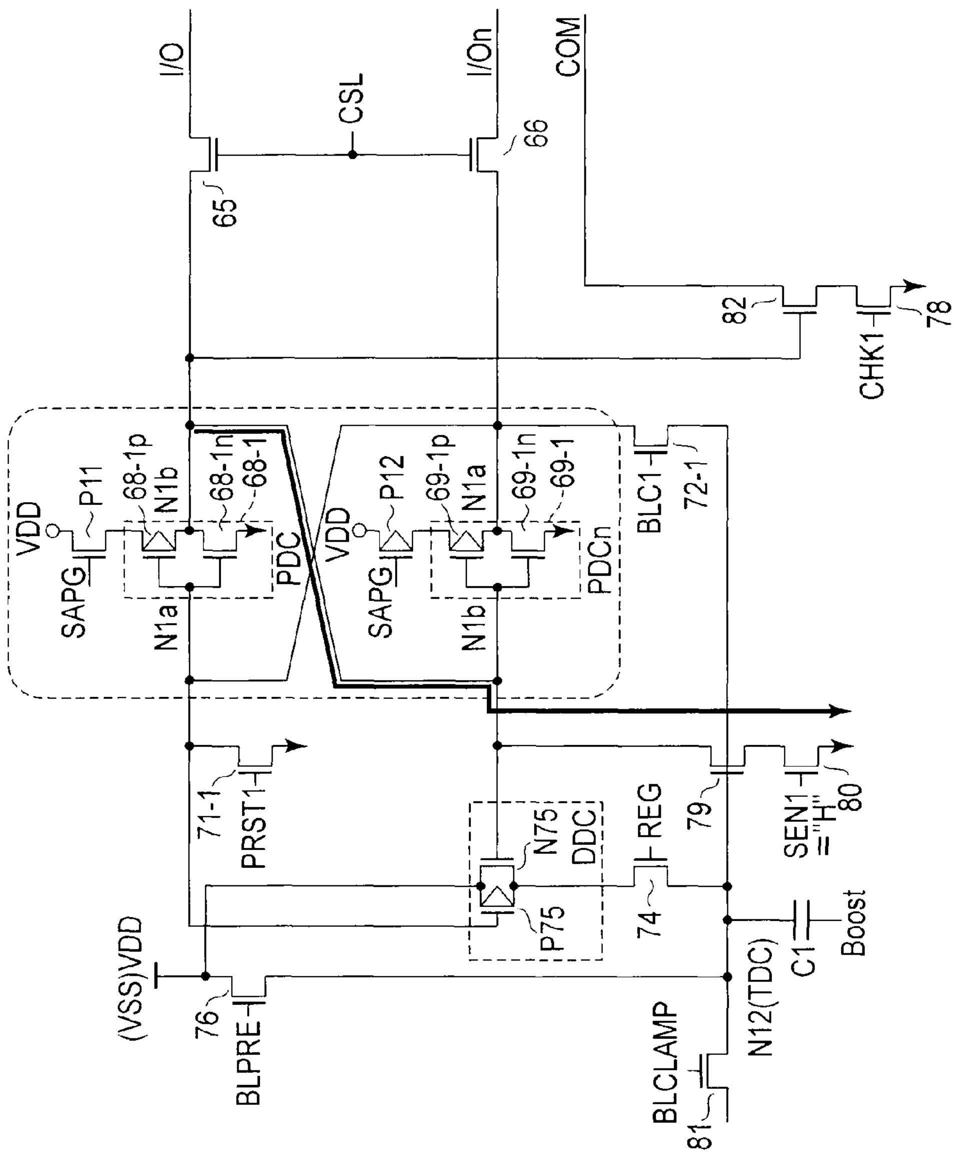

Subsequently, the signal SEN1 is set to the 'H' level to turn on the MOS transistor 80 as illustrated in FIG. 56. At that time, when the node N12 (TDC) is at the 'L' level, the MOS transistor 79 is turned off, so that the potential of the node N1*b* is maintained at the 'H' level.

On the other hand, when the node N12 is at the 'H' level, the MOS transistor 79 is turned on. Therefore, the node N1*b* is connected to the ground and the potential of the node N1*b* transits from the 'H' level to the 'L' level.

Meanwhile, at that time also, the current potential signal SAPG applied to the MOS transistors P11 and P12 is set to the '$H_1$' level when the above-described signal SEN1 is set to the 'H' level. That is to say, the sense operation is performed in a state in which the current driving force of the MOS transistors P11 and P12 is inhibited. Also, the amount of the current, which flows to the node N1*b*, depends on the current driving force of the MOS transistor P11 as described above.

2-7. <Method of Measuring Cell Current>

Next, a cell current measuring operation in the sense unit SU according to the fifth embodiment is described with reference to FIGS. 57 to 61.

Figure 57:
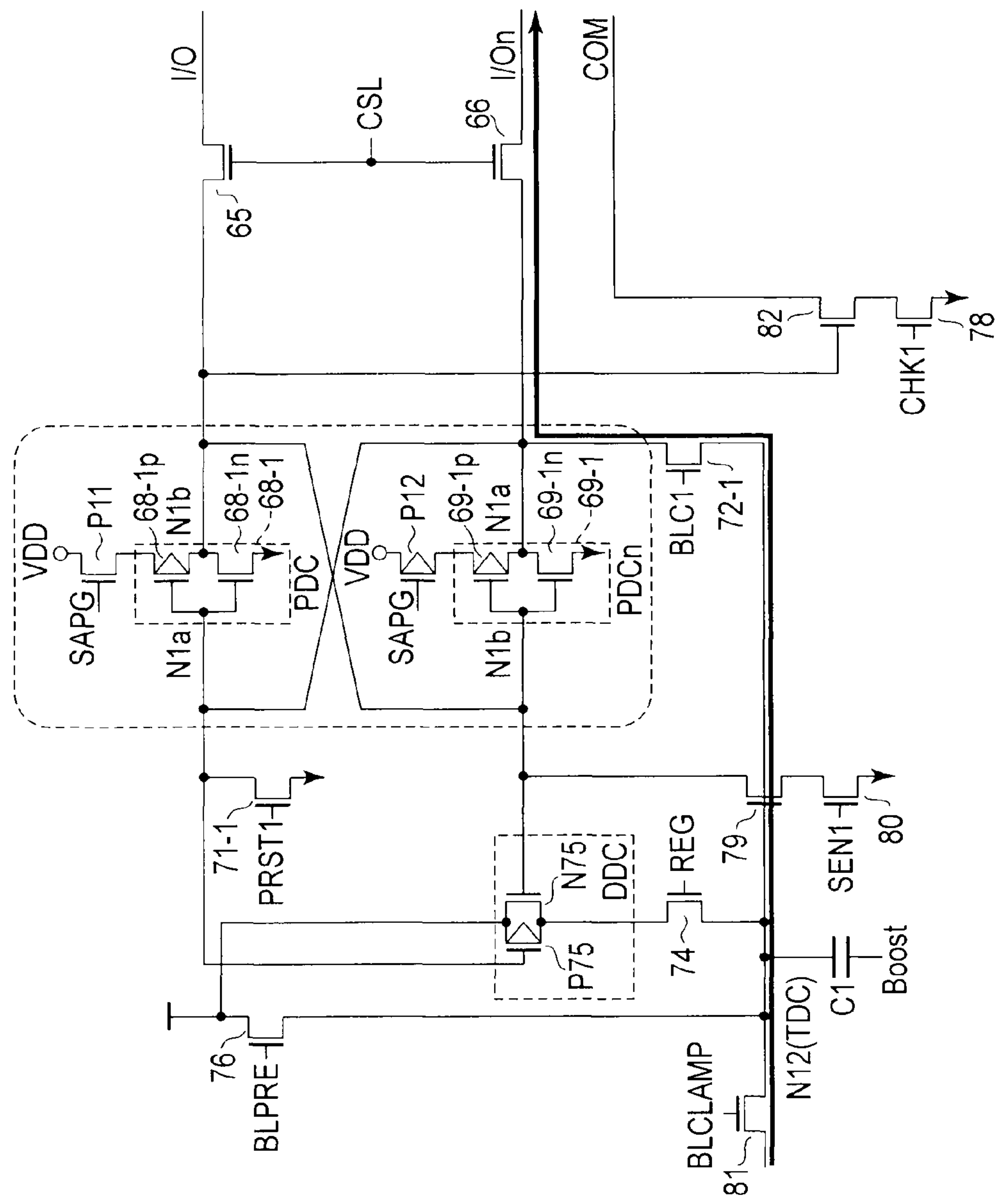
FIGS. 57-61 are a view illustrating a cell current monitoring operation of the sense unit according to the fifth embodiment.
Figure 58:
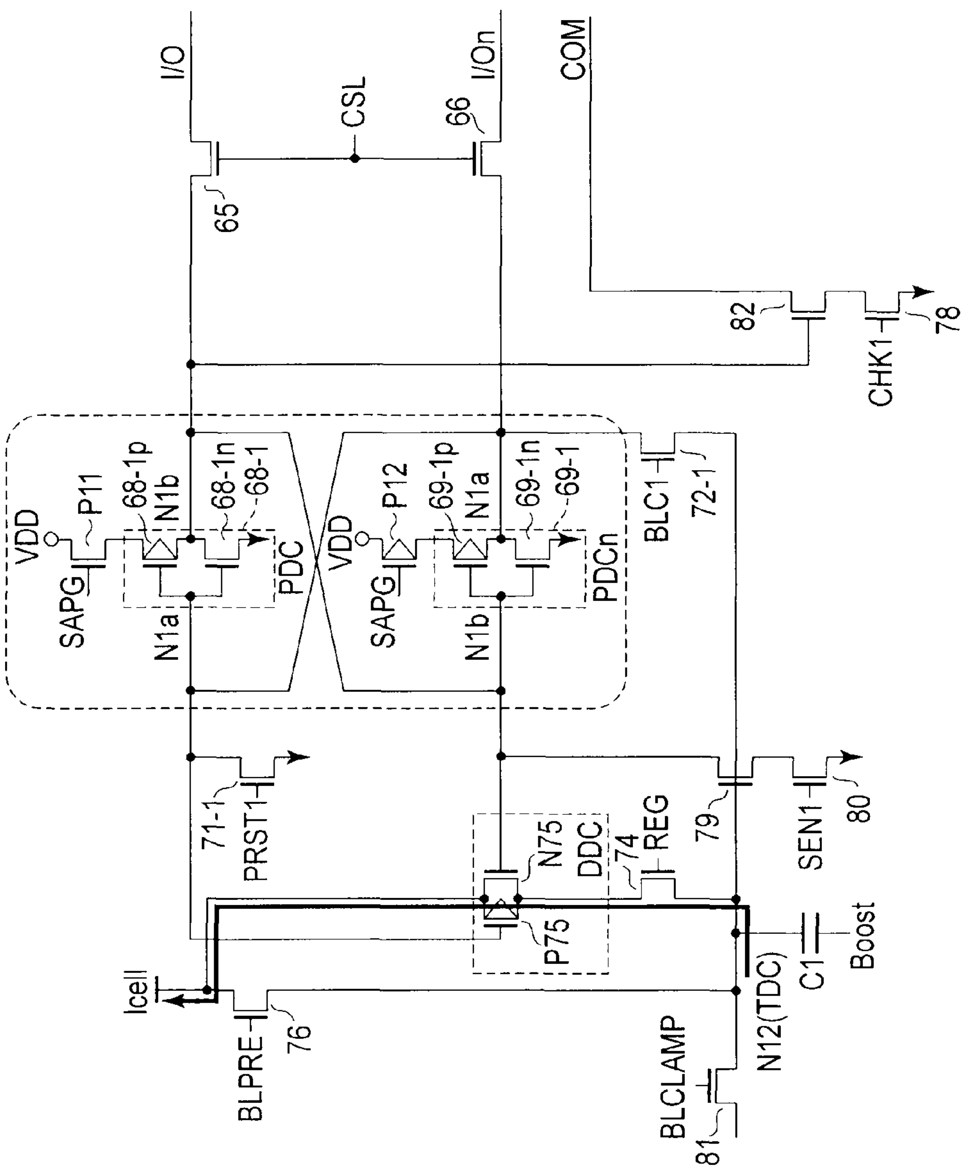
Figure 59:
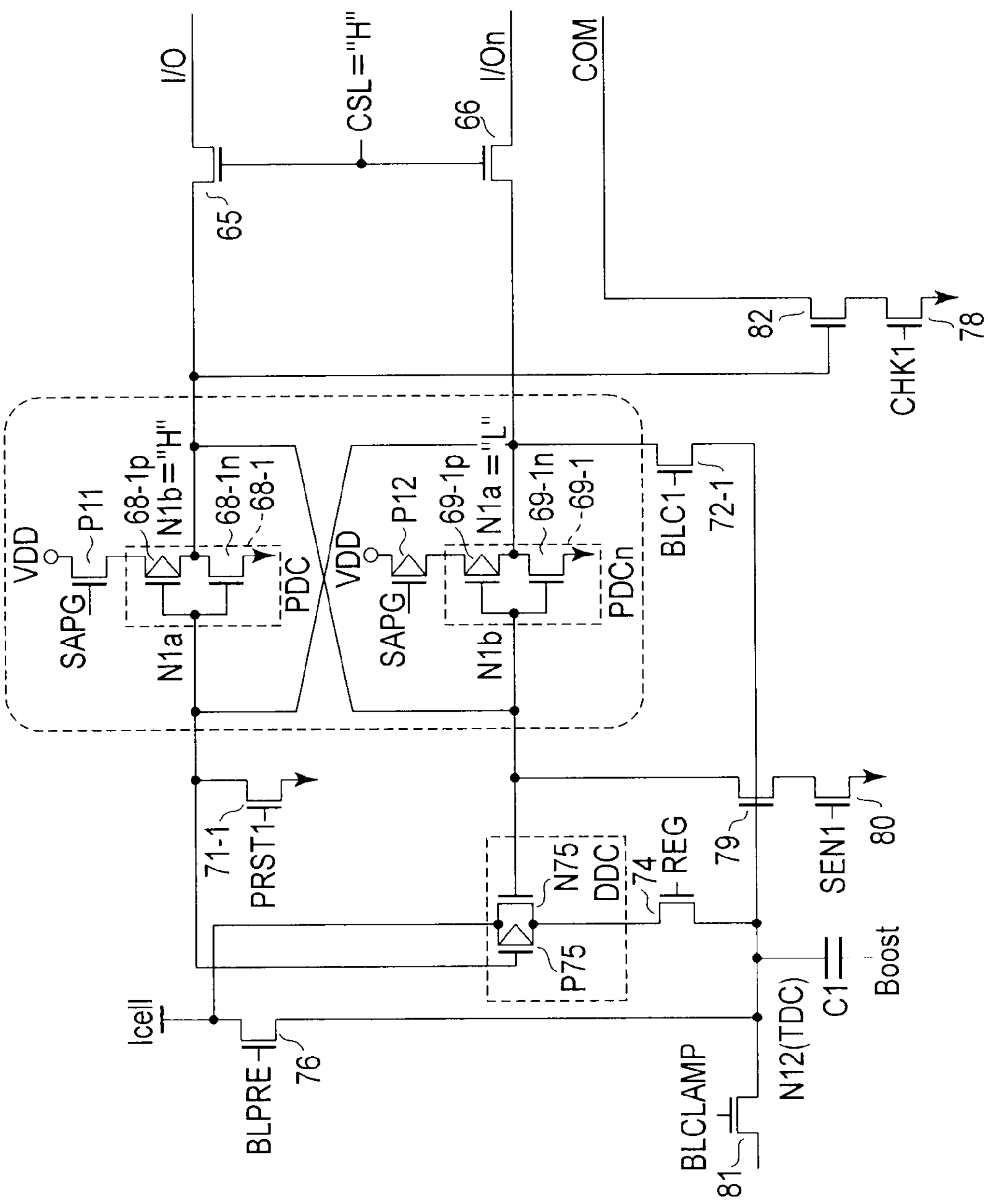
Figure 60:
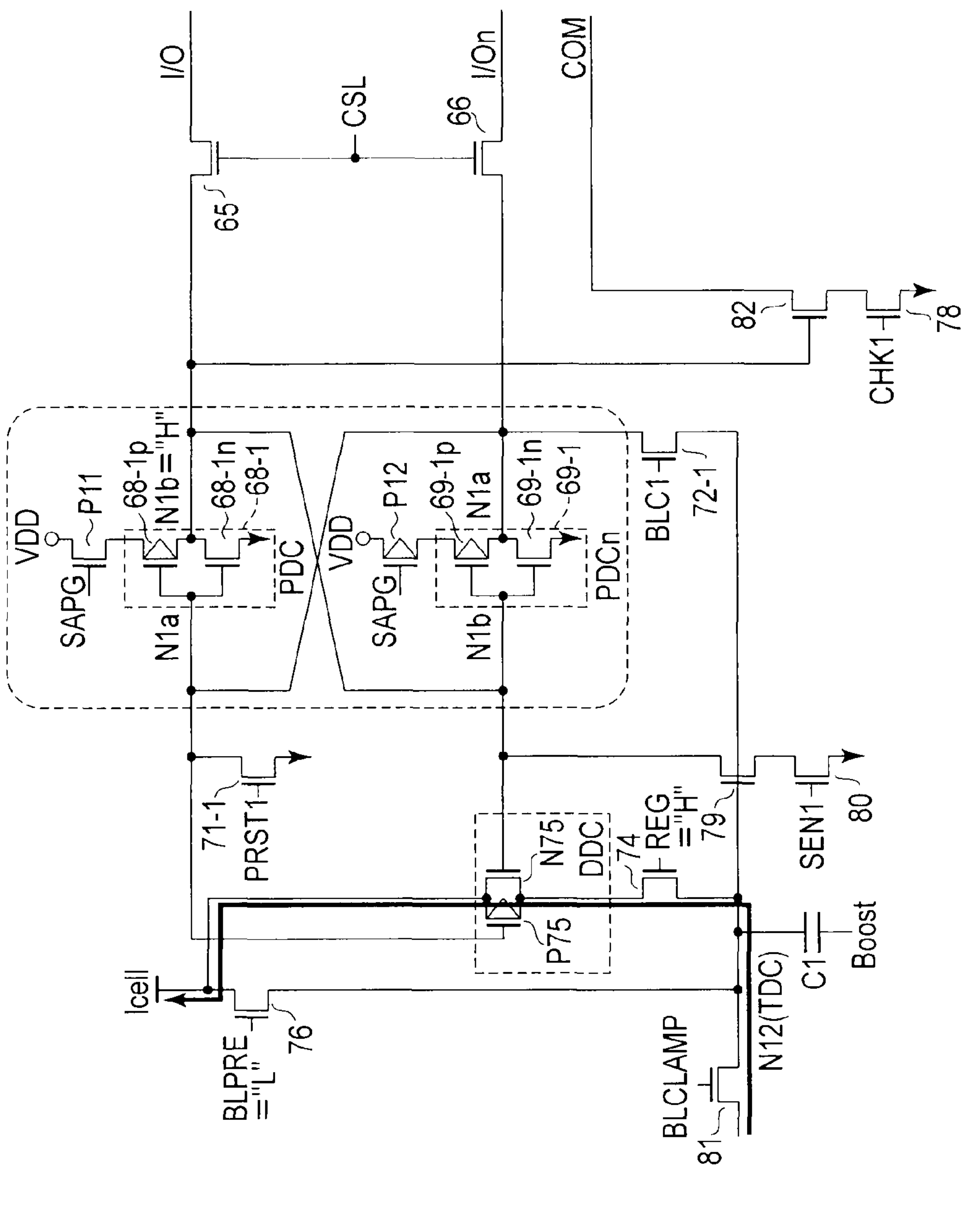

First, a current Icell, which flows to the bit line BL, is applied to a signal line COM as illustrated in FIG. 57. At that time, the PDCs of all the sense units SU are operated. Meanwhile, at that time, the held data of the PDC is at the 'L' level. Subsequently, as illustrated in FIG. 58, the MOS transistor N75 is turned off and the MOS transistor P75 is turned on while stopping the PDCs of all the sense units SU (latch function is stopped) and the cell current Icell (Ioff) is applied. Subsequently, as illustrated in FIG. 59, the signal CSL is set to the 'H' level to turn on the MOS transistors 65 and 66. According to this, the written data 'H' and 'L' are transferred from the data lines I/O and I/On to the PDC. As a result, the node N1*b* is set to the 'H' level and the node N1*a* is set to the 'L' level.

Subsequently, latch data is transferred from the PDC to the node N12 (TDC) and the cell current is detected, which is hereinafter specifically described. First, in a case of the bit line BL, which is a measuring target, the MOS transistor P75 is turned on and the MOS transistor 76 is turned off. Then, the signal REG is set to the 'H' level to turn on the MOS transistor 74, and the current is applied to a pathway from the node N12 through the MOS transistor 74 to the DDC (refer to FIG. 60). At that time, the node N1*b* and the node N1*a* of the PDC are at the 'H' level and at the 'L' level, respectively.

On the other hand, in a case of the bit line BL, which is not the measuring target, the MOS transistor P75, the MOS transistor N75, and the MOS transistor 76 are turned off. Therefore, even when the signal REG is set to the 'H' level to turn on the MOS transistor 74, the current is not generated in the pathway from the node N12 through the MOS transistor 74 to the DDC. Meanwhile, at that time, the node N1*b* and the node N1*a* of the PDC are at the 'L' level and at the 'H' level, respectively.

Figure 61:
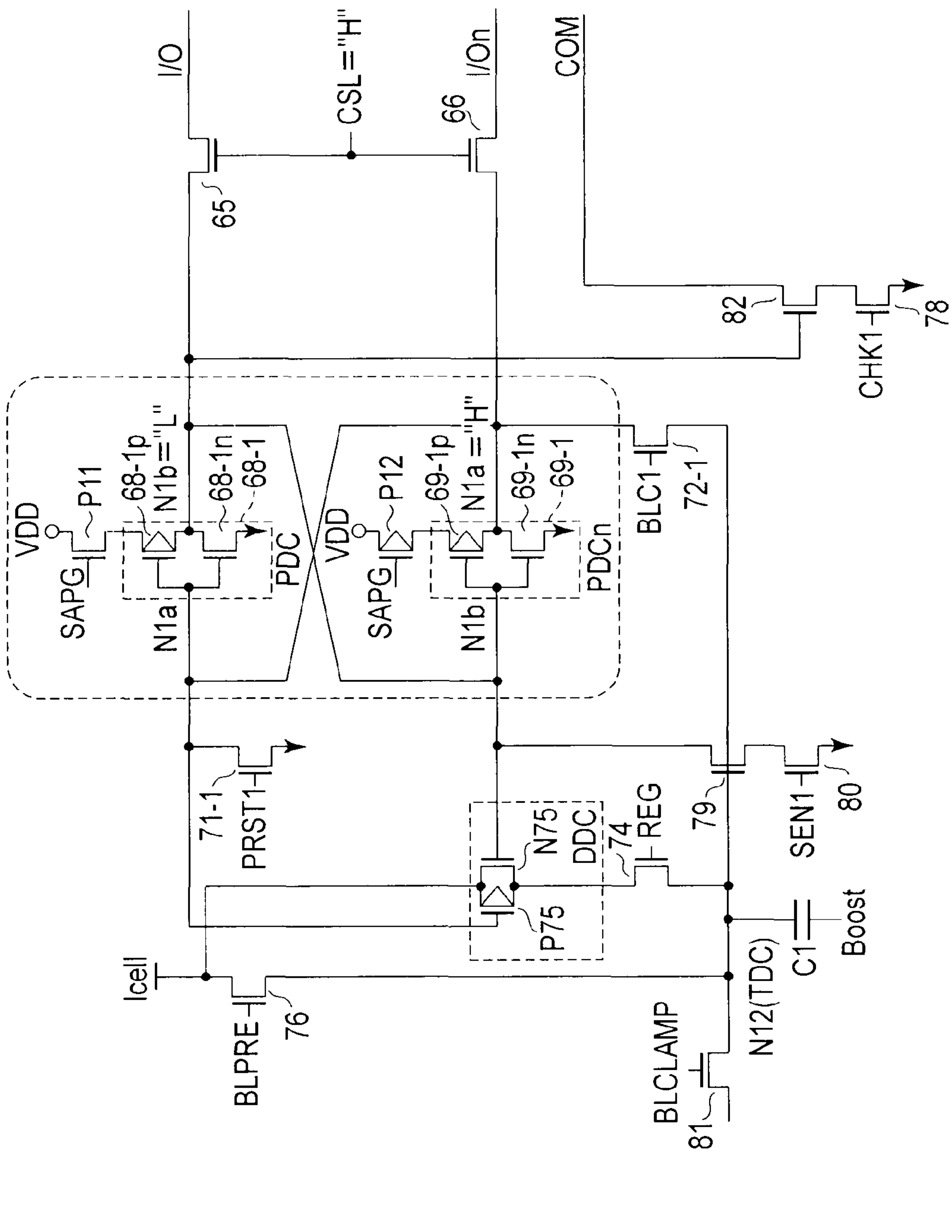

Subsequently, as illustrated in FIG. 61, the signal CSL is set to the 'H' level to turn on the MOS transistors 65 and 66, and the written data 'L' and 'H' are transferred from the data lines I/O and I/On to the PDC. That is to say, the node N1*b* and the node N1*a* of the PDC are set to the 'L' level and the 'H' level, respectively. Meanwhile, in a case in which the written data is the '1' data also, the cell current may be detected as in the above-described case.

Effect According to Fifth Embodiment (6)

According to the semiconductor storage device according to the fifth embodiment and the operation thereof, at least the peak current may be decreased (6). As described above, the MOS transistors P11 and P12 are AND connected to latch circuits 68-1 and 69-1 of the semiconductor storage device according to the first embodiment. Further, when storing the data of the TDC in the PDC, the current potential signal SAPG capable of controlling the current driving force of the MOS transistors P11 and P12 is applied to the gates of the MOS transistors P11 and P12.

Specifically, at the time of the sense operation, for example, the current driving force of the MOS transistor P11 is decreased. As a result, the current, which flows to the MOS transistor 68-1*p* and the NMOS transistor 79, may be decreased as illustrated in FIG. 43. Therefore, the peak current when charging the node N1*b* may be decreased, and further, it is possible to reduce a drastic decrease in an output from the internal supply voltage.

Also, by controlling the MOS transistor P11 by the current potential signal SAPG, it is possible to inhibit the peak current to approximately one-fifth. Therefore, as described above, the drastic decrease in the internal supply voltage may be reduced.

According to the semiconductor storage device according to the fifth embodiment and the operation thereof, a footprint may be reduced to realize miniaturization. As described above, the current, which flows to the MOS transistor 68-1*p* and the MOS transistor 79, may be decreased by current control by the PMOS transistors P11 and P12. Therefore, it is possible to decrease the gate lengths (L) of the MOS transistors P11 and P12 and the gate width (W) of the NMOS transistor 79. Therefore, the footprint may be reduced and it is advantageous in the miniaturization.

Sixth Embodiment

Example Further Provided with Cache Unit

Next, a semiconductor storage device according to a sixth embodiment is described. The sixth embodiment relates to an example further provided with a cache unit. In this description, detailed description of a part overlapping with the above-described fifth embodiment is omitted.

1. <Configuration Example>

Figure 62:
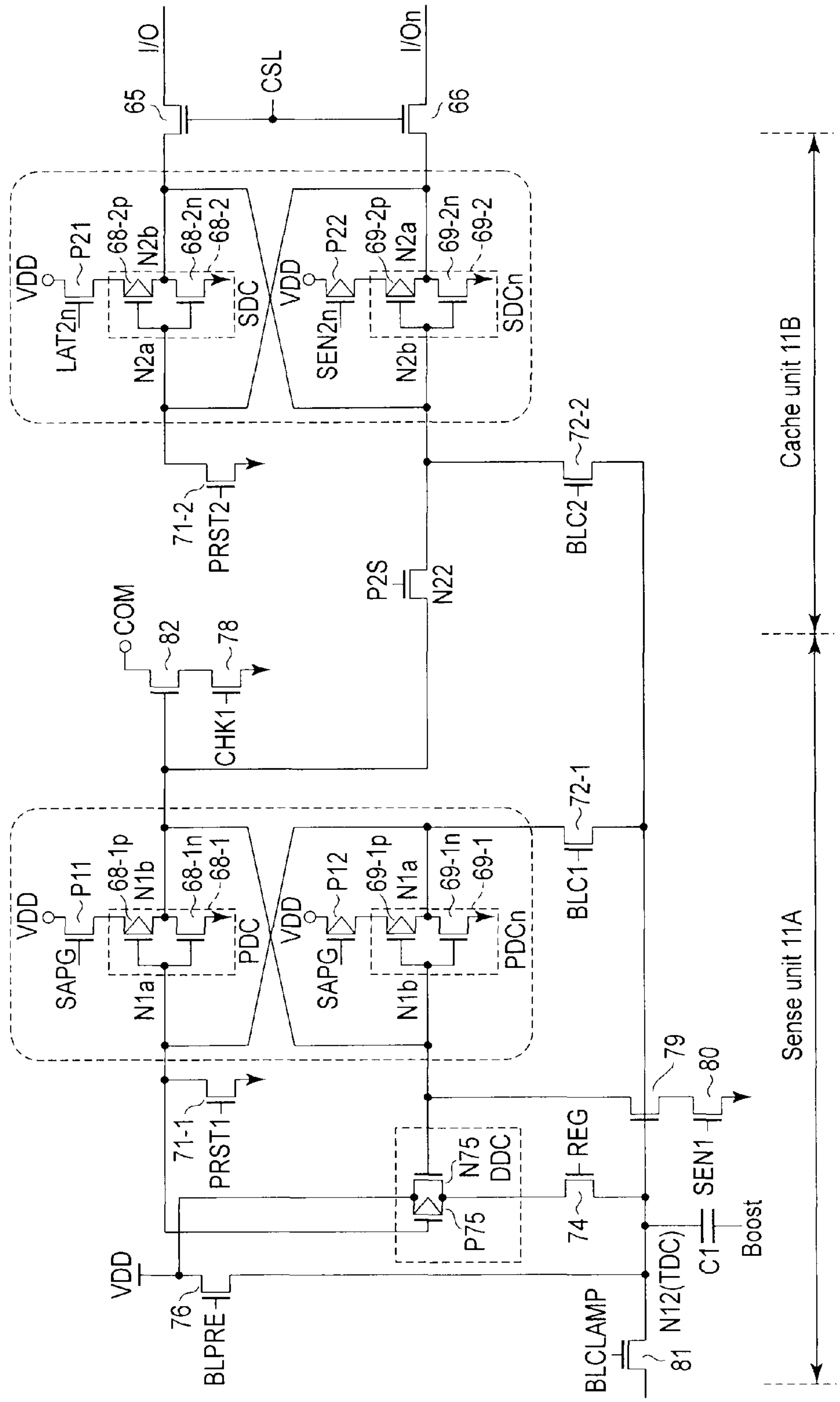
FIG. 62 is an equivalent circuit diagram illustrating the sense unit according to the sixth embodiment.

First, a configuration example of a sense unit SU according to the sixth embodiment is described with reference to FIG. 62. As illustrated in FIG. 62, the sense unit SU according to the sixth embodiment is different from that of the above-described first embodiment in that a cache unit 11B is further provided in addition to a sense unit 11A.

The cache unit 11B is provided with a data cache (hereinafter, referred to as an SDC), transistors 71-2 and 72-2, and a MOS transistor N22. The SDC is provided with inverters 68-2 and 69-2 and PMOS transistors P21 and P22. The inverter 68-2 is formed of a MOS transistor 68-2*p* and a MOS transistor 68-2*n*. Specifically, as illustrated in FIG. 62, one end of a current pathway of the MOS transistor 68-2*p* is connected to one end of a current pathway of the MOS transistor 68-2*n* at a node N2*b* and a gate thereof is connected to a node N2*a*. The other end of the current pathway of the MOS transistor 68-2*n* is connected to the ground and a gate thereof is connected to the node N2*a*. Further, the other end of the current pathway of the MOS transistor 68-2*p*, which forms the inverter 68-2, is connected to one end (drain side) of a current pathway of the MOS transistor P21. Also, an internal supply voltage VDD is supplied to the other end (source side) of the current pathway of the MOS transistor P21 and a current potential signal LAT2*n* is applied to a gate thereof.

Further, the inverter 69-2 is formed of a MOS transistor 69-2*p* and a MOS transistor 69-2*n*. As illustrated in FIG. 62, one end of a current pathway of the MOS transistor 69-2*p* is connected to one end of a current pathway of the MOS transistor 69-2*n* at the node N2*a* and a gate thereof is connected to the node N2*b*. The other end of the current pathway of the MOS transistor 69-2*n* is connected to the ground and a gate thereof is connected to the node N2*b*. Further, the other end of the current pathway of the MOS transistor 69-2*p*, which forms the inverter 69-2, is connected to one end (drain side) of a current pathway of the MOS transistor P22. Also, the internal supply voltage VDD is supplied to the other end (source side) of the current pathway of the MOS transistor P22 and a current potential signal SEN2*n* is applied to a gate thereof.

Also, an input and an output of the inverter 68-2 are connected to an output and an input of the inverter 69-2, respectively. According to this, the inverters 68-2 and 69-2 serve as a latch circuit.

One end of a current pathway of the transistor 71-2 is connected to the ground, the other end of the current pathway is connected to the node N2*a* of the SDC, and a signal PRST2 is applied to a gate thereof. One end of a current pathway of the transistor 72-2 is connected to the node N2*b* of the SDC, the other end of the current pathway is connected to a node N12 (TDC), and a signal BLC2 is applied to a gate thereof. One end of a current pathway of the MOS transistor N22 is connected to a PDC (node N1*b*) of the sense unit 11A, the other end thereof is connected to the SDC (node N2*b*) of the cache unit 11B, and a signal P2S is applied to a gate thereof. That is to say, the MOS transistor N22 electrically connects the sense unit 11A to the cache unit 11B according to a value of the signal P2S.

2. <Operation of Sense Unit SU>

Next, an operation of the sense unit SU according to the sixth embodiment is described with reference to FIGS. 63 to 70. In this embodiment, as described above, the sense unit SU of the fifth embodiment is further provided with the cache unit 11B. Therefore, description of the operation overlapping with that in the sense unit 11A is omitted. That is, description of the precharge, discharge, discharge, and charge transfer operation are herein omitted.

<SDC-RESET>

Figure 63:
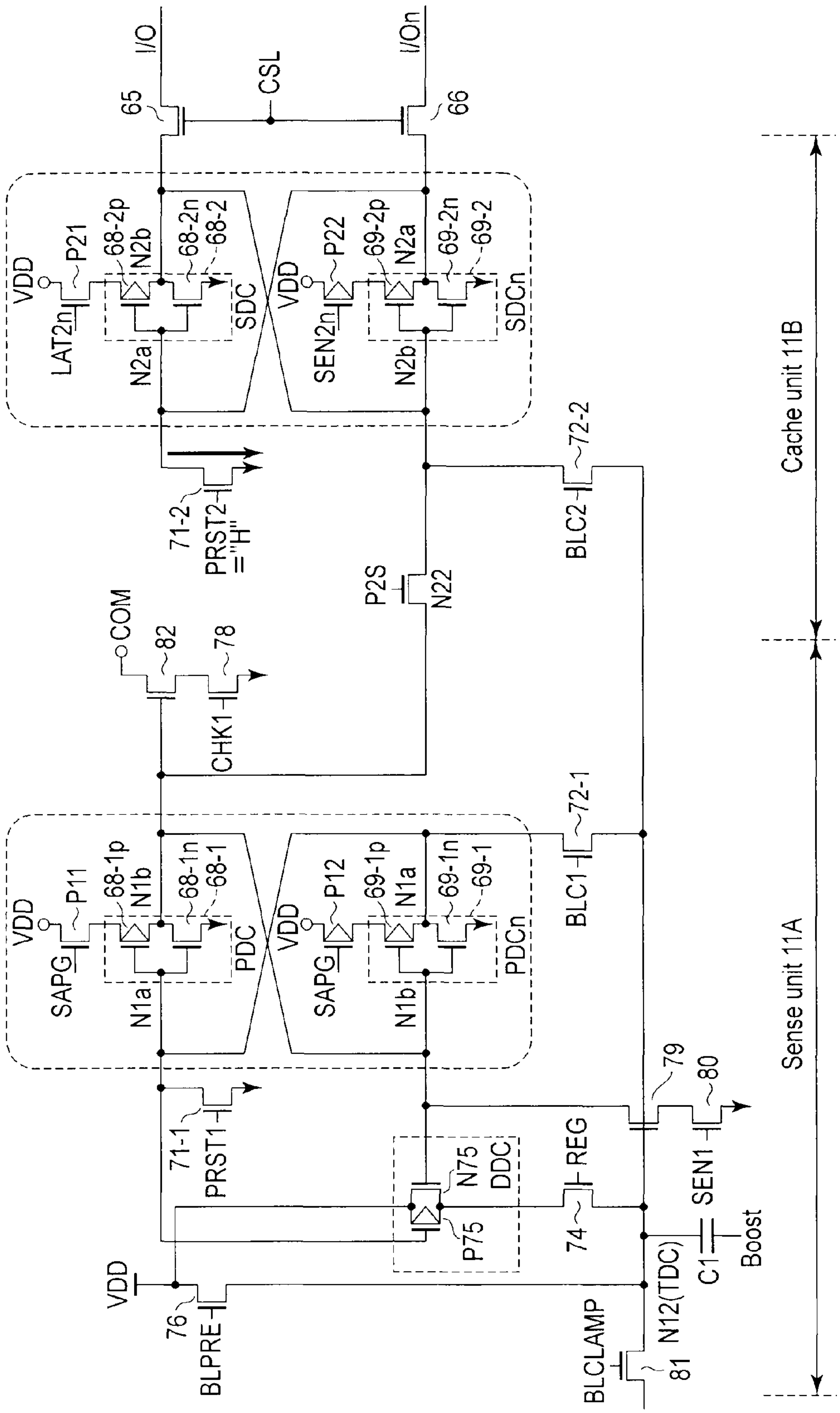

After precharge, RESET, and discharge, as illustrated in FIG. 63, the signal PRST2 is set to the 'H' level to turn on the MOS transistor 71-2, thereby connecting the node N2*a* to the ground. At that time, gate signals of the MOS transistors P11, P12, P21, and P22 are controlled and an amount of a current, which flows to MOS transistors 68-1*p* and 69-1*p* forming the PDC, and the MOS transistors 68-2*p* and 69-2*p* forming the SDC, is controlled.

<PDC-RESET>

Figure 64:
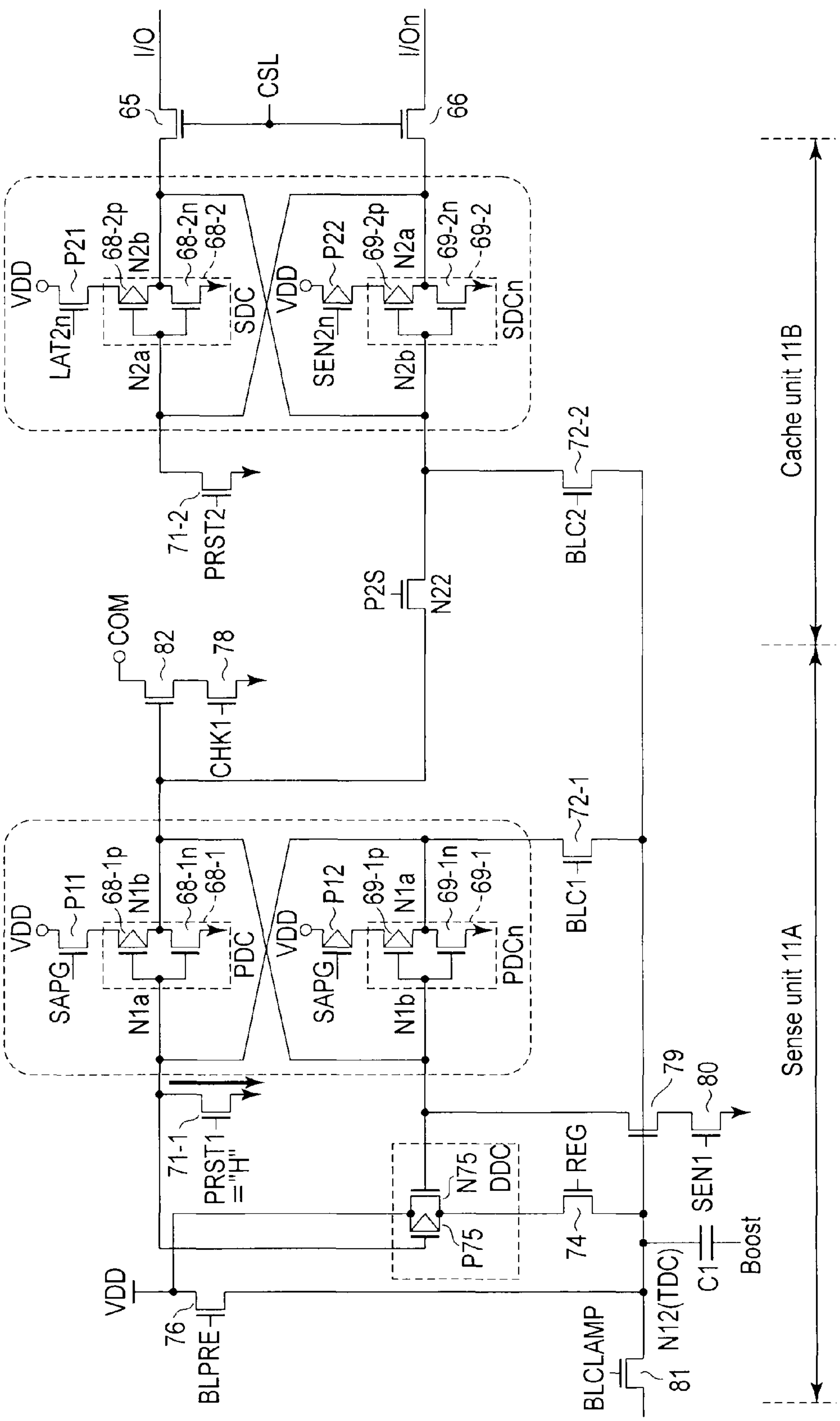

Subsequently, as illustrated in FIG. 64, a signal PRST1 is set to the 'H' level to turn on the MOS transistor 71-1. According to this, the node N1*b* and the node N1*a* are set to the 'H' level and the 'L' level, respectively, and the DDC is turned on. That is to say, the DDC is charged. Meanwhile, in this case also, the gate signals SAPG, LAT2*n*, and SEN2*n* of the MOS transistors P11, P12, P21, and P22 are controlled, and the amount of the current, which flows to the MOS transistors 68-1*p* and 68-2*p*, is controlled.

<Sensing>

Subsequently, a sense operation is performed as illustrated in FIG. 65. That is to say, this is the operation to set a signal SEN1 to 'H' to import the potential of the node N12 (TDC) into the PDC. In this case also, the gate signals SAPG, LAT2*n*, and SEN2*n* of the MOS transistors P11, P12, P21, and P22 are controlled, and the amount of the current, which flows to the MOS transistors 68-1*p* and 68-2*p*, is controlled.

<Signal P2S='H' Level>

Subsequently, the signal P2S is set to the 'H' level (voltage VSG) to turn on the MOS transistor N22. According to this, as illustrated in FIG. 66, the held data of the PDC is transferred to the SDC. In this case also, the gate signals SAPG, LAT2*n*, and SEN2*n* of the MOS transistors P11, P12, P21, and P22 are controlled, and the amount of the current, which flows to the MOS transistors 68-1*p* and 68-2*p*, is controlled.

As a result, for example, latch data at the 'H' level and the 'L' level latched into the nodes N1*b* and N1*a* of the PDC are transferred to the nodes N2*b* and N2*a* of the SDC as the latch data at the 'H' level and the 'L' level, respectively.

<Definition of Held Data of SDC>

Figure 67:
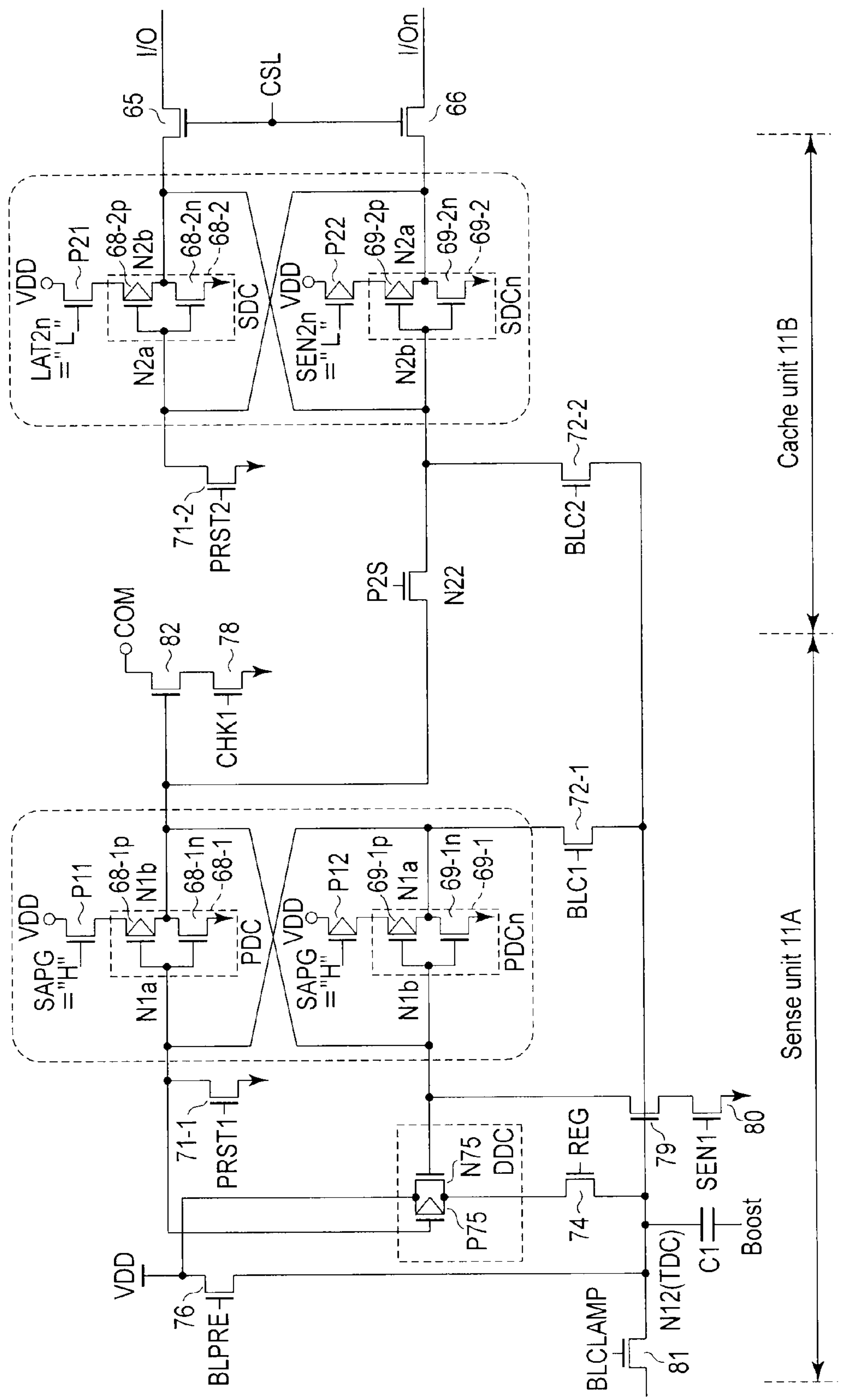

Subsequently, as illustrated in FIG. 67, the gate signal SAPG is set to the 'H' level while the gate signals LAT2*n*, SEN2*n*, and PRST2 are set to the 'L' level. In this manner, the held data of the SDC is defined while controlling the current, which flows to the MOS transistor 68-1*p*.

<Data Transfer>

Figure 68:
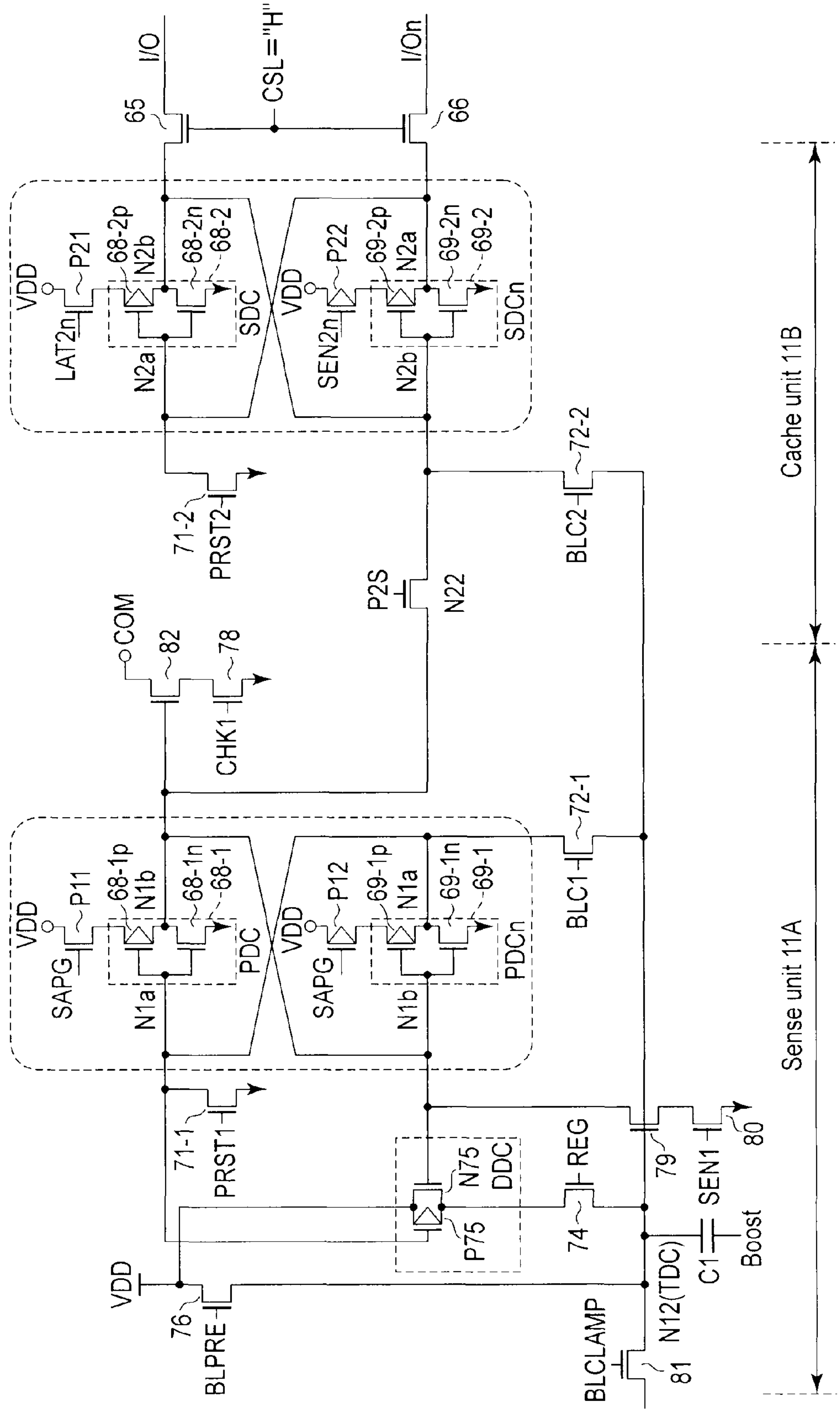

Further, as illustrated in FIG. 68, a signal CSL is set to the 'H' level to turn on MOS transistors 65 and 66. Then, the held data of the SDC is transferred to signal lines I/O and I/On through the transistors 65 and 66, respectively.

2-2. <Data Write Operation>

Next, data write operation of the sense unit SU according to the sixth embodiment is described with reference to FIG. 69. In this embodiment also, a case in which the even-numbered bit line BLi is made the selected bit line BL is described as an example.

<80 hrst>

Figure 69:
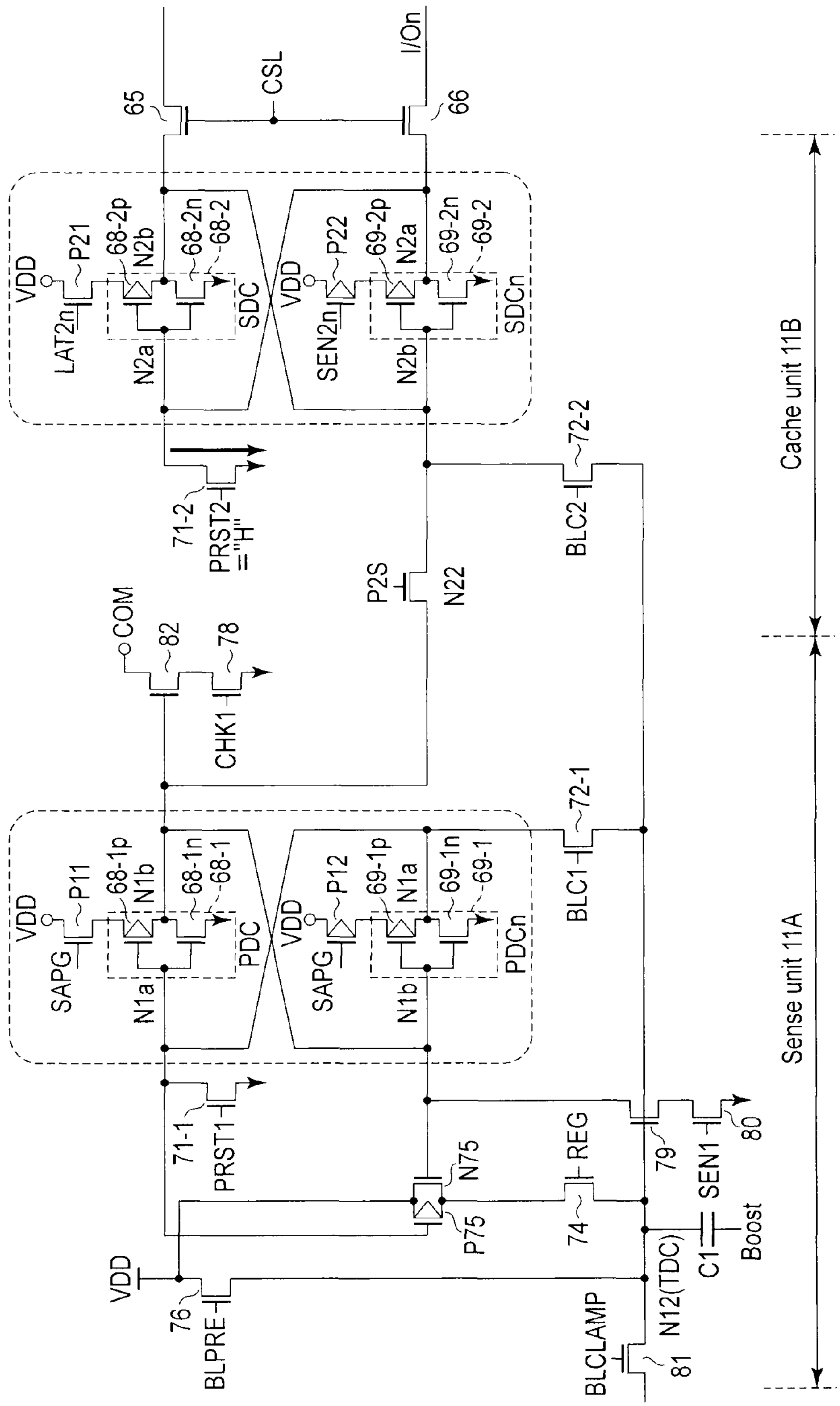

As illustrated in FIG. 69, the signal PRST2 is set to the 'H' level to turn on the MOS transistor 71-2. That is to say, the node N2*a* is connected to the ground. According to this, the potential of the node N1*b* is set to the 'H' level.

<Data Transfer>

Figure 70:
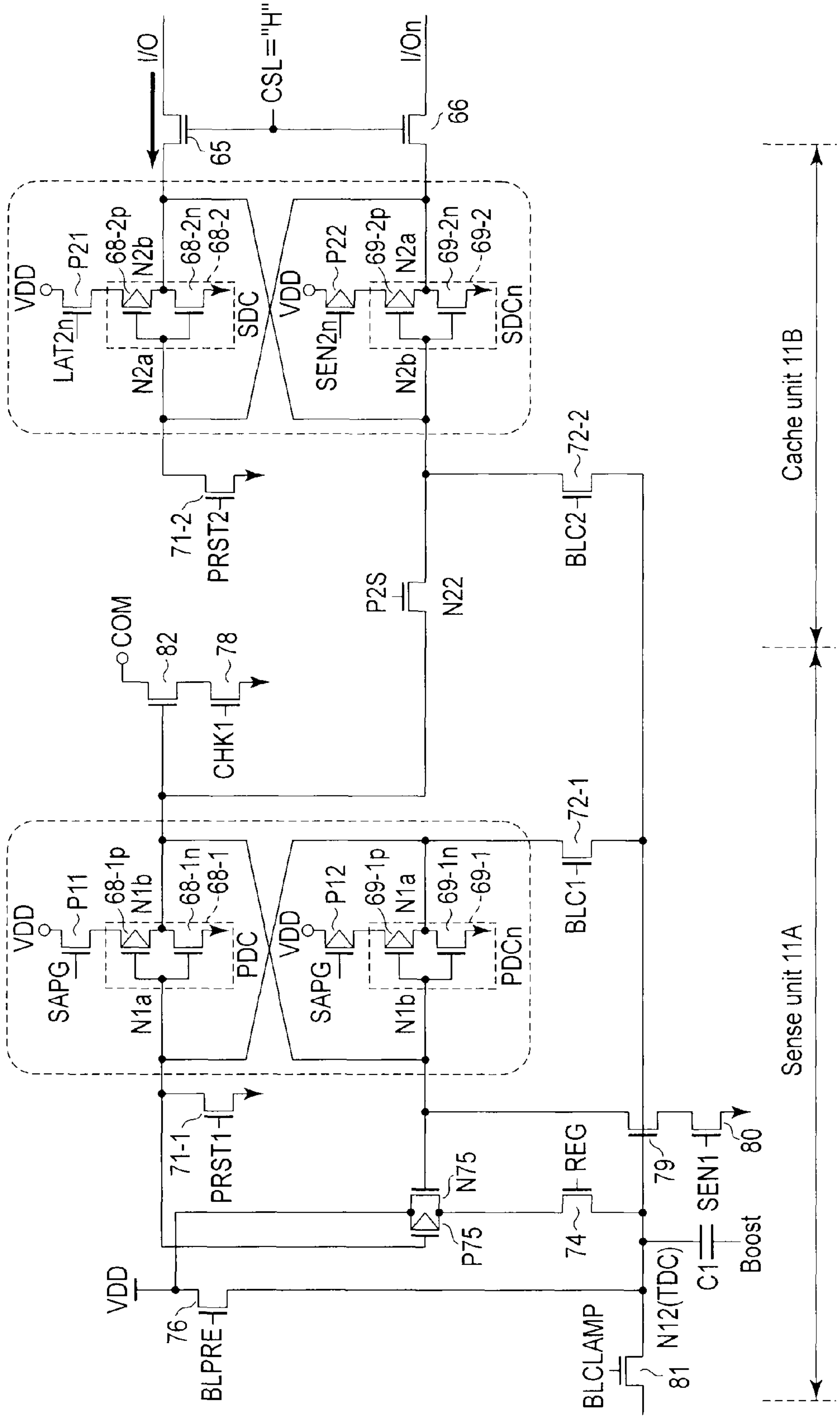

Subsequently, data transfer with a host is described with reference to FIG. 70. When a command (for example, CMD85h) is given by the host to a controller 8, the controller 8 sets the signal CSL to the 'H' level to turn on the MOS transistors 65 and 66. According to this, written data transferred from the host is transferred to (loaded on) the SDC through the data lines I/O and I/On. That is to say, the data at the 'H' or 'L' level is stored in the SDC.

<TDC SET/PDC RESET>

Figure 74:
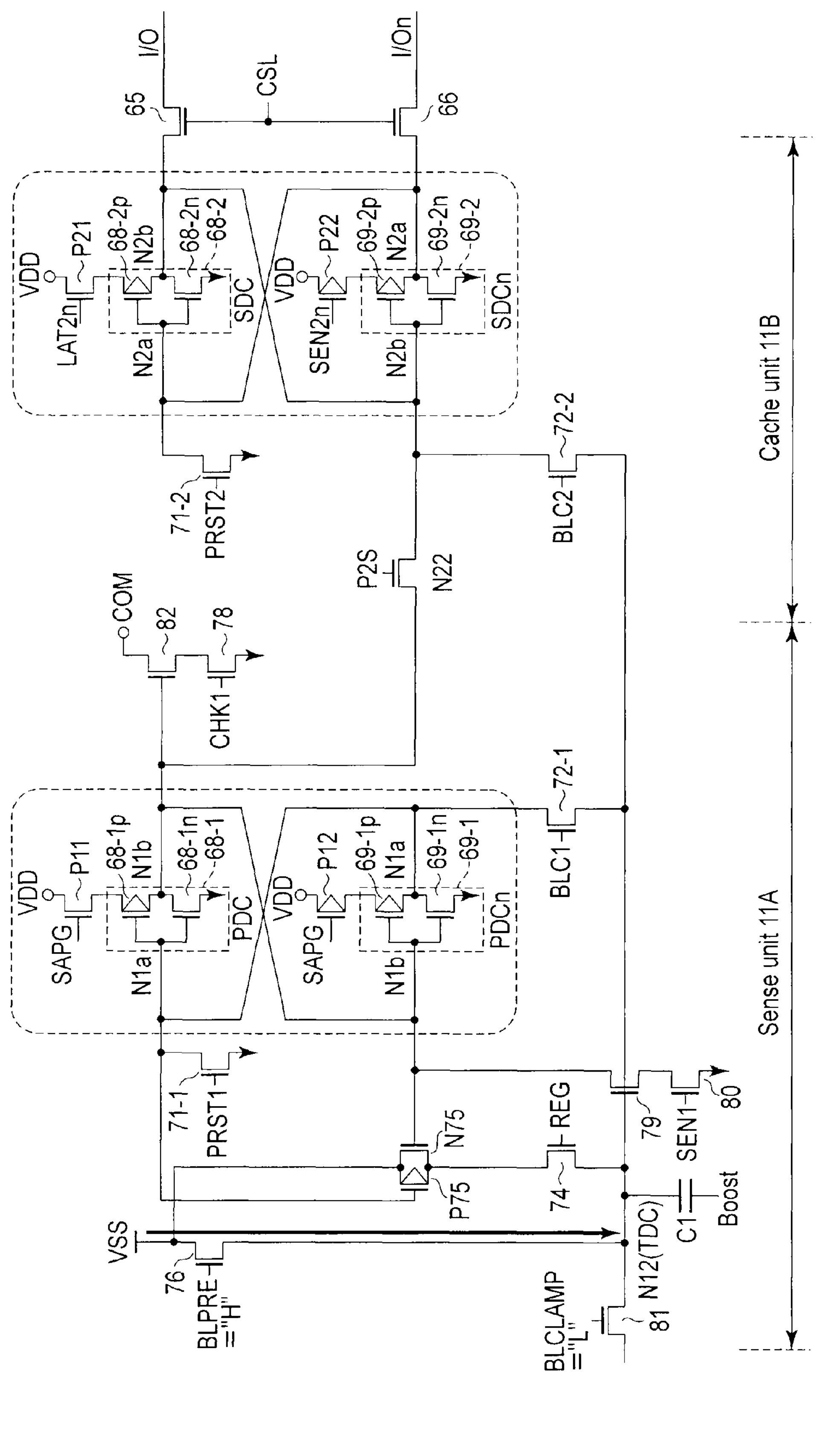

Further, the held data of the PDC is set in the node 12 (TDC). As illustrated in FIG. 74, the gate signals PRST1 and BLC2 are set to the 'H' level to turn on the MOS transistors 72-2. According to this, the written data (held data of the SDC) is set in the node N12 (TDC) through the node N2*b* and the MOS transistor 72-2. In this case also, by controlling the gate signal SAPG of the MOS transistors P11 and P12, the amount of the current, which flows to the MOS transistors 68-1*p* and 69-1*p*, is controlled.

<PDC SET>

Subsequently, as illustrated in FIG. 72, the signal SEN1 is set to the 'H' level to transfer the written data of the node 12 (TDC) to the PDC. That is to say, when the potential of the node N12 is at the 'H' level, the potential of the node N1*b* is set to the 'L' level, and when the potential of the node N12 is at the 'L' level, the potential of the node N1*b* is maintained at the 'H' level.

2-3. <Write Verify Operation>

The verify operation of the sense unit SU according to this embodiment is identical to that in the above-described first embodiment, so that description thereof is omitted.

2-4. <Erase Verify Operation>

Next, an erase verify operation in the configuration according to this embodiment is described with reference to FIGS. 73 to 86. The erase verification of the sense unit SU according to this embodiment is different in that the potential of the bit line BL is set to the voltage VSS in a precharge operation and the node N12 is boosted at the time of the charge share. An operation other than this is identical to that of the above-described erase verify operation. That is to say, this is alternately performed for the even-numbered bit line BLi and the odd-numbered bit line BL(i+1) and at a time period at which it is confirmed that the written data of the memory cell transistor MT is erased for both of the even-numbered bit line BLi and the odd-numbered bit line BL(i+1), the erase verify operation is completed. Specifically, after the erase verification, when the held data of the PDC (node N1*b*) is at the 'L' level, the controller 8 judges that the erase verification is completed based on information from a fail bit detecting circuit 11-1. First, the erase verify operation of the even-numbered bit line BLi is described.

<Precharge>

Figure 73:
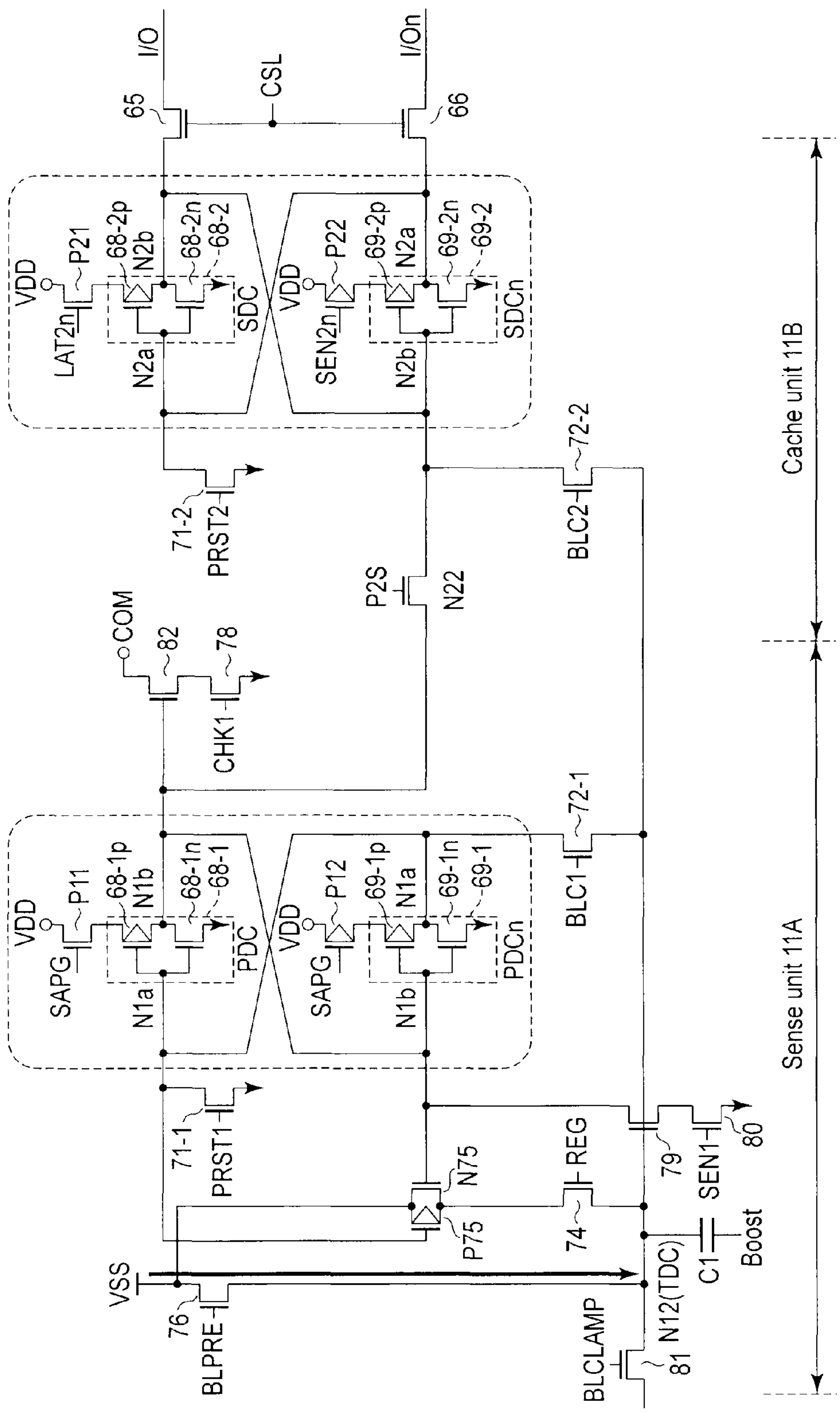

As illustrated in FIG. 73, the signals BLCCLAMP and BLPRE are set to the 'H' level while setting the voltage supplied to one end of a current pathway of the MOS transistor 76 to the ground potential (VSS). According to this, the potential of the bit line BL is set to the voltage VSS through the MOS transistors 76 and 81.

<Discharge and TDC Charge>

Subsequently, as illustrated in FIG. 74, the signal BLCCLAMP is set to the 'L' level to turn off the MOS transistor 81. That is to say, the sense unit SU and the bit line BL are electrically separated. Further, the potential of one end of the current pathway of the MOS transistor 76 is set to the voltage VDD while setting the signal BLPRE to the 'H' level. According to this, the node N12 (TDC) is set to the voltage VDD.

<Charge Share>

Figure 75:
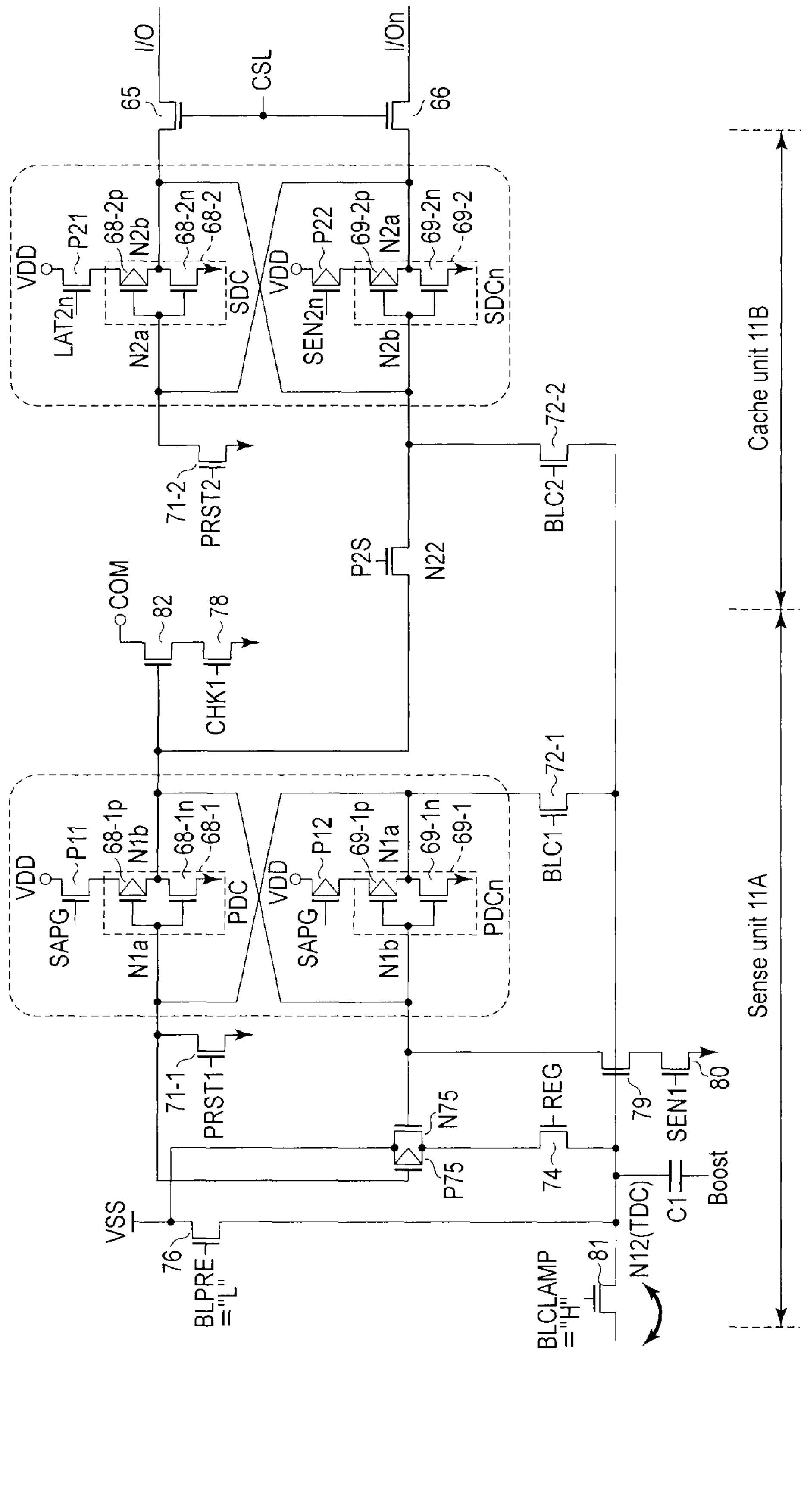

Subsequently, the charge share is described as illustrated in FIG. 75. The voltage VDD is boosted on one electrode of a capacitor element C1 while setting the signal BLPRE to the 'L' level to turn off the MOS transistor 76. Also, the signal BLCCLAMP is set to the 'H' level (voltage Vsen). According to this, the even-numbered bit line BLi is electrically connected to the node N12 (TDC). If all the memory cell transistors MT connected to the even-numbered bit line BLi are in an erased state, the potential of the even-numbered bit line BLi is set to the 'H' level after the charge share (erase verification passes). On the other hand, if there is any memory cell transistor MT, which is not in the erased state, the potential of the even-numbered bit line BLi is maintained at the 'L' level even after the charge share (erase verification fails).

<Signal REG='H' Level>

Figure 76:
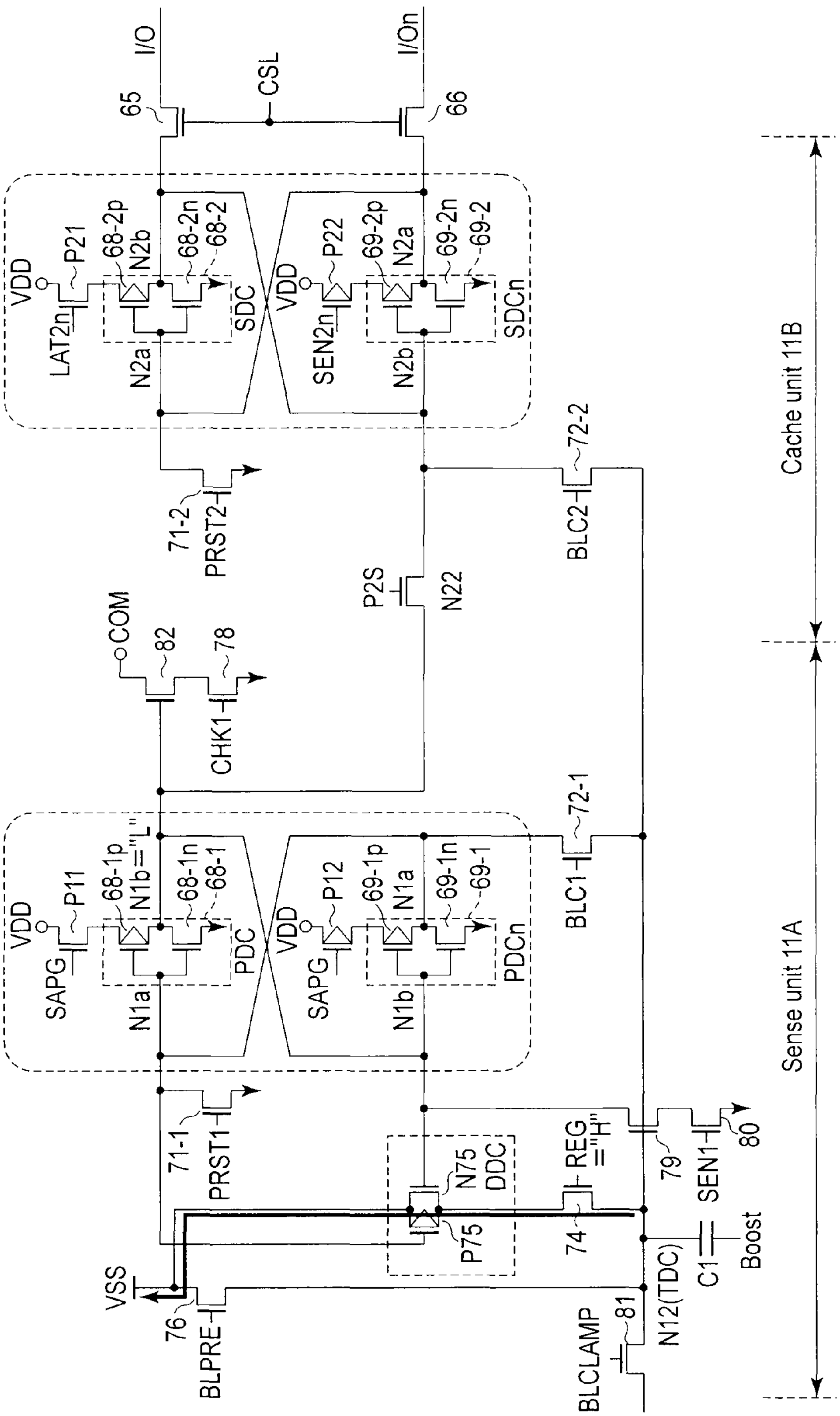

Subsequently, as illustrated in FIG. 76, a signal REG is set to the 'H' level while setting the potential of one end of the current pathway of the MOS transistor 76 to VSS. Herein, since the held data of the PDC (node N1*b*) is at the 'L' level, the DDC is turned off.

<RESET>

Further, as illustrated in FIG. 77, the signal PRST1 is set to the 'H' level and the PDC is reset. That is to say, the node N1*b* is set to the 'H' level and the node N1*a* is set to the 'L' level.

<Sense Operation>

Subsequently, the signal SEN1 is set to the 'H' level to turn on the MOS transistor 80 as illustrated in FIG. 78. According to this, the potential of the node N12 (TDC) is imported into the PDC. As a result of the charge share, when the node N12 (TDC) is at the 'H' level (erase verification passes), the MOS transistor 79 is turned on. That is to say, when the signal SEN1 is set to the 'H' level, the node N1*b* is connected to the ground, and the held data of the PDC (node N1*b*) transits from the 'H' level to the 'L' level.

Figure 79:
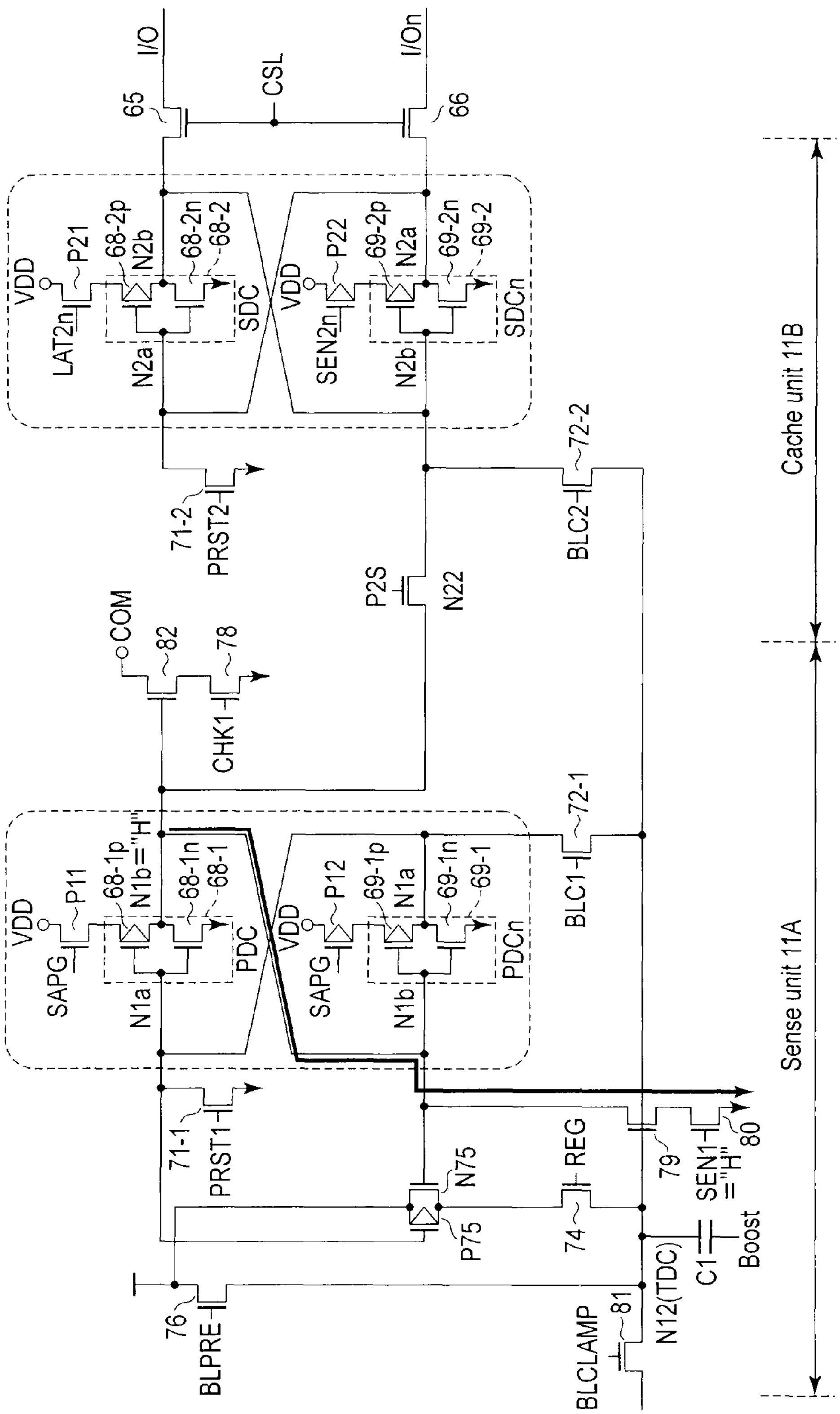

On the other hand, as illustrated in FIG. 79, when the node N12 (TDC) is set to the 'L' level, that is to say, when the erase verification fails, the MOS transistor 79 is turned off. Therefore, the held data of the PDC (node N1*b*) is maintained at the 'H' level even when the signal SEN1 is set to the 'H' level.

In the sense operation according to this embodiment also, the signal SEN is set to the 'H' level and the signal SAPG is set to the 'H' level. That is to say, as described above, a peak current, which flows through the PDC, is inhibited.

Next, the erase verify operation of the odd-numbered bit line BL(i+1) is described. Hereinafter, the odd-numbered bit line BL(i+1) is simply referred to as the bit line BL.

<Precharge>

First, as illustrated in FIG. 80, the signals BLCCLAMP and BLPRE are set to the 'H' level while setting the potential of one end of the current pathway of the MOS transistor 76 to the voltage VSS. According to this, the odd-numbered bit line BL is set to the voltage VSS through the MOS transistor 76, the node N12, and the MOS transistor 81.

<Discharge>

Figure 81:
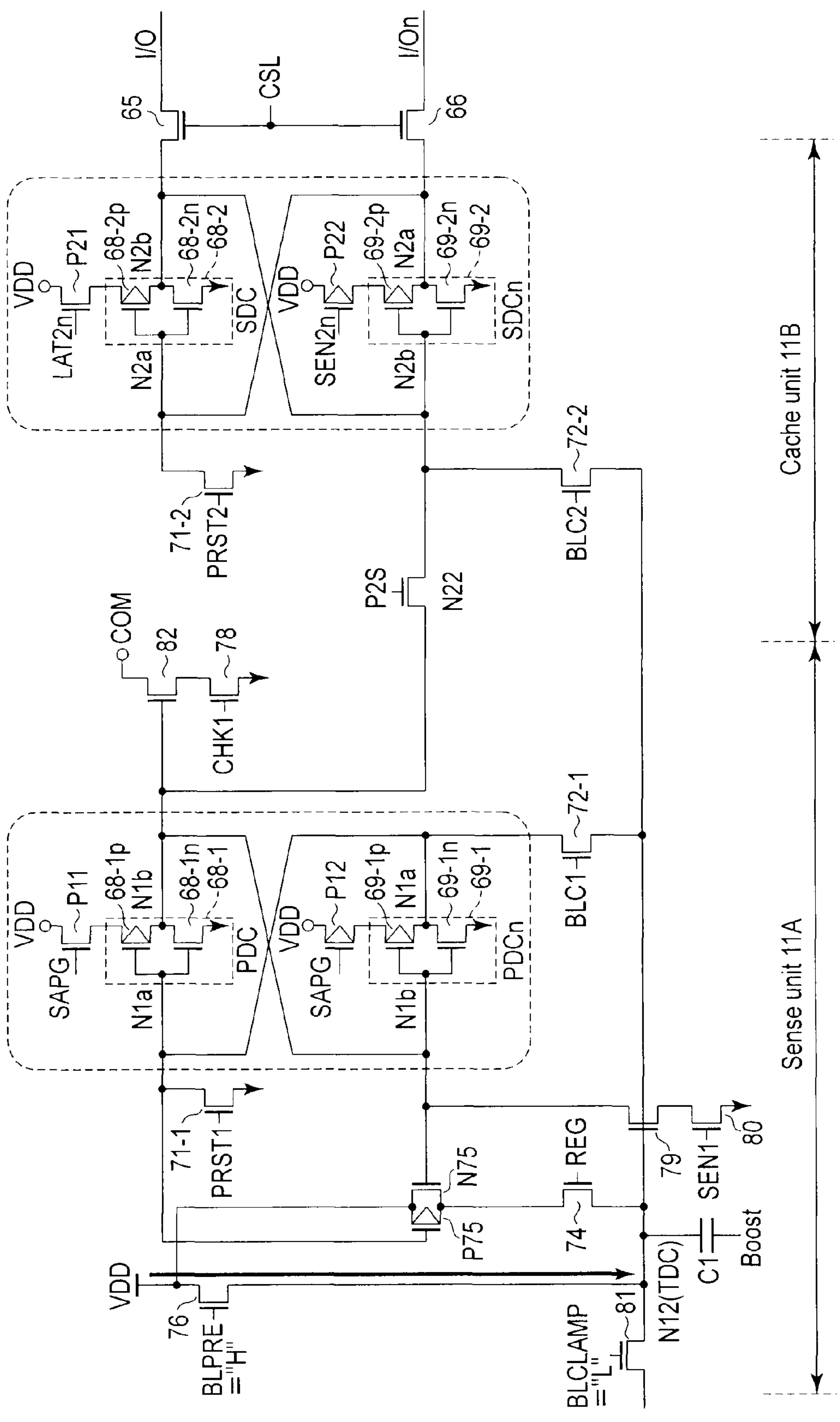

Subsequently, as illustrated in FIG. 81, the signal BLCCLAMP is set to the 'L' level to turn off the MOS transistor 81, and the bit line BL and the sense unit SU are electrically separated. In this state, the transition of the potential of the bit line BL is waited for. Next, the signal BLPRE is set to the 'H' level (voltage Vsg) while setting the potential of one end of the current pathway of the MOS transistor 76 to the voltage VDD. According to this, the node N12 (TDC) is charged up to the internal supply voltage VDD through the MOS transistor 76.

<Sense Operation>

Subsequently, sensing is performed. As illustrated in FIG. 82, as a result of the charge share, when the node N12 (TDC) is at the 'H' level, that is to say, when the erase verification passes, the MOS transistor 79 is turned on.

On the other hand, as illustrated in FIG. 83, as a result of the charge share, when the node N12 (TDC) is at the 'L' level, that is to say, when the erase verification fails, the MOS transistor 79 is turned off. Therefore, the node N1*b* is not set to the ground potential even when the signal SEN1 is set to the 'H' level. In the sense operation for the odd-numbered bit line BL also, the signal SEN is set to the 'H' level and the signal SAPG is set to the 'H' level, and the peak current, which flows through the PDC, is inhibited. Meanwhile, herein, as the held data of the PDC, a sense result of the even-numbered bit line BL, that is to say, the data at the 'H' or 'L' level is stored.

2-5. <Erase Verify Arithmetic>

Next, erase verify arithmetic of the even-numbered and odd-numbered bit lines according to this embodiment is described with reference to FIG. 84. First, as illustrated in FIG. 84, the signals BLCCLAMP and BLPRE are set to the 'L' level to turn off the MOS transistors 76 and 81, respectively. Herein, the voltage supplied to one end of the current pathway of the MOS transistor 76 is set to VSS and the signal REG is set to the 'H' level. That is to say, the potential of the node N12 (TDC) is discharged through the DDC and a MOS transistor 74. The operation is carried out in accordance with the held data of the PDC. That is to say, when the held data of the PDC (node N1*b*) is set to the 'H' level, the potential of the node N12 is discharged. As a result of the verify arithmetic, the potential of the node N12 (TDC) is as follows.

After the verification of the odd-numbered bit line BL, when the node N12 is at the 'H' level, it is supposed that the erase verification passes for both of the even-numbered bit line BL and the odd-numbered bit line BL ('H' level).

After the verification of the odd-numbered bit line BL, when the node N12 is at the 'L' level, it is supposed that the erase verification fails for any or both of the even-numbered bit line BL and the odd-numbered bit line BL. Specifically, this is any of following cases in which:

(i) even though the verification of the even-numbered bit line BL passes (node N1*b*='L'), as a result of the verify operation, the verification of the odd-numbered bit line BL fails (node N12='L'), (ii) the verification of the even-numbered bit line BL fails (node N1*b*='H'), and as a result, even when the verification of the odd-numbered bit line BL passes, the DDC is turned on, so that the node N12 is connected to the ground ('L' level), and (iii) the verification fails for both of the even-numbered bit line BL and the odd-numbered bit line BL.

<RESET>

Next, as illustrated in FIG. 85, a signal PRST1 is set to the 'H' level to turn on a MOS transistor 71-1 and the PDC is reset. That is to say, the node N1*b* is set to the 'H' level and the node N1*a* is set to the 'L' level.

<Sense Operation>

Figure 86:
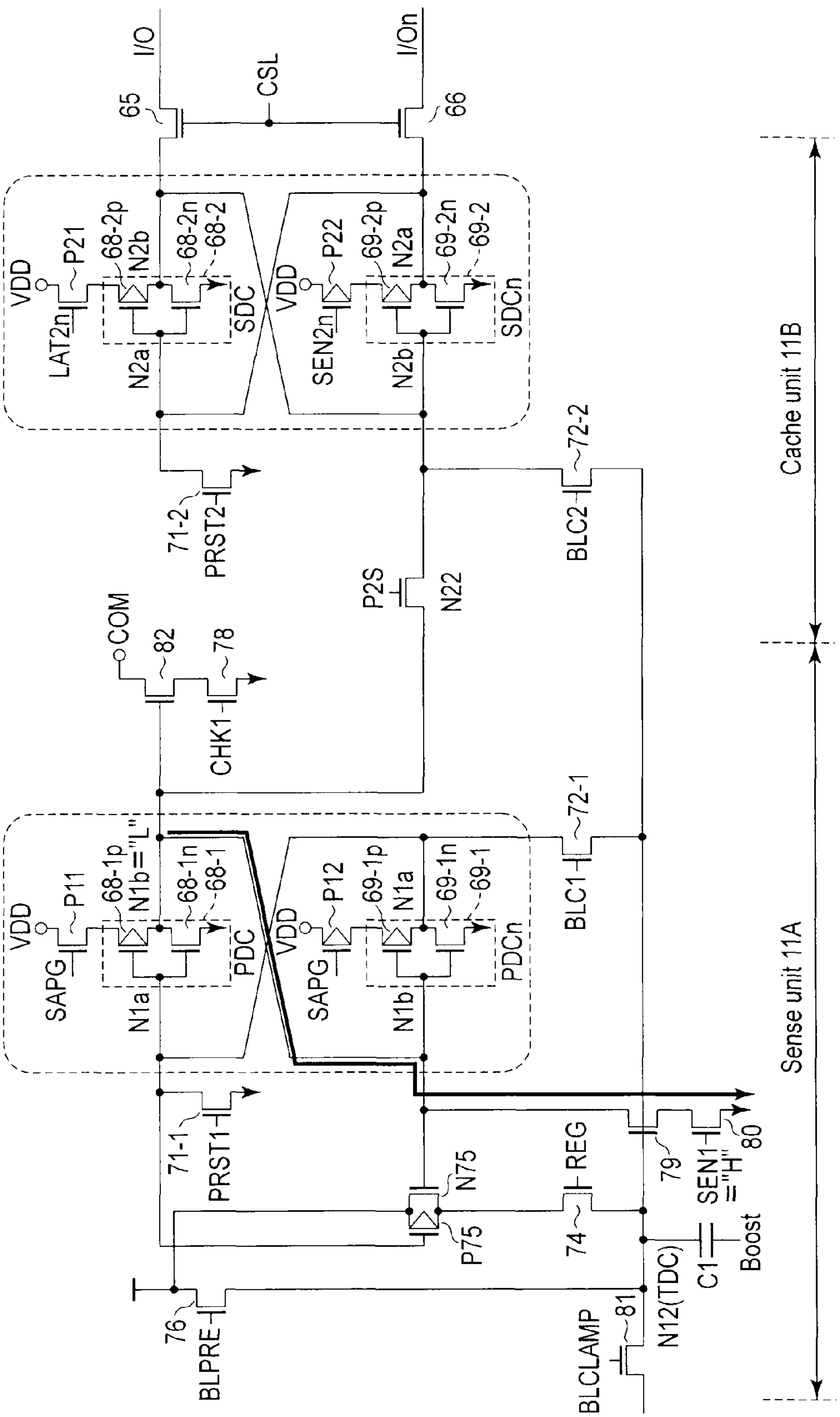

Thereafter, the sense operation is performed as illustrated in FIG. 86. That is to say, the signal SEN1 is set to the 'H' level to turn on the MOS transistor 80 and the potential of the TDC is transferred to the PDC.

At that time, the potential of the PDC is arithmetically obtained as follows according to the potential of the node N12 described above.

As a result of the sense operation, when the held data of the PDC (node N1*b*) is at the 'L' level, it is judged that the erase verification passes for both of the even-numbered bit line BL and the odd-numbered bit line BL.

Also, as a result of the sense operation, when the held data of the PDC is at the 'H' level, it is judged that the erase verification fails for any or both of the even-numbered bit line BL and the odd-numbered bit line BL. Specifically, this is any of following cases in which:

(i) although the erase verification of the even-numbered bit line BL passes (PDC='L'), the erase verification of the odd-numbered bit line BL fails (TDC='L'), (ii) although the erase verification of the even-numbered bit line BL fails (PDC='H'), the erase verification of the odd-numbered bit line BL passes ('H' level), and (iii) the erase verification fails for both of the even-numbered bit line BL and the odd-numbered bit line BL.

2-6. <Collective Detection>

Subsequently, collective detection (serial mode) in the sense unit SU according to this embodiment is described. The collective detection is an operation to collectively detect for judging whether it is the erased state as described above. The collective detection operation according to this embodiment is identical to that in the above-described first embodiment, so that description thereof is omitted.

2-7. <NOT Arithmetic>

Next, a NOT arithmetic operation of the sense unit SU according to the sixth embodiment is described with reference to FIGS. 87 to 93. The NOT arithmetic operation is to invert the held data of the PDC (node N1*b*) as in the above-described embodiment.

<TDC='L'>

First, as illustrated in FIG. 87, the signal BLPRE is set to the 'H' level to turn on the MOS transistor 76, and the node N12 (TDC) is set to the ground potential.

<Data Transfer (PDC to TDC)>

Figure 88:
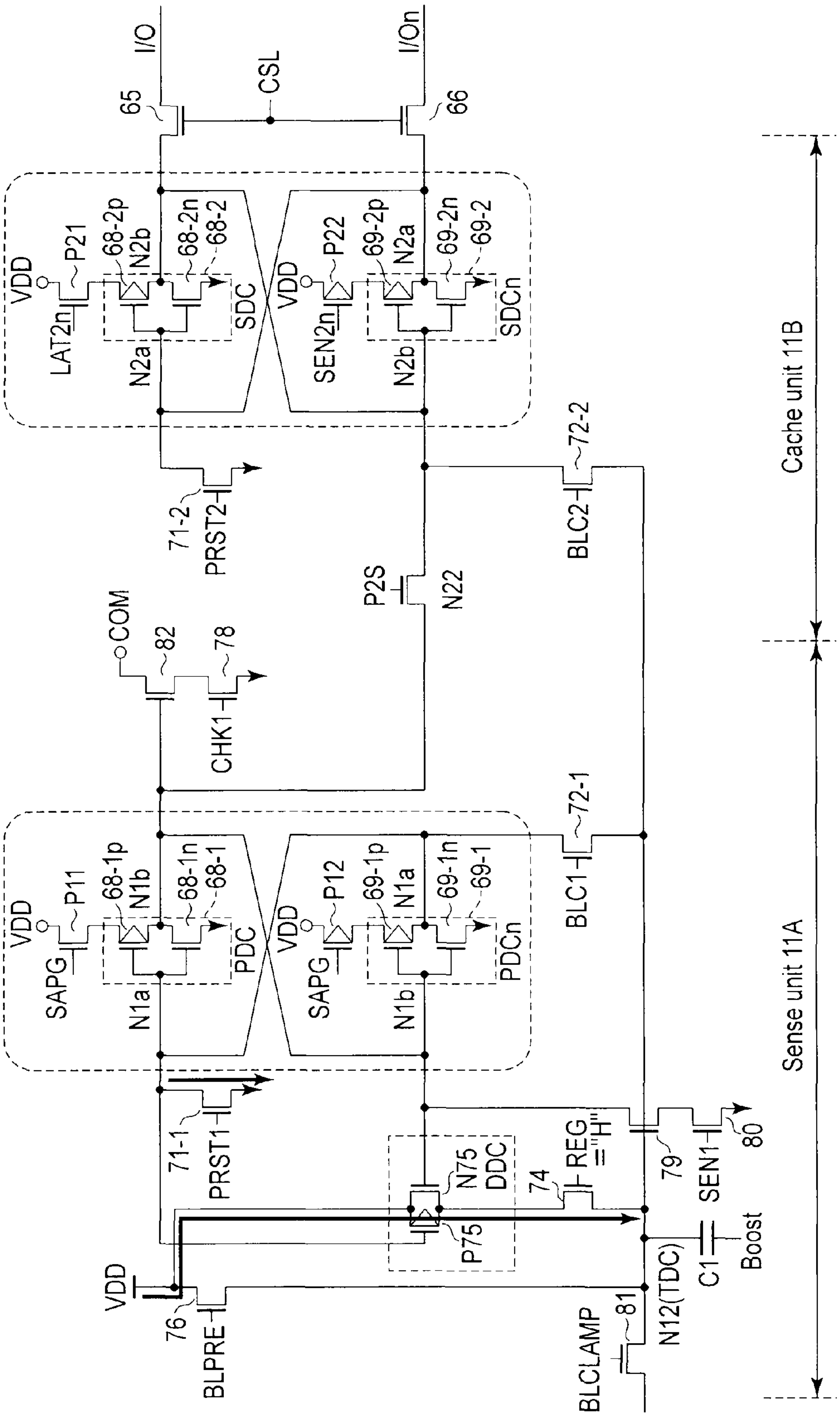

Subsequently, as illustrated in FIG. 88, the potential of one end of the current pathway of the MOS transistor 76 is set to the voltage VDD, the signal REG is set to the 'H' level (voltage Vsg), and the held data of the PDC is transferred to the node N12 (TDC). Specifically, this is as follows. That is to say, when the held data of the PDC is at the 'H' level, the DDC is turned on, so that the potential of the node N12 transits from the 'L' level so far to the 'H' level. In this manner, the data at the 'H' level stored in the PDC is transferred to the node N12 (TDC). On the other hand, when the held data of the PDC is at the 'L' level, the DDC is turned off, so that the potential of the node N12 is maintained at the 'L' level so far.

<RESET>

Figure 89:
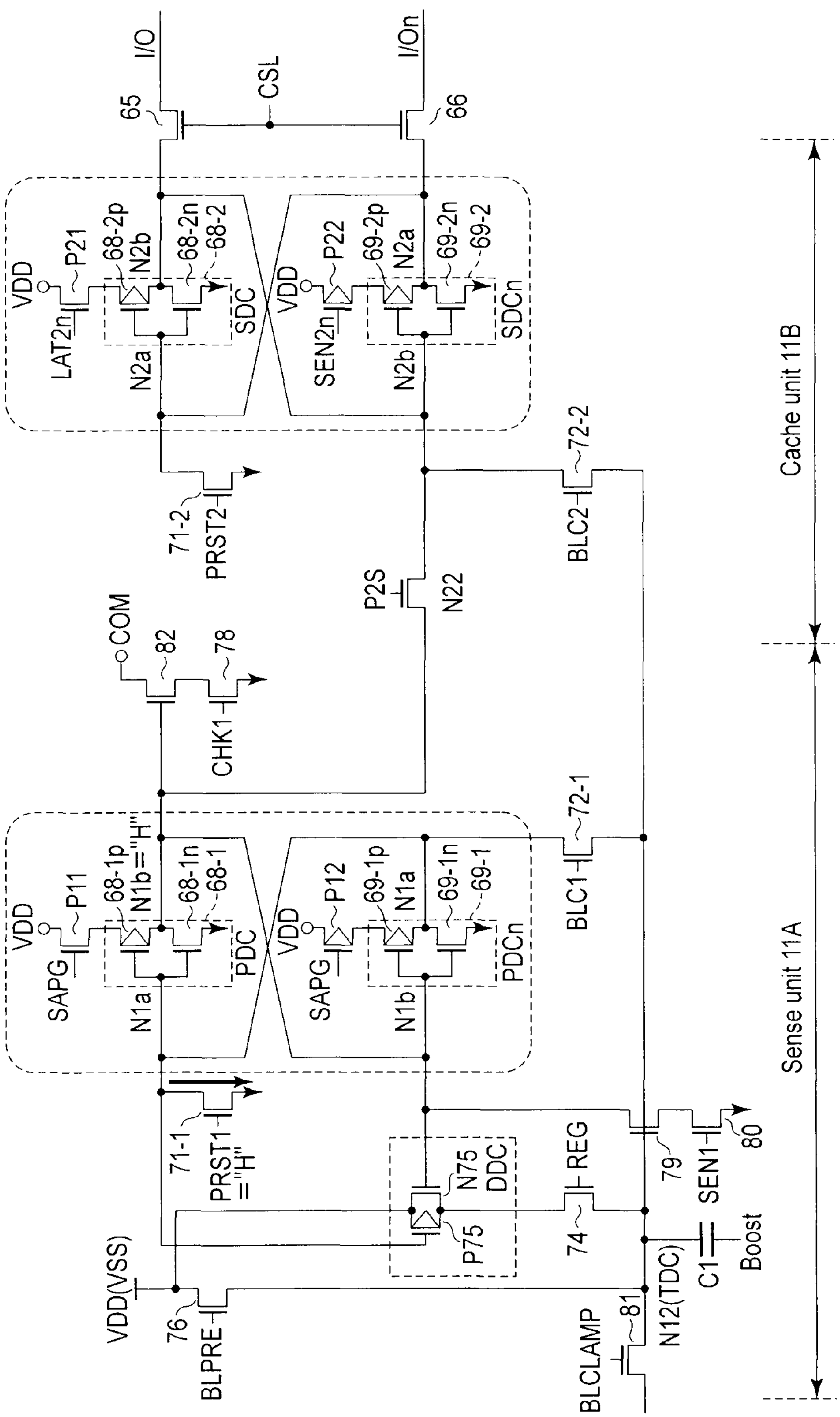

Next, a PDC reset operation is performed as illustrated in FIG. 89. That is to say, by setting the signal PRST1 to the 'H' level to turn on the MOS transistor 71-1, the node N1*b* of the PDC is set to the 'H' level.

<Sense Operation>

Thereafter, the sense operation is performed as illustrated in FIG. 90. That is to say, the signal SEN1 is set to the 'H' level to turn on the MOS transistor 80. At that time, when the data transferred from the node N12 (TDC) is at the 'H' level, the potential of the node N1*b* transits from the 'H' level to the 'L' level. According to this, the data stored in the PDC is defined.

Figure 91:
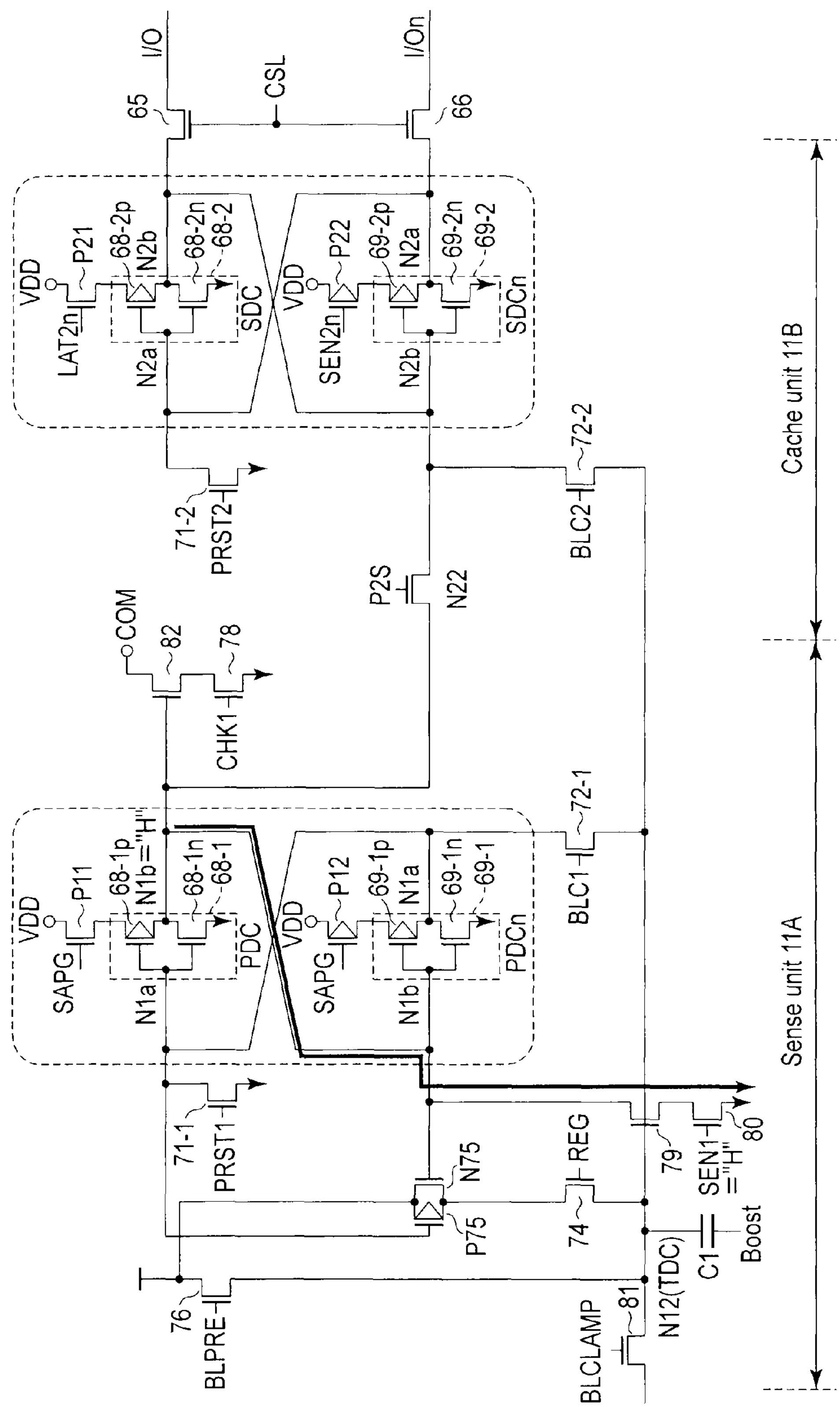

On the other hand, as illustrated in FIG. 91, when the data transferred from the node N12 (PDC) is at the 'L' level, the MOS transistor 79 is turned off, so that the potential of the node N1*b* is maintained at the 'H' level. According to this, the data stored in the PDC is defined.

<Data Transfer Operation from PDC to SDC>

Next, an operation to transfer data from the PDC to the SDC in the sense unit SU according to the sixth embodiment is described with reference to FIGS. 92 and 93. This is described with reference to a timing chart in FIG. 92. Also, pathways to transfer the data at the 'H' level latched into the node N1*b* of the PDC to the node N2*b* of the SDC (Read transfer pathway and ProgData transfer pathway) are herein described. As illustrated, the signal PRST (signal PRST2), a signal P2SGATE, a signal LAT2_V, a signal SEN2_V, and a signal ISALMTEN_V are represented along a longitudinal axis, and a time t is represented along an abscissa axis.

2-8. <Read Transfer Pathway>

First, at a time t1, the signals LAT2*n* and SEN2 are set to the 'L' level and the data at the 'H' level is set in the node N2*b* of the SDC. Next, at a time t2, the signal PRST2 is set to the 'H' level and the held data of the SDC (node N2*b*) is reset, that is to say, set to the 'H' level. Thereafter, at a time t3, the signal P2SGATE is set to the 'H' level to turn on the MOS transistor N22, and a data read (Read) pathway to transfer the data at the 'H' level latched into the PDC (node N1*b*) to the node N2*b* of the SDC is formed.

2-9. <ProgData Transfer Pathway>

First, the signal SEN1 is set to the 'H' level to turn on the MOS transistor 80. Subsequently, at a time t4, the signal PRST2 is set to the 'L' level to turn off the MOS transistor 71-2. Next, by the MOS transistor 71-2, which is turned off, the 'H' level stored in the PDC is transferred to the SDC through the MOS transistor N22. Therefore, the MOS transistor 69-2*n* is turned on, so that a value of the node N1*a* (node N1*b*) is fixed.

Thereafter, at a time t5, the signal SEN2*n* is set to the 'H' level to turn off the MOS transistor N22, thereby forming the ProgData transfer pathway, and the transferred data is latched into the SDC. Further, at a time t6, the signal LAT2*n* is set to the 'H' level to turn off the MOS transistor P21, and the data latched into the SDC is set. Thereafter, at a time t7, the signal P2S is set to the 'L' level to turn off the MOS transistor N22, thereby closing the formed ProgData transfer pathway.

Effect According to Sixth Embodiment (7)

As described above, the semiconductor storage device according to the sixth embodiment may at least obtain an effect similar to the above-described (1) to (6).

Further, the sense unit SU according to the sixth embodiment is further provided with the cache unit 11B including the inverters 68-2 and 69-2 to which the PMOS transistors P21 and P22 are AND connected in addition to the above-described sense unit 11A.

The voltage VDD is supplied to a source of the PMOS transistor P21, a drain thereof is connected to a source of the MOS transistor 68-2*p*, which forms the inverter 68-2, and the signal LAT2*n* is applied to a gate thereof. The voltage VDD is supplied to a source of the MOS transistor P22, a drain thereof is connected to a source of the MOS transistor 69-2*p*, which forms the inverter 69-2, and the signal SEN2*n* is applied to a gate thereof.

Therefore, by independently controlling the signals SEN2N and LAT2*n*, it is possible to limit a switching current of the MOS transistor 69-2*p*, thereby slowing charge of the SDC.

Figure 95:
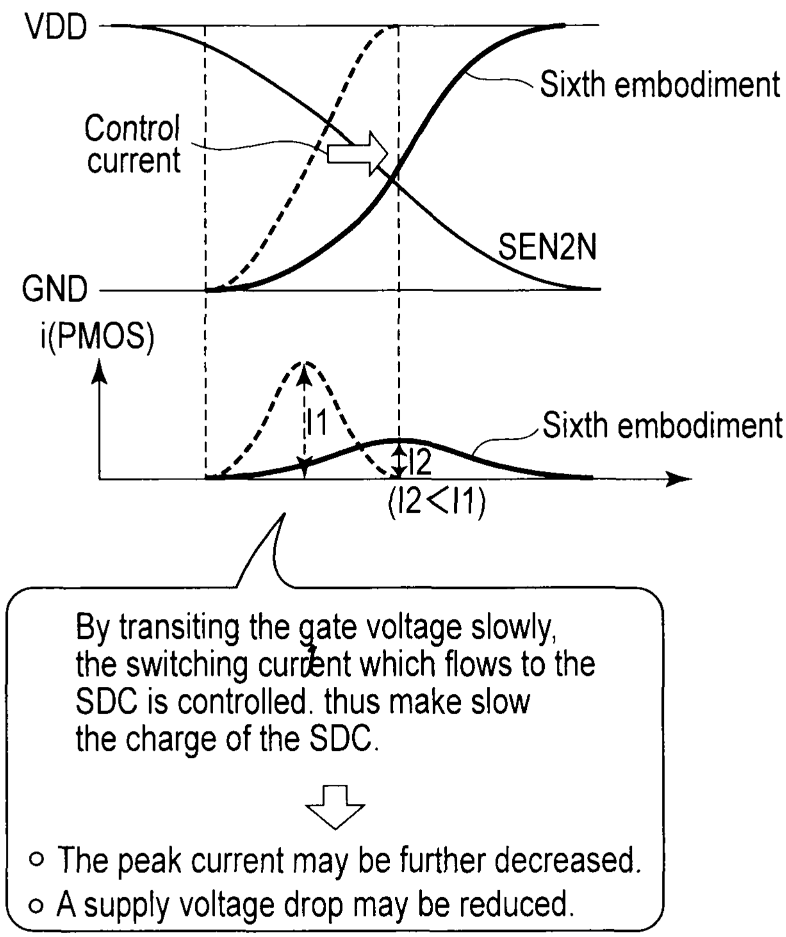

More specifically, as shown FIGS. 94 and 95, for example, by controlling the current signal SEN2N in the SDC in the above-described data read operation, the current, which flows to the SDC, is controlled.

Therefore, by further decreasing to limit the switching current, which flows to the SDC, it is possible to slow the charge of the SDC.

As a result, this is advantageous in that the peak current may be further decreased and a supply voltage drop may be reduced. In this manner, this embodiment may be applied as needed.

<Fourth Variation>

Next, a semiconductor storage device according to a variation of the above-described fifth and sixth embodiments is described. In this variation, MOS transistors P11, P12, P21, and P22 connected to a PDC and an SDC, which form a sense unit SU, are not provided on each sense unit SU, and a configuration is such that a plurality of sense units SU shares the MOS transistors P11, P12, P21, and P22. That is to say, for example, a plurality of MOS transistors P11 provided on each sense unit SU are assembled. In other words, a plurality of sense units SU shares one MOS transistor P11. In this manner, further reduction of an area may be realized. It goes without saying that not only the MOS transistor P11 but also the MOS transistors P12, P21, and P22 may have a similar configuration.

Seventh Embodiment

Next, a semiconductor storage device according to a seventh embodiment is described. The semiconductor storage device according to this embodiment is configured to reduce errors in reading by a sense unit SU. Specifically, a read margin is secured by boosting potential of node N12 (a detecting unit) of a sense unit SU, which performs a charge share operation with a bit line, when reading '1' data held by a memory cell transistor MT. Hereinafter, the semiconductor storage device according to this embodiment is described. Meanwhile, the sense unit SU according to seventh embodiment also employs a forced inverting method, and description of a configuration identical to that of the above-described embodiment is omitted.

1. Configuration 1-1. <Regarding Cell Current Icell>

A current (Icell), which flows to a channel of the memory cell transistor MT when the above-described memory cell transistor MT holds a threshold distribution of any of '0' and '1' data, is described with reference to FIG. 96. FIG. 96 is a graph in which current distribution is represented along an abscissa axis and the number of memory cell transistors MT is represented along a longitudinal axis.

Each memory cell transistor MT takes any of an on state and an off state according to a voltage applied by a row decoder 2. As described above, a current Icell_on flows to the memory cell transistor MT in the on state (hereinafter, sometimes referred to as an ON cell) and a current Icell_off flows to the memory cell transistor MT in the off state (hereinafter, sometimes referred to as an OFF cell). In this manner, a value of the current, which flows, changes according to the on state or the off state in the memory cell transistor MT, and there is a relationship represented as Icell_on>Icell_off.

Each of the currents Icell_on and Icell_off has a distribution with a certain width. That is to say, these currents differ. This is caused by different characteristics of the memory cell transistor MT itself, a difference in line width of the bit line and the like.

A minimum value Icell_on_min of the current Icell_on, which flows to the memory cell transistor MT in the on state, has a relationship represented as Icell_on_min>Read-Level. Also, a maximum value Icell_off_max of the current Icell_off, which flows to the memory cell transistor MT in the off state, has a relationship represented as Icell_off_max<Read-Level. Also, Read-Level is the value of the current, and is used by a sense unit SU, to be described later, to judge whether the data is to be '0' or '1'. The Read-Level might differ by a certain width, the difference of which is described later.

1.2<Regarding Controller 8>

As described above, controller 8 supplies a signal BLCCLAMP to a MOS transistor group 6, which connects the sense unit SU to a bit line BL. More particularly, the controller 8 outputs a voltage (Vclamp+Vth1), a voltage (Vsen+Vth1), and a voltage (Vtr+Vth1) as the signal BLCCLAMP. The signal BLCCLAMP is described later.

1-3. <Regarding Configuration of Sense Amplifier 11 (Sense Unit SU)>

Next, a configuration of the sense amplifier 11 according to this embodiment is described with reference to FIG. 97. Meanwhile, description of the configuration similar to that of the above-described sense amplifier 11 (sense unit SU) according to first to sixth embodiments is omitted.

One electrode of a capacitor element C1 is connected to the node N12. That is to say, the capacitor element C1 accumulates charge according to the potential of the node N12. Also, a driver circuit 85 supplies a voltage VDD, for example, to the other electrode of the capacitor element C1. That is to say, the driver circuit 85 boosts the potential of the node N12 by further supplying the voltage VDD in addition to the voltage according to the charge held by the capacitor element C1. A timing with which the driver circuit 85 supplies the voltage VDD may be controlled by the above-described controller 8, for example, or may be controlled by the driver circuit 85 itself. Meanwhile, the timing with which the driver circuit 85 supplies the voltage VDD to the other electrode of the capacitor element C1 in a read operation is described later.

The capacitor element C1 accumulates the charge transferred from the BL line through wiring 83 by a charge transfer operation to be described hereinafter.

2. Operation 2-1. <Read Operation>

Figure 99:
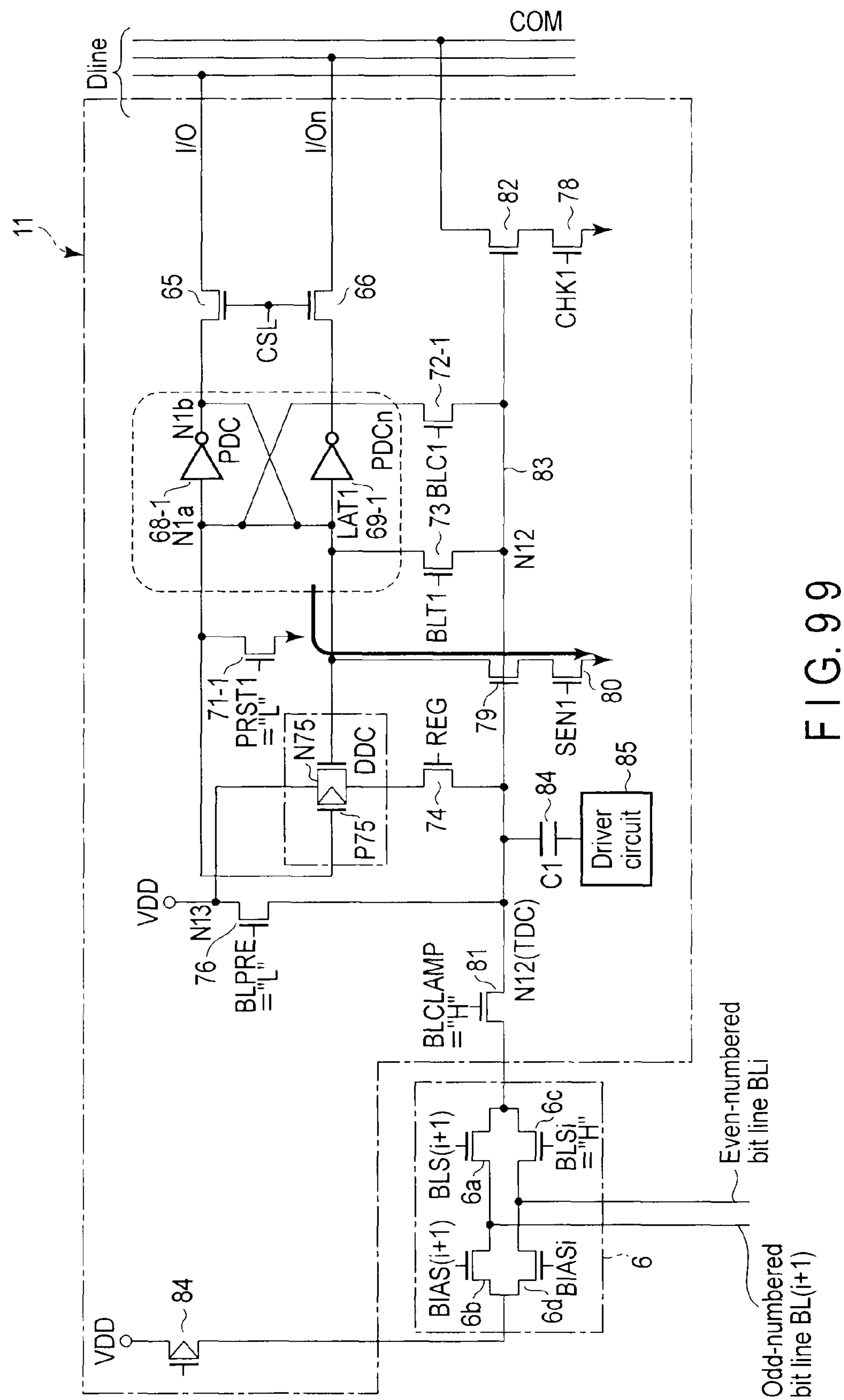

Next, the read operation of data in the above-described configuration is described with reference to FIGS. 98 and 99. Meanwhile, the read operation (precharge, RESET, and discharge) of the sense unit SU according to this embodiment is identical to that in the above-described first embodiment, so that description thereof is omitted.

<Boost>

A boost operation by the driver circuit 85 is described, the boost operation is performed after precharge, RESET, and discharge. The controller 8 controls the driver circuit 85 to supply the voltage VDD, for example. On the other hand, the driver circuit 85 supplies the voltage VDD to the other electrode of the capacitor element C1. According to this, the potential of the node N12 is boosted up to a voltage VDD×2.

<Charge Transfer>

As illustrated in FIG. 98, the signals BLCCLAMP and BLSi are set to the 'H' level and the even-numbered bit line BLi is electrically connected to the node N12. According to this, charge transfer occurs. That is to say, when the NAND string 10 is in a conducting state, the charge of the even-numbered bit line BLi is discharged toward the source line SL. As a result, even in a boosting state, the node N12 transits from the voltage VDD×2 to the zero potential, for example. That is to say, the charge of the node N12 moves to the even-numbered bit line BLi. This is because a capacity of the even-numbered bit line BLi is larger than a wiring capacity of the node N12.

On the other hand, when the NAND string 10 is not in the conducting state, the potential of the even-numbered bit line BLi is maintained at the voltage VDD. Therefore, the charge transferred is not large and the potential of the node N12 is maintained at a voltage slightly lower than the voltage VDD×2. This is hereinafter referred to as a voltage $VDD_1$×2 (<voltage VDD×2).

<Sensing>

Sensing is described with reference to FIG. 99. A sense operation is the operation to set the signal SEN1 to the 'H' level to import the potential of the bit line BL (wiring 83) into the PDC. As a result of conduction of the NAND string 10, when the potential of the node N12 transits to the zero potential, for example, the MOS transistor 79 is turned off. Therefore, even when the signal SEN1 is set to the 'H' level to turn on the MOS transistor 80, the node N1*b* of the PDC (hereinafter, represented as PDC (node N1*b*)) holds the 'H' level.

On the other hand, when the NAND string 10 is put into a non-conducting state and the potential of the node N12 is maintained at the voltage $VDD_1$×2, the MOS transistor 79 is turned on. The threshold voltage of the MOS transistor 79 is set to VtTP2, which is a value larger than a voltage VDD/2 and smaller than the voltage VDD. In this state, when the signal SEN1 is set to the 'H' level to turn on the MOS transistor 80, the node N1*b* is set to the ground potential (for example, 'L' level=zero potential) (indicated by an arrow in FIG. 8). Therefore, the PDC (node N1*b*) holds the 'L' level. Herein, the value of the threshold voltage VtTP2 is more specifically defined. The threshold voltage VtTP2 is the voltage for turning on the MOS transistor 79 for transition of the potential of the node N1*b* from the 'H' level to the 'L' level while maintaining the on state of the MOS transistor 80, and the MOS transistor 79 is turned off and the node N1*b* keeps maintaining the 'H' level at a voltage lower than this.

In this manner, the PDC holds the data at the 'L' or 'H' level according to the potential of the even-numbered bit line BLi. Thereafter, when a signal CSL is set to the 'H' level, the held data of the PDC is output to signal lines I/O and I/On through MOS transistors 65 and 66, respectively.

2-2. <Regarding Read Operation of Semiconductor Storage Device>

Next, a case in which attention is focused on each signal in the above-described read operation of the data is described with reference to FIG. 100. FIG. 100 is a time chart in which the transition of each signal in the read operation of the semiconductor storage device is indicated. The potential of the bit line BL, the signal BLCCLAMP to be supplied to a gate of the MOS transistor 81, an output of the driver circuit 85, the signal BLSi to be supplied to a gate of the MOS transistor 6*c*, and the potential of the node N12 are represented along a longitudinal axis and a time is represented along an abscissa axis.

First, charge to the bit line BL is performed in a period from a time t1 to a time t2. That is to say, the signals BLCCLAMP and BLSi are set to the 'H' level as described above. Specifically, the signal BLCCLAMP is set to the voltage (Vclamp+Vth1) and the signal BLSi is set to a voltage (VDD+Vth2), for example. Also, since the signal BLPRE is set to the 'H' level, the potential of the bit line BL increases up to the voltage VDD through the node N12 and the MOS transistors 81 and 6*c*. Meanwhile, the node N12 maintains the voltage VDD from before the time t1. Also, voltage Vclamp=voltage VDD is satisfied.

Next, discharge of the bit line BL is performed in a period from the time t2 to a time t4. That is to say, by setting the signal BLCCLAMP to the 'L' level to turn off the MOS transistor 81, the node N12 is electrically separated from the bit line BL. If a threshold level of the memory cell transistor MT is put into an erased state ('1' data in FIG. 96), and the NAND string 10 is in the conducting state, the current Icell_on flows to the channel (refer to FIG. 97) and the bit line BL discharges, so that the potential transits to the zero potential.

On the other hand, when the threshold level of the memory cell transistor MT is put into a writing state ('0' data in FIG. 96) and the NAND string 10 is not in the conducting state, the potential of the bit line BL is not discharged and the current Icell_off flows to the channel (refer to FIG. 97), but this is substantially held at the voltage VDD.

Next, the driver circuit 85 outputs the voltage VDD at a time t3 before the charge transfer is performed. According to this, the potential of the node N12 increases from the voltage VDD so far to achieve the voltage VDD×2.

After the time t4, the charge transfer operation is performed between the node N12 and the bit line BL. That is to say, the signal BLCCLAMP is set to the 'H' level to achieve the voltage (Vsen+Vth1). Meanwhile, a relationship represented as voltage Vsen<voltage VDD is established. Herein, when the potential of the bit line BL is the voltage VDD (the memory cell transistor MT holds the '0' data), a potential difference between a source and a gate becomes smaller than a threshold voltage Vth1 of the MOS transistor 81. Therefore, the charge transfer between the bit line BL and the node N12 substantially does not occur and the potential of the node N12 is set to the voltage $VDD_1$×2. Herein, the potential difference between the threshold voltage VtTP2 of the MOS transistor 79 and the voltage $VDD_1$×2 is set to '0' Read Margin. Therefore, the larger the voltage of the node N12 (TDC) relative to the threshold voltage VtTP2 of the MOS transistor 79, the larger the '0' Read Margin.

On the other hand, when the potential of the bit line BL is the zero potential (the memory cell transistor MT holds the '1' data, that is to say, in the erased state), the potential difference between the source and the gate becomes larger than the threshold voltage Vth1 of the MOS transistor 81. Therefore, the charge transfer between the bit line BL and the node N12 occurs and the potential of the node N12 transits from the voltage VDD×2 to the zero potential. Also, in a write operation, when '1' writing fails and increase in the threshold voltage is not sufficient (potential line of fail in writing in FIG. 100), the current Icell according to the threshold voltage of the memory cell transistor MT flows to the bit line BL. Therefore, when the charge transfer operation is performed, the potential of the node N12 transits from the voltage VDD×2 to a voltage $VDD_2$ (<voltage VDD), for example. Herein, the potential difference between the voltage $VDD_2$ and the threshold voltage VtTP2 of the MOS transistor 79 is set to '1' Read Margin. Therefore, the smaller the voltage of the node N12 (TDC) relative to the threshold voltage VtTP2 of the MOS transistor 79, the larger the '1' Read Margin. That is to say, the '1' Read Margin is the largest when the bit line BL transits to the zero potential.

Next, the sensing is performed by the sense unit SU after a time t5. Specifically, as described above, at a time t6, the signal SEN1 is set to the 'H' (voltage VDD) level to turn on the MOS transistor 80. When the potential of the node N12 is larger than the threshold voltage VtTP2 of the MOS transistor 79, the MOS transistor 79 is turned on, and the ground potential, that is to say, the 'L' level is latched into a latch circuit LAT1 before a time t7. On the other hand, when the potential of the node N12 is smaller than the threshold voltage VtTP2 of the MOS transistor 79, the MOS transistor 79 is turned off and the latch circuit LAT1 holds the 'H' level.

Thereafter, boost down is performed from the time t7. The boost down is performed regardless of the potential of the node N12. By the boost down, the potential of the node N12 is fixed to the zero potential. Herein, a case in which the potential of the node N12 transits to the zero potential, for example, after the charge transfer operation (for example between the time t5 and t7) is considered. In this case, when the driver circuit 85 stops supplying the voltage VDD, the potential of the node N12 connected to the other electrode of the capacitor element C1 is set to −VDD. This might cause a large amount of noise in an entire chip. The boost down prevents such errors in operation.

Also, at the time t7, the boost down is performed. That is to say, the signal BLCCLAMP is set to the 'H' level and the voltage (Vtr+Vth1) is supplied to the gate of the MOS transistor 81. Herein, since the signal BLSi is also set to the 'H' level, the node N12 is electrically connected to the bit line BL. Herein, since "the wiring capacity of the bit line BL is larger than the wiring capacity of the wiring 83 and the capacity of the capacitor element C1", the boost down is completed by applying the charge of the node N12 to the bit line BL. Meanwhile, even when the charge is applied to the bit line BL, since the capacity of the bit line BL is large, the potential of the bit line BL does not substantially change. Thereafter, the output from the driver circuit 85 is stopped at a time t8 during the boost down, and the signal BLSi is set to the 'L' level at a time t10.

Effect According to this Embodiment (8)

The semiconductor storage device according to this embodiment may obtain an effect (8) of improving an operation speed of the charge transfer in addition to the effects (1)-(7) obtained by the above-described first to sixth embodiments. As described above, in the semiconductor storage device according to this embodiment, the potential of the node N12 increases from the voltage VDD up to the voltage VDD×2 as a result of the boost. For example, suppose a case in which the potential of the bit line BL is set to the zero potential by the conduction of the NAND string 10 after the discharge. In this case, a potential difference Vds between the source and the drain in the MOS transistor 81 is a voltage (VDD×2-0), that is to say, the potential difference of the voltage VDD×2 is generated. Therefore, the voltage Vds may be increased, so that the charge transfer operation speed is improved even when the potential of the node N12 is set to the voltage VDD×2.

Figure 101A:
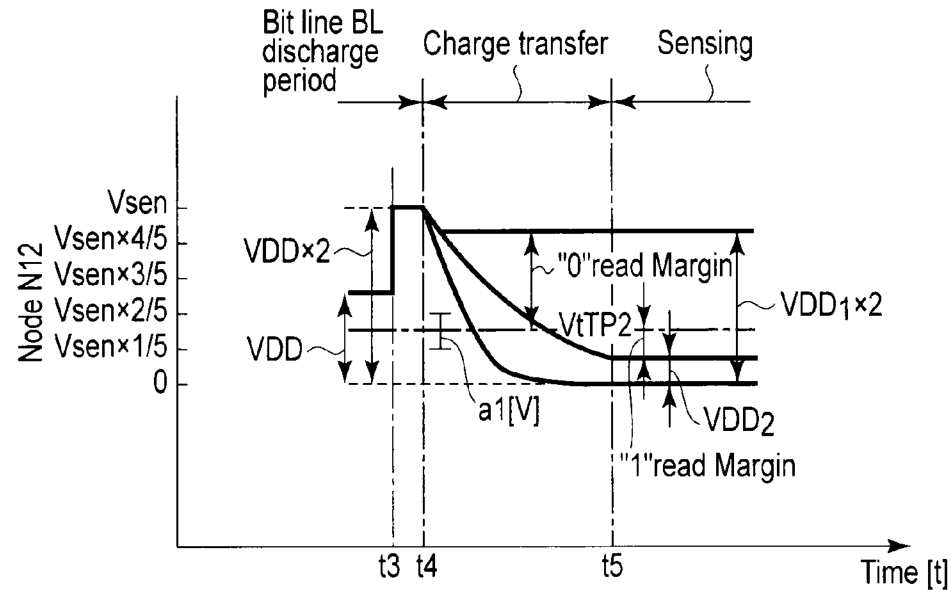
FIG. 101A is a time chart obtained by enlarging FIG. 100 in which attention is focused on a Read Margin.
Figure 101B:
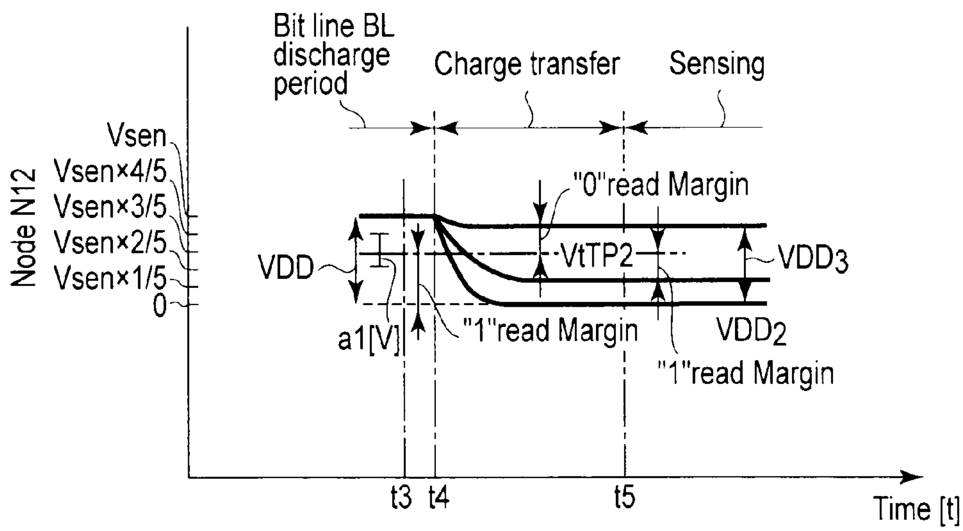
FIG. 101B is a time chart according to a comparative example of the seventh embodiment in which attention is focused on the Read Margin.

Further, the semiconductor storage device according to this embodiment may increase the '0' Read Margin. That is to say, in the semiconductor storage device according to this embodiment, the driver circuit 85 of which timing is controlled by the controller 8 supplies the voltage VDD to one electrode of the capacitor element C1 before the charge transfer operation. According to this, the potential of the node N12 is boosted from the voltage VDD up to the voltage VDD×2. Since a value of the voltage VDD×2 is sufficiently higher than the threshold voltage VtTP2 of the MOS transistor 79, the '0' Read Margin may be increased. This state is described with reference to FIGS. 101A and 101B. FIG. 101A is a time chart obtained by enlarging FIG. 100 in which attention is focused on the potential difference between the potential of the node N12 and the threshold voltage VtTP2 of the MOS transistor 79 according to this embodiment. FIG. 101B is a time chart of a comparative example of the semiconductor storage device according to this embodiment in which attention is focused on the potential difference between the node N12, which is not boosted, that is to say, the node N12 at the voltage VDD and the threshold voltage VtTP2 of the MOS transistor 79.

As illustrated in FIG. 101A, the '0' Read Margin is set to a voltage (Vdd×2-VtTP2) in the charge transfer from the time t4 to t5. On the other hand, in FIG. 101B, the '0' Read Margin is set to a voltage (VDD-VtTP2) in the charge transfer from the time t4 to the time t5, and in the comparative example, this is smaller than the voltage (VDD×2-VtTP2) obtained in this embodiment illustrated in FIG. 101B.

In addition, by an effect of recently developed miniaturization of the chip, there is a tendency that a leak current from a connection of the wiring is generated in the sense unit SU and operation is performed at a lower voltage, for example, so that a value of the voltage VDD decreases. Further, there is difference in the value of the threshold voltage VtTP2 of the MOS transistor 79. That is to say, as illustrated in FIGS. 101A and 101B, there is the difference in the value of the threshold voltage VtTP2 up and down (a width of the difference is set to a1). For example, although the difference in the threshold voltage VtTP2 is within a range from Vsen×2/5 to Vsen×4/5 for the voltage VDD(Vsen) in FIG. 101B, in the semiconductor storage device according to this embodiment, the difference in the threshold voltage VtTP2 is within the range from Vsen×1/5 to Vsen×2/5 for the voltage VDD×2(Vsen).

From such a background, when the '0' Read Margin is small as illustrated in FIG. 101B, even when the held data of the memory cell transistor MT is the '0' data, the sense unit SU might erroneously judge that this is the '1' data, that is to say, in the erased state, by decrease in the potential of the node N12. Herein, although it is considered to be preferable that the value of the threshold voltage VtTP2 of the MOS transistor 79 is decreased, the threshold voltage VtTP2 cannot be decreased for a following reason. This is because of a relationship in current driving force with a p-channel MOS transistor, which forms an inverter 68. That is to say, when the MOS transistors 79 and 80 are turned on, in other words, when the node N1*b* is connected to the ground, the p-channel MOS transistor applies the current to the node N1*b* so as to prevent the node N1*b* from transiting to the ground potential, that is to say, to maintain the node N1*b* at the 'H' level. That is to say, in a forced inverting type, discharge by the MOS transistor 79 and the charge by the p-channel MOS transistor occur simultaneously. Herein, in order to invert the held data of the latch circuit LAT1 from the 'H' level to the 'L' level, the current driving force of the MOS transistor 79 should be larger than that of the p-channel MOS transistor. Therefore, VtTP2 should be not smaller than a certain value.

Also, there is also the difference in the threshold voltage of the p-channel MOS transistor as in the case of the MOS transistor 79. That is to say, it is required that the threshold voltage of the MOS transistor 79 is larger than a maximum value of the threshold voltage, which the p-channel MOS transistor may take. Therefore, the threshold voltage VtTP2 of the MOS transistor 79 is required to be smaller than a voltage $VDD_3$ and larger than VDD/2. From such a circumstance, the value of the VtTP2 cannot be decreased, and it is required to prevent erroneous reading of the judgment of '0' or '1' by the sense operation by boosting the potential of the node N12.

From above, the semiconductor storage device according to this embodiment may reduce (prevent) the erroneous reading due to the difference in the threshold voltage VtTP2 of the MOS transistor 79 by boosting the potential of the node N12. Meanwhile, the voltage $VDD_3$ is the potential of the bit line BL obtained as a result of flow of a minimum current (left side in state distribution) of the current Icell_off, for example, in the memory cell transistor MT, which holds the '0' data (off state) in FIG. 96.

Further, the semiconductor storage device according to this embodiment may decrease the difference in the cell current Icell relative to the difference in the threshold voltage VtTP2 of the MOS transistor 79.

The above-described effect is described with reference to FIGS. 102A and 102B. FIG. 102A is a time chart in which attention is focused on the bit line BL and the node N12 in FIG. 101A. Specifically, this is the time chart illustrating change in the potential of the node N12 when changing the value of the current Icell, which flows to the bit line BL, and performing the charge transfer operation for each changed current Icell. Also, FIG. 102B is a graph illustrating a relationship between the current Icell, which flows to the bit line BL, and the voltage of the node N12 illustrated in FIG. 102A, that is to say, the graph of I-V characteristics.

As illustrated in FIG. 102A, the value of the current Icell, which flows to the bit line BL (channel portion of the memory cell transistor MT), is changed in discharge operation from the time t2 to the time t3. In other words, the value of the current Icell, which flows to the channel, is changed by changing the state distribution of the memory cell transistor MT, which forms the NAND string 10. As illustrated in FIG. 96 also, when threshold potential of the memory cell transistor MT is in the "erased state" and the characteristics are excellent, the value of the current Icell is large. In this case, a slope of the current Icell, which flows to the NAND string 10 at the time of the discharge is sharp. On the other hand, when the value of the current Icell in a state in which the '0' data is held in which the threshold potential of the memory cell transistor MT is high is small, the slope of the current Icell, which flows at the time of the discharge, is gentle.

As described above, when the value of the current Icell is changed, the potential of the node N12 in which the charge transfer operation is performed is set to a value according to the potential of each bit line BL. That is to say, as illustrated in FIGS. 101A and 101B also, when the threshold distribution of the memory cell transistor MT is put into the erased state and the discharge of the bit line BL progresses as a result of the reading, the potential of the node N12 transits to the zero potential. On the other hand, when the discharge of the bit line BL does not progress because the memory cell transistor MT holds the '0' data, the charge transfer operation after the time t3 is not substantially performed.

Next, it is described with reference to FIG. 102B. The potential of the node N12 is represented along a longitudinal axis, and the value of the current Icell, which flows to the bit line BL, according to the potential of the node N12 is represented along an abscissa axis. In the graph of the I-V characteristics in FIG. 102B, a case of the semiconductor storage device provided with a forced inverting type sense unit SU in which the node N12 is boosted is indicated by an A line, a case in which the node N12 is not boosted in the A line is indicated by a B line, and a case of the semiconductor storage device provided with the sense unit SU of the inverter system as an example of the comparative example in which the node N12 is not boosted is indicated by a C line. Meanwhile, the sense unit SU, which adopts the inverter system, has a configuration without the MOS transistors 79 and 80 in FIG. 97. That is to say, the held data of the PDC (node N1*b*) is set according to an amount of the charge accumulated by the capacitor element.

As illustrated, the node N12 is boosted in the semiconductor storage device according to this embodiment, an intersecting point of the A line and the longitudinal axis is set to the voltage VDD×2, and as described above, the potential of the node N12 drastically decreases as the current Icell increases. Also, difference (hereinafter, d) in the threshold voltage VtTP2 of the MOS transistor 79 is set to d1 and the intersecting points (hereinafter, Ip) of the A line and upper and lower line of the difference d1 are set to intersecting points Ip1 and Ip2, respectively. Next, difference in current between the intersecting points Ip1 and Ip2 is set to ΔI1 and an intermediate current between the intersecting points Ip1 and Ip2 is set to a current $Icell_A$. Herein, the current $Icell_A$ is a current value for judging whether the held data of the memory cell transistor MT is the data '0' or '1' (refer to FIG. 96). That is to say, this is a parameter for judging the held data of the memory cell transistor MT to the channel of which the current larger than the current $Icell_A$ flows to be the '1' data and judging the held data of the memory cell transistor MT to which the current smaller than a current $Icell_B$ flows to be the '0' data, and $Icell_A$ corresponds to Itrip in FIG. 96.

Also, in the semiconductor storage device according to this embodiment, there is the difference with half a width of ΔI1 in the intermediate current $Icell_A$ to judge the held data of the memory cell transistor MT as illustrated in FIG. 102B. That is to say, in FIG. 96, it is understood that Itrip to judge the '0' or '1' data has a current difference of ($Icell_A$±ΔI1/2).

On the other hand, in a case of the B line in which the node N12 is not boosted, the intersecting point with the longitudinal axis is set to a value larger than the voltage VDD and smaller than the voltage VDD×2, and the larger the current Icell, the more gently the potential of the node N12 decreases than in the A line. Also, the intersecting points of the upper and lower lines of the difference d1 and the B line are set to IP3 and IP4, respectively. Next, the difference in the current between the intersecting points Ip3 and Ip4 is set to ΔI2. Also, when the intermediate current between the intersecting points Ip3 and Ip4 is set to the current $Icell_B$, in a case of the B line, it is found that there is the difference with a width of a current ($Icell_B$±ΔI2/2). Meanwhile, a relationship of ΔI2>ΔI1 is established.

Further, in the case of the C line in which the node N12 is not boosted in the inverter system described as an example of the comparative example, the intersecting point with the longitudinal axis is set to the voltage VDD, for example, and the larger the current Icell, the more gently the potential of the node N12 decreases than in the B line. Also, the intersecting points of the upper and lower lines of difference d2 and the C line are set to Ip5 and Ip6, respectively. Subsequently, a difference in the current between the intersecting points Ip5 and Ip6 is set to ΔI3. Also, when the intermediate current between the intersecting points Ip5 and Ip6 is set to a current $Icell_C$, it is found that there is the difference with the width of a current ($Icell_C$±ΔI3/2) in the case of the C line. Meanwhile, the relationship of ΔI3>ΔI2 is established.

From the above, in the semiconductor storage device according to this embodiment, the difference in the current Itrip as a boundary value to judge the '0' or '1' data decreases and the erroneous reading of the data may be prevented.

Eighth Embodiment

Next, a semiconductor storage device according to an eighth embodiment is described. The semiconductor storage device according to this embodiment is obtained by changing a current pathway when boosting down by a sense amplifier 11 from a bit line BL to a precharge pathway. Boost down according to this embodiment is described with reference to FIG. 103. A configuration of the sense unit SU according to this embodiment is identical to that in the above-described first embodiment, so that description thereof is omitted.

<Boost Down>

Figure 103:
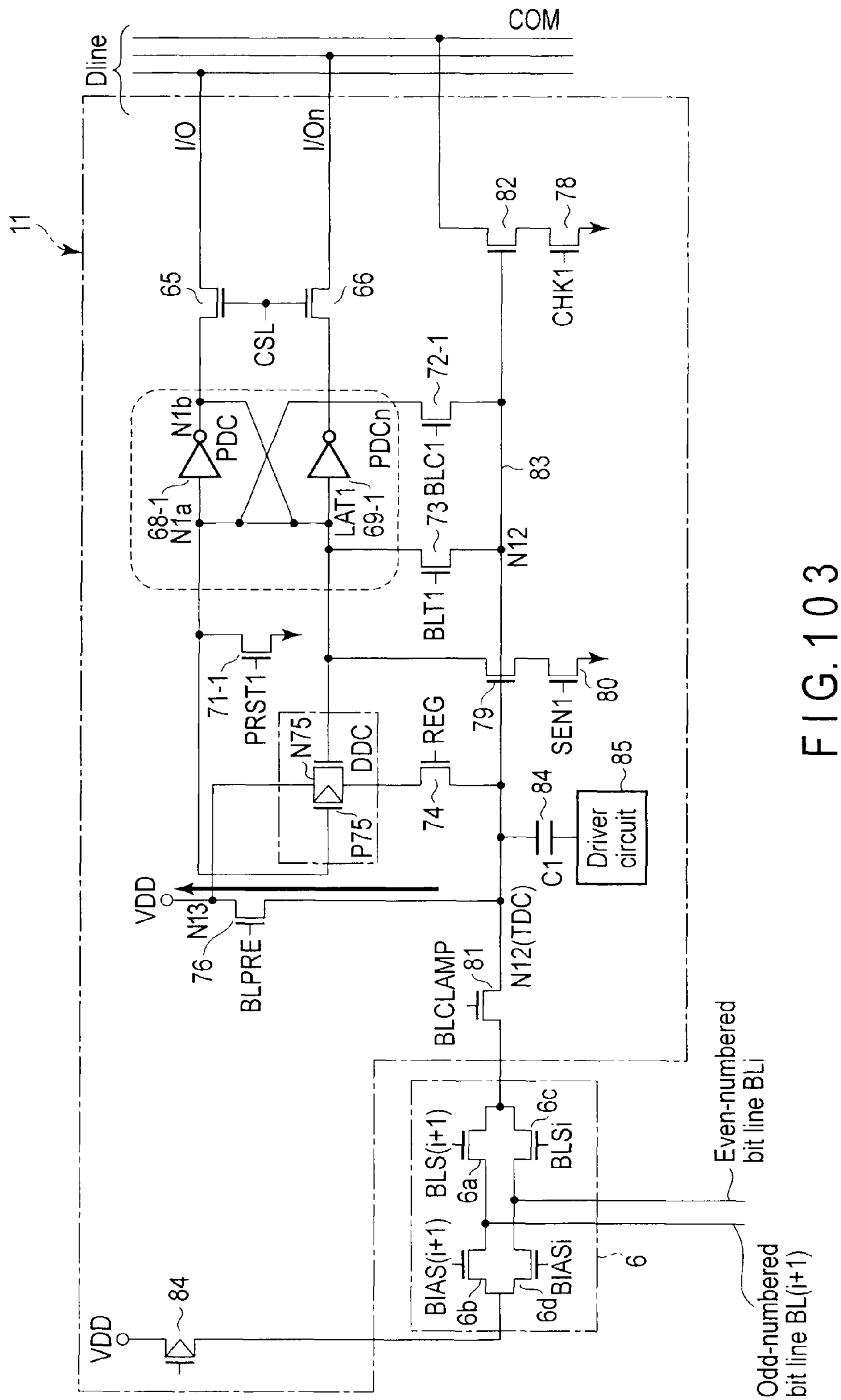
FIG. 103 is a schematic diagram illustrating an operation of boost down of a sense unit according to the eighth embodiment.

FIG. 103 is a circuit diagram of the sense unit SU illustrated in FIG. 97 to illustrate the pathway to perform a boost down operation. As illustrated, the boost down of a node N12 is performed by turning on a MOS transistor 76. At that time, a voltage VSS is supplied to one end of a current pathway of the MOS transistor 76. That is to say, when boosting down, the node N12 is connected to the ground regardless of held data of a latch circuit LAT1 by setting a signal BLPRE to an 'H' level to turn on the MOS transistor 76.

Effect According to this Embodiment (9)

The semiconductor storage device according to this embodiment may obtain an effect (9) of simplifying control in addition to the effects (1)-(8) obtained by the above-described first to seventh embodiments. That is to say, in the semiconductor storage device according to this embodiment, the precharge pathway is used for the boost down of the node N12 as described above. Therefore, it is not required to generate the signal BLCCLAMP (=voltage Vtr+Vth1) to be supplied to a gate of the MOS transistor 81 of the above-described first embodiment at the time of the boost down. That is to say, in the above-described first embodiment, a controller 8 generates various voltages as the signal BLCCLAMP in a read operation. Specifically, as illustrated in FIG. 112 also, the controller 8 is required to generate the voltage (Vtr+Vth1) in addition to a voltage (Vclamp+Vth1) and a voltage (Vsen+Vth1).

On the other hand, in the semiconductor storage device according to this embodiment, the controller 8 may connect one end of the current pathway of the MOS transistor 76 to the ground and set the signal BLPRE to the 'H' level to turn on the MOS transistor 79, and the control for generating the voltage (Vtr+Vth1) may be omitted.

Ninth Embodiment

Next, a semiconductor storage device according to a ninth embodiment is described. The semiconductor storage device according to this embodiment is obtained by changing a current pathway when boosting down in a sense unit SU of a node N12 to a pathway for electrically connecting the node N12 and one end of a current pathway of a MOS transistor 76 through a DDC. The DDC serves as a transfer gate. Boost down according to this embodiment is described with reference to FIG. 104. Meanwhile, a configuration of the sense unit SU according to this embodiment is identical to that in the above-described first embodiment, so that description thereof is omitted.

<Boost Down>

Figure 104:
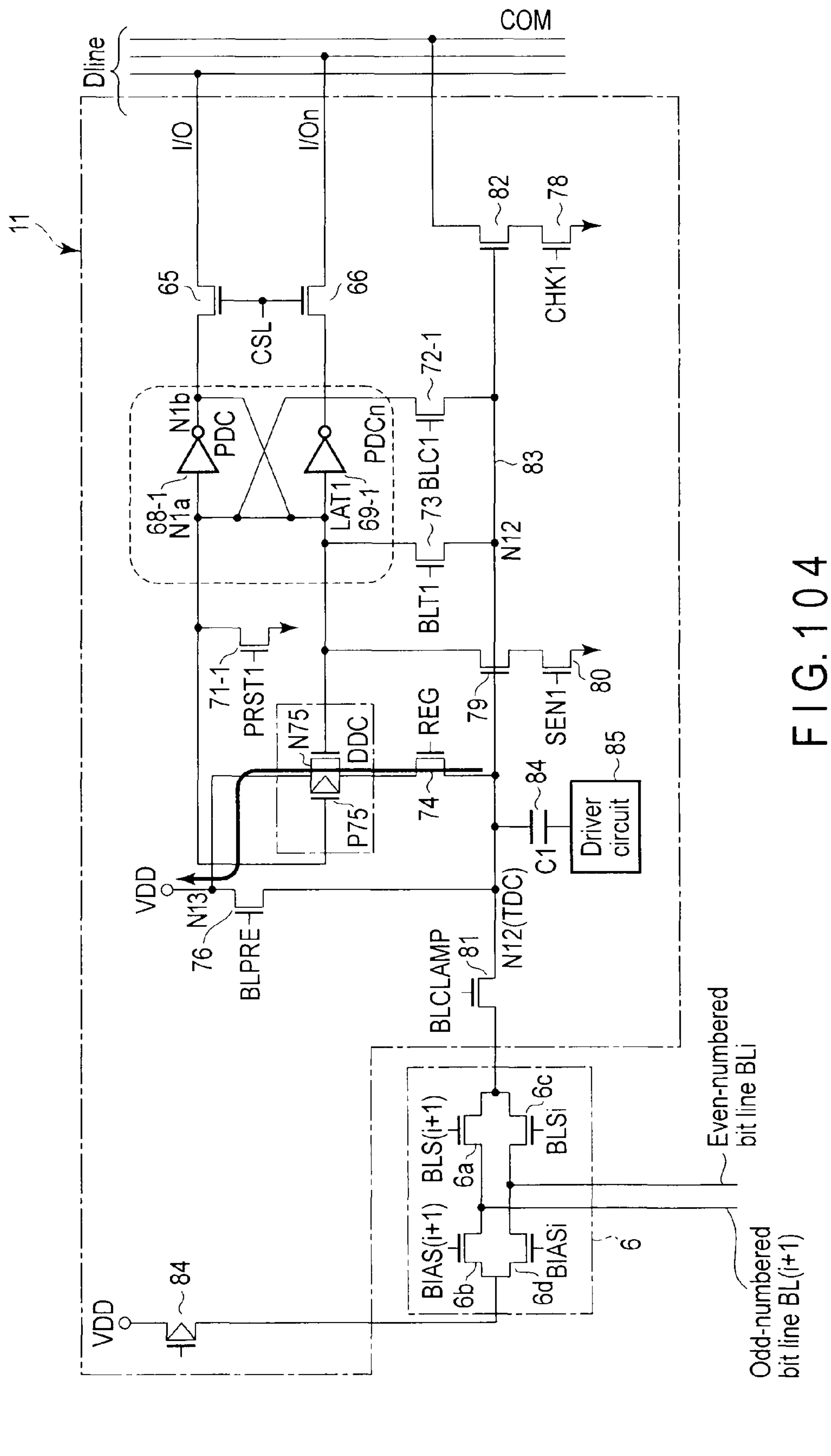
FIG. 104 is a schematic diagram illustrating the operation of the boost down of a sense unit according to the ninth embodiment.

FIG. 104 is a circuit diagram of the sense unit SU illustrated in FIG. 97 for illustrating the pathway for performing the boost down operation. As described above, when boosting down the potential of the node N12, the node N12 is connected to one end of the current pathway of the MOS transistor 76, which is set to a voltage VSS, through MOS transistors N75 and P75, which form the DDC. That is to say, when boosting down by the pathway, it is required to turn on the MOS transistors N75 and P75, which serve as the transfer gate, in addition to the MOS transistor 74. That is to say, it is required that a node N1_a_ is set to an 'L' level and a node N1_b_ is set to an 'H' level. In other words, it is required that a latch circuit LAT1 holds the 'L' level. That is to say, only in a case in which the node N12 is set to zero potential as a result of a charge transfer operation, and the potential of the node N12 is set to −VDD by the boost down in which a voltage VDD from a driver circuit 85 stops, the potential of the node N12 is connected to the ground. That is to say, when the potential of the node N12 is set from a voltage VDD×2 to the voltage VDD by the stop of the voltage VDD by the driver circuit 85, and when this is set from the voltage VDD to the zero potential, it is not required that the node N12 is connected to the ground.

Effect According to this Embodiment (10)

The semiconductor storage device according to this embodiment may obtain an effect (10) of inhibiting a discharge current in addition to the effects (1)-(9) obtained by the above-described first to eighth embodiments. That is to say, the semiconductor storage device according to this embodiment selectively connects the potential of the node N12 to the ground only when the potential of the node N12 decreases to −VDD by the boost down operation as described above. According to this, it is not required to discharge the potential of the node N12 of a case in which the potential of the node N12 is not required to be set to a fixed voltage (herein, zero potential) (the potential of the node N12 is the voltage VDD or the zero potential after the boost down operation), so that an excessive discharge current may be inhibited.

Meanwhile, although the sense unit SU for judging whether the data is '0' data or '1' data is described in the first to third embodiment, there is no limitation. That is to say, this may also be applied to the sense amplifier for judging held data of a 4-level memory cell transistor MT, which holds data of "00", "01", "10", and "11".

Meanwhile, although the potential of the node N12 is boosted up to the voltage VDD×2 by the driver circuit 85 in this embodiment, the node N12 may be boosted by the pathway of the MOS transistor 76. That is to say, the potential of the node N12 may be increased up to the voltage VDD×2 by supplying the voltage VDD×2 to one end of the current pathway of the MOS transistor 76. In this case, a timing to supply the voltage VDD×2 to one end of the current pathway of the MOS transistor 76 and the like is controlled by a controller 8.

Although a matter is course, it is possible to combine each embodiment freely. The combination of the embodiments is arbitrary, for example, may combine the seventh embodiment with the fifth embodiment. In this case, while controlling switching current, the semiconductor memory device which reduces error in data reading may be offered. Thus, the effect of above mentioned (1)-(10) may be obtained by combining two or more embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:

a memory cell array including a plurality of memory cells in rows and columns;

an even-numbered bit line connected to the memory cells connected to an even-numbered column;

an odd-numbered bit line connected to the memory cells connected to an odd-numbered column adjacent to the even-numbered column; and a plurality of sense amplifiers each of which is selectively connected to the odd-numbered bit line or the even-numbered bit line, wherein each of the sense amplifiers includes:

a latch circuit including a first node and a second node, which holds the data supplied to the first node;

a first transistor of which gate is connected to wiring selectively connected to the even-numbered bit line or the odd-numbered bit line, one end of a current pathway of the first transistor is connected to the first node of the latch circuit, the first transistor supplies read data to the latch circuit on the basis of a potential of the wiring when reading the data;

a second transistor of which current pathway is connected between the first node of the latch circuit and the wiring, which transfers the data held by the latch circuit to the wiring when performing arithmetic of the data; and a third transistor of which current pathway is connected between the second node of the latch circuit and the wiring, which transfers the data held by the latch circuit to the wiring when writing the data.

2. The device according to claim 1, further comprising:

a fourth transistor which sets the wiring to a ground potential according to information indicating whether the data stored in the memory cells is erased, wherein, when the information indicates that erasing of the data stored in the memory cells connected to the even-numbered bit line is not completed, the fourth transistor sets the wiring to the ground potential regardless of whether the data stored in the memory cells connected to the odd-numbered bit line is erased.

3. The device according to claim 1, further comprising:

a fourth transistor capable of connecting a signal line connected in common to the sense amplifiers to a ground potential according to the potential of the wiring; and a detecting circuit, which detects a signal indicating whether the data is written to the memory cells corresponding to the sense amplifiers or whether the data stored in the memory cells is erased according to whether the signal line is set to the ground potential.

4. The device according to claim 1, further comprising:

an inverting circuit capable of inverting the data held by the latch circuit and output to the wiring, which is connected in common to the sense amplifiers, wherein the inverting circuit judges whether the data held by the memory cells connected to the bit line is erased by a result obtained by performing inversion arithmetic of the data output to the wiring.

5. The device according to claim 4, wherein the inverting circuit comprises an arithmetic unit and an inverting element, the inverting element inverts a result obtained by performing arithmetic by the arithmetic unit, and when writing of the data to the memory cells is completed, a signal, which indicates that the writing of the data is completed, is input to the arithmetic unit.

6. The device according to claim 1, wherein each of the sense amplifiers includes:

a fourth transistor; and a fifth transistor, wherein the latch circuit includes:

a sixth transistor and a seventh transistor connected in series and an eighth transistor and a ninth transistor connected in series, wherein the first node is connected to one end of a current pathway of the sixth transistor connected to one end of a current pathway of the seventh transistor, the second node is connected to one end of a current pathway of the eighth transistor connected to one end of a current pathway of the ninth transistor, a first voltage is supplied to one end of a current pathway of the fourth transistor, the other end of the current pathway is connected to the other end of the current pathway of the sixth transistor, a control signal is applied to a gate, and the first voltage is supplied to one end of a current pathway of the fifth transistor, the other end of the current pathway is connected to the other end of the current pathway of the eighth transistor and the control signal is applied to a gate.

7. The device according to claim 6, wherein the sense amplifier further comprises a cache unit, which latches the data held by the first and second inverter circuits.

8. The device according to claim 7, wherein each of the sense amplifiers includes:

a tenth transistor;

an eleventh transistor; and a second latch circuit, wherein the second latch circuit includes:

a twelfth transistor and a thirteenth transistor connected in series, and a fourteenth transistor and a fifteenth transistor connected in series, wherein the first node is connected to one end of a current pathway of the twelfth transistor connected to one end of a current pathway of the thirteenth transistor, the second node is connected to one end of a current pathway of the fourteenth transistor connected to one end of a current pathway of the fifteenth transistor, the first voltage is supplied to one end of a current pathway of the tenth transistor, the other end of the current pathway is connected to the other end of the current pathway of the fourth transistor, the control signal is applied to a gate, and the first voltage is supplied to one end of a current pathway of the eleventh transistor, the other end of the current pathway is connected to the other end of the current pathway of the fourteenth transistor and the control signal is applied to a gate.

9. The device according to claim 6, wherein the first and second nodes are electrically connected to complementary first and second data lines, the sense amplifier further comprises sixteenth and seventeenth transistors of which current pathways are connected in series between the second data line and a second supply voltage, and a gate of the sixteenth transistor is connected to the first data line, and a verify result is detected by a terminal connected to one end of the current pathway of the sixteenth transistor by selecting a gate signal of the seventeenth transistor.

10. The device according to claim 7, wherein the first and second nodes are electrically connected to complementary first and second data lines, a sense unit further comprises sixteenth and seventeenth transistors of which current pathways are connected in series between the second data line and a second supply voltage, and a gate of the sixteenth transistor is connected to the first data line, and a verify result is detected by a terminal connected to one end of the current pathway of the sixteenth transistor by selecting a gate signal of the seventeenth transistor.

11. The device according to claim 8, wherein the first and second nodes are electrically connected to complementary first and second data lines, a sense unit further comprises sixteenth and seventeenth transistors of which current pathways are connected in series between the second data line and a second supply voltage, and a gate of the sixteenth transistor is connected to the first data line, and a verify result is detected by a terminal connected to one end of the current pathway of the sixteenth transistor by selecting a gate signal of the seventeenth transistor.

12. The device according to claim 6, wherein the control signal is controlled so as to inhibit a current driving force of the fourth and fifth transistors in a data read operation of the memory cells.

13. The device according to claim 9, wherein the control signal is controlled so as to inhibit a current driving force of the fourth and fifth transistors in a data read operation of the memory cells.

14. The device according to claim 8, wherein the control signal is controlled so as to inhibit a current driving force of the tenth and eleventh transistors in data read operation of the memory cells.

15. The device according to claim 1, wherein each of the sense amplifiers includes:

a third node connected to the other end of the bit line on the wiring, in order to perform a charge share operation with the other end of the bit line when reading the data; and a driver circuit, which supplies a voltage to the other electrode of a capacitor element to boost the third node, wherein the sense amplifier latches a potential according to a charge held by the capacitor element of which one electrode is connected to the fifth node, and the driver circuit supplies the voltage to the other electrode during a period from before the charge share operation to completion of a latch operation of the data held by the memory cell.

16. The device according to claim 15, wherein the driver circuit stops applying the voltage to the other electrode after the completion of the latch operation.

17. The device according to claim 16, wherein the sense amplifier includes:

a pathway in which a voltage is supplied to a sixth node when reading the data, which precharges the bit line through the fifth node, wherein discharge of the voltage applied to the other electrode is performed through the pathway.

18. The device according to claim 17, wherein the sense amplifier includes:

a switch, which is turned on when the latch circuit holds the data at an ‘H’ level to connect the fifth node to the sixth node as the pathway.

19. The device according to claim 16, wherein, when the voltage is applied to the other electrode, a ratio of change in a current, which flows to the bit line, to change in potential of the one electrode is smaller than the ratio in a case in which the voltage is not applied to the other electrode.

20. The device according to claim 16, wherein discharge of the first node is performed through the bit line.

* * * * *